(12) United States Patent
Mueller et al.

(10) Patent No.: US 7,646,029 B2
(45) Date of Patent: Jan. 12, 2010

(54) LED PACKAGE METHODS AND SYSTEMS

(75) Inventors: George G. Mueller, Boston, MA (US);
Kevin J. Dowling, Westford, MA (US);
Frederick M. Morgan, Quincy, MA (US); Ihor A. Lys, Milton, MA (US)

(73) Assignee: Philips Solid-State Lighting Solutions, Inc., Burlington, MA (US)

( * ) Notice: Subject to any disclaimer, the term of this patent is extended or adjusted under 35 U.S.C. 154(b) by 535 days.

(21) Appl. No.: 11/178,214

(22) Filed: Jul. 8, 2005

(65) Prior Publication Data
US 2006/0022214 A1 Feb. 2, 2006

Related U.S. Application Data

(60) Provisional application No. 60/586,939, filed on Jul. 8, 2004, provisional application No. 60/588,090, filed on Jul. 15, 2004.

(51) Int. Cl.
*H01L 29/161* (2006.01)
(52) U.S. Cl. .................. 257/84; 257/13; 257/E51.022; 257/E25.032; 438/27; 438/237; 438/328
(58) Field of Classification Search .................. 438/27, 438/237, 328; 257/13, 84, E51.022, E25.032
See application file for complete search history.

(56) References Cited

U.S. PATENT DOCUMENTS

| | | | |
|---|---|---|---|
| 4,967,330 A | 10/1990 | Bell et al. | |
| 5,847,593 A * | 12/1998 | Pernyeszi | ................... 327/432 |
| 6,016,038 A | 1/2000 | Mueller et al. | |
| 6,150,774 A | 11/2000 | Mueller et al. | |
| 6,166,496 A | 12/2000 | Lys et al. | |
| 6,208,073 B1 | 3/2001 | Wang et al. | |
| 6,211,626 B1 | 4/2001 | Lys et al. | |
| 6,292,901 B1 | 9/2001 | Lys et al. | |
| 6,340,868 B1 | 1/2002 | Lys et al. | |
| 6,369,525 B1 | 4/2002 | Chang et al. | |
| 6,459,919 B1 | 10/2002 | Lys et al. | |
| 6,528,954 B1 | 3/2003 | Lys et al. | |
| 6,548,967 B1 | 4/2003 | Dowling et al. | |
| 6,577,080 B2 | 6/2003 | Lys et al. | |
| 6,608,453 B2 | 8/2003 | Morgan et al. | |
| 6,614,103 B1 | 9/2003 | Durocher et al. | |
| 6,624,597 B2 | 9/2003 | Dowling et al. | |
| 6,717,376 B2 | 4/2004 | Lys et al. | |
| 6,720,745 B2 | 4/2004 | Mueller et al. | |
| 6,774,584 B2 | 8/2004 | Lys et al. | |
| 6,777,891 B2 | 8/2004 | Lys et al. | |
| 6,781,329 B2 | 8/2004 | Morgan et al. | |
| 6,788,011 B2 | 9/2004 | Mueller et al. | |
| 6,801,003 B2 | 10/2004 | Schanberger et al. | |
| 6,806,659 B1 | 10/2004 | Mueller et al. | |
| 6,869,204 B2 | 3/2005 | Piepgras et al. | |
| 6,883,929 B2 | 4/2005 | Dowling | |
| 6,885,035 B2 | 4/2005 | Bhat et al. | |
| 6,888,322 B2 | 5/2005 | Dowling et al. | |
| 6,897,624 B2 | 5/2005 | Ducharme et al. | |
| 6,936,978 B2 | 8/2005 | Morgan et al. | |
| 6,965,205 B2 | 11/2005 | Piepgras et al. | |
| 6,967,448 B2 | 11/2005 | Morgan et al. | |
| 6,969,954 B2 | 11/2005 | Lys | |
| 6,975,079 B2 | 12/2005 | Lys et al. | |
| 7,015,825 B2 | 3/2006 | Callahan | |
| 2001/0032985 A1 * | 10/2001 | Bhat et al. | ..................... 257/88 |
| 2002/0038157 A1 | 3/2002 | Dowling et al. | |
| 2002/0044066 A1 | 4/2002 | Dowling et al. | |
| 2002/0048169 A1 | 4/2002 | Dowling et al. | |
| 2002/0070688 A1 | 6/2002 | Dowling et al. | |
| 2002/0074559 A1 | 6/2002 | Dowling et al. | |
| 2002/0078221 A1 | 6/2002 | Blackwell et al. | |
| 2002/0122309 A1 | 9/2002 | Abdelhafez et al. | |
| 2002/0130627 A1 | 9/2002 | Morgan et al. | |
| 2002/0145394 A1 | 10/2002 | Morgan et al. | |
| 2002/0145869 A1 | 10/2002 | Dowling | |
| 2002/0152045 A1 | 10/2002 | Dowling et al. | |
| 2002/0158583 A1 | 10/2002 | Lys et al. | |
| 2002/0176259 A1 | 11/2002 | Ducharme | |
| 2003/0011538 A1 | 1/2003 | Lys et al. | |
| 2003/0028260 A1 | 2/2003 | Blackwell | |
| 2003/0057884 A1 | 3/2003 | Dowling et al. | |
| 2003/0057887 A1 | 3/2003 | Dowling et al. | |
| 2003/0076281 A1 | 4/2003 | Morgan et al. | |
| 2003/0100837 A1 | 5/2003 | Lys et al. | |
| 2003/0133292 A1 | 7/2003 | Mueller et al. | |
| 2003/0222587 A1 | 12/2003 | Dowling et al. | |
| 2004/0036006 A1 | 2/2004 | Dowling | |
| 2004/0052076 A1 | 3/2004 | Mueller et al. | |
| 2004/0061106 A1 | 4/2004 | Kitagawa et al. | |
| 2004/0090191 A1 | 5/2004 | Mueller et al. | |
| 2004/0090787 A1 | 5/2004 | Dowling et al. | |
| 2004/0100204 A1 | 5/2004 | Chun | |
| 2004/0105261 A1 | 6/2004 | Ducharme et al. | |
| 2004/0105264 A1 | 6/2004 | Spero | |
| 2004/0113568 A1 | 6/2004 | Dowling et al. | |

(Continued)

*Primary Examiner*—Michelle Estrada

(57) ABSTRACT

Methods and systems are provided for LED modules that include an LED die integrated in an LED package with a submount that includes an electronic component for controlling the light emitted by the LED die. The electronic component integrated in the submount may include drive hardware, a network interface, memory, a processor, a switch-mode power supply, a power facility, or another type of electronic component.

37 Claims, 102 Drawing Sheets

U.S. PATENT DOCUMENTS

| | | |
|---|---|---|
| 2004/0116039 A1 | 6/2004 | Mueller et al. |
| 2004/0130909 A1 | 7/2004 | Mueller et al. |
| 2004/0178751 A1 | 9/2004 | Mueller et al. |
| 2004/0179793 A1 | 9/2004 | McColloch et al. |
| 2004/0206970 A1 | 10/2004 | Martin |
| 2004/0212320 A1 | 10/2004 | Dowling et al. |
| 2004/0212321 A1 | 10/2004 | Lys et al. |
| 2004/0212993 A1 | 10/2004 | Morgan et al. |
| 2005/0006754 A1* | 1/2005 | Arik et al. .................. 257/712 |
| 2005/0099824 A1 | 5/2005 | Dowling et al. |
| 2005/0116667 A1 | 6/2005 | Mueller et al. |
| 2005/0151489 A1 | 7/2005 | Lys et al. |
| 2005/0179041 A1* | 8/2005 | Harbers et al. ............... 257/80 |
| 2005/0213352 A1 | 9/2005 | Lys et al. |
| 2005/0213353 A1 | 9/2005 | Lys |
| 2005/0218838 A1 | 10/2005 | Lys |
| 2005/0218870 A1 | 10/2005 | Lys |
| 2005/0219872 A1 | 10/2005 | Lys |
| 2005/0231133 A1 | 10/2005 | Lys |
| 2005/0236029 A1 | 10/2005 | Dowling |
| 2005/0236998 A1 | 10/2005 | Mueller |
| 2005/0253533 A1 | 11/2005 | Lys et al. |
| 2005/0275626 A1 | 12/2005 | Mueller |
| 2005/0276053 A1 | 12/2005 | Nortrup |
| 2007/0001177 A1* | 1/2007 | Bruning et al. ............... 257/79 |
| 2007/0120135 A1* | 5/2007 | Soules et al. ................. 257/98 |

* cited by examiner

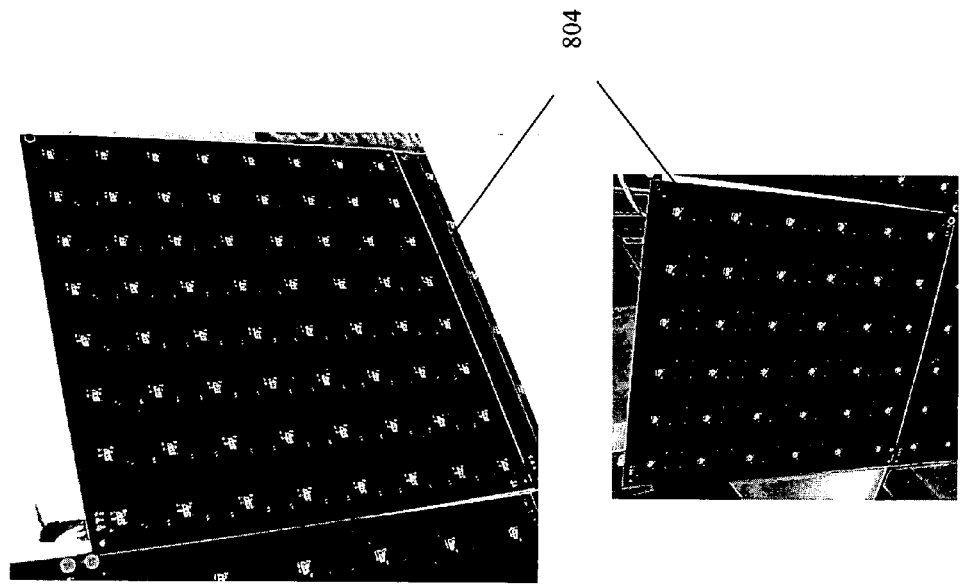
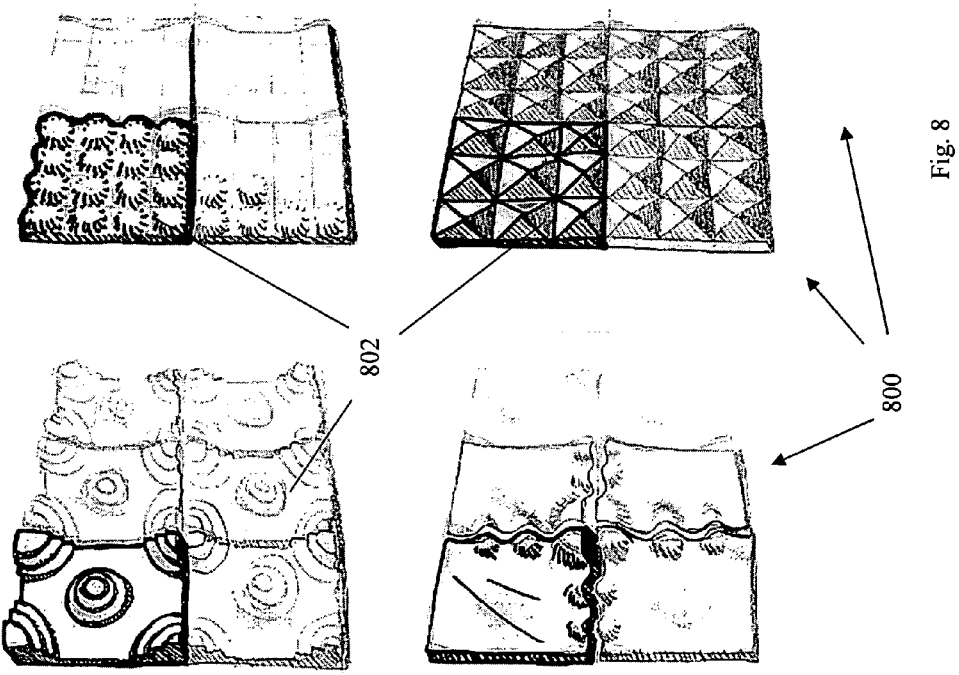
Fig. 8

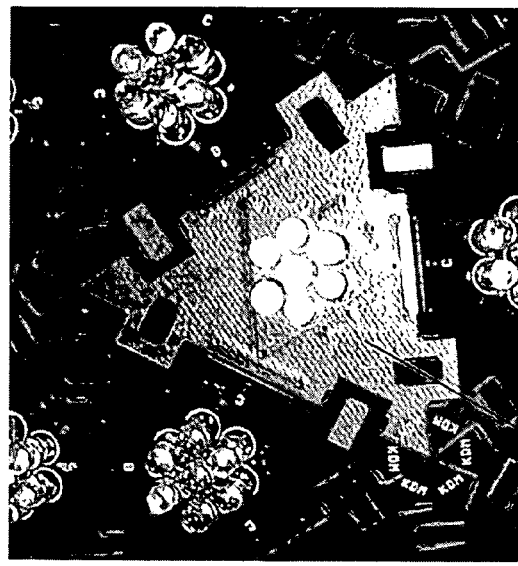
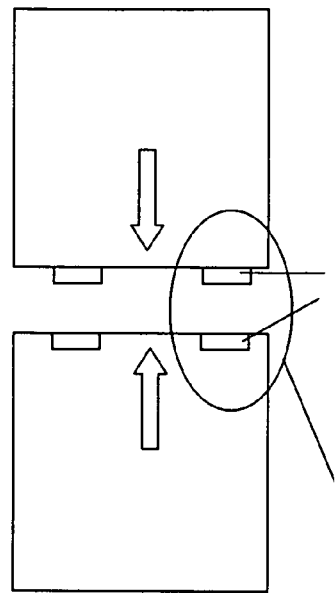
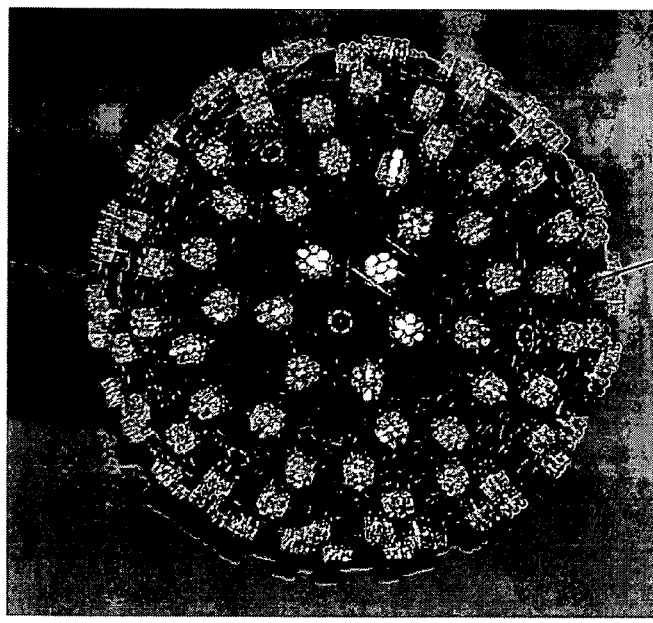
Fig. 22

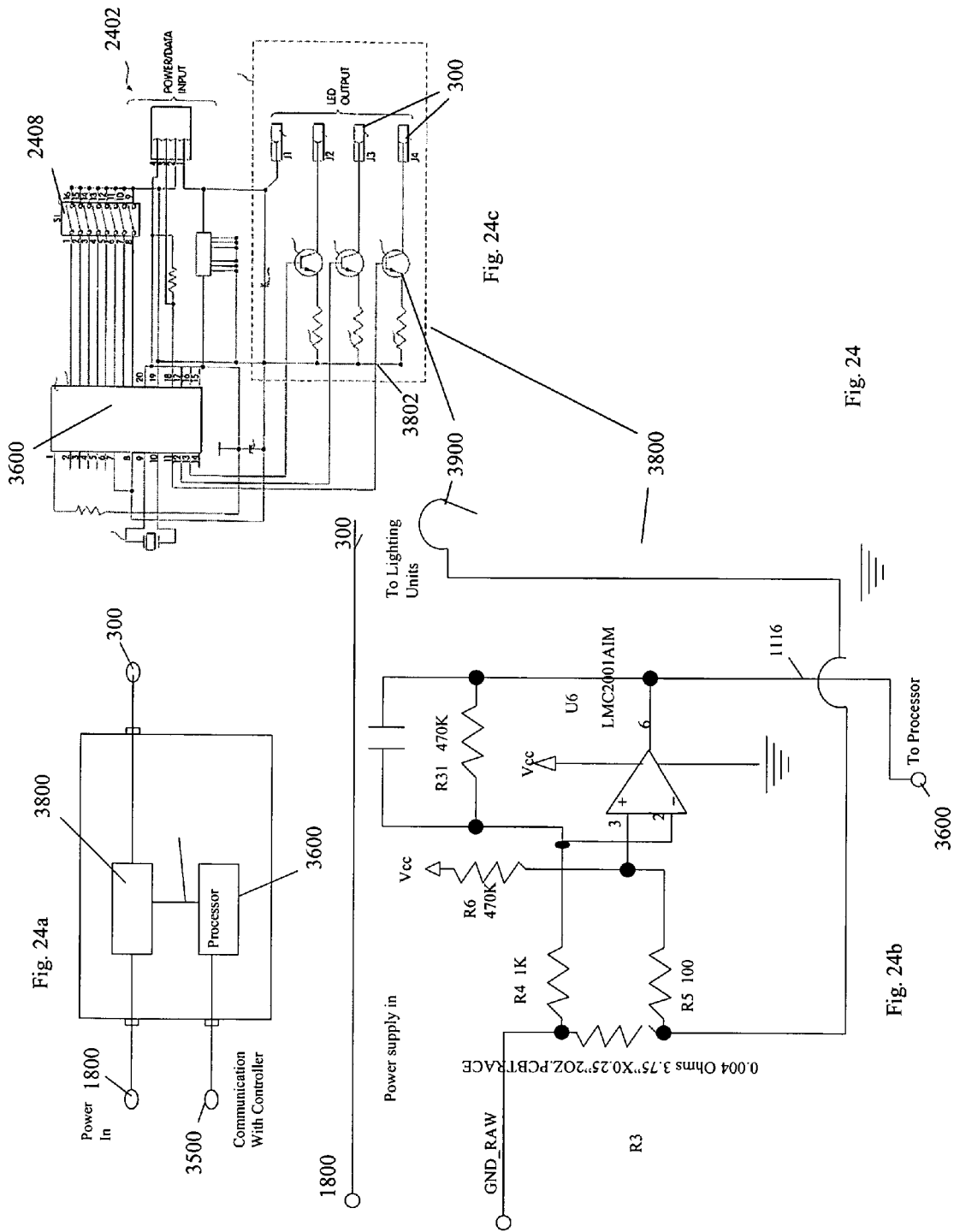

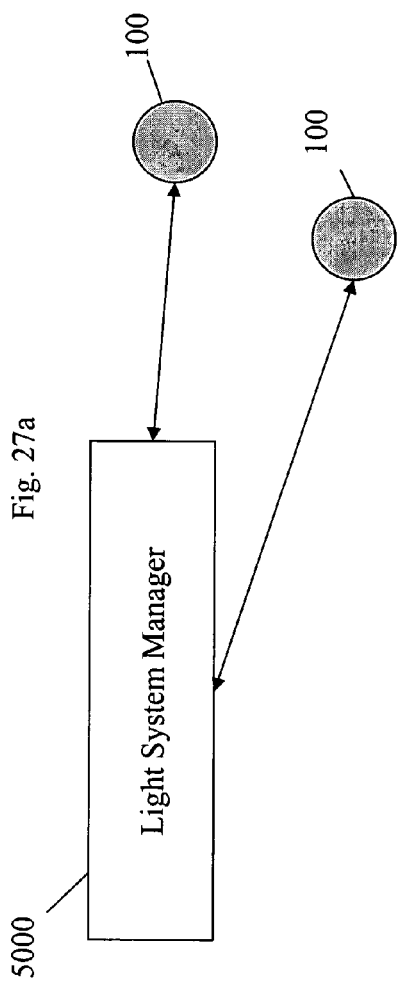
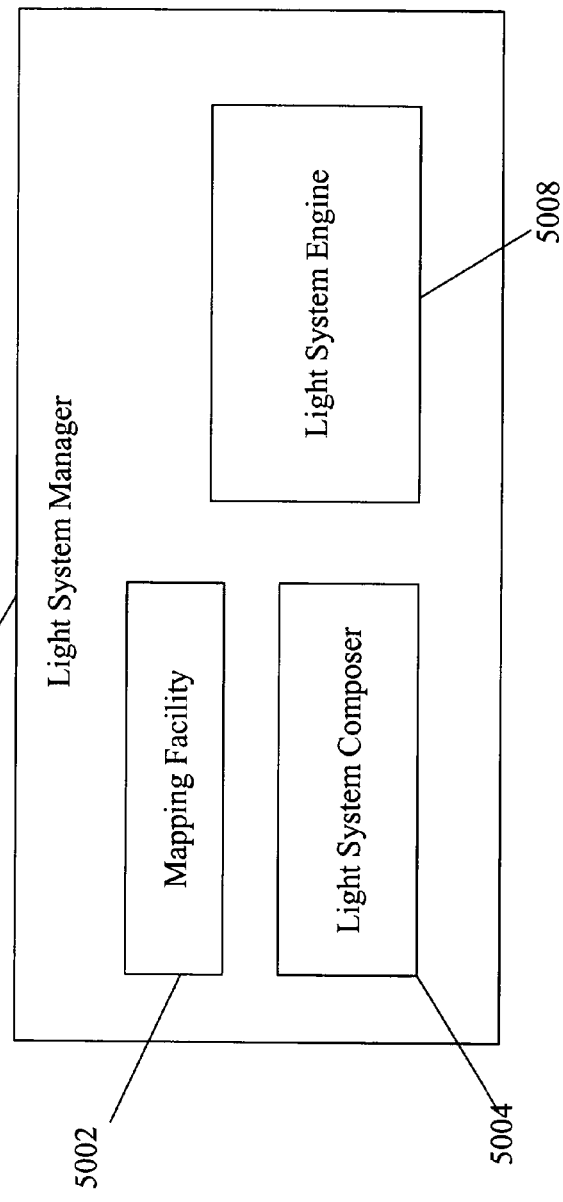
Fig. 27a
Fig. 27b

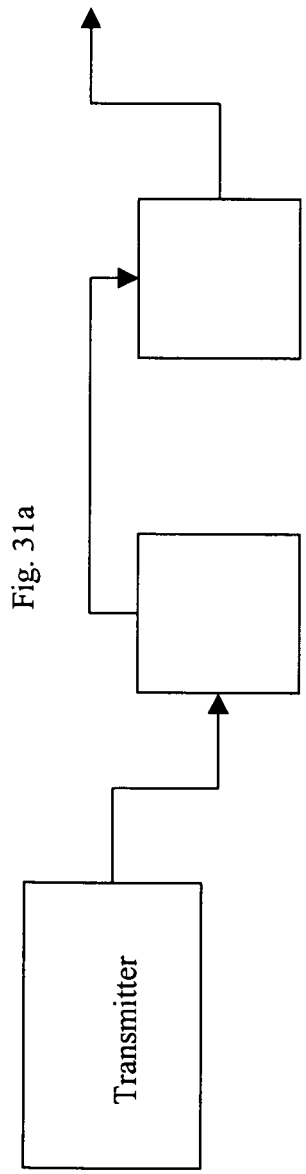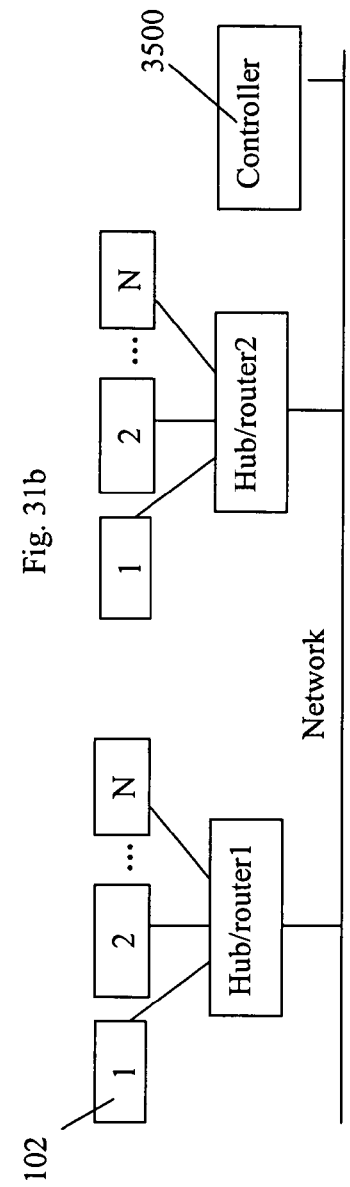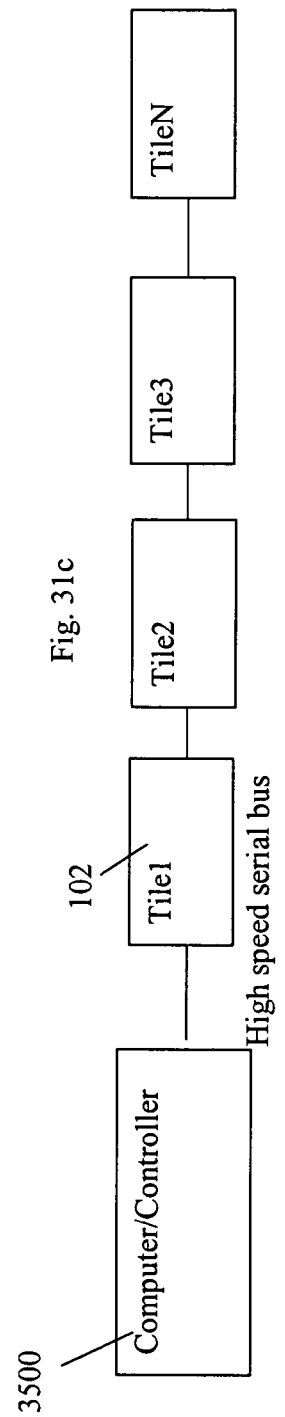

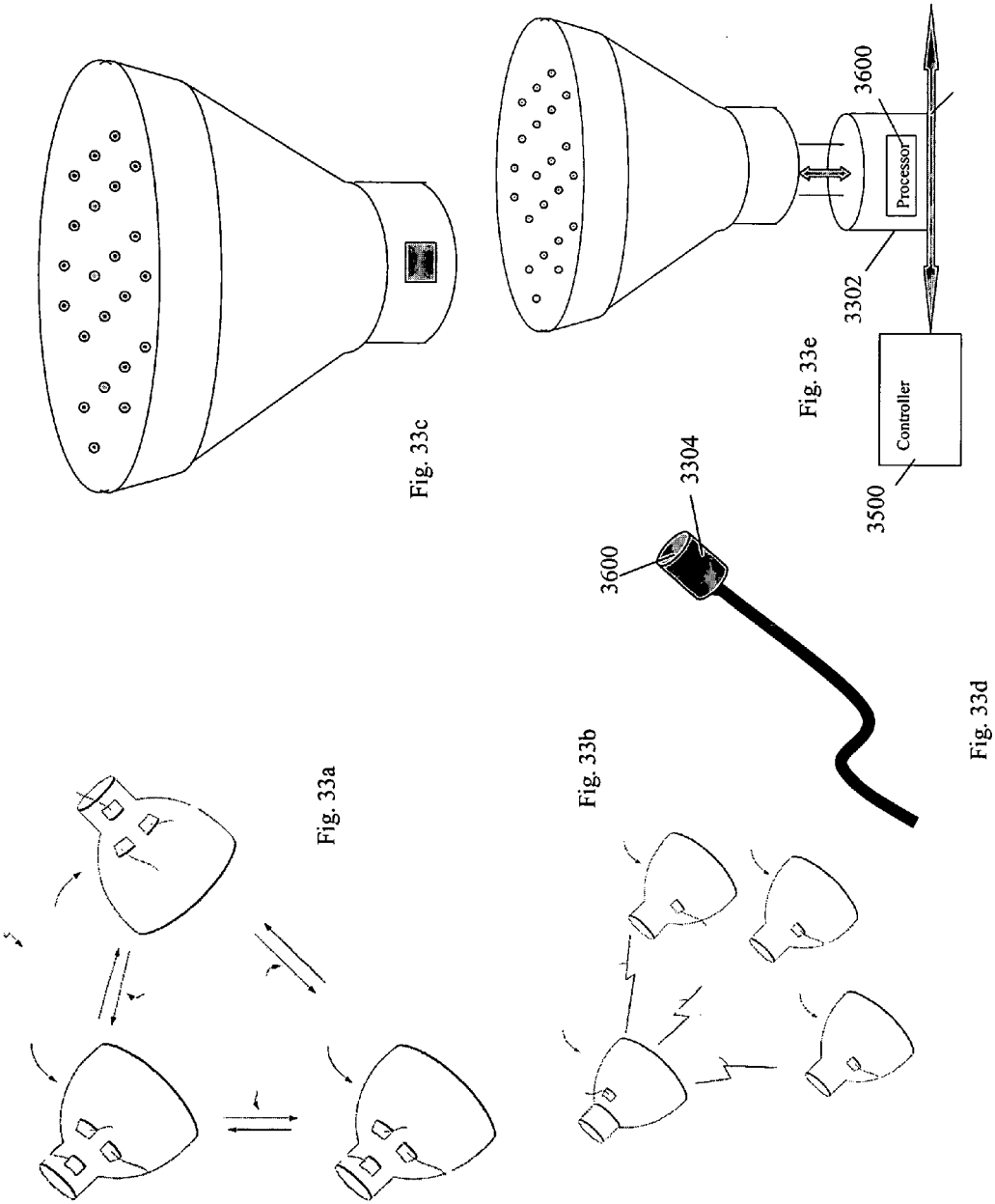

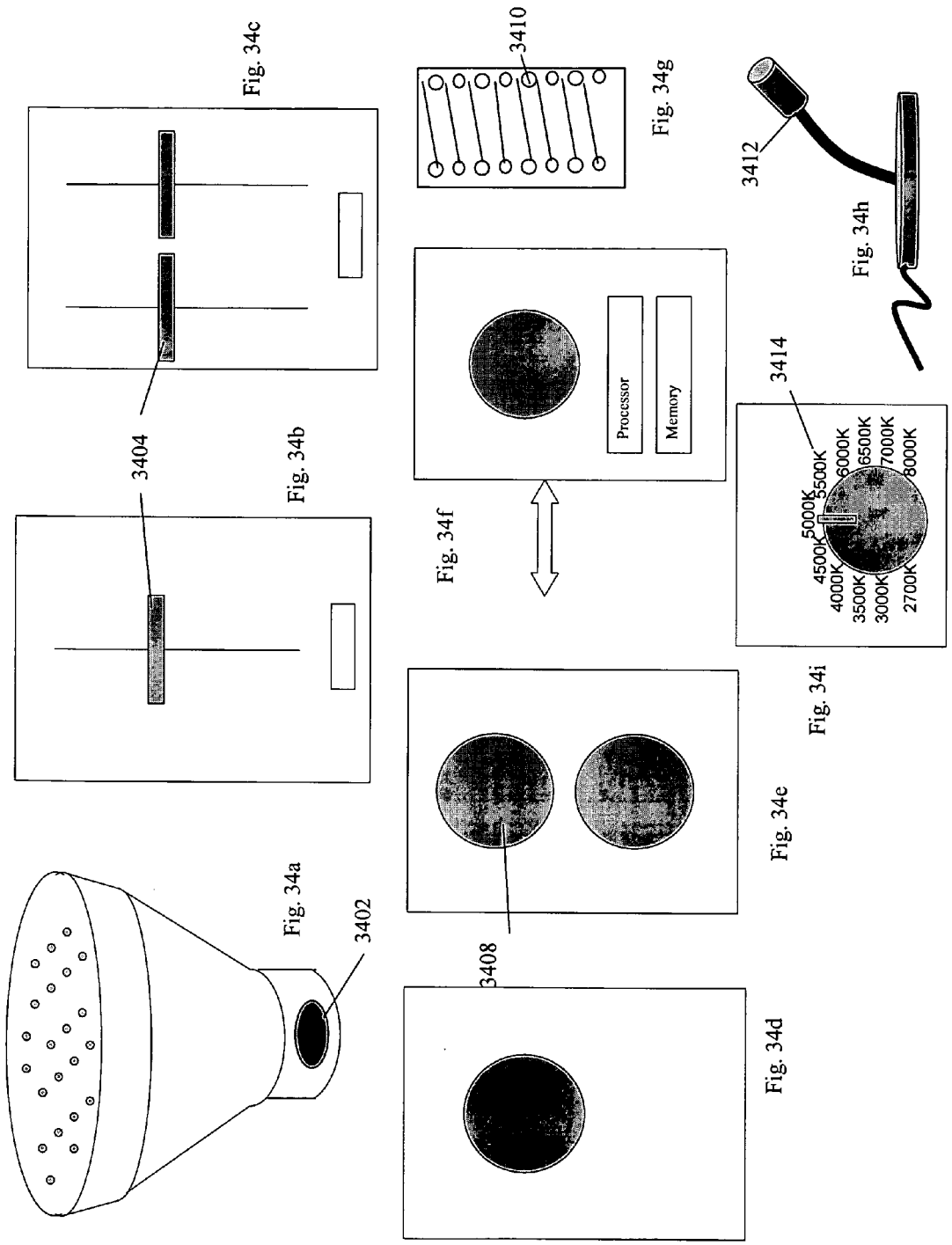

| Light System | Time | Position | Lit Position | Color Range | Intensity | Other Sys. | Position |
|---|---|---|---|---|---|---|---|
| LS001 | T1 | (1, 3, 7) | Poly001 | 0-16000 | 0-100 | | |
| LS001 | T2 | (1, 3, 7) | Poly001 | 0-16000 | | | |
| LS001 | T3 | (1, 3, 7) | Poly 002 | 0-16000 | | | |
| LS002 | T1 | (0,0,0) | Poly 003 | 0-16000 | | | |
| LS002 | T2 | (0,0,0) | Poly004 | 0-16000 | | | |
| LS002 | T3 | (0,0,0) | Poly 005 | | | | |
| | | | | | | | |
| | | | | | | | |
| | | | | | | | |
| LS00N | TN | | | | | | |

Fig. 37

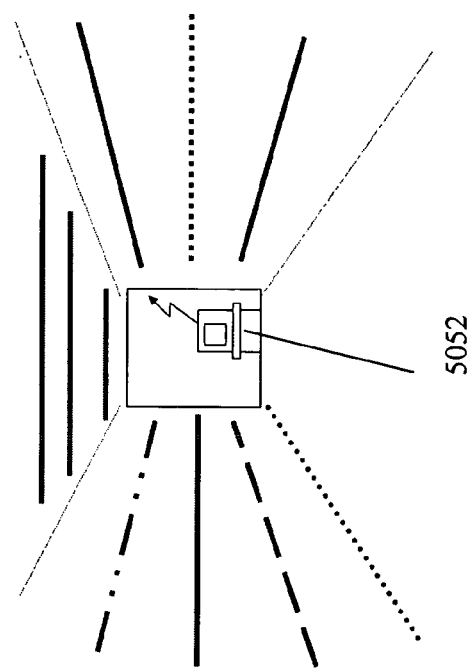
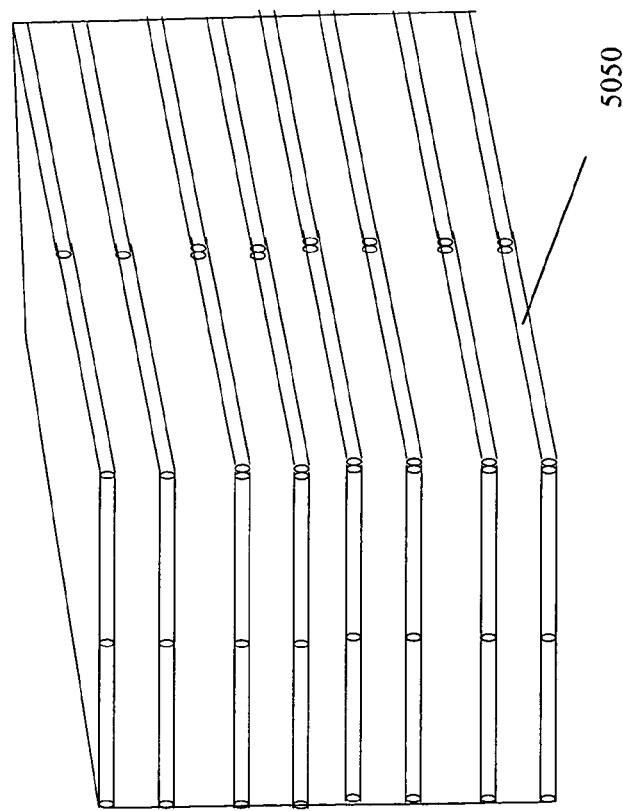
Fig. 50

LED PACKAGE METHODS AND SYSTEMS

CROSS-REFERENCES TO RELATED APPLICATIONS

The present application claims the benefit, under 35 U.S.C. §119(e), of the following U.S. provisional applications:

Ser. No. 60/586,939, filed Jul. 8, 2004, entitled "Integrated LED Systems and Methods;" and Ser. No. 60/588,090, filed Jul. 15, 2004, entitled "LED Package Methods and Systems."

Each of the foregoing applications is incorporated herein by reference.

BACKGROUND

LED packages have been developed that include an LED die and a submount that includes a diode, such as an ESD diode. However, current LED packages require manufacturers to develop and implement many separate electronic components in order to power the LED dies and to control the light coming from the LED dies. A need exists to simplify the challenges of powering and controlling LED packages.

Power supplies used in LED lighting systems have often been based on power supplies for conventional lighting systems or other electronic devices, leading to problems of inefficiency, lack of reliability and lack of longevity. Accordingly, a need exists for power supplies designed and optimized for LED lighting systems.

Incandescent lighting sources are a simple resistive load to the power network. Over the years, the increased acceptance and use of fluorescent and HID lamps has increased the use of electronics to drive loads and these devices, along with computers and appliances, have introduced some side effects due to the ballasts and power supplies they incorporate. The electrical current these newer systems draw is very different from resistive loads and introduces issues for electricity consumers and providers. These issues arise from the power supplies. Switching power supplies are small and efficient compared to the linear supplies used in the past. However, they introduce distortions of the input current. Switching supplies draw current in pulses and not in a smooth sinusoidal fashion. Thus the alternating voltage (typically a 50 or 60Hz sine wave in most power distribution systems) and current are often out of phase. This distortion causes problems with power distribution with the local grid and can introduce capacity issues in power distribution and local circuits.

For a simple resistive load the power factor is unity or 1.0. For switching supplies however the power factor can be as low as 0.6. Fixing low power factor is accomplished through the use of power factor correction (PFC). Good quality PFC can bring that ratio to 0.99 thus mitigating the problems associated with poor power factor.

Since LEDs and most electronics are low voltage systems, the use of power conversion is quite common. In many cases, there is an off-board power supply that is plugged into the wall and provides lower voltage AC or, more typically, DC power. Thus high voltage and low voltage systems are often separate. In most consumer electronics these power supply systems are integral to the device; that is, they plug directly into the wall. This is most practical for most electronics and eliminates the need for separate boxes for power supplies and electronics.

In most current LED systems, the off-board supply is used because it can supply energy to a multitude of fixtures and keep the system cost down. The integration of such power supplies into fixtures would have been prohibitive both in cost and physical space required as well as creating a thermal issue. However, in installations where the fixtures are located apart, the additional costs of cabling in addition to maintenance issues can outweigh the initial benefits of a distributed power system.

In general the impedance of the power grid tends to be low so that delivery of power is efficient. The impedance of the power supply, or any device that uses power, should not be non-linear otherwise it can generate harmonics on the power line and this is wasteful and undesirable. This also reduces power factor. A need exists for methods and systems for improving power factor for LED lighting systems.

SUMMARY

Methods and systems are provided herein for LED modules that include an LED die integrated in an LED package with a submount that includes an electronic component for controlling the light emitted by the LED die. The electronic component integrated in the submount may include drive hardware, a network interface, memory, a processor, a switch-mode power supply, a power facility, or another type of electronic component.

In one aspect, there is disclosed herein a light source including at least one LED die including an LED, and a package for the LED die, the package including a submount, wherein the submount incorporates an electronic component for controlling the LED, wherein the electronic component facilitates control of at least one of the intensity and the apparent intensity of the LED die.

In another aspect, there is disclosed herein is a method for providing a light source including providing at least one LED in an LED die, and packaging the LED die with a submount, wherein the submount incorporates an electronic component for controlling the LED, wherein the electronic component facilitates control of at least one of the intensity and the apparent intensity of the LED die.

In still another aspect, there is disclosed herein a lighting system including a plurality of light sources including at least one LED in an LED die, the LED die packaged with a submount, wherein the submount incorporates an electronic component for controlling the LED, wherein the electronic component facilitates control of at least one of the intensity and the apparent intensity of the LED die among at least three distinct levels of intensity.

The intensity or apparent intensity of the LED die may be controlled by the electronic component among at least three distinct levels of intensity.

In these various aspects, The LED package may include components selected from the group consisting of a an optical facility, a lens, an LED die mounted in a reflector cup, a silicone filling, a wire bond between the LED and the edge of the reflector cup, a submount, a diode in the submount, and a plurality of isolated leads for electrically connecting the LED die to a power source. The LED package may include an LED die mounted in a reflector cup and surrounded by an injection molding. The LED package may include an LED die and submount mounted in a reflector cup and surrounded by a plastic package. The LED package may be created by a mask. The LED package may have a substrate, wherein the substrate is selected from the group consisting of a metal core substrate, a ceramic substrate, a ceramic on metal substrate, an FR4 substrate, a sapphire substrate, an silicon on sapphire substrate, and a silicon carbide substrate.

In these various aspects, at one of the levels of intensity the LED die may be in an off condition. The package may include a reflector. The package may include an electro-static discharge protection diode.

In various aspects, the electronic component may be mounted on one or more submounts of the package. The electronic component may include a current regulator for allowing the module to take a 12V DC signal. The electronic component may include a circuit for taking a 12V AC signal directly. The electronic component may include at least one of a bridge rectifier, a capacitor, and a current regulator.

In various aspects, the LED package may include an optical facility.

In various aspects, the electronic component may include a circuit for taking an AC signal with voltage in a range from 100V to 240V. The electronic component may include a switch mode power supply and a current regulator. The electronic component may include a circuit. The electronic component may include a dimming circuit. The electronic component may be responsive to power-cycle events. The electronic component may include a data interface. The data interface may be configured to receive a signal selected from the group consisting of a DMX signal, a DALI signal, an Ethernet signal, a TCP/IP protocol signal, an HTTP protocol signal, an XML or other mark-up language instruction, a script, an 802.11or other wireless signal, a cellular or radio-frequency signal, an infrared signal, or a Bluetooth signal. The electronic component may include firmware. The firmware may include an XML parser. The firmware may include firmware for responding to a signal selected from the group consisting of a DMX signal, a DALI signal, an Ethernet signal, a TCP/IP protocol signal, an HTTP protocol signal, an 802.11 signal, a cellular telephony signal, a radio-frequency signal, an infrared signal, or a Bluetooth signal.

In various aspects, the electronic component may include an application specific integrated circuit. The application specific integrated circuit may respond to signals according to a serial addressing protocol. The electronic component may include a processor. The processor may control a signal by pulse-width-modulation. The processor may control a signal by pulse-amplitude-modulation. The processor may select between a pulse-width-modulation mode and a pulse-amplitude-modulation mode. The processor may provide calibration for the light source. The processor may respond to a sensor, such as in a sensor-feedback loop.

In various aspects, the electronic component may include a voltage regulator. The electronic component may include a power-factor-control circuit. The electronic component may include an inductive loop drive circuit. The electronic component may include a feed-forward drive circuit. The electronic component may respond to a combined power/data signal.

In various aspects, the electronic component may provide an address for the light source. The electronic component may be a signal source for a signal including at least one of a DMX signal, a DALI signal, an Ethernet signal, a TCP/IP protocol signal, an HTTP protocol signal, an 802.11 signal, a cellular telephony signal, a radio-frequency signal, an infrared signal, or a Bluetooth signal.

In various aspects, the electronic component may include a temperature sensor. The electronic component may include a timing facility. The electronic component may include a drive circuit adapted to receive an arbitrary voltage. The electronic component may include a microcontroller. The electronic component may include a drive circuit adapted to receive high voltage. The drive circuit may include a power-factor-corrected drive circuit.

In various aspects, the electronic component may include a data storage facility. The data storage facility may include memory. The data storage facility may include a lookup table for storing values for a control signal for the LED. The data storage facility may store programs for controlling the light source. The data storage facility may store programs for responding to control signals from a signal source. The data storage facility may store a program for controlling power to the LED die based on the anticipated requirements of the installation of the light source. The data storage facility may include an erasable programmable read-only memory.

In various aspects, the electronic component may include a photosensor. The electronic component may include a digital-to-analog converter. The electronic component may include an analog-to-digital converter. The electronic component may include a power facility. The electronic component may include a wireless control facility. The electronic component may include a bridge rectifier. The electronic component may include a boost converter. The electronic component may include a boost regulator. The component may include an analog dimming input. The electronic component may include a resistor for assisting in identification of the light source. The electronic component may include a temperature sensor and a facility for controlling the LED in response to a thermal condition.

In various aspects, the light sources described above may include a facility for connecting the light source to a conductive element. The conductive element may include a linear conductive element. The conductive element may include a rail.

The light source may be for a boat light. The light source may be for an MR-type fixture. The light source may be for a reading light. The LED die may include a high-power LED die. The LED die may include a 5 W or greater LED die. The light source may be for a camera flash. The light source may include an external resistor for adjusting a voltage input to the light source.

In various embodiments, the light source may include an optical facility including at least one of a lens, a filter, a diffuser, a reflector, a phosphorescent material, or a luminescent material. The optical facility may include at least one of a Bragg cell, a holographic film, a digital mirror, a spinning mirror, a light pipe, a color mixing system, or a microlens array.

In certain aspects, a light source includes at least one LED die including an LED, and a package for the LED die, the LED package including a submount, wherein the submount incorporates an electronic component for controlling the LED, wherein the electronic component facilitates control of at least one of the intensity and the apparent intensity of the LED die.

The LED package may include a thermal facility for cooling at least one of the LED die and the submount. The thermal facility may be selected from the group consisting of a Peltier effect device, a fluid cooling facility, a potting facility, a thermally conductive plate, a gap pad, a micro-machine, a MEMs device, and a fan.

The light source may further include an external electrical component for the package, wherein the external component is selected from the group consisting of a capacitor, a resistor, and an inductor. The external component may be a capacitor for energy storage and wherein the submount includes a dimmer-compatible circuit. The external component may be a resistor to set a voltage level of the input signal to the LED package. The external component may be a capacitor for bulk energy storage. The external component may be an inductor.

The light source may include a reflective cup, the reflective cup serving as an inductor for the LED package. At least one of the submount and the LED may be fabricated from a heat-tolerant material. The heat-tolerant material may be silicon carbide. The light source may include a memory facility such as an SRAM.

The electronic component may be a buck converter, a flyback converter, or a current regulator.

The LED package may be compression molded or plastic molded. The LED package may include a material such as a metal, a ceramic, an epoxy, a plastic, a glass, a polymer, and/or a compound.

The LED package may be used as an indicator. The indicator may indicate a sensed condition. The condition may include acceleration, pressure, temperature, time, humidity, light, a fault condition, proximity, and/or a chemical condition. The indicator may display a state of a device, such as a sensor.

The electronic component may include a MEMS device. The MEMS device may include a pressure transducer, an active cooling device, a chemical detector, a gyro, an accelerometer, a timer, and/or an oscillator. The electronic component may include a Peltier effect device.

The LED package may be used as a component for a display. The display may include a graphics display, a monitor, a video display, and an animation display. The LED package may include an input/output facility. The light source may include a photovoltaic energy source.

The LED package may be used in a road barrier. The LED package may be used in a cellular phone. The LED package may operate directly from the power source for the cell phone. The LED package may be used in an automobile, where the LED package may operate directly on an electrical bus for the automobile or on power from a battery, such as a 1.5 Volt battery. The LED package may be used in connection with a gaming device, an elevator, an automation system for a factory, and/or a traffic signal. The LED package may be used in a photographic flash.

It should be appreciated that all combinations of the foregoing concepts and additional concepts discussed in greater detail below are contemplated as being part of the inventive subject matter disclosed herein. In particular, all combinations of claimed subject matter appearing at the end of this disclosure are contemplated as being part of the inventive subject matter disclosed herein.

Provided herein are methods and systems for providing a high power ASIC for integrating power, control and communications specifically for LED systems.

Provided herein are methods and systems for providing a power factor-corrected line voltage supply to reduce utility issues with low power factor systems causing wasted energy.

Provided herein are methods and systems for providing a light module/puck that integrates ASIC, power supply, optics and LEDs on a unified and universal module.

Provided herein are methods and systems for providing an intelligent socket to mount a light module, providing thermal, mechanical and electrical connections.

The following patents and patent applications are hereby incorporated herein by reference:

U.S. Pat. No. 6,016,038, issued Jan. 18, 2000, entitled "Multicolored LED Lighting Method and Apparatus;"

U.S. Pat. No. 6,211,626, issued Apr. 3, 2001 to Lys et al, entitled "Illumination Components,"

U.S. Pat. No. 6,608,453, issued Aug. 19, 2003, entitled "Methods and Apparatus for Controlling Devices in a Networked Lighting System;"

U.S. Pat. No. 6,548,967, issued Apr. 15, 2003, entitled "Universal Lighting Network Methods and Systems;"

U.S. patent application Ser. No. 09/886,958, filed Jun. 21, 2001, entitled Method and Apparatus for Controlling a Lighting System in Response to an Audio Input;"

U.S. patent application Ser. No. 10/078,221, filed Feb. 19, 2002, entitled "Systems and Methods for Programming Illumination Devices;"

U.S. patent application Ser. No. 09/344,699, filed Jun. 25, 1999, entitled "Method for Software Driven Generation of Multiple Simultaneous High Speed Pulse Width Modulated Signals;"

U.S. patent application Ser. No. 09/805,368, filed Mar. 13, 2001, entitled "Light-Emitting Diode Based Products;"

U.S. patent application Ser. No. 09/716,819, filed Nov. 20, 2000, entitled "Systems and Methods for Generating and Modulating Illumination Conditions;"

U.S. patent application Ser. No. 09/675,419, filed Sep. 29, 2000, entitled "Systems and Methods for Calibrating Light Output by Light-Emitting Diodes;"

U.S. patent application Ser. No. 09/870,418, filed May 30, 2001, entitled "A Method and Apparatus for Authoring and Playing Back Lighting Sequences;"

U.S. patent application Ser. No. 10/045,604, filed Mar. 27, 2003, entitled "Systems and Methods for Digital Entertainment;"

U.S. patent application Ser. No. 10/045,629, filed Oct. 25, 2001, entitled "Methods and Apparatus for Controlling Illumination;"

U.S. patent application Ser. No. 09/989,677, filed Nov. 20, 2001, entitled "Information Systems;"

U.S. patent application Ser. No. 10/158,579, filed May 30, 2002, entitled "Methods and Apparatus for Controlling Devices in a Networked Lighting System;"

U.S. patent application Ser. No. 10/163,085, filed Jun. 5, 2002, entitled "Systems and Methods for Controlling Programmable Lighting Systems;"

U.S. patent application Ser. No. 10/174,499, filed Jun. 17, 2002, entitled "Systems and Methods for Controlling Illumination Sources;"

U.S. patent application Ser. No. 10/245,788, filed Sep. 17, 2002, entitled "Methods and Apparatus for Generating and Modulating White Light Illumination Conditions;"

U.S. patent application Ser. No. 10/245,786, filed Sep. 17, 2002, entitled "Light Emitting Diode Based Products;"

U.S. patent application Ser. No. 10/325,635, filed Dec. 19, 2002, entitled "Controlled Lighting Methods and Apparatus;"

U.S. patent application Ser. No. 10/360,594, filed Feb. 6, 2003, entitled "Controlled Lighting Methods and Apparatus;"

U.S. patent application Ser. No. 10/435,687, filed May 9, 2003, entitled "Methods and Apparatus for Providing Power to Lighting Devices;"

U.S. patent application Ser. No. 10/828,933, filed Apr. 21, 2004, entitled "Tile Lighting Methods and Systems;"

U.S. patent application Ser. No. 10/839,765, filed May 5, 2004, entitled "Lighting Methods and Systems;"

U.S. patent application Ser. No. 11/010,840, filed Dec. 13, 2004, entitled "Thermal Management Methods and Apparatus for Lighting Devices;"

U.S. patent application Ser. No. 11/079,904, filed Mar. 14, 2005, entitled "LED Power Control Methods and Apparatus;" and U.S. patent application Ser. No. 11/081,020, filed on Mar. 15, 2005, entitled "Methods and Systems for Providing Lighting Systems."

BRIEF DESCRIPTION OF THE FIGURES

The foregoing and other objects and advantages of the invention will be appreciated more fully from the following further description thereof, with reference to the accompanying drawings, wherein:

FIG. 8 depicts a tile light housing for a lighting system.

FIG. 22 depicts additional mechanical interfaces for a lighting system.

FIG. 24 depicts drive hardware for a lighting system.

FIG. 27 depicts a configuration for a light system manager.

FIG. 31 depicts network topologies for lighting systems.

FIG. 33 depicts physical data interfaces for lighting systems.

FIG. 34 depicts user interfaces for lighting systems.

FIG. 37 depicts a configuration file for mapping locations of lighting systems.

FIG. 50 depicts additional effects.

DETAILED DESCRIPTION

Figure 1:
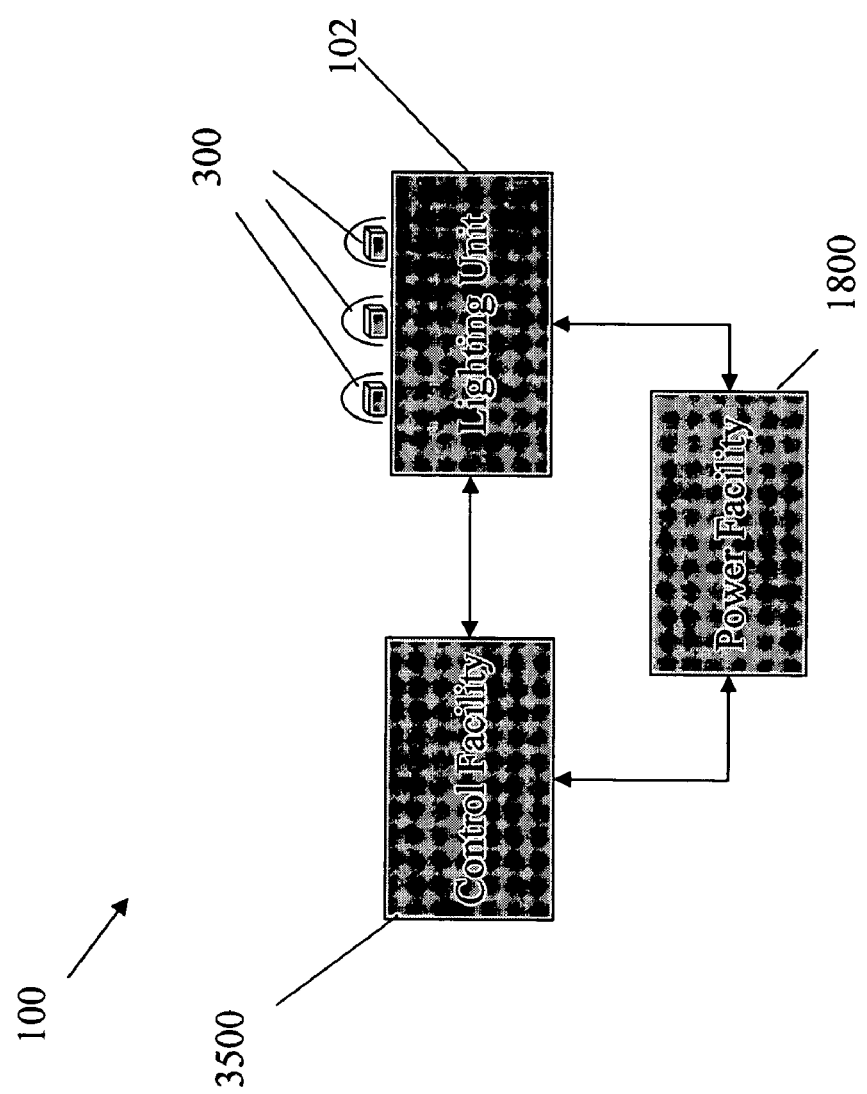
FIG. 1 depicts a configuration for a controlled lighting system.

Referring to FIG. 1, in a lighting system 100 a lighting unit 102 is controlled by a control facility 3500. In embodiments, the control facility 3500 controls the intensity, color, saturation, color temperature, on-off state, brightness, or other feature of light that is produced by the lighting unit 102. The lighting unit 102 can draw power from a power facility 1800. The lighting unit 102 can include a light source 300, which in embodiments is a solid-state light source, such as a semiconductor-based light source, such as light emitting diode, or LED.

Figure 2:
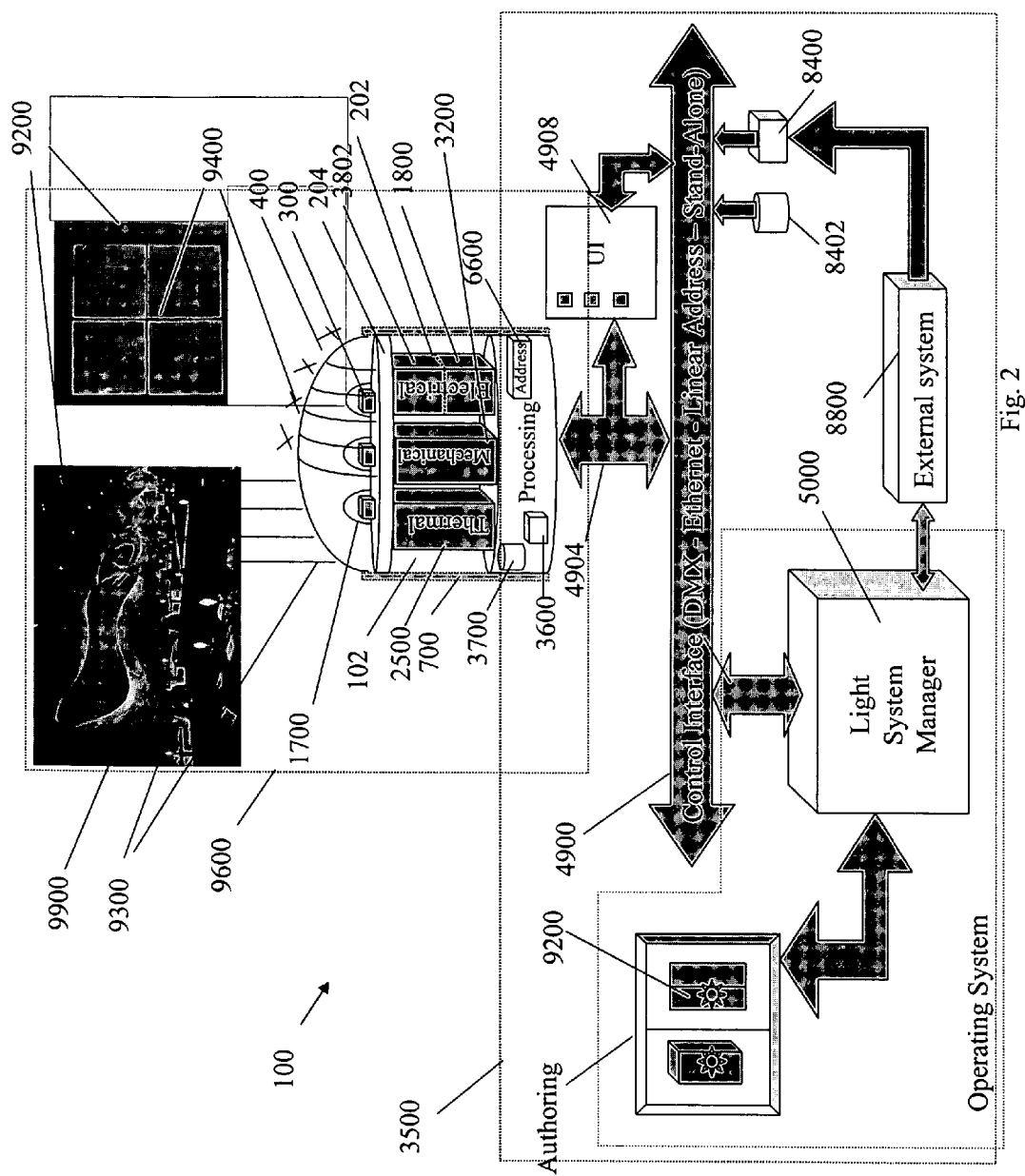
FIG. 2 is a schematic diagram with elements for a lighting system.

Referring to FIG. 2, the system 100 can be a solid-state lighting system and can include the lighting unit 102 as well as a wide variety of optional control facilities 3500.

In embodiments, the system 100 may include an electrical facility 202 for powering and controlling electrical input to the light sources 300, which may include drive hardware 3802, such as circuits and similar elements, and the power facility 1800.

In embodiments the system can include a mechanical interface 3200 that allows the lighting unit 102 to mechanically connect to other portions of the system 100, or to external components, products, lighting units, housings, systems, hardware, or other items.

The lighting unit 102 may have a primary optical facility 1700, such as a lens, mirror, or other optical facility for shaping beams of light that exit the light source, such as photons exiting the semiconductor in an LED package The system 100 may include an optional secondary optical facility 400, which may diffuse, spread, focus, filter, diffract, reflect, guide or otherwise affect light coming from a light source 300. The secondary optical facility 400 may include one or many elements.

In embodiments, the light sources 300 may be disposed on a support structure, such as a board 204. The board 204 may be a circuit board or similar facility suitable for holding light sources 300 as well as electrical components, such as components used in the electrical facility 202.

In embodiments the system 100 may include a thermal facility 2500, such as a heat-conductive plate, metal plate, gap pad, liquid heat-conducting material, potting facility, fan, vent, or other facility for removing heat from the light sources 300.

The system 100 may optionally include a housing 800, which in embodiments may hold the board 204, the electrical facility 202, the mechanical interface 3200, and the thermal facility 2500. In some embodiments, no housing 800 is present.

In embodiments the system 100 is a standalone system with an on-board control facility 3500. The system 100 can include a processor 3600 for processing data to accept control instructions and to control the drive hardware 3802.

In embodiments the system 100 can respond to control of a user interface 4908, which may provide control directly to the lighting unit 102, such as through a switch, dial, button, dipswitch, slide mechanism, or similar facility or may provide control through another facility, such as a network interface 4902, a light system manager 5000, or other facility.

The system 100 can include a data storage facility 3700, such as memory. In a standalone embodiment the data storage facility 3700 may be memory, such as random access memory. In other embodiments the data storage facility 3700 may include any other facility for storing and retrieving data.

The system 100 can produce effects 9200, such as illumination effects 9300 that illuminate a subject 9900 and direct view effects 9400 where the viewer is intended to view the light sources 300 or the secondary optical facility 400 directly, in contrast to viewing the illumination produced by the light sources 300, as in illumination effects 9300. Effects can be static and dynamic, including changes in color, color-temperature, intensity, hue, saturation and other features of the light produced by the light sources 300. Effects from lighting units 102 can be coordinated with effects from other systems, including other lighting units 102.

The system 100 can be disposed in a wide variety of environments 9600, where effects 9200 interact with aspects of the environments 9600, such as subjects 9900, objects, features, materials, systems, colors or other characteristics of the environments. Environments 9600 can include interior and exterior environments, architectural and entertainment environments, underwater environments, commercial environment, industrial environments, recreational environments, home environments, transportation environments and many others.

Subjects 9900 can include a wide range of subjects 9900, ranging from objects such as walls, floors and ceilings to alcoves, pools, spas, fountains, curtains, people, signs, logos, buildings, rooms, objects of art and photographic subjects, among many others.

While embodiments of a control facility 3500 may be as simple as a single processor 3600, data storage facility 3700 and drive hardware 3802, in other embodiments more complex control facilities 3500 are provided. Control facilities may include more complex drive facilities 3800, including various forms of drive hardware 3802, such as switches, current sinks, voltage regulators, and complex circuits, as well as various methods of driving 4300, including modulation techniques such as pulse-width-modulation, pulse-amplitude-modulation, combined modulation techniques, table-based modulation techniques, analog modulation techniques, and constant current techniques. In embodiments a control facility 3500 may include a combined power/data protocol 4800 for controlling light sources 300 in response to data delivered over power lines.

A control facility 3500 may include a control interface 4900, which may include a physical interface 4904 for delivering data to the lighting unit 102. The control interface 4900 may also include a computer facility, such as a light system manager 5000 for managing the delivery of control signals, such as for complex shows and effects 9200 to lighting units 102, including large numbers of lighting units 102 deployed in complex geometric configurations over large distances.

The control interface 4900 may include a network interface 4902, such as for handling network signals according to any desired network protocol, such as DMX, Ethernet, TCP/IP, DALI, 802.11 and other wireless protocols, and linear addressing protocols, among many others. In embodiments the network interface 4902 may support multiple protocols for the same lighting unit 102.

In embodiments involving complex control, the physical data interface 4904 may include suitable hardware for handling data transmissions, such as USB ports, serial ports, Ethernet facilities, wires, routers, switches, hubs, access points, buses, multi-function ports, intelligent sockets, intelligent cables, flash and USB memory devices, file players, and other facilities for handling data transfers.

In embodiments the control facility 3500 may include an addressing facility 6600, such as for providing an identifier or address to one or more lighting units 102. Many kinds of addressing facility 6600 may be used, including facilities for providing network addresses, dipswitches, bar codes, sensors, cameras, and many others.

In embodiments the control facility 3500 may include an authoring facility 7400 for authoring effects 9200, including complex shows and static and dynamic effects. The authoring facility 7400 may be associated with the light system manager 5000, such as to facilitate delivery of control signals for complex shows and effects over a network interface 4900 to one or more lighting units 102. The authoring facility 7400 may include a geometric authoring facility, an interface for designing light shows, an object-oriented authoring facility, an animation facility, or any of a variety of other facilities for authoring shows and effects.

In embodiments the control facility 3500 may take input from a signal source 8400, such as a sensor 8402, an information source, a light system manager 5000, a user interface 4908, a network interface 4900, a physical data interface 4904, an external system 8800, or any other source capable of producing a signal.

In embodiments the control facility 3500 may respond to an external system 8800. The external system 8800 may be a computer system, an automation system, a security system, an entertainment system, an audio system, a video system, a personal computer, a laptop computer, a handheld computer, or any of a wide variety of other systems that are capable of generating control signals.

Figure 3:
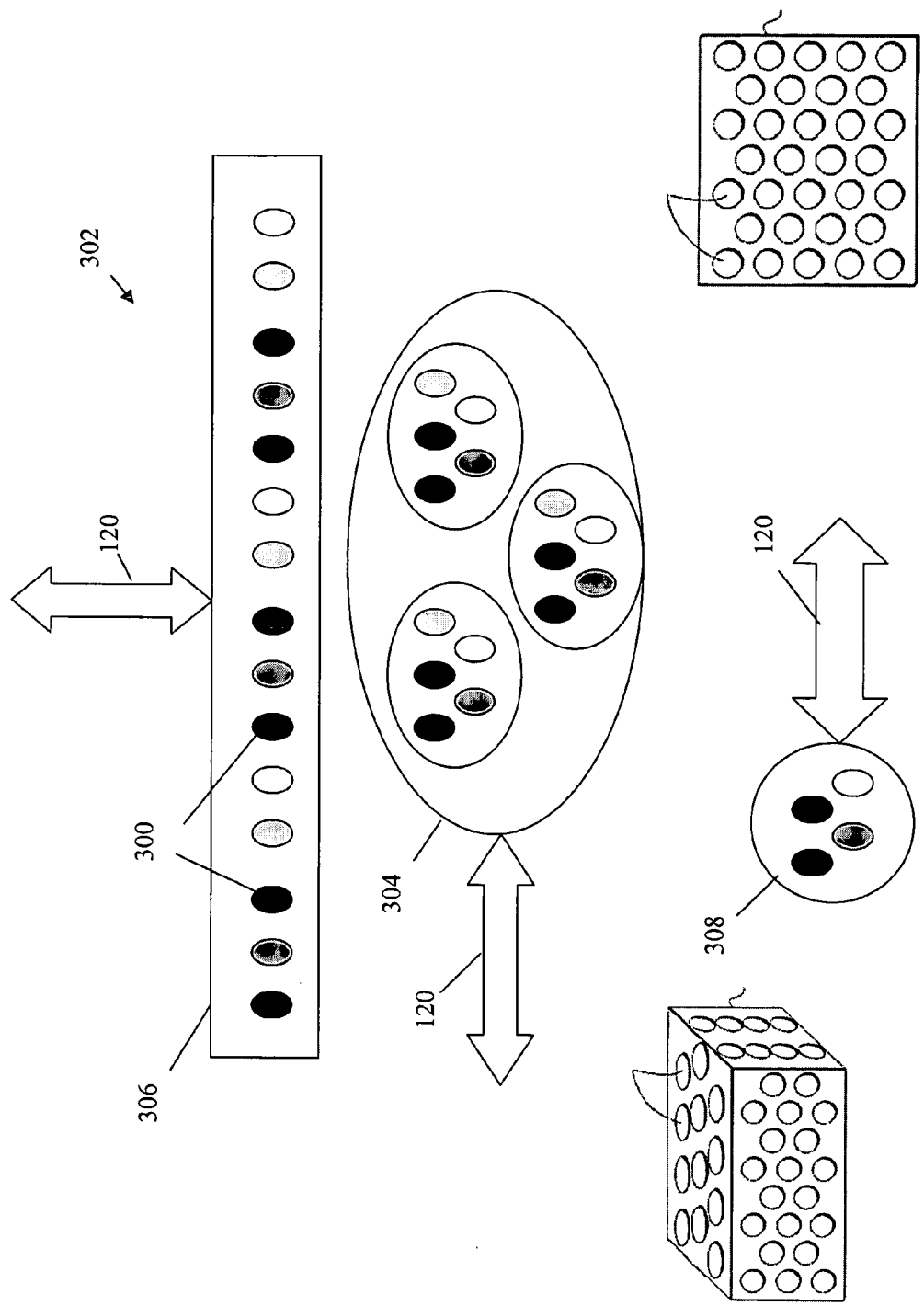
FIG. 3 depicts configurations of light sources that can be used in a lighting system.

Referring to FIG. 3, the lighting unit 102 may be any kind of lighting unit 102 that is capable of responding to control, but in embodiments the lighting unit 102 includes a light source 300 that is a solid-state light source, such as a semiconductor-based light source, such as a light emitting diode, or LED. Lighting units 102 can include LEDs that produce a single color or wavelength of light, or LEDs that produce different colors or wavelengths, including red, green, blue, white, orange, amber, ultraviolet, infrared, purple or any other wavelength of light. Lighting units 102 can include other light sources, such as organic LEDS, or OLEDs, light emitting polymers, crystallo-luminescent lighting units, lighting units that employ phosphors, luminescent polymers and other sources. In other embodiments, lighting units 102 may include incandescent sources, halogen sources, metal halide sources, fluorescent sources, compact fluorescent sources and others.

Referring still to FIG. 3, the sources 300 can be point sources or can be arranged in many different configurations 302, such as a linear configuration 306, a circular configuration 308, an oval configuration 304, a curvilinear configuration, or any other geometric configuration, including two-dimensional and three-dimensional configurations. The sources 300 can also be mixed, including sources 300 of varying wavelength, intensity, power, quality, light output, efficiency, efficacy or other characteristics. In embodiments sources 300 for different lighting units 102 are consistently mixed to provide consistent light output for different lighting units 102. In embodiments the sources are mixed 300 to allow light of different colors or color temperatures, including color temperatures of white. Various mixtures of sources 300 can produce substantially white light, such as mixtures of red, green and blue LEDs, single white sources 300, two white sources of varying characteristics, three white sources of varying characteristics, or four or more white sources of varying characteristics. One or more white source can be mixed with, for example, an amber or red source to provide a warm white light or with a blue source to produce a cool white light.

Sources 300 may be constructed and arranged to produce a wide range of variable color radiation. For example, the source 300 may be particularly arranged such that the processor-controlled variable intensity light generated by two or more of the light sources combines to produce a mixed colored light (including essentially white light having a variety of color temperatures). In particular, the color (or color temperature) of the mixed colored light may be varied by varying one or more of the respective intensities of the light sources or the apparent intensities, such as using a duty cycle in a pulse width modulation technique. Combinations of LEDs with other mechanisms that affect light characteristics, such as phosphors, are also encompassed herein.

Any combination of LED colors can produce a gamut of colors, whether the LEDs are red, green, blue, amber, white, orange, UV, or other colors. The various embodiments described throughout this specification encompass all possible combinations of LEDs in lighting units 102, so that light of varying color, intensity, saturation and color temperature can be produced on demand under control of a control facility 3500.

Although mixtures of red, green and blue have been proposed for light due to their ability to create a wide gamut of additively mixed colors, the general color quality or color rendering capability of such systems are not ideal for all applications. This is primarily due to the narrow bandwidth of current red, green and blue emitters. However, wider band sources do make possible good color rendering, as measured, for example, by the standard CRI index. In some cases this may require LED spectral outputs that are not currently available. However, it is known that wider-band sources of light will become available, and such wider-band sources are encompassed as sources for lighting units 102 described herein.

Additionally, the addition of white LEDs (typically produced through a blue or UV LED plus a phosphor mechanism) does give a 'better' white, but it still can be limiting in the color temperature that is controllable or selectable from such sources.

The addition of white to a red, green and blue mixture may not increase the gamut of available colors, but it can add a broader-band source to the mixture. The addition of an amber source to this mixture can improve the color still further by 'filling in' the gamut as well.

Combinations of light sources 300 can help fill in the visible spectrum to faithfully reproduce desirable spectrums of lights. These include broad daylight equivalents or more discrete waveforms corresponding to other light sources or desirable light properties. Desirable properties include the ability to remove pieces of the spectrum for reasons that may include environments where certain wavelengths are absorbed or attenuated. Water, for example tends to absorb and attenuate most non-blue and non-green colors of light, so underwater applications may benefit from lights that combine blue and green sources 300.

Amber and white light sources can offer a color temperature selectable white source, wherein the color temperature of generated light can be selected along the black body curve by a line joining the chromaticity coordinates of the two sources. The color temperature selection is useful for specifying particular color temperature values for the lighting source.

Orange is another color whose spectral properties in combination with a white LED-based light source can be used to provide a controllable color temperature light from a lighting unit 102.

As used herein, "Color Kinetics" means Color Kinetics Incorporated a Delaware corporation with headquarters in Boston, Mass.

As used herein for purposes of the present disclosure, the term "LED" should be understood to include any light emitting diode or other type of carrier injection/junction-based system that is capable of generating radiation in response to an electric signal. Thus, the term LED includes, but is not limited to, various semiconductor-based structures that emit light in response to current, light emitting polymers, light-emitting strips, electro-luminescent strips, and the like.

In particular, the term LED refers to light emitting diodes of all types (including semi-conductor and organic light emitting diodes) that may be configured to generate radiation in one or more of the infrared spectrum, ultraviolet spectrum, and various portions of the visible spectrum (generally including radiation wavelengths from approximately 400 nanometers to approximately 700 nanometers). Some examples of LEDs include, but are not limited to, various types of infrared LEDs, ultraviolet LEDs, red LEDs, blue LEDs, green LEDs, yellow LEDs, amber LEDs, orange LEDs, and white LEDs (discussed further below). It also should be appreciated that LEDs may be configured to generate radiation having various bandwidths for a given spectrum (e.g., narrow bandwidth, broad bandwidth).

For example, one implementation of an LED configured to generate essentially white light (e.g., a white LED) may include a number of dies which respectively emit different spectrums of luminescence that, in combination, mix to form essentially white light. In another implementation, a white light LED may be associated with a phosphor material that converts luminescence having a first spectrum to a different second spectrum. In one example of this implementation, luminescence having a relatively short wavelength and narrow bandwidth spectrum "pumps" the phosphor material, which in turn radiates longer wavelength radiation having a somewhat broader spectrum.

It should also be understood that the term LED does not limit the physical and/or electrical package type of an LED. For example, as discussed above, an LED may refer to a single light emitting device having multiple dies that are configured to respectively emit different spectrums of radiation (e.g., that may or may not be individually controllable). Also, an LED may be associated with a phosphor that is considered as an integral part of the LED (e.g., some types of white LEDs). In general, the term LED may refer to packaged LEDs, non-packaged LEDs, surface mount LEDs, chip-on-board LEDs, radial package LEDs, power package LEDs, LEDs including some type of encasement and/or optical element (e.g., a diffusing lens), etc.

The term "light source" should be understood to refer to any one or more of a variety of radiation sources, including, but not limited to, LED-based sources as defined above, incandescent sources (e.g., filament lamps, halogen lamps), fluorescent sources, phosphorescent sources, high-intensity discharge sources (e.g., sodium vapor, mercury vapor, and metal halide lamps), lasers, other types of luminescent sources, electro-luminescent sources, pyro-luminescent sources (e.g., flames), candle-luminescent sources (e.g., gas mantles, carbon arc radiation sources), photo-luminescent sources (e.g., gaseous discharge sources), cathode luminescent sources using electronic satiation, galvano-luminescent sources, crystallo-luminescent sources, kine-luminescent sources, thermo-luminescent sources, triboluminescent sources, sonoluminescent sources, radioluminescent sources, and luminescent polymers.

A given light source may be configured to generate electromagnetic radiation within the visible spectrum, outside the visible spectrum, or a combination of both. Hence, the terms "light" and "radiation" are used interchangeably herein. Additionally, a light source may include as an integral component one or more filters (e.g., color filters), lenses, or other optical components. Also, it should be understood that light sources may be configured for a variety of applications, including, but not limited to, indication and/or illumination. An "illumination source" is a light source that is particularly configured to generate radiation having a sufficient intensity to effectively illuminate an interior or exterior space.

The term "spectrum" should be understood to refer to any one or more frequencies (or wavelengths) of radiation produced by one or more light sources. Accordingly, the term "spectrum" refers to frequencies (or wavelengths) not only in the visible range, but also frequencies (or wavelengths) in the infrared, ultraviolet, and other areas of the overall electromagnetic spectrum. Also, a given spectrum may have a relatively narrow bandwidth (essentially few frequency or wavelength components) or a relatively wide bandwidth (several frequency or wavelength components having various relative strengths). It should also be appreciated that a given spectrum may be the result of a mixing of two or more other spectrums (e.g., mixing radiation respectively emitted from multiple light sources).

For purposes of this disclosure, the term "color" is used interchangeably with the term "spectrum." However, the term "color" generally is used to refer primarily to a property of radiation that is perceivable by an observer (although this usage is not intended to limit the scope of this term). Accordingly, the terms "different colors" implicitly refer to different spectrums having different wavelength components and/or bandwidths. It also should be appreciated that the term "color" may be used in connection with both white and non-white light.

The term "color temperature" generally is used herein in connection with white light, although this usage is not intended to limit the scope of this term. Color temperature essentially refers to a particular color content or shade (e.g., reddish, bluish) of white light. The color temperature of a given radiation sample conventionally is characterized according to the temperature in degrees Kelvin (K) of a black body radiator that radiates essentially the same spectrum as the radiation sample in question. The color temperature of white light generally falls within a range of from approximately 700 degrees K (generally considered the first visible to the human eye) to over 10,000 degrees K.

Lower color temperatures generally indicate white light having a more significant red component or a "warmer feel," while higher color temperatures generally indicate white light having a more significant blue component or a "cooler feel." By way of example, a wood burning fire has a color temperature of approximately 1,800 degrees K, a conventional incandescent bulb has a color temperature of approximately 2848 degrees K, early morning daylight has a color temperature of approximately 3,000 degrees K, and overcast midday skies have a color temperature of approximately 10,000 degrees K. A color image viewed under white light having a color temperature of approximately 3,000 degree K has a relatively reddish tone, whereas the same color image viewed under white light having a color temperature of approximately 10,000 degrees K has a relatively bluish tone.

Illuminators may be selected so as to produce a desired level of output, such as a desired total number of lumens of output, such as to make a lighting unit 102 consistent with or comparable to another lighting unit 102, which might be a semiconductor illuminator or might be another type of lighting unit, such as an incandescent, fluorescent, halogen or other light source, such as if a designer or architect wishes to fit semiconductor-based lighting units 102 into installations that use such traditional units.

The number and type of semiconductor illuminators can be selected to produce the desired lumens of output, such as by selecting some number of one-watt, five-watt, power package or other LEDs. In embodiments two or three LEDs are chosen. In other embodiments any number of LEDs, such as six, nine, twenty, thirty, fifty, one hundred, three hundred or more LEDs can be chosen.

Figure 4:
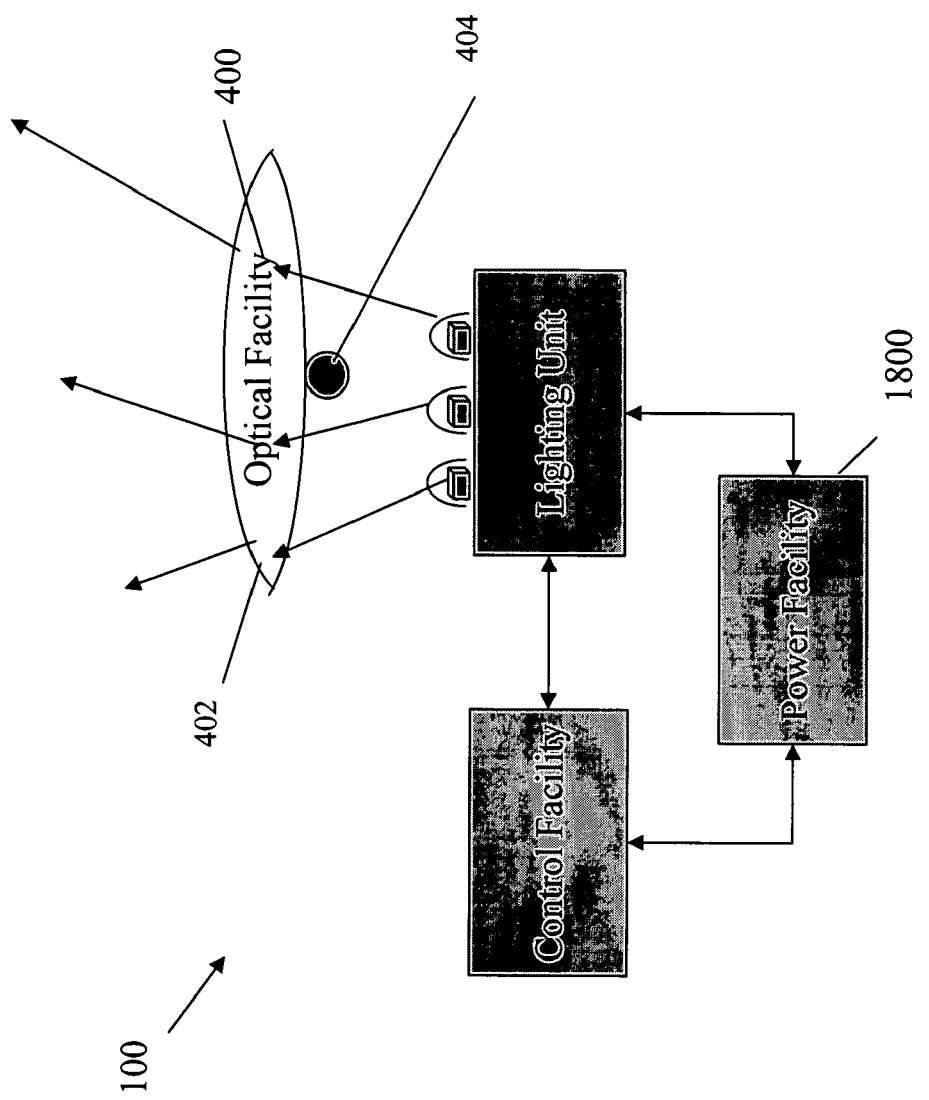
FIG. 4 depicts an optical facility for a lighting system.

Referring to FIG. 4, a system 100 can include a secondary optical facility 400 to optically process the radiation generated by the light sources 300, such as to change one or both of a spatial distribution and a propagation direction of the generated radiation. In particular, one or more optical facilities may be configured to change a diffusion angle of the generated radiation. One or more optical facilities 400 may be particularly configured to variably change one or both of a spatial distribution and a propagation direction of the generated radiation (e.g., in response to some electrical and/or mechanical stimulus). An actuator 404, such as under control of a control facility 3500, can control an optical facility 400 to produce different optical effects.

Figure 5:
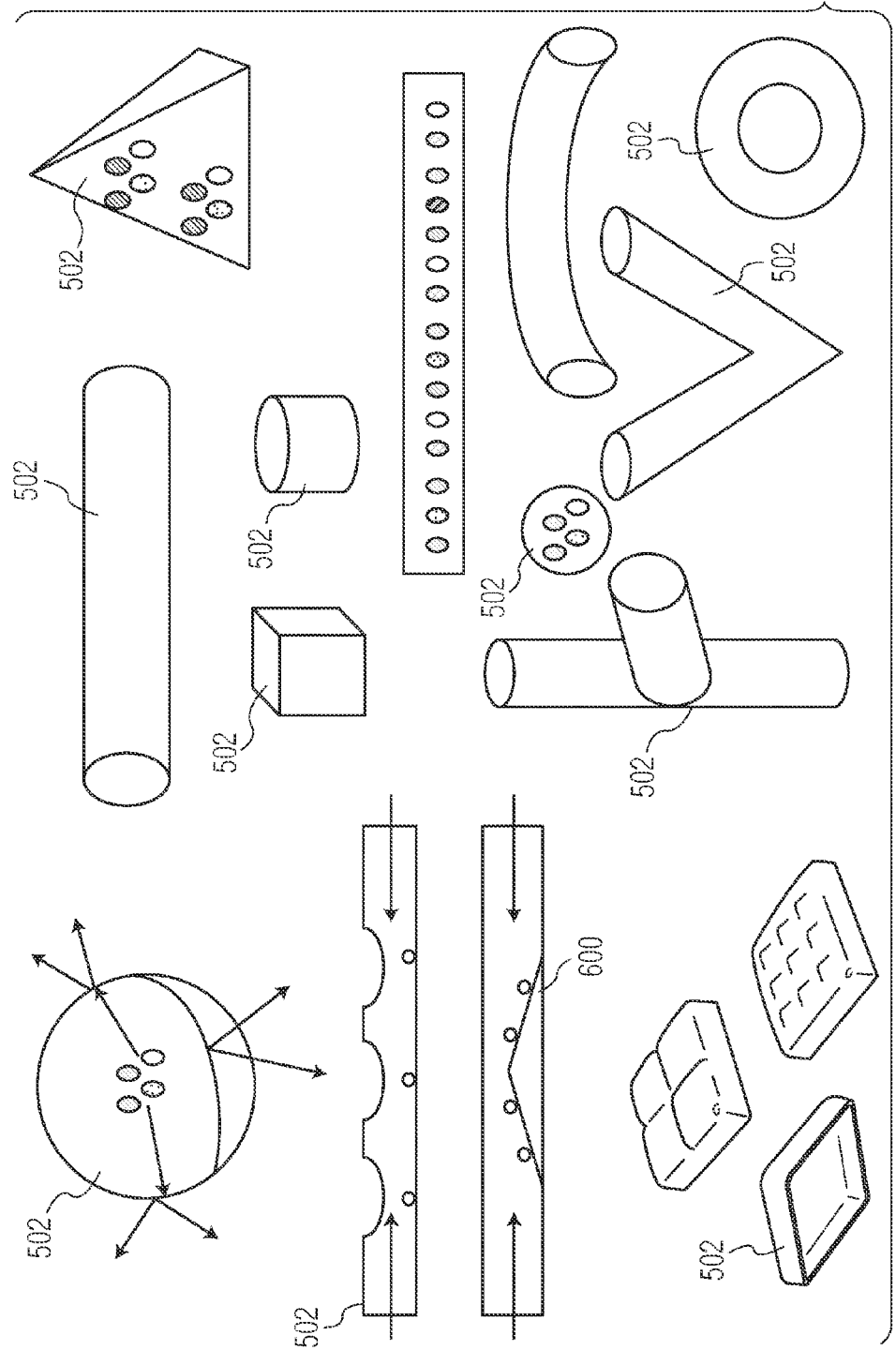
FIG. 5 depicts diffusers that can serve as optical facilities.

Referring to FIG. 5, an optical facility 400 may be a diffuser 502. A diffuser may absorb and scatter light from a source 300, such as to produce a glowing effect in the diffuser. As seen in FIG. 5, diffusers 502 can take many different shapes, such as tubes, cylinders, spheres, pyramids, cubes, tiles, panels, screens, doughnut shapes, V-shapes, T-shapes, U-shapes, junctions, connectors, linear shapes, curves, circles, squares, rectangles, geometric solids, irregular shapes, shapes that resemble objects found in nature, and any other shape. Diffusers may be made of plastics, polymers, hydrocarbons, coated materials, glass materials, crystals, micro-lens arrays, fiber optics, or a wide range of other materials. Diffusers 502 can scatter light to provide more diffuse illumination of other objects, such as walls or alcoves. Diffusers 502 can also produce a glowing effect when viewed directly by a viewer. In embodiments, it may be desirable to deliver light evenly to the interior surface of a diffuser 502. For example, a reflector 600 may be disposed under a diffuser 502 to reflect light to the interior surface of the diffuser 502 to provide even illumination.

Diffusing material can be a substantially light-transmissive material, such as a fluid, gel, polymer, gas, liquid, vapor, solid, crystal, fiber optic material, or other material. In embodiments the material may be a flexible material, so that the diffuser may be made flexible. The diffuser may be made of a flexible material or a rigid material, such as a plastic, rubber, a crystal, PVC, glass, a polymer, a metal, an alloy or other material.

Figure 6:
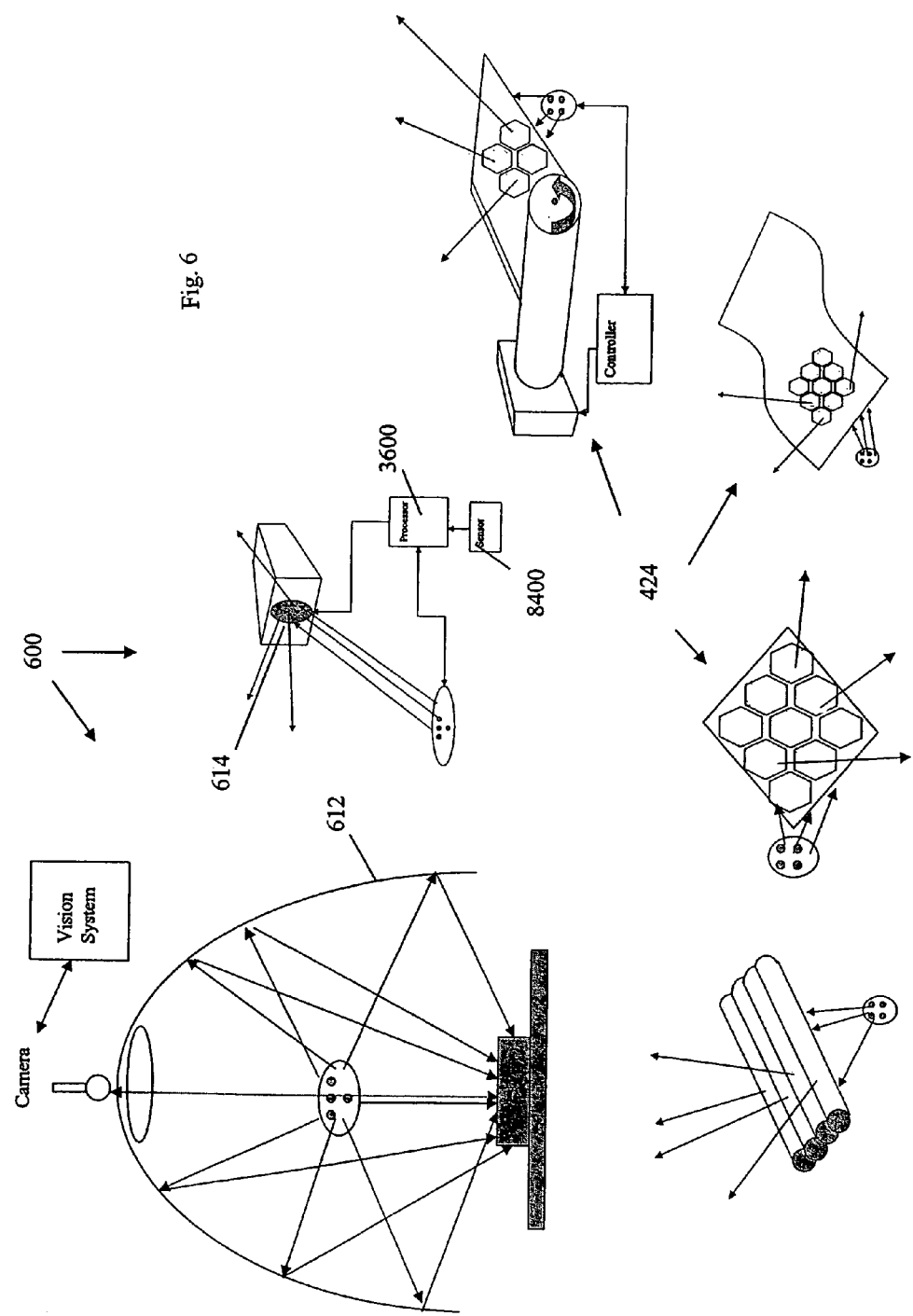
FIG. 6 depicts optical facilities.

Referring to FIG. 6, an optical facility 400 may include a reflector 600 for reflecting light from a light source 300. Embodiments include a parabolic reflector 612 for reflecting light from many angles onto an object, such as an object to be viewed in a machine vision system. Other reflectors 600 include mirrors, spinning mirrors 614, reflective lenses, and the like. In some cases, the optical facility 400 may operate under control of a processor 3600. Optical facilities 500 can also include lenses 402, including microlens arrays that can be disposed on a flexible material.

Other examples of optical facilities 400 include, but are not limited to, reflectors, lenses, reflective materials, refractive materials, translucent materials, filters, mirrors, spinning mirrors, dielectric mirrors, Bragg cells, MEMs, acousto-optic modulators, crystals, gratings and fiber optics. The optical facility 400 also may include a phosphorescent material, luminescent material, or other material capable of responding to or interacting with the generated radiation.

Variable optics can provide discrete or continuous adjustment of beam spread or angle or simply the profile of the light beam emitted from a fixture. Properties can include, but are not limited to, adjusting the profile for surfaces that vary in distance s from the fixture, such as wall washing fixtures. In various embodiments, the variable nature of the optic can be manually adjusted, adjusted by motion control or automatically be controlled dynamically.

Figure 7:
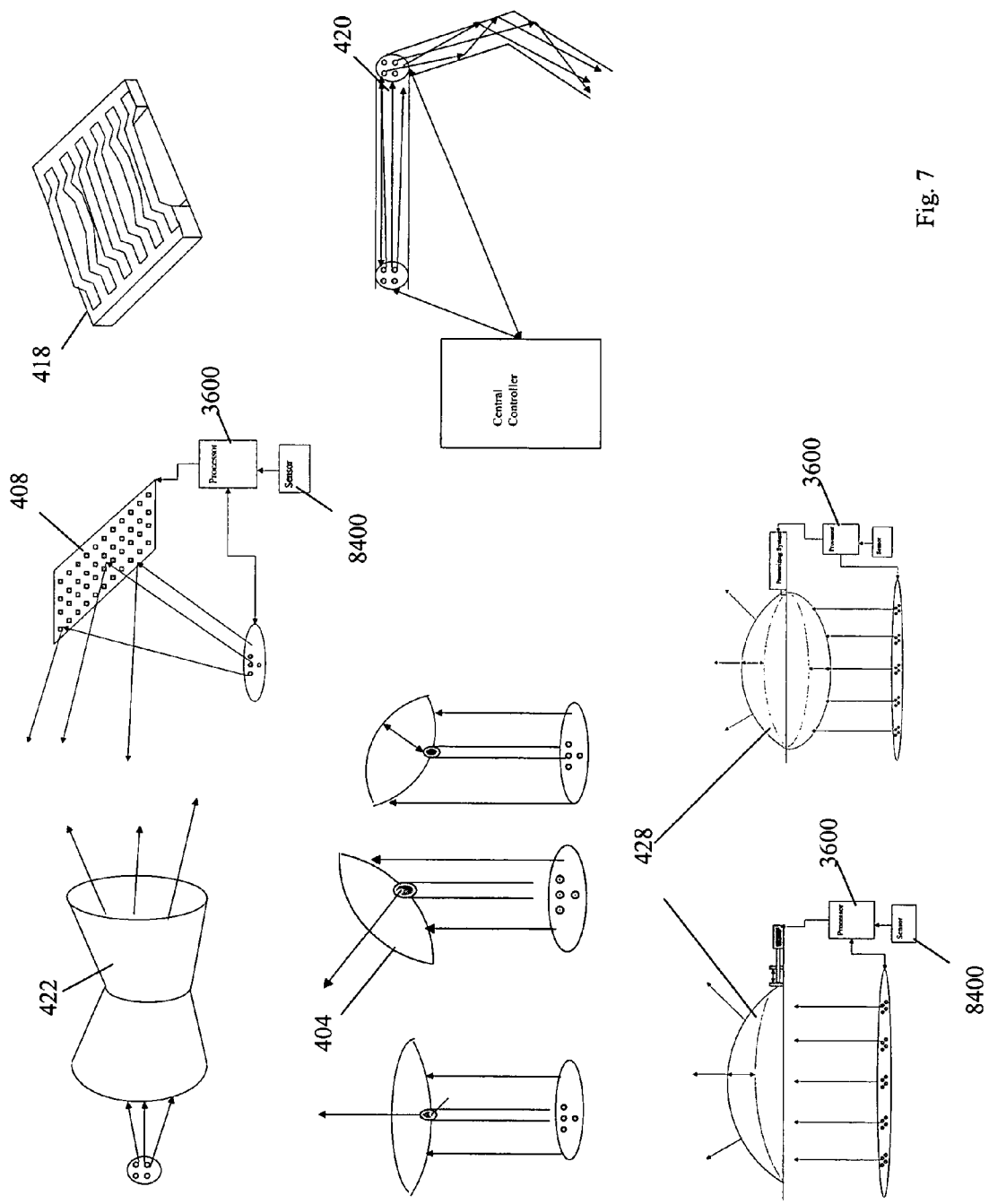
FIG. 7 depicts optical facilities for lighting systems.

Referring to FIG. 7, actuation of variable optics can be through any kind of actuator, such as an electric motor, piezoelectric device, thermal actuator, motor, gyro, servo, lever, gear, gear system, screw drive, drive mechanism, flywheel, wheel, or one of many well-known techniques for motion control. Manual control can be through an adjustment mechanism that varies the relative geometry of lens, diffusion materials, reflecting surfaces or refracting elements. The adjustment mechanism may use a sliding element, a lever, screws, or other simple mechanical devices or combinations of simple mechanical devices. A manual adjustment or motion control adjustment may allow the flexing of optical surfaces to bend and shape the light passed through the system or reflected or refracted by the optical system.

Actuation can also be through an electromagnetic motor or one of many actuation materials and devices. Optical facilities 400 can also include other actuators, such as piezo-electric devices, MEMS devices, thermal actuators, processors, and many other forms of actuators.

A wide range of optical facilities 400 can be used to control light. Such devices as Bragg cells or holographic films can be used as optical facilities 400 to vary the output of a fixture. A Bragg cell or acoustic-optic modulator can provide for the movement of light with no other moving mechanisms. The combination of controlling the color (hue, saturation and value) as well as the form of the light beam brings a tremendous amount of operative control to a light source. The use of polarizing films can be used to reduce glare and allow the illumination and viewing of objects that present specular surfaces, which typically are difficult to view. Moving lenses and shaped non-imaging surfaces can provide optical paths to guide and shape light.

In other embodiments, fluid-filled surfaces 428 and shapes can be manipulated to provide an optical path. In combination with lighting units, such shapes can provide varying optical properties across the surface and volume of the fluid-filled material. The fluid-filled material can also provide a thermal dissipation mechanism for the light-emitting elements. The fluid can be water, polymers, silicone or other transparent or translucent liquid or a gas of any type and mixture with desirable optical or thermal properties.

In other embodiments, gelled, filled shapes can be used in conjunction with light sources to evenly illuminate said shapes. Light propagation and diffusion is accomplished through the scattering of light through the shape.

In other embodiments, spinning mirror systems such as those used in laser optics for scanning (E.g. bar code scanners or 3D terrain scanners) can be used to direct and move a beam of light. That combined with the ability to rapidly turn on and off a lighting unit 102 can allow a beam of light to be spread across a larger area and change colors to 'draw' shapes of varying patterns. Other optical facilities 400 for deflecting and changing light patterns are known and described in the literature. They include methods for beam steering, such as mechanical mirrors, driven by stepper or galvanometer motors and more complex robotic mechanisms for producing sophisticated temporal effects or static control of both color (HS&V) and intensity. Optical facilities 400 also include acousto-optic modulators that use sound waves generated via piezoelectrics to control and steer a light beam. They also include digital mirror devices and digital light processors, such as available from Texas Instruments. They also include grating light valve technology (GLV), as well as inorganic digital light deflection. They also include dielectric mirrors, such as developed at Massachusetts Institute of Technology.

Control of form and texture of the light can include not only control of the shape of the beam but also control of the way in which the light is patterned across its beam. An example of a use of this technology may be in visual merchandising, where product 'spotlights' could be created while other media is playing in a coordinated manner. Voice-overs or music-overs or even video can be played during the point at which a product is highlighted during a presentation. Lights that move and 'dance' can be used in combination with A/V sources for visual merchandising purposes.

Optical facilities 400 can be light pipes, lenses, light guides and fibers and any other light transmitting materials.

In other embodiments, non-imaging optics are used as an optical facility. Non-imaging optics do not require traditional lenses. They use shaped surfaces to diffuse and direct light. A fundamental issue with fixtures using discrete light sources is mixing the light to reduce or eliminate color shadows and to produce uniform and homogenous light output. Part of the issue is the use of high efficiency surfaces that do not absorb light but bounce and reflect the light in a desired direction or manner. Optical facilities can be used to direct light to create optical forms of illumination from lighting units 102.

The actuator 404 can be any type of actuator for providing linear movement, such as an electromechanical element, a screw drive mechanism (such as used in computer printers), a screw drive, or other element for linear movement known to those of ordinary skill in the art.

In embodiments the optical facility is a fluid filled lens, which contains a compressible fluid, such as a gas or liquid. The actuator includes a valve for delivering fluid to the interior chamber of the lens.

In embodiments a digital mirror 408 serves as an optical facility 400. The digital mirror is optionally under control of a processor 3600, which governs the reflective properties of the digital mirror.

In embodiments a spinning mirror system 614 serves as an optical facility 400. As in other embodiments, the spinning mirror system is responsive to the control of a processor, which may be integrated with it or separate.

In embodiments a grating light valve (GLV) 418 serves as an optical facility 400. The grating light valve can receive light from a lighting unit under control of a processor. GLV uses micro-electromechanical systems (MEMS) technology and optical physics to vary how light is reflected from each of multiple ribbon-like structures that represent a particular "image point" or pixel. The ribbons can move a tiny distance, such as between an initial state and a depressed state. When the ribbons move, they change the wavelength of reflected light. Grayscale tones can also be achieved by varying the speed at which given pixels are switched on and off. The resulting image can be projected in a wide variety of environments, such as a large arena with a bright light source or on a small device using low power light sources. In the GLV, picture elements (pixels) are formed on the surface of a silicon chip and become the source for projection.

In embodiments an acousto-optical modulator serves as an optical facility 400. Also known as a tunable filter and as a Bragg cell, the acousto-optical modulator consists of a crystal that is designed to receive acoustic waves generated, for example, by a transducer, such as a piezoelectric transducer. The acoustic standing waves produce index of refraction changes in the crystal, essentially due to a Doppler shift, so that the crystal serves as a tunable diffraction grating. Incident light, such as from a lighting unit 102, is reflected in the crystal by varying degrees, depending on the wavelength of the acoustic standing waves induced by the transducer. The transducer can be responsive to a processor, such as to convert a signal of any type into an acoustic signal that is sent through the crystal.

Referring again to FIG. 6, in embodiments the optical facility 400 is a reflector 612, such as a reflective dome for providing illumination from a wide variety of beam angles, rather than from one or a small number of beam angles. Providing many beam angles reduces harsh reflections and provides a smoother view of an object. A reflective surface is provided for reflecting light from a lighting unit 102 to the object. The reflective surface is substantially parabolic, so that light from the lighting unit 102 is reflected substantially to the object, regardless of the angle at which it hits the reflective surface from the lighting unit 102. The surface could be treated to a mirror surface, or to a matte Lambertian surface that reflects light substantially equally in all directions. As a result, the object is lit from many different angles, making it visible without harsh reflections. The object may optionally be viewed by a camera, which may optionally be part of or in operative connection with a vision system. The camera may view the object through a space in the reflective surface, such as located along an axis of viewing from above the object. The object may rest on a platform, which may be a moving platform. The platform, light system 100, vision system and camera may each be under control of a processor, so that the viewing of the object and the illumination of the object may be coordinated, such as to view the object under different colors of illumination.

Referring to FIG. 7, optical facilities include a light pipe 420 that reflects light to produce a particular pattern of light at the output end. A different shape of light pipe produces a different pattern. In general, such secondary optics, whether imaging or non-imaging, and made of plastic, glass, mirrors or other materials, can be added to a lighting unit 102 to shape and form the light emission. Such an optical facility 400 can be used to spread, narrow, diffuse, diffract, refract or reflect the light in order that a different output property of the light is created. These can be fixed or variable. Examples can be light pipes, lenses, light guides and fibers and any other light transmitting materials, or a combination of any of these.

In embodiments the light pipe 420 serves as an optical facility, delivering light from one or more lighting systems 102 to an illuminated material. The lighting systems 100 are optionally controlled by a control facility 3500, which controls the lighting systems 102 to send light of selected colors, color temperatures, intensities and the like into the interior of the light pipe. In other embodiments a central controller is not required, such as in embodiments where the lighting systems 102 include their own processor. In embodiments one or more lighting systems 102 may be equipped with a communications facility, such as a data port, receiver, transmitter, or the like. Such lighting systems 102 may receive and transmit data, such as to and from other lighting systems 100. Thus, a chain of lighting systems 100 in a light pipe may transmit not only light, but also data along the pipe, including data that sends control signals for the lighting systems disposed in the pipe.

The optical facility may be a color mixing system 422 for mixing color from a lighting unit 102. The color mixing system may consist of two opposing truncated conical sections, which meet at a boundary. Light from a lighting unit 102 is delivered into the color mixing system and reflected from the interior surfaces of the two sections. The reflections mix the light and produce a mixed light from the distal end of the color mixing system. U.S. Pat. No. 2,686,866 to Williams, incorporated by reference herein, shows a color mixing lighting apparatus utilizing two inverted cones to reflect and mix the light from multiple sources. By combining a color mixing system such as this with color changes from the lighting unit 102, a user can produce a wide variety of lighting effects.

Other color mixing systems can work well in conjunction with color changing lighting systems 102. For example, U.S. Pat. No. 2,673,923 to Williams, also incorporated by reference herein, uses a series of lens plates for color mixing.

In embodiments an optical facility is depicted consisting of a plurality of cylindrical lens elements. These cylindrical elements diffract light from a lighting unit 102, producing a variety of patterns of different colors, based on the light from the lighting unit 102. The cylinders may be of a wide variety of sizes, ranging from microlens materials to conventional lenses.

In embodiments the optical facility 400 is a microlens array 424. The microlens array consists of a plurality of microscopic hexagonal lenses, aligned in a honeycomb configuration. Microlenses are optionally either refractive or diffractive, and can be as small as a few microns in diameter. Microlens arrays can be made using standard materials such as fused silica and silicon and newer materials such as Gallium Phosphide, making possible a very wide variety of lenses. Microlenses can be made on one side of a material or with lenses on both sides of a substrate aligned to within as little as one micron. Surface roughness values of 20 to 80 angstroms RMS are typical, and the addition of various coatings can produce optics with very high transmission rates. The microlens array can refract or diffract light from a lighting unit 102 to produce a variety of effects.

In embodiments a microlens array optical facility 400 can consist of a plurality of substantially circular lens elements. The array can be constructed of conventional materials such as silica, with lens diameters on the range of a few microns. The array can operate on light from a lighting unit 102 to produce a variety of colors and optical effects.

In embodiments a microlens array is disposed in a flexible material, so that the optical facility 400 can be configured by bending and shaping the material that includes the array.

In embodiments a flexible microlens array is rolled to form a cylindrical shape for receiving light from a lighting unit 102. The configuration could be used, for example, as a light-transmissive lamp shade with a unique appearance.

In embodiments a system can be provided to roll a microlens array about an axis. A drive mechanism can roll or unroll the flexible array under control of a controller. The controller can also control a lighting unit 102, so that the array is disposed in front of the lighting unit 102 or rolled away from it, as selected by the user.

The terms "lighting unit,""luminaire" and "lighting fixture" are used herein to refer to an apparatus including one or more light sources 300. A given lighting unit 102 may have any one of a variety of mounting arrangements for the light source(s) in a variety of housings 800. Housings 800 may include enclosures, platforms, boards, mountings, and many other form factors, including forms designed for other purposes. Housings 800 may be made of any material, such as metals, alloys, plastics, polymers, and many others.

Referring to FIG. 8, housings 800 may include panels 804 that consist of a support platform on which light sources 300 are disposed in an array. Equipped with a diffuser 502, a panel 804 can form a light tile 802. The diffuser 502 for a light tile 802 can take many forms, as depicted in FIG. 8. The light tile 802 can be of any shape, such as square, rectangular, triangular, circular or irregular. The light tile 802 can be used on or as a part of a wall, door, window, ceiling, floor, or other architectural features, or as a work of art, or as a toy, novelty item, or item for entertainment, among other uses. Housings 800 may be configured as tiles or panels, such as for wall-hangings, walls, ceiling tiles, or floor tiles.

Figure 9:
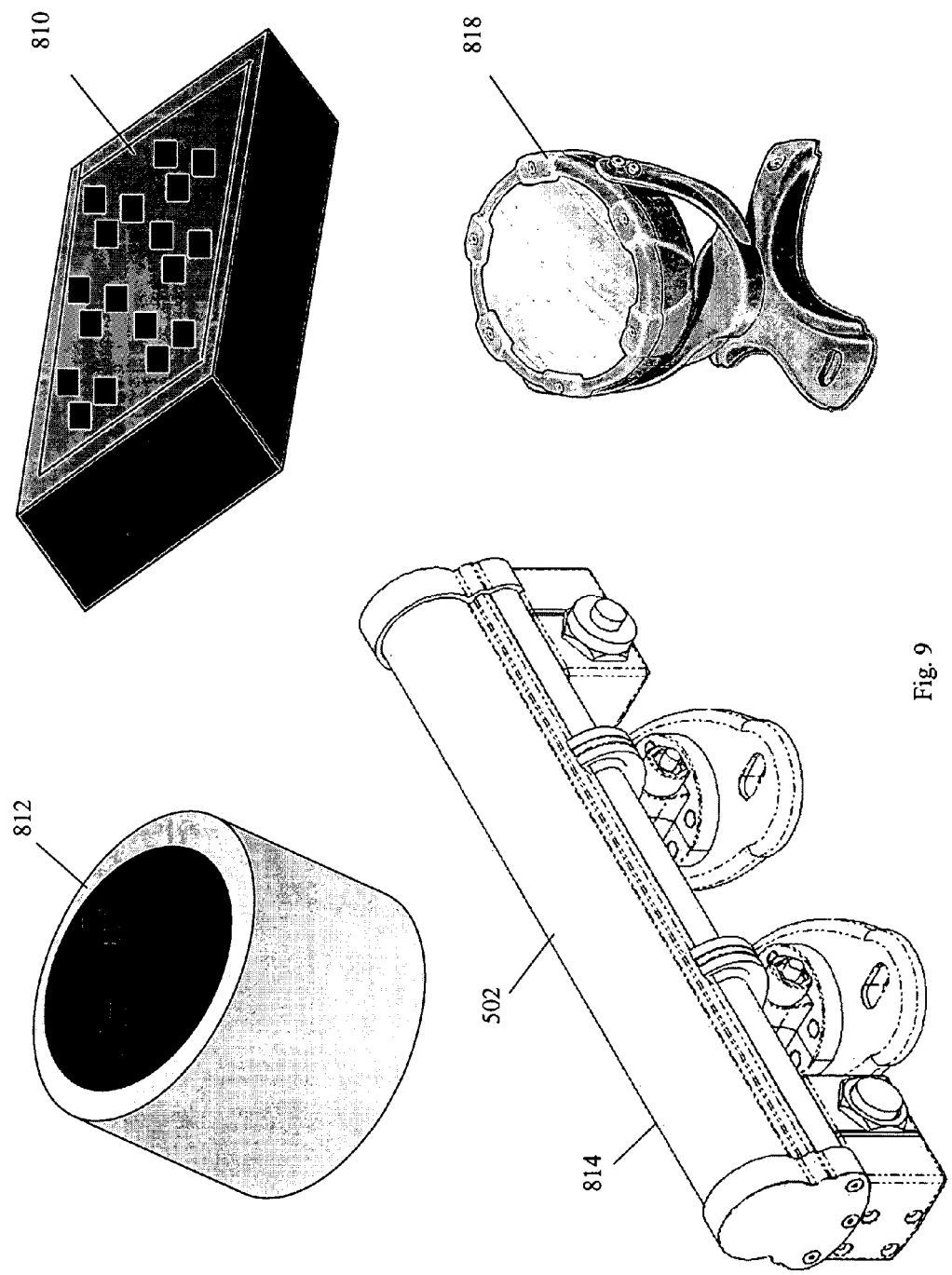
FIG. 9 depicts housings for architectural lighting systems.

Referring to FIG. 9, housings 800 may include a housing for an architectural lighting fixture 810, such as a wall-washing fixture. Housings 800 may be square, rectangular 810, circular, cylindrical 812, or linear 814. A linear housing 814 may be equipped with a diffuser 502 to simulate a neon light of various shapes, or it may be provided without a diffuser, such as to light an alcove or similar location. A housing 800 may be provided with a watertight seal, to provide an underwater lighting system 818.

Housings 800 may be configured to resemble retrofit bulbs, fluorescent bulbs, incandescent bulbs, halogen lamps, high-intensity discharge lamps, or other kinds of bulbs and lamps. Housings 800 may be configured to resemble neon lights, such as for signs, logos, or decorative purposes. Housings 800 may be configured to highlight architectural features, such as lines of a building, room or architectural feature. Housings 800 may be configured for various industrial applications, such as medical lighting, surgical lighting, automotive lighting, under-car lighting, machine vision lighting, photographic lighting, lighting for building interiors or exteriors, lighting for transportation facilities, lighting for pools, spas, fountains and baths, and many other kinds of lighting.

Additionally, one or more lighting units similar to that described in connection with FIG. 2 may be implemented in a variety of products including, but not limited to, various forms of light modules or bulbs having various shapes and electrical/mechanical coupling arrangements (including replacement or "retrofit" modules or bulbs adapted for use in conventional sockets or fixtures), as well as a variety of consumer and/or household products (e.g., night lights, toys, games or game components, entertainment components or systems, utensils, appliances, kitchen aids, cleaning products, etc.).

Lighting units 102 encompassed herein include lighting units 102 configured to resemble all conventional light bulb types, so that lighting units 102 can be conveniently retrofitted into fixtures, lamps and environments suitable for such environments. Such retrofitting lighting units 102 can be designed, as disclosed above and in the applications incorporated herein by reference, to use conventional sockets of all types, as well as conventional lighting switches, dimmers, and other controls suitable for turning on and off or otherwise controlling conventional light bulbs. Retrofit lighting units 102 encompassed herein include incandescent lamps, such as A15 Med, A19 Med, A21 Med, A21 3C Med, A23Med, B10 Blunt Tip, B10 Crystal, B10 Candle, F15, GT, C7 Candle C7 DC Bay, C15, CA10, CA8, G16/1/2 Cand, G16-1/2 Med, G25 Med, G30 Med, G40 Med, S6 Cand, S6 DC Bay, S11 Cand, S11 DC Bay, S11 Inter, S11 Med, S14 Med, S19 Med, LINESTRA 2-base, T6 Cand, T7 Cand, T7 DC Bay, T7 Inter, T8 Cand, T8 DC Bay, T8 Inter, T10 Med, T6-1/2 Inter, T6-1/2 DC Bay, R16 Med, ER30 Med, ER40 Med, BR30 Med, BR40 Med, R14 Inter, R14 Med, K19, R20 Med, R30 Med, R40 Med, R40 Med Skrt, R40 Mog, R52 Mog, P25 Med, PS25 3C, PS25 Med, PS30 Med, PS35 Mog, PS52 Mog, PAR38 Med Skrt, PAR38 Med Sid Pr, PAR46 Scrw Trm, PAR46 Mog End Pr, PAR 46 Med Sid Pr, PAR56 Scrw Trm, PAR56 Mog End Pr, PAR 64 Scrw Trm, and PAR64 Ex Mog End Pr. Also, retrofit lighting units 102 include conventional tungsten/halogen lamps, such as BT4, T3, T4 BI-PIN, T4 G9, MR16, MR11, PAR14, PAR16, PAR16 GU10, PAR20, PAR30, PAR30LN, PAR36, PAR38 Medium Skt., PAR38 Medium Side Prong, AR70, AR111, PAR56 Mog End Pr, PAR64 Mog End Pr, T4 DC Bayonet, T3, T4 Mini Can, T3, T4 RSC Double End, T10, and MB19. Lighting units 102 can also include retrofit lamps configured to resemble high intensity discharge lamps, such as E17, ET18, ET23.5, E25, BT37, BT56, PAR20, PAR30, PAR38, R40, T RSC base, T Fc2 base, T G12 base, T G8.5 base, T Mogul base, and TBY22d base lamps. Lighting units 102 can also be configured to resemble fluorescent lamps, such as T2 Axial Base, T5 Miniature Bipin, T8 Medium Bipin, T8 Medium Bipin, T12 Medium Bipin, U-shaped t-12, OCTRON T-8 U-shaped, OCTRON T8 Recessed Double Contact, T12 Recessed Double Contact, T14-1/2 Recessed Double Contact, T6 Single Pin, T8 Single Pin, T12 Single Pin, ICETRON, Circline 4-Pin T-19, PENTRON CIRCLINE 4-pin T5, DULUX S, DULUX S/E, DULUX D, DULUX D/E, DULUX T, DULUX T/E, DULUX T/E/IN, DULUX L, DULUX F, DULUX EL Triple, DULUX EL TWIST DULUX EL CLASSIC, DULUX EL BULLET, DULUX EL Low Profile GLOBE, DULUX EL GLOBE, DULUE EL REFLECTOR, and DULUX EL Circline. Lighting units 102 can also include specialty lamps, such as for medical, machine vision, or other industrial or commercial applications, such as airfield/aircraft lamps, audio visual maps, special purpose heat lamps, studio, theatre, TV and video lamps, projector lamps, discharge lamps, marine lamps, aquatic lamps, and photo-optic discharge lamps, such as HBO, HMD, HMI, HMP, HSD, HSR, HTI, LINEX, PLANON, VIP, XBO and XERADEX lamps. Other lamps types can be found in product catalog for lighting manufacturers, such as the Sylvania Lamp and Ballast Product Catalog 2002, from Sylvania Corporation or similar catalogs offered by General Electric and Philips Corporation.

In embodiments the lighting system may have a housing configured to resemble a fluorescent or neon light. The housing may be linear, curved, bent, branched, or in a "T" or "V" shape, among other shapes.

Housings 800 can take various shapes, such as one that resembles a point source, such as a circle or oval. Such a point source can be located in a conventional lighting fixture, such as lamp or a cylindrical fixture. Lighting units 102 can be configured in substantially linear arrangements, either by positioning point sources in a line, or by disposing light sources substantially in a line on a board located in a substantially linear housing, such as a cylindrical housing. A linear lighting unit can be placed end-to-end with other linear elements or elements of other shapes to produce longer linear lighting systems comprised of multiple lighting units 102 in various shapes. A housing can be curved to form a curvilinear lighting unit. Similarly, junctions can be created with branches, "Ts," or "Ys" to create a branched lighting unit. A bent lighting unit can include one or more "V" elements. Combinations of various configurations of point source, linear, curvilinear, branched and bent lighting units 102 can be used to create any shape of lighting system, such as one shaped to resemble a letter, number, symbol, logo, object, structure, or the like.

Housings 800 can include or be combined to produce three-dimensional configurations, such as made from a plurality of lighting units 102. Linear lighting units 102 can be used to create three-dimensional structures and objects, or to outline existing structures and objects when disposed along the lines of such structures and objects. Many different displays, objects, structures, and works of art can be created using linear lighting units as a medium. Examples include pyramid configurations, building outlines and two-dimensional arrays. Linear units in two-dimensional arrays can be controlled to act as pixels in a lighting show.

In embodiments the housing 800 may be a housing for an architectural, theatrical, or entertainment lighting fixture, luminaire, lamp, system or other product. The housing 800 may be made of a metal, a plastic, a polymer, a ceramic material, glass, an alloy or another suitable material. The housing 800 may be cylindrical, hemispherical, rectangular, square, or another suitable shape. The size of the housing may range from very small to large diameters, depending on the nature of the lighting application. The housing 800 may be configured to resemble a conventional architectural lighting fixture, such as to facilitate installation in proximity to other fixtures, including those that use traditional lighting technologies such as incandescent, fluorescent, halogen, or the like. The housing 800 may be configured to resemble a lamp. The housing 800 may be configured as a spot light, a down light, an up light, a cove light, an alcove light, a sconce, a border light, a wall-washing fixture, an alcove light, an area light, a desk lamp, a chandelier, a ceiling fan light, a marker light, a theatrical light, a moving-head light, a pathway light, a cove light, a recessed light, a track light, a wall fixture, a ceiling fixture, a floor fixture, a circular fixture, a spherical fixture, a square fixture, a rectangular fixture, an accent light, a pendant, a parabolic fixture, a strip light, a soffit light, a valence light, a floodlight, an indirect lighting fixture, a direct lighting fixture, a flood light, a cable light, a swag light, a picture light, a portable luminaire, an island light, a torchiere, a boundary light, a flushor any other kind architectural or theatrical lighting fixture or luminaire.

Housings may also take appropriate shapes for various specialized, industrial, commercial or high performance lighting applications. For example, in an embodiment a miniature system, such as might be suitable for medical or surgical applications or other applications demanding very small light systems 100, can include a substantially flat light shape, such as round, square, triangular or rectangular shapes, as well as non-symmetric shapes such as tapered shapes. In many such embodiments, housing 800 could be generally described as a planar shape with some small amount of depth for components. The housing 800 can be small and round, such as about ten millimeters in diameter (and can be designed with the same or similar configuration at many different scales). The housing 800 may include a power facility, a mounting facility and an optical facility. The housing 800 and optical facility can be made of metals or plastic materials suitable for medical use.

Figure 10:
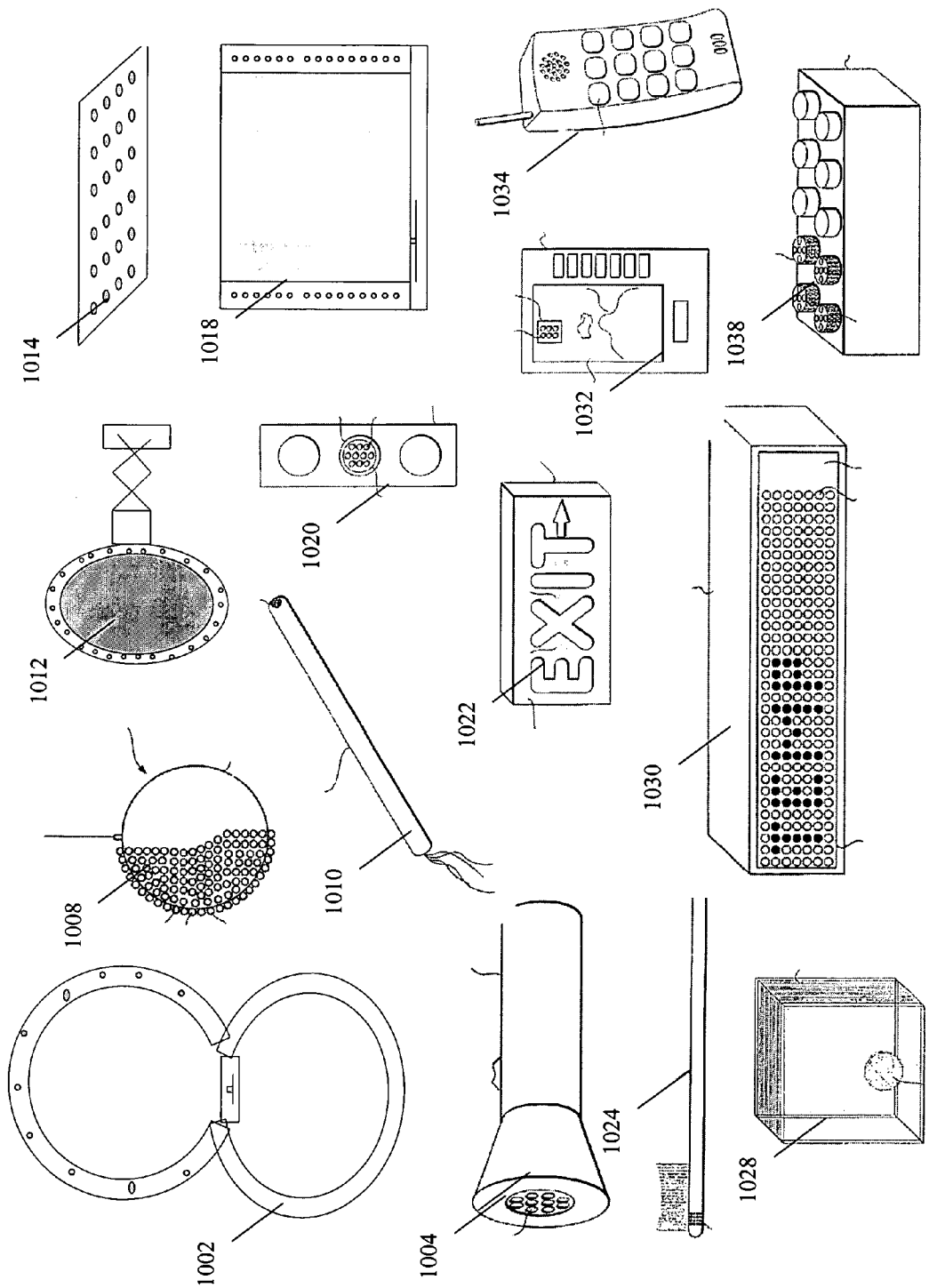
FIG. 10 depicts specialized housings for lighting systems.

Referring to FIG. 10, a housing 800 for a lighting unit 100 may serve as a housing for another object as well, such as a compact 1002, a flashlight 1004, a ball 1008, a mirror 1012, an overhead light 1014, a wand 1010, a traffic light 1020, a mirror 1018, a sign 1022, a toothbrush 1024, a cube 1028 (such as a Lucite cube), a display 1030, a handheld computer 1032, a phone 1034, or a block 1038. Almost any object can be integrated with a lighting unit 102 to provide a controlled lighting feature.

Figure 11:
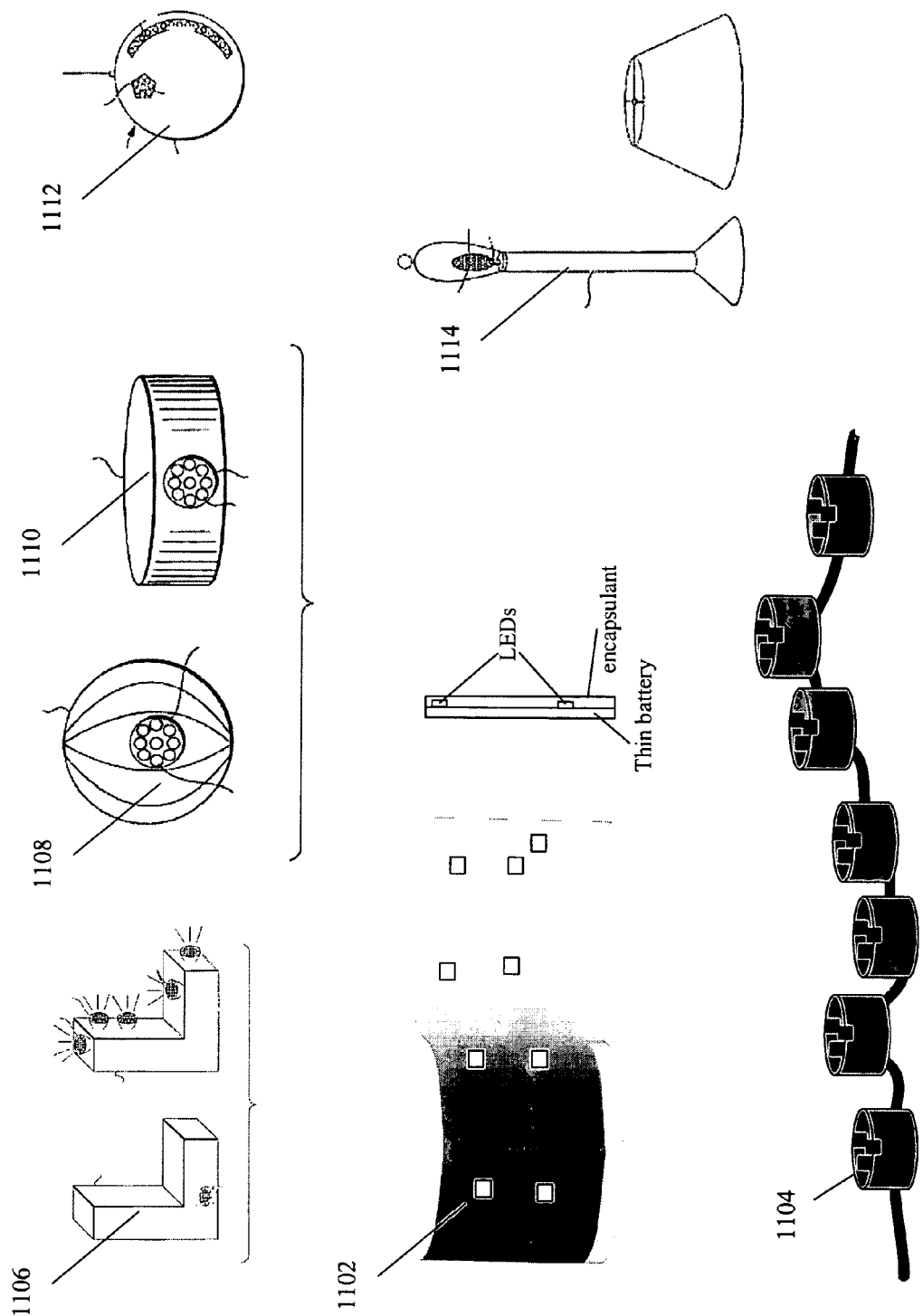
FIG. 11 depicts housings for lighting systems.

FIG. 11 shows additional housings 800 for lighting units 102, such as blocks 1104, balls 1108, pucks 1110, spheres 1112, and lamps 1114.

Referring to FIG. 11, housings 800 may also take the form of a flexible band 1102, tape or ribbon to allow the user to conform the housing to particular shapes or cavities. Similarly, housings 800 can take the form of a flexible string 1104. Such a band 1102 or string 1104 can be made in various lengths, widths and thicknesses to suit specific demands of applications that benefit from flexible housings 800, such as for shaping to fit body parts or cavities for surgical lighting applications, shaping to fit objects, shaping to fit unusual spaces, or the like. In flexible embodiments it may be advantageous to use thin-form batteries, such as polymer or "paper" batteries for small bands 1102 or strings 1104.

Figure 12:
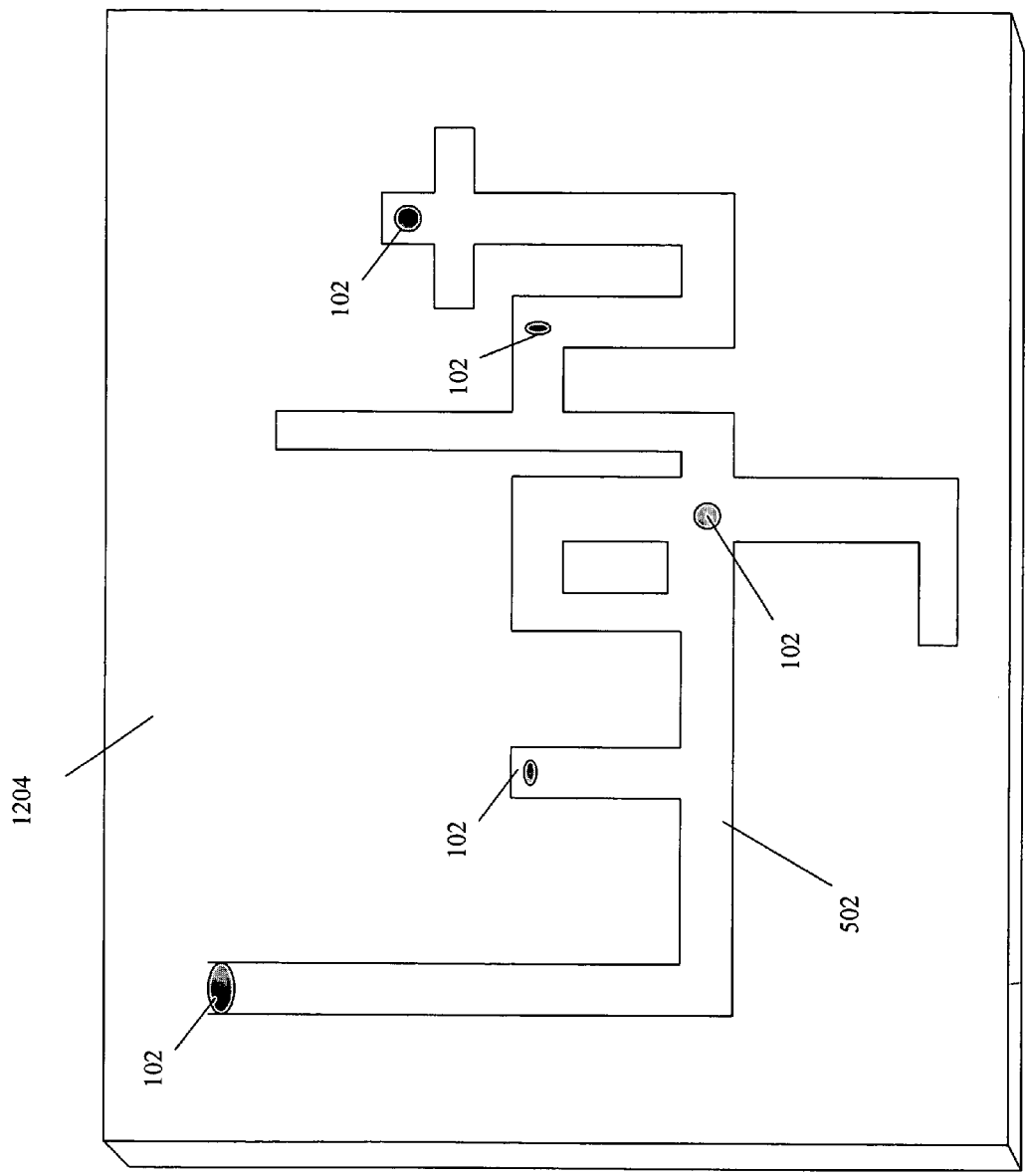
FIG. 12 depicts a signage housing for a lighting system.

Referring to FIG. 12, lighting units 102 can be disposed in a sign 1204, such as to provide lighting. Combined with diffusers 502, the lighting units 102 can produce an effect similar to neon lights. Signs 1204 can take many different forms, with lighting units 102, housings 800 and diffusers 502 shaped to resemble logos, characters, numbers, symbols, and other signage elements. In embodiments the sign 1204 can be made of light-transmissive materials. Thus, a sign 1204 can glow with light from the lighting units 102, similar to the way a neon light glows. The sign 1204 can be configured in letters, symbols, numbers, or other configurations, either by constructing it that way, or by providing sub-elements that are fit together to form the desired configuration. The light from the lighting units 102 can be white light, other colors of light, or light of varying color temperatures. In an embodiment the sign 1204 can be made from a kit that includes various sub-elements, such as curved elements, straight elements, "T" junctions, "V-" and "U-" shaped elements, and the like.

In embodiments a housing 800 may be configured as a sphere or ball, so as to produce light in substantially all directions. The ball housing 800 can be made of plastic or glass material that could be transparent for maximum light projection or diffuse to provide softer light output that is less subject to reflections. The ball housing 800 could be very small, such as the size of a marble or a golf ball, so that it is easily managed in environments that require miniature light systems 100, or it could be very large, such as in art, architectural, and entertainment applications. Multiple balls can be used simultaneously to provide additional light. If it is desired to have directional light from a ball lighting system 100, then part of the ball can be made dark.

Housings 800 can incorporate lighting units 102 into conventional objects, such as tools, utensils, or other objects. For example, a housing 800 may be shaped into a surgical tool, such as tweezers, forceps, retractors, knives, scalpels, suction tubes, clamps or the like. A lighting unit 102 can be collocated at the end of a tool and provide illumination to the working area of the tool. One of many advantages of this type of tool is the ability to directly illuminate the working area, avoiding the tendency of tools or the hands that use them to obscure the working area. Tools can have onboard batteries or include other power facilities as described herein.

Housings 800 can also be configured as conventional tools with integrated lighting units 102, such as hammers, screw drivers, wrenches (monkey wrenches, socket wrenches and the like), pliers, vise-grips, awls, knives, forks, spoons, wedges, drills, drill bits, saws (circular saws, jigsaws, mitre saws and the like), sledge hammers, shovels, digging tools, plumbing tools, trowels, rakes, axes, hatchets and other tools. As with surgical tools, including the lighting unit 102 as part of the tool itself allows lighting a work area or work piece without the light being obscured by the tool or the user.

Figure 13:
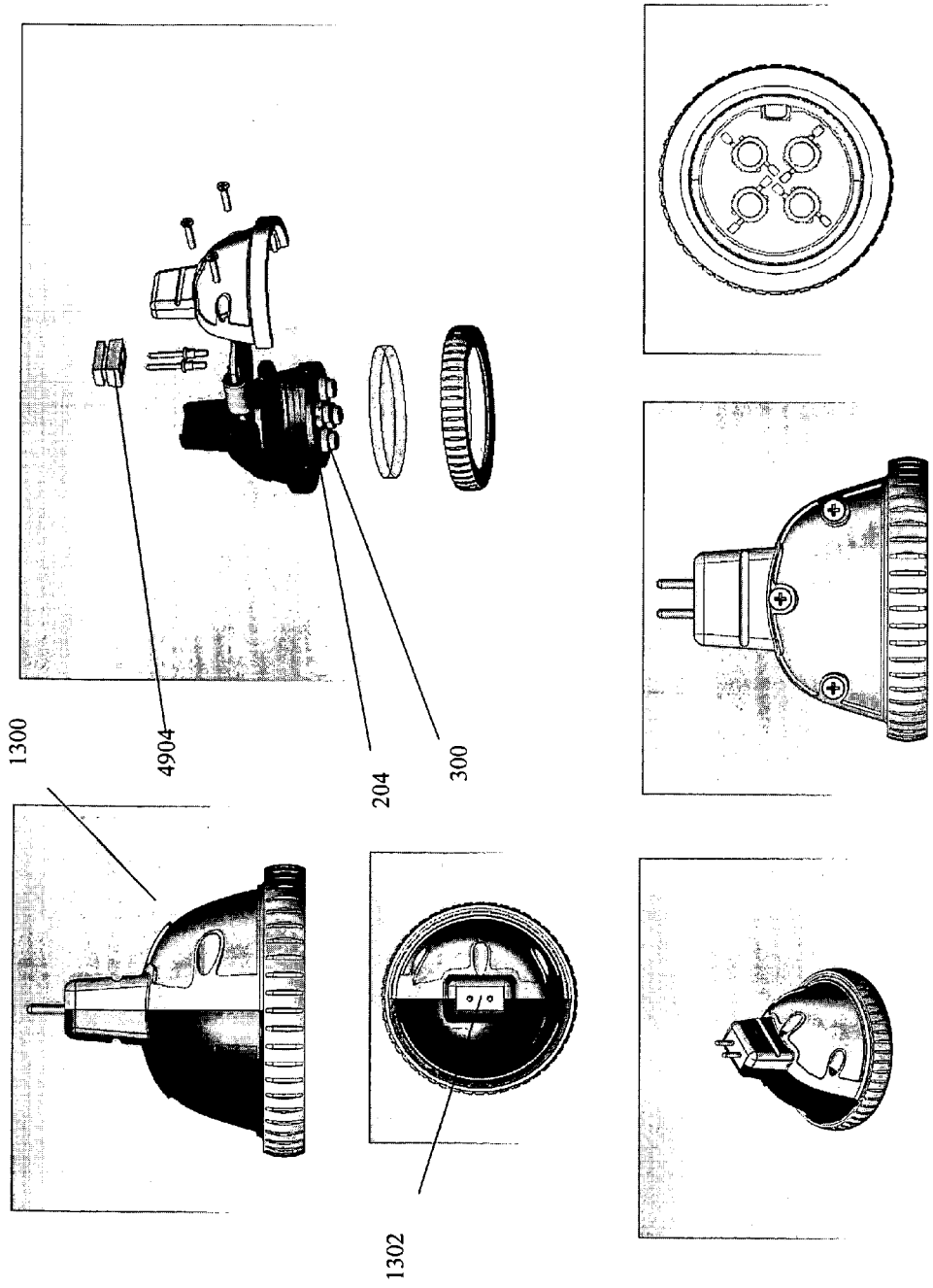
FIG. 13 depicts a housing for a retrofit lighting unit.

Referring to FIG. 13, a housing may be configured to resemble a conventional MR-type halogen fixture 1300. A rectangular opening 1302 in the housing 800 allows the positioning of a connector that serves as an interface 4904 between a socket into which the housing 800 is positioned and a board 204 that bears the light sources 300, which include a plurality of LEDs. The interface 4904 provides a mechanical, electrical and data connection between the board 204 and the socket into which the housing 800 is placed.

Figure 14A:
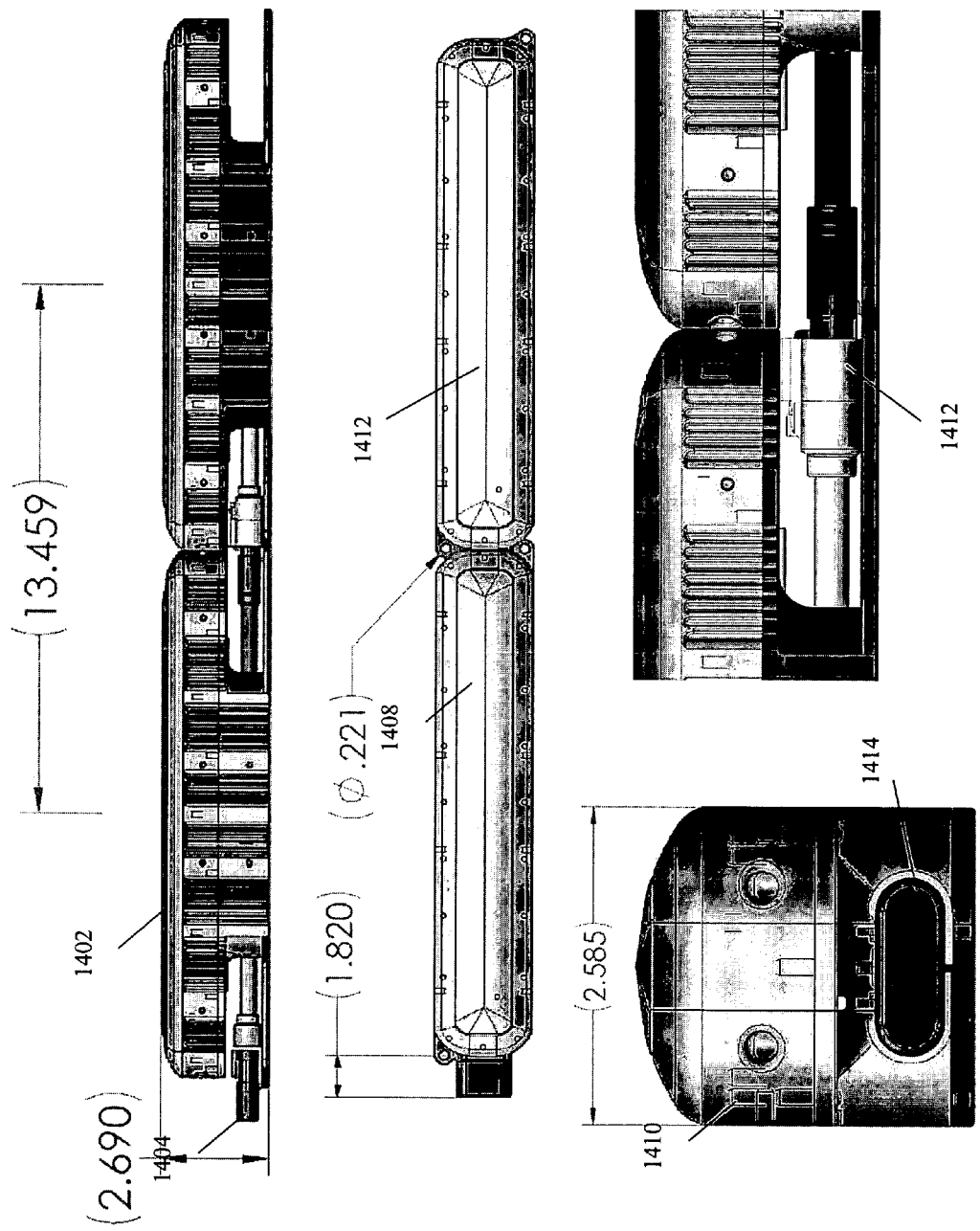
FIGS. 14a and 14b depict housings for a linear fixture.
Figure 14B:
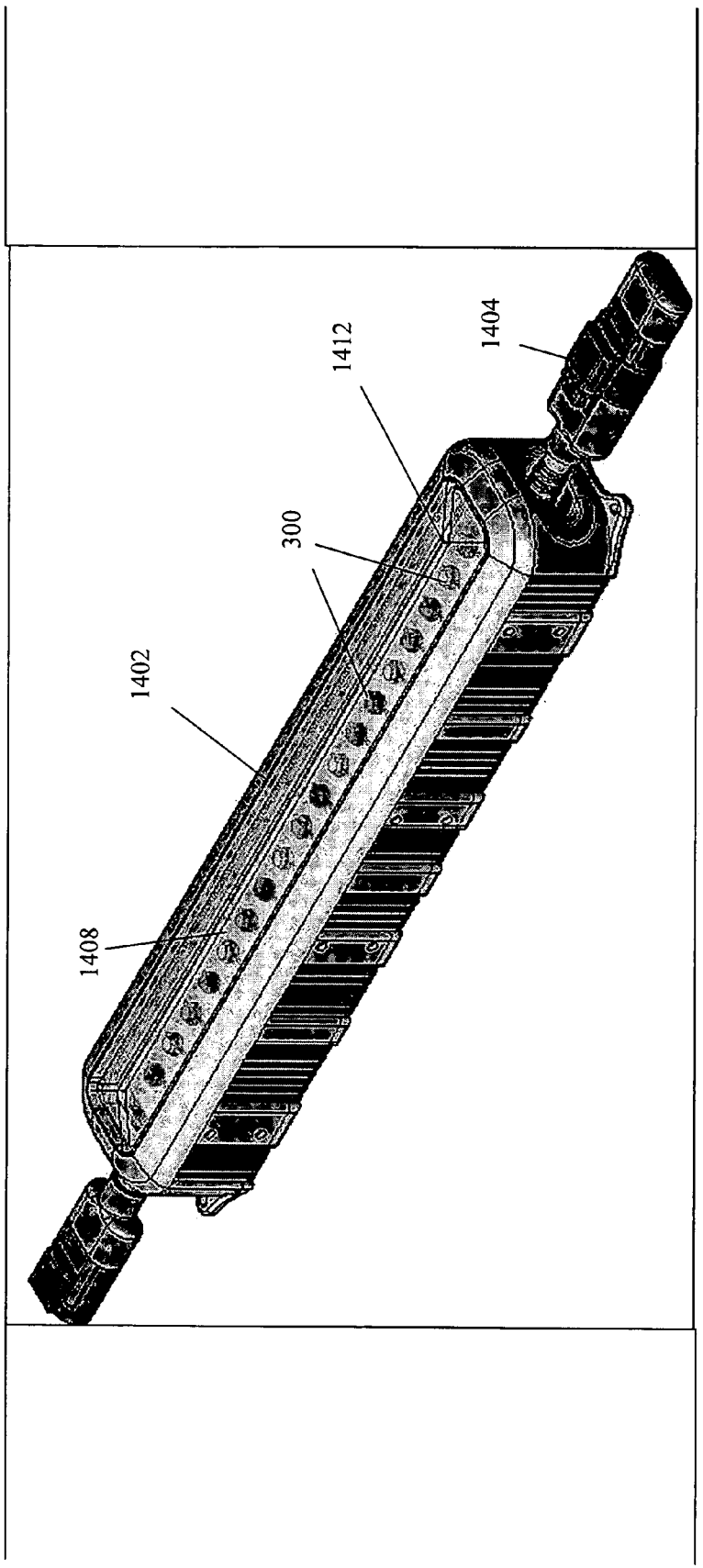

Referring to FIGS. 14a and 14b, a housing 800 may be a linear housing 1402. Referring to FIG. 14a, the housing may include connectors 1404 located at the ends of the linear housing 1402, so that separate modular units of the housing 1402 can be connected end-to-end at a junction 1412 with little spacing in between. The connectors 1404 of FIG. 14b extend from the housing 800. The connectors 1404 can be designed to transmit power and data from one lighting unit 102 to another lighting unit 102 having a similar linear housing 1402. The top of the housing can include a slot 1408 into which light sources 300 are disposed. The housing 800 can be fit with a lens 1412 for protecting the light sources 300 or shaping light coming from the light sources 300. The lens 1412 can be provided with a very tight seal, such as to prevent a user from touching the light sources 300 or any of the drive circuitry. In embodiments the housing 1402 may house drive circuitry for a high-voltage embodiment, as described in more detail below and in applications incorporated herein by reference. In embodiments the housing 1402 may include a cover 1414 for covering the connector 1404 if the connector is not in use. The linear housing 1402 can be deployed to produce many different effects in many different environments, as described in connection with other linear embodiments described herein. In one preferred embodiment, lighting units 102 with linear housings 1402 are strung end-to-end in an alcove to light the alcove. In another preferred embodiments, such lighting units 102 with linear housings 1402 are connected end-to-end across the base of a wall or other architectural feature to wash the wall or other feature with light of varying colors.

In embodiments a light source 300 may be equipped with a primary optical facility 1700, such as a lens, diode package, or phosphor for shaping, spreading or otherwise optically operating on photons that exit the semiconductor in an LED. For example, a phosphor may be used to convert UV or blue radiation coming out of a light source 300 into broader band illumination, such as white illumination. Primary optical facilities may include packages such as those used for one-watt, three-watt, five-watt and power packages offered by manufacturers such as LumiLeds, Nichia, Cree and Osram-Opto.

In one embodiment, the lighting unit 102 or a light source 300 of FIGS. 1 and 2 may include and/or be coupled to a power facility 1800. In various aspects, examples of power facilities 1800 include, but are not limited to, AC power sources, DC power sources, batteries, solar-based power sources, thermoelectric or mechanical-based power sources and the like. Additionally, in one aspect, the power facility 1800 may include or be associated with one or more power conversion devices that convert power received by an external power source to a form suitable for operation of the lighting unit 102.

Light sources 300 have varying power requirements. Accordingly, lighting units 102 may be provided with dedicated power supplies that take power from power lines and convert it to power suitable for running a lighting unit 102. Power supplies may be separate from lighting units 102 or may be incorporated on-board the lighting units 102 in power-on-board configurations. Power supplies may power multiple lighting units 102 or a single lighting unit 102. In embodiments power supplies may provide low-voltage output or high-voltage output. Power supplies may take line voltage or may take power input that is interrupted or modified by other devices, such as user interfaces 4908, such as switches, dials, sliders, dimmers, and the like.

In embodiments a line voltage power supply is integrated into a lighting system 100 and a power line carrier (PLC) serves as a power facility 1800 and as a control facility 3500 for delivering data to the lighting units 102 in the lighting system 100 over the power line. In other cases a lighting system 100 ties into existing power systems (120 or 220VAC), and the data is separately wired or provided through wireless.

A power facility 1800 may include a battery, such as a watch-style battery, such as Lithium, Alkaline, Silver-Zinc, Nickel-Cadmium, Nickel metal hydride, Lithium ion and others. The power facility 1800 may include a thin-form polymer battery that has the advantage of being very low profile and flexible, which can be useful for lighting unit configurations in flexible forms such as ribbons and tape. A power facility 1800 may also comprise a fuel cell, photovoltaic cell, solar cell or similar energy-producing facility. A power facility 1800 may be a supercapacitor, a large-value capacitor that can store much more energy than a conventional capacitor. Charging can be accomplished externally through electrical contacts and the lighting device can be reused. A power facility 1800 can include an inductive charging facility. An inductive charging surface can be brought in proximity to a lighting unit 102 to charge an onboard power source, allowing, for example, a housing 800 to be sealed to keep out moisture and contaminants.

Battery technologies typically generate power at specific voltage levels such as 1.2 or 1.5V DC. LED light sources 300, however, typically require forward voltages ranging from around 2V DC to 3.2V DC. As a result batteries may be put in series to achieve the required voltage, or a boost converter may be used to raise the voltage.

It is also possible to use natural energy sources as a power facility 1800, such as solar power, the body's own heat, mechanical power generation, the body's electrical field, wind power, water power, or the like.

Figure 15:
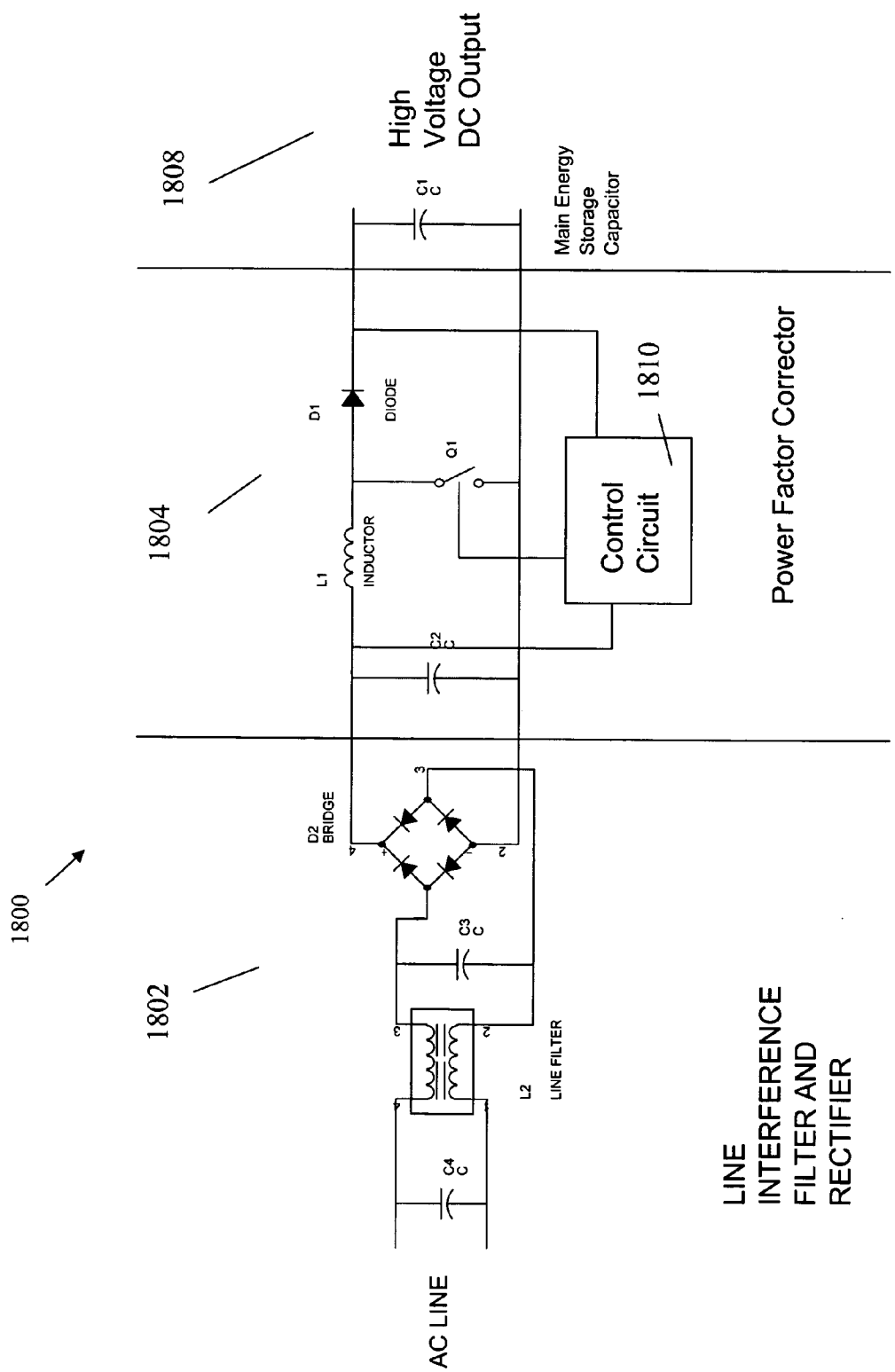
FIG. 15 depicts a power circuit for a lighting system with power factor correction.

Referring to FIG. 15, in embodiments it is desirable to supply power factor correction (PFC) to power for a lighting unit 102. In a power-factor-corrected lighting system 102, a line interference filter and rectifier 1802 may be used to remove interference from the incoming line power and to rectify the power. The rectified power can be delivered to a power factor corrector 1804 that operates under control of a control circuit 1810 to provide power factor correction, which is in turn used to provide a high voltage direct current output 1808 to the lighting unit 102. Many embodiments of power factor correction systems can be used as alternatives to the embodiment of FIG. 15.

Figure 16:
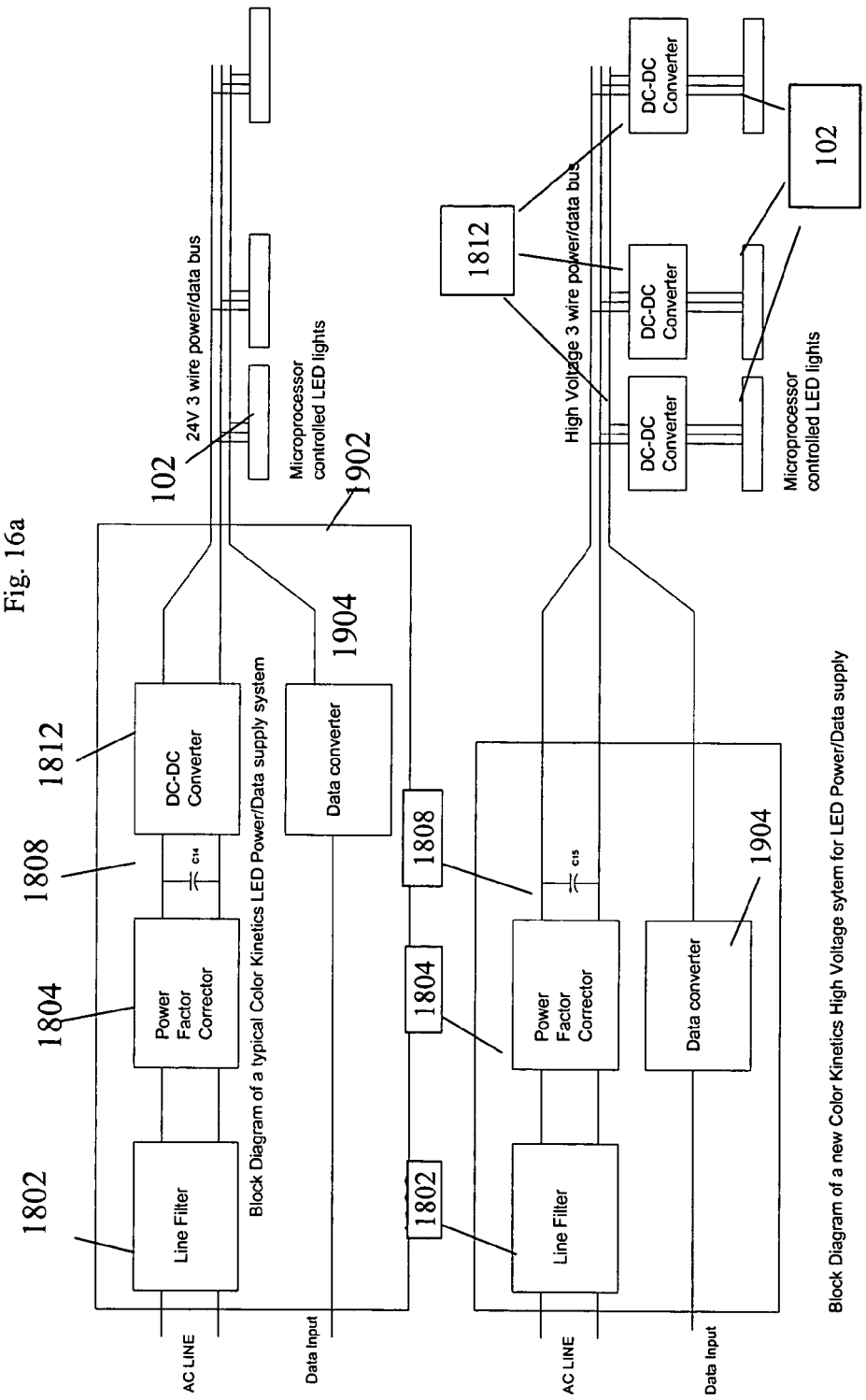
FIG. 16 depicts another embodiment of a power factor correction power system.

FIG. 16a shows an embodiment of a lighting system 100 with a power factor correction facility 1804. The line filter and rectifier 1802 takes power from the line, filters and rectifies the power, and supplies it to the power factor correction facility 1804. The embodiment of FIG. 16a includes a DC to DC converter 1812 that converts the output of the power factor correction facility 1804 to, for example, twenty-four volt power for delivery via a bus. The bus also carries data from a data converter 1904, which carries a control signal for the lighting units 102 that are attached to the bus that carries both the power and the data. In the embodiment of FIG. 16b, the DC to DC converter 1812 is disposed locally at each lighting unit 102, rather than in a central power supply as in FIG. 16a.

Figure 17:
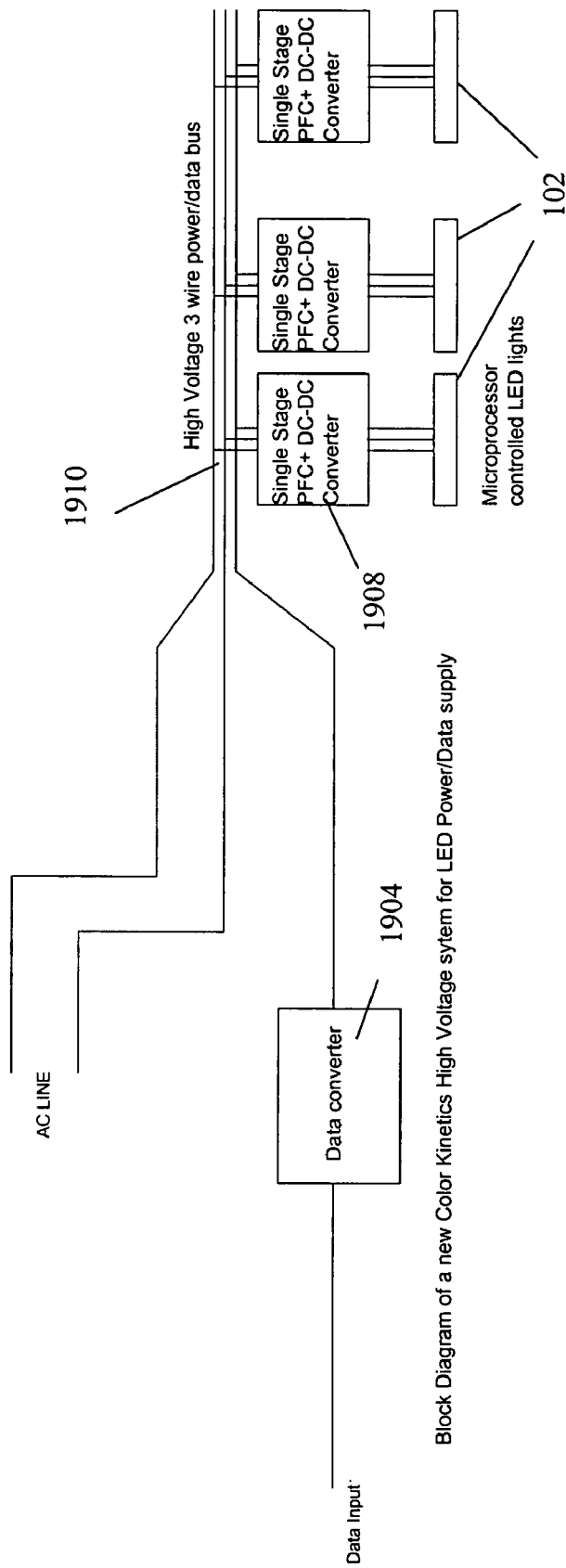
FIG. 17 depicts another embodiment of a power system for a lighting system that includes power factor correction.

FIG. 17 shows an embodiment where the power factor correction facility 1804 and DC to DC converter 1812 are integrated into a single stage power factor correction/DC to DC converter facility 1908 that is integrated with the lighting unit 102, rather than being contained in a separate power supply. The alternating current line power is delivered to a high-voltage three wire power/data bus 1910 that also carries input from a data converter 1904 that carries control signals for the lighting unit 102. Power factor correction and conversion to DC output voltages suitable for light sources 300 such as LEDs occurs at the lighting units 102. Unlike conventional power supplies where power factor correction is absent or present only in a separate power supply, the local power factor correction/DC to DC converter 1908 can take line voltage and correct it to an appropriate input for a LED light source 300 even if the line voltage has degraded substantially after a long run of wire. The configuration of FIG. 17 and other alternative embodiments that supply power factor correction and voltage conversion on board allow lighting units 102 to be configured in long strings over very large geometries, without the need to install separate power supplies for each lighting unit 102. Accordingly, it is one preferred embodiment of a power supply for disposing lighting units 102 on building exteriors and other large environments where it is inconvenient to install or maintain many separate power supplies.

Figure 18:
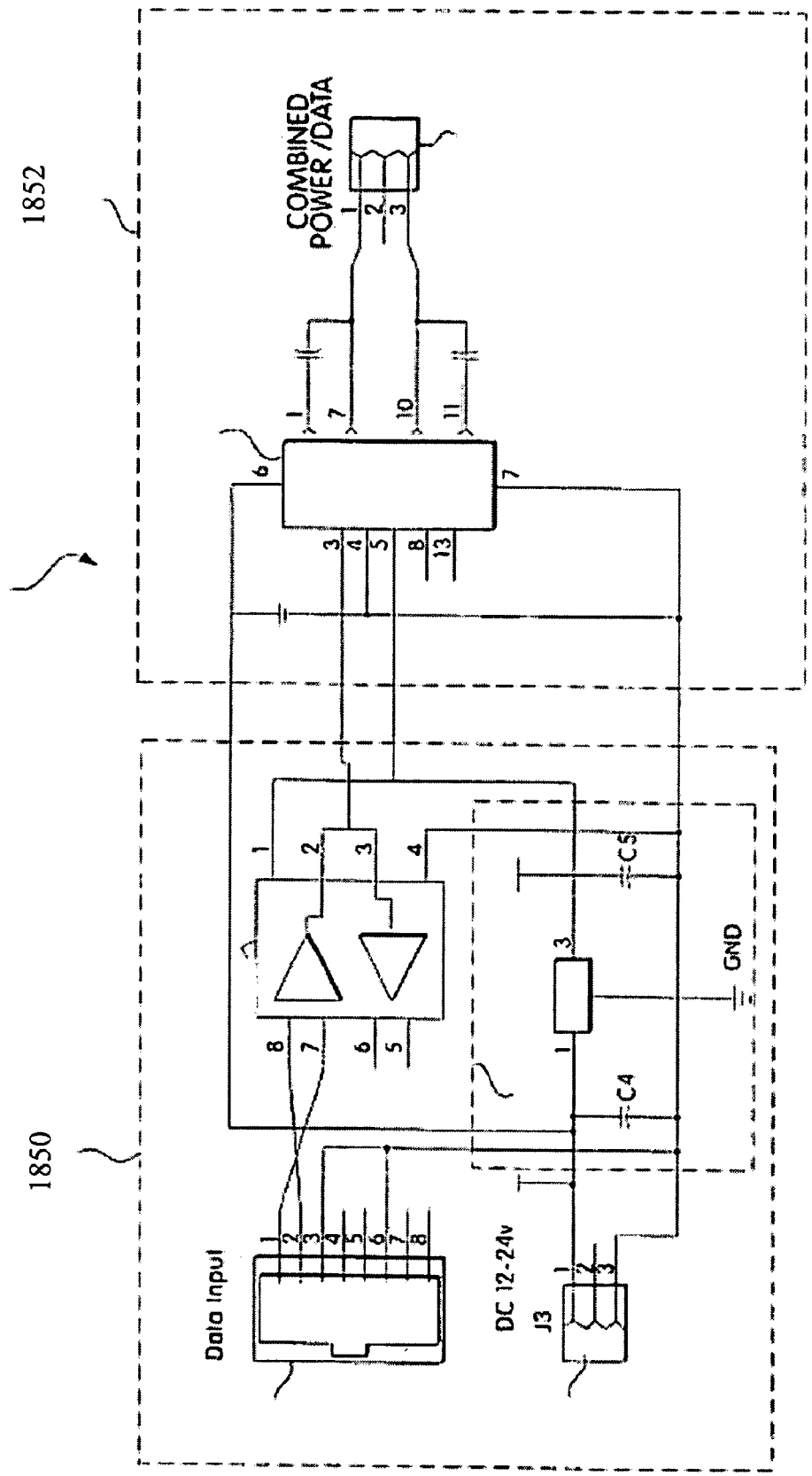
FIG. 18 depicts drive hardware for a lighting system.

In embodiments it is desirable to provide power and data over the same line. Referring to FIG. 18, a multiplexer 1850 takes a data input and a direct current power input and combines them to provide a combined power and data signal. 1852.

Figure 19:
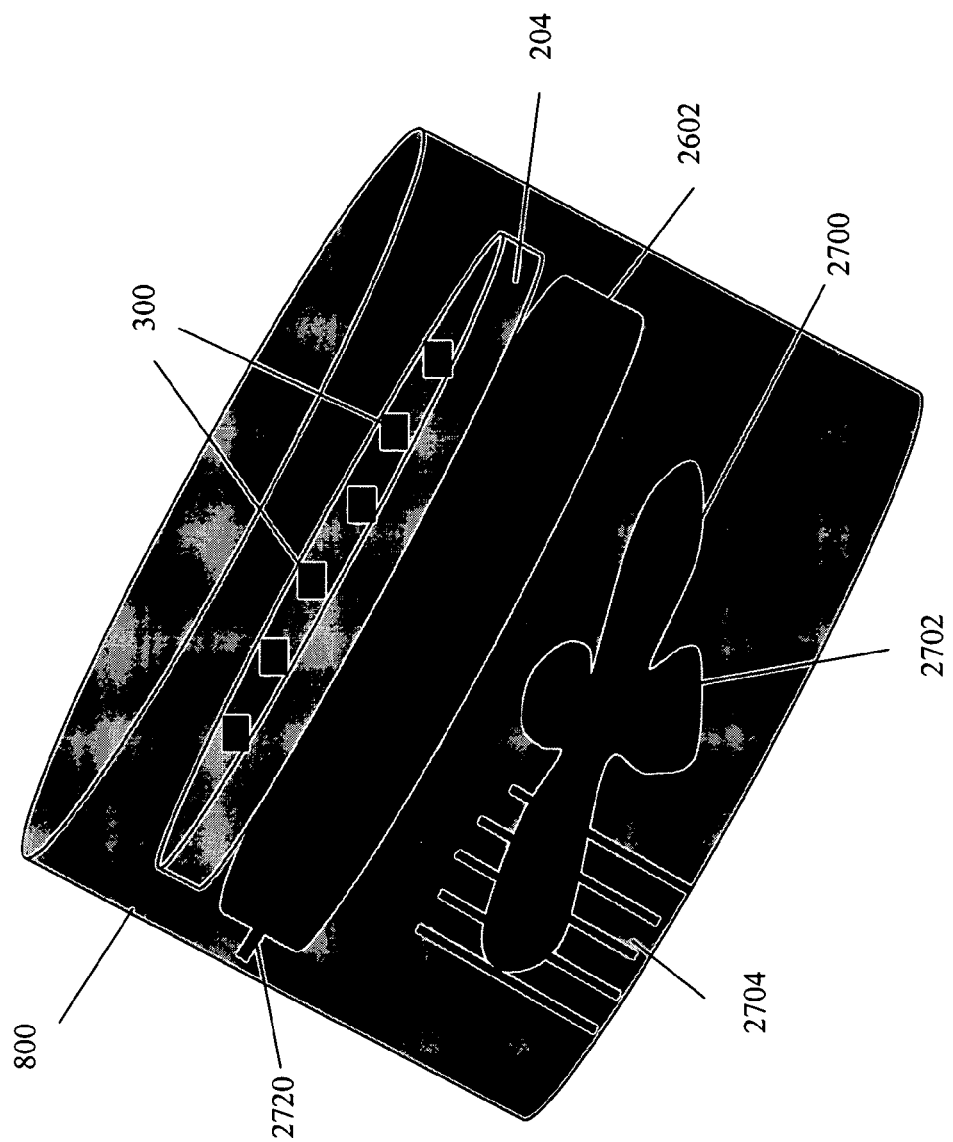
FIG. 19 depicts thermal facilities for a lighting system.

Semiconductor devices like LED light sources 300 can be damaged by heat; accordingly, a system 100 may include a thermal facility 2500 for removing heat from a lighting unit 102. Referring to FIG. 19, the thermal facility 2500 may be any facility for managing the flow of heat, such as a convection facility 2700, such as a fan 2702 or similar mechanism for providing air flow to the lighting unit 102, a pump or similar facility for providing flow of a heat-conducting fluid, a vent 2704 for allowing flow of air, or any other kind of convection facility 2700. A fan 2702 or other convection facility 2700 can be under control of a processor 3600 and a temperature sensor such as a thermostat to provide cooling when necessary and to remain off when not necessary.

The thermal facility 2500 can also be a conduction facility 2600, such as a conducting plate or pad of metal, alloy, or other heat-conducting material, a gap pad 2602 between a board 204 bearing light sources 300 and another facility, a thermal conduction path between heat-producing elements such as light sources 300 and circuit elements, or a thermal potting facility, such as a polymer for coating heat-producing elements to receive and trap heat away from the light sources 300. The thermal facility 2500 may be a radiation facility 2800 for allowing heat to radiate away from a lighting unit 102. A fluid thermal facility 2900 can permit flow of a liquid or gas to carry heat away from a lighting unit 102. The fluid may be water, a chlorofluorocarbon, a coolant, or the like. In a preferred embodiment a conductive plate is aluminum or copper. In embodiments a thermal conduction path 2720 conducts heat from a circuit board 204 bearing light sources 300 to a housing 800, so that the housing 800 radiates heat away from the lighting unit 102.

Figure 20:
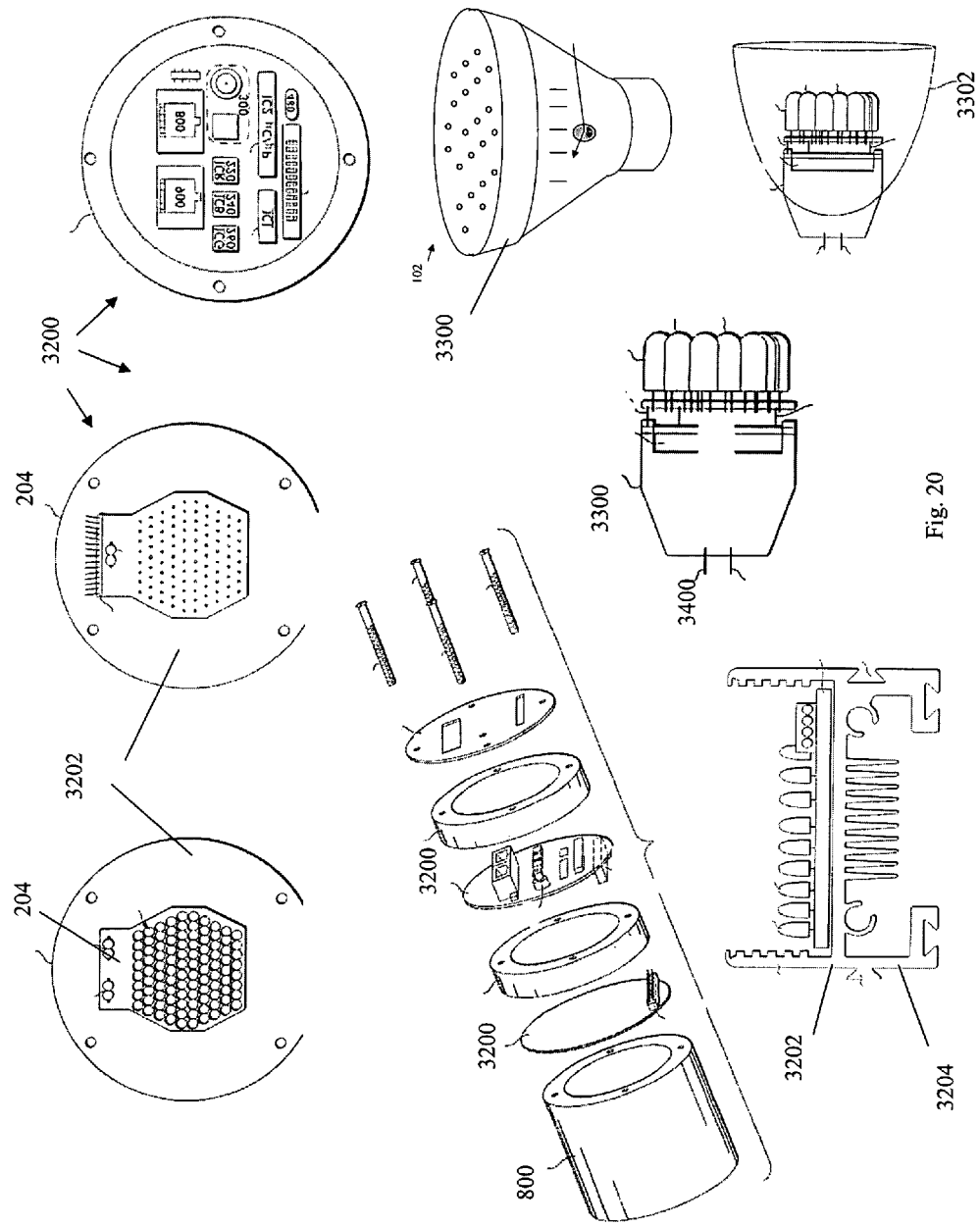
FIG. 20 depicts mechanical interfaces for lighting systems.

Referring to FIG. 20, a mechanical interface 3200 may be provided for connecting a lighting unit 102 or light source 300 mechanically to a platform, housing 800, mounting, board, other lighting unit 102, or other product or system. In embodiments the mechanical interface 3200 may be a modular interface for removably and replaceably connecting a lighting unit 102 to another lighting unit 102 or to a board 204. A board 204 may include a lighting unit 102, or it may include a power facility for a lighting unit 102.

In embodiments the modular interface 3202 comprises a board 204 with a light source 300 on one side and drive circuit elements on the other side, or two boards 204 with the respective elements on opposite sides and the boards 204 coupled together. The modular interface 3202 may be designed to allow removal or replacement of a lighting unit 102, either in the user environment of the lighting unit 102 or at the factory. In embodiments a lighting unit 102 has a mechanical retrofit interface 3300 for allowing it to fit the housing of a traditional lighting source, such as a halogen bulb 3302. In embodiments the modular interface 3200 is designed to allow multiple lighting units 102 to fit together, such as a modular block 3204 with teeth, slots, and other connectors that allow lighting units 102 to serve as building blocks for larger systems of lighting units 102.

In embodiments the retrofit interface 3300 allows the lighting unit 102 to retrofit into the mechanical structure of a traditional lighting source, such as screw for an Edison-mount socket, pins for a Halogen socket, ballasts for a fluorescent fixture, or the like.

In embodiments the mechanical interface is a socket interface 3400, such as to allow the lighting unit 102 to fit into any conventional type of socket, which in embodiments may be a socket equipped with a control facility 3500, i.e., a smart socket.

In embodiments the mechanical interface 3200 is a circuit board 204 on which a plurality of light sources 300 are disposed. The board 204 can be configured to fit into a particular type of housing 800, such as any of the housings 800 described above. In embodiments the board 204 may be moveably positioned relative to the position of the housing 800. A control facility may adjust the position of the board 204.

A kit may be provided for producing an illumination system, which may include light sources 300, components for a control facility 3500, and instructions for using the control facility components to control the light sources 300 to produce an illumination effect.

In embodiments a control facility 3500 for a light source 300 may be disposed on a second board 204, so that the control facility 3500 can be moveably positioned relative to the board 204 on which the light sources 300 are disposed. In embodiments the board for the control facility 3500 and the board 204 for the light sources 300 are configured to mechanically connect in a modular way, permitting removal and replacement of one board 204 relative to the other, whether during manufacturing or in the field.

A developer's kit may be provided including light sources 300, a circuit board 204 and instructions for integrating the board 204 into a housing 800. A board 204 with light sources 300 may be provided as a component for a manufacturer of a lighting system 100. The component may further include a chip, firmware, and instructions or specifications for configuring the system into a lighting system 100.

In embodiments a board 204 carrying LEDs may be configured to fit into an architectural lighting fixture housing 800 or other housing 800 as described above.

In embodiments, a light source 300 can be configured with an off-axis mounting facility or a light shade that selectively allows light to shine through in certain areas and not in others. These techniques can be used to reduce glare and light shining directly into the eyes of a user of the lighting unit 102. Snap-on lenses can be used atop the light-emitting portion to allow for a much wider selection of light patterns and optical needs. In embodiments a disk-shaped light source 300 emits light in one off-axis direction. The light can then be rotated about the center axis to direct the light in a desired direction. The device may be simply picked up, rotated, and placed back down using the fastening means such as magnetic or clamp (see below for more fastening options) or may simply incorporate a rotational mechanism.

Figure 21:
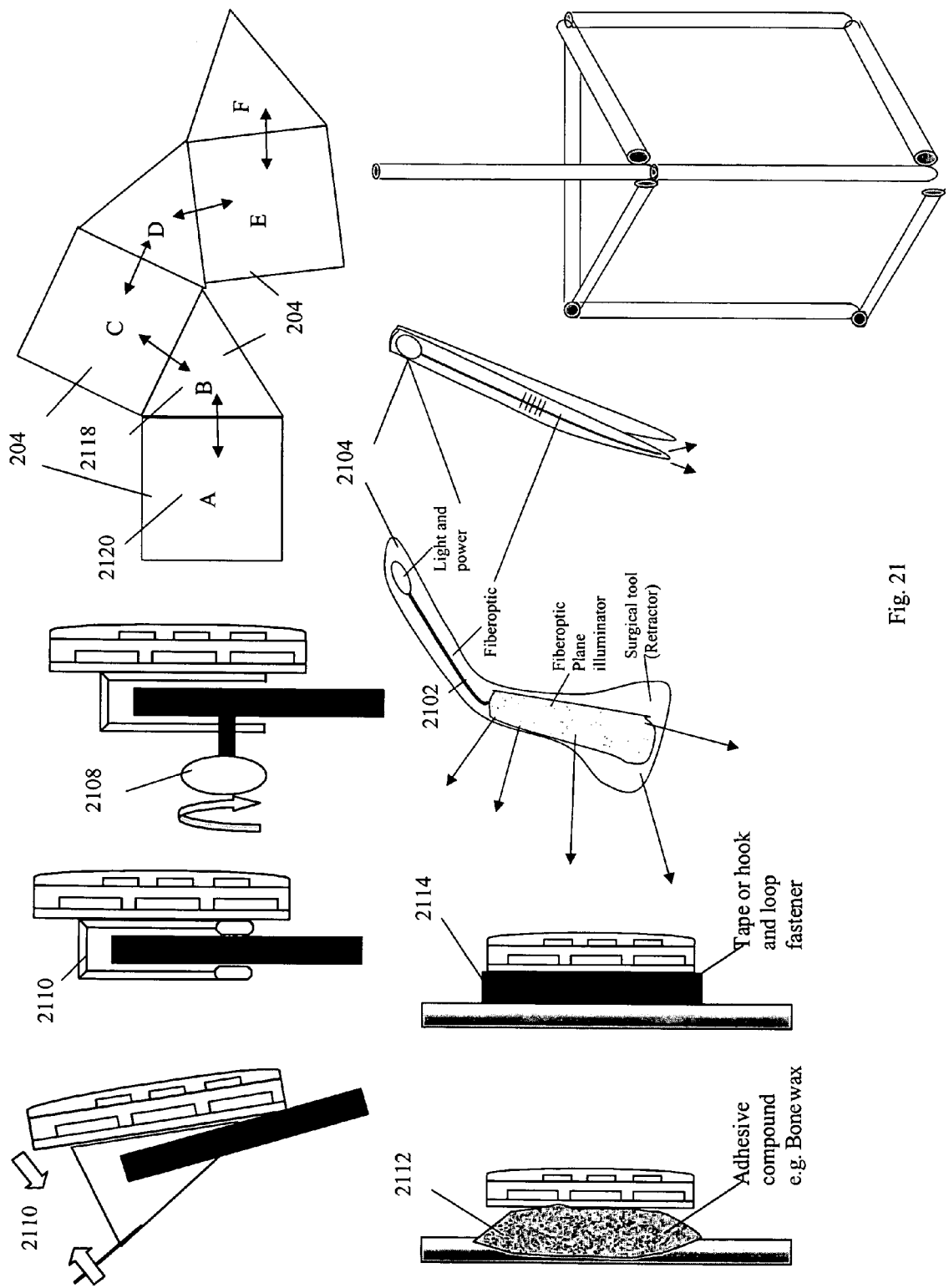
FIG. 21 depicts additional mechanical interfaces for lighting systems.

Referring to FIG. 21, in embodiments the mechanical interface 3200 may connect light sources 300 to fiber bundles 2102 to create flexible lighting units 102. A lighting unit 102 can be configured to be incorporated directly in a tool 2104, so that the fiber transports the light to another part of the tool 2104. This would allow the light source 300 to be separated from the 'working' end of the tool 2104 but still provide the lighting unit 102 without external cabling and with only a short efficient length of fiber. An electro-luminescent panel can be used wherein the power is supplied via onboard power in the form of a battery or a cable or wire to an off board source.

A mechanical interface 3200 may include facilities for fastening lighting units 102 or light sources 300, such as to platforms, tools, housing or the like. Embodiments include a magnetic fastening facility. In embodiments a lighting unit 102 is clamped or screwed into a tool or instrument. For example, a screw-type clamp 2108 can be used to attach a lighting unit 102 to another surface. A toggle-type clamp can be used, such as De-Sta-Co style clamps as used in the surgical field. A clip or snap-on facility can be used to attach a lighting unit 102 and allow flexing elements. A flexible clip 2110 can be added to the back of a lighting device 102 to make it easy to attach to another surface. A spring-clip, similar to a binder clip, can be attached to the back of a lighting unit 102. A flexing element can provide friction when placed on another surface. Fasteners can include a spring-hinge mechanism, string, wire, Ty-wraps, hook and loop fastener 2114, adhesives or the like. Fastening materials include bone wax 2112; a beeswax compound (sometimes mixed with Vaseline), which can be hand, molded, and can also be used for holding the lighting device 102. The exterior of the lighting device 102 can be textured to provide grip and holding power to facilitate the fastening. Tapes, such as surgical DuoPlas tape from Sterion, are another example of materials that can be used to fasten the light to tools, instruments, and drapes or directly to the patient.

Mechanical interfaces 3200 configured as boards 204 on which light sources 300 are disposed can take many shapes, including shapes that allow the boards 204 to be used as elements, such as tiles, to make up larger structures. Thus, a board 204 can be a triangle 2118, square 2120, hexagon, or other element that can serve as a subunit of a larger pattern, such as a two-dimensional planar pattern or a three-dimensional object, such as a regular polyhedron or irregular object.

Referring to FIG. 22, boards 204 can provide a mechanical and electrical connection 2202, such as with matching tabs and spaces that fit into each other to hold the boards 204 together. Such boards can build large structures. For example, a large number of triangular boards 2118 can be arranged together to form a substantially spherical configuration 2204 that resembles a large ball, with individual lighting units 102 distributed about the entire perimeter to shine light in substantially all directions from the ball sphere 2204.

Figure 23:
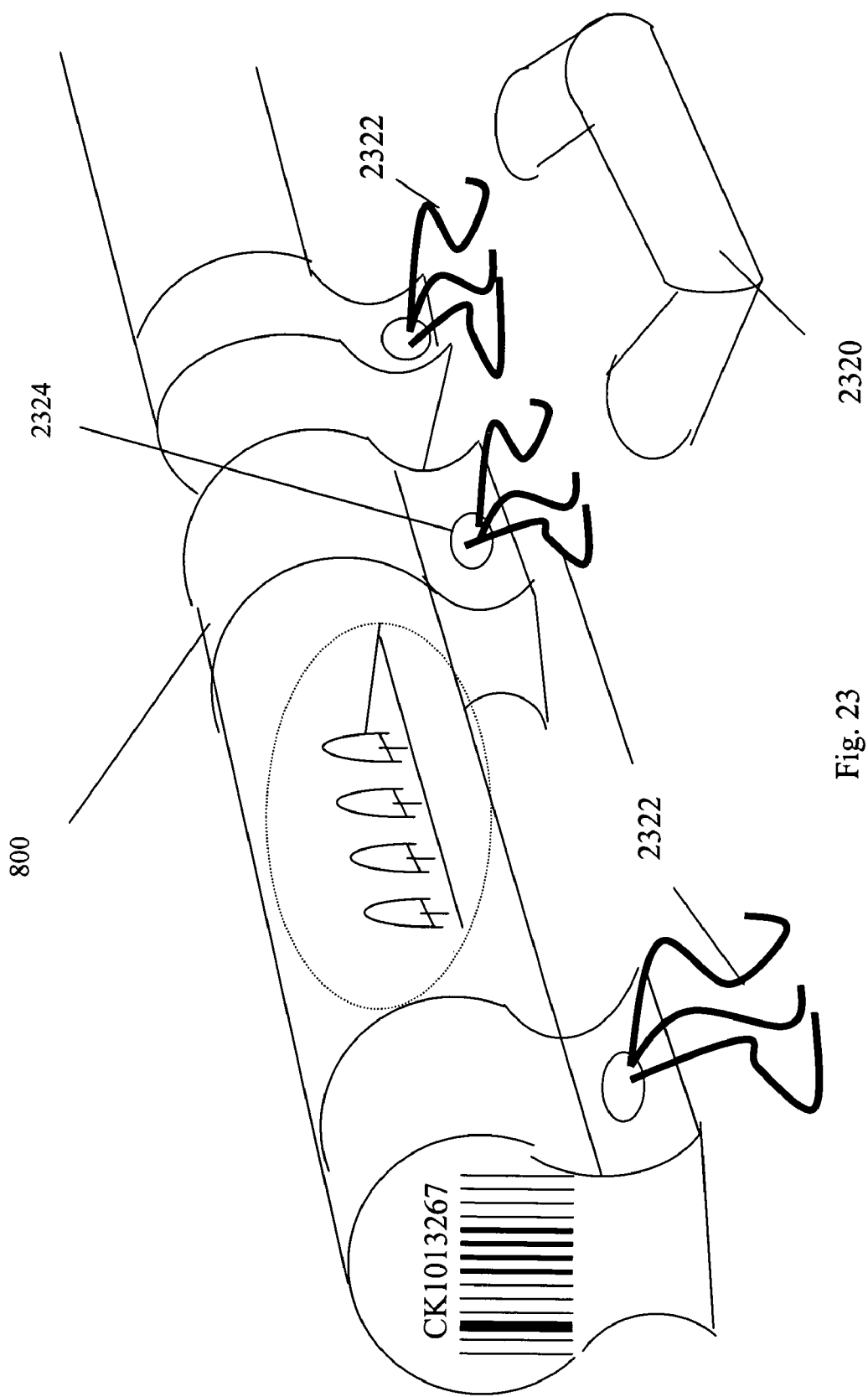
FIG. 23 depicts a mechanical interface for connecting two linear lighting units.

FIG. 14 showed a mechanical interface 3200 for connecting two linear lighting units 102 end-to-end. Another mechanical interface 3200 is seen in FIG. 23, where cables 2322 exit a portal 2324 in the housing 800 and enter a similar portal 2324 in the housing 800 of the next linear unit 102, so that the two units 102 can be placed end-to-end. A protective cover 2320 can cover the cables 2322 between the units 102. The cables 2322 can carry power and data between the units 102.

In embodiments, mechanical interfaces 3200 can include thermal facilities 2500 such as those described above as well as facilities for delivering power and data.

A control facility 3500 may produce a signal for instructing a light system 100 lighting unit 102 to produce a desired light output, such as a mixture of light from different light sources 300. Control facilities can be local to a lighting unit 102 or remote from the lighting unit 102. Multiple lighting units 102 can be linked to central control facilities 3500 or can have local control facilities 3500. Control facilities can use a wide range of data protocols, ranging from simple switches for "on" and "off" capabilities to complex data protocols such as Ethernet and DMX.

Referring to FIG. 24a, a control facility 3500 may include drive hardware 3800 for delivering controlled current to one or more light sources 300. Referring to FIGS. 24a and 24b, control signals from a control facility 3500, such as a central data source, are used by a processor 3600 that controls the drive hardware 3800, causing current to be delivered to the light sources 300 in the desired intensities and durations, often in very rapid pulses of current, such as in pulse width modulation or pulse amplitude modulation, or combinations of them, as described below. Two examples of drive hardware 3800 circuits are shown in FIG. 24, but many alternative embodiments are possible, including those described in the patent incorporated by reference herein. Referring to FIG. 24c in embodiments power from a power facility 1800 and data from a control facility 3500 are delivered together as an input 2402. A dipswitch 2408 can be used to provide a processor 3600 with a unique address, so that the lighting unit 102 responds to control signals intended for that particular lighting unit 102. The processor 3600 reads the power/data input and drives the drive hardware 3800 to provide current to the light sources 300.

In embodiments the control facility 3500 includes the processor 3600. "Processor" or "controller" describes various apparatus relating to the operation of one or more light sources. A processor or controller can be implemented in numerous ways, such as with dedicated hardware, using one or more microprocessors that are programmed using software (e.g., microcode or firmware) to perform the various functions discussed herein, or as a combination of dedicated hardware to perform some functions and programmed microprocessors and associated circuitry to perform other functions. The terms "program" or "computer program" are used herein in a generic sense to refer to any type of computer code (e.g., software or microcode) that can be employed to program one or more processors or controllers, including by retrieval of stored sequences of instructions.

In particular, in a networked lighting system environment, as discussed in greater detail further below (e.g., in connection with FIG. 2), as data is communicated via the network, the processor 3600 of each lighting unit coupled to the network may be configured to be responsive to particular data (e.g., lighting control commands) that pertain to it (e.g., in some cases, as dictated by the respective identifiers of the networked lighting units). Once a given processor identifies particular data intended for it, it may read the data and, for example, change the lighting conditions produced by its light sources according to the received data (e.g., by generating appropriate control signals to the light sources). In one aspect, a data facility 3700 of each lighting unit 102 coupled to the network may be loaded, for example, with a table of lighting control signals that correspond with data the processor 3600 receives. Once the processor 3600 receives data from the network, the processor may consult the table to select the control signals that correspond to the received data, and control the light sources of the lighting unit accordingly.

In one aspect of this embodiment, the processor 3600 of a given lighting unit, whether or not coupled to a network, may be configured to interpret lighting instructions/data that are received in a DMX protocol (as discussed, for example, in U.S. Pat. No. 6,016,038 and 6,211,626), which is a lighting command protocol conventionally employed in the lighting industry for some programmable lighting applications. However, it should be appreciated that lighting units suitable for purposes of the present invention are not limited in this respect, as lighting units according to various embodiments may be configured to be responsive to other types of communication protocols so as to control their respective light sources.

In other embodiments the processor 3600 may be an application specific integrated circuit, such as one configured to respond to instructions according to a protocol, such as the DMX protocol, Ethernet protocols, or serial addressing protocols where each ASIC responds to control instructions directed to it, based on the position of the ASIC in a string of similar ASICs.

In various implementations, a processor or controller may be associated with a data facility 3700, which can comprise one or more storage media (generically referred to herein as "memory," e.g., volatile and non-volatile computer memory such as RAM, PROM, EPROM, and EEPROM, floppy disks, compact disks, optical disks, magnetic tape, etc.). In some implementations, the storage media may be encoded with one or more programs that, when executed on one or more processors and/or controllers, perform at least some of the functions discussed herein. Various storage media may be fixed within a processor or controller or may be transportable, such that the one or more programs stored thereon can be loaded into a processor or controller so as to implement various aspects of the present invention discussed herein.

In embodiments the data storage facility 3700 stores information relating to control of a lighting unit 102. For example, the data storage facility may be memory employed to store one or more lighting programs for execution by the processor 3600 (e.g., to generate one or more control signals for the light sources), as well as various types of data useful for generating variable color radiation (e.g., calibration information, information relating to techniques for driving light sources 300, information relating to addresses for lighting units 102, information relating to effects run on lighting units 102, and may other purposes as discussed further herein). The memory also may store one or more particular identifiers (e.g., a serial number, an address, etc.) that may be used either locally or on a system level to identify the lighting unit 102. In various embodiments, such identifiers may be pre-programmed by a manufacturer or alterable by the manufacturer, for example, and may be either alterable or non-alterable thereafter (e.g., via some type of user interface located on the lighting unit, via one or more data or control signals received by the lighting unit, etc.). Alternatively, such identifiers may be determined at the time of initial use of the lighting unit in the field, and again may be alterable or non-alterable thereafter. The data storage facility 3700 may also be a disk, diskette, compact disk, random access memory, read only memory, SRAM, DRAM, database, data mart, data repository, cache, queue, or other facility for storing data, such as control instructions for a control facility 3500 for a lighting unit 102. Data storage may occur locally with the lighting unit, in a socket or housing 800, or remotely, such as on a server or in a remote database. In embodiments the data storage facility 3700 comprises a player that stores shows that can be triggered through a simple interface.

The drive facility 3800 may include drive hardware 3802 for driving one or more light sources 300. In embodiments the drive hardware 3802 comprises a current sink, such as a switch 3900, such as for turning on the current to a light source 300. In embodiments the switch 3900 is under control of the processor 3600, so that the switch 3900 can turn on or off in response to control signals. In embodiments the switch turns on and off in rapid pulses, such as in pulse width modulation of the current to the LEDs, which results in changes in the apparent intensity of the LED, based on the percentage of the duty cycle of the pulse width modulation technique during which the switch is turned on.

The drive hardware 3802 may include a voltage regulator 4000 for controlling voltage to a light source, such as to vary the intensity of the light coming from the light source 300.

The drive hardware 3802 may include a feed-forward drive circuit 4100 such as described in the patent applications incorporated herein by reference.

The drive hardware 3802 may include an inductive loop drive circuit 4200 such as in the patent applications incorporated herein by reference.

Various embodiments of the present invention are directed generally to methods and apparatus for providing and controlling power to at least some types of loads, wherein overall power efficiency typically is improved and functional redundancy of components is significantly reduced as compared to conventional arrangements. In different aspects, implementations of methods and apparatus according to various embodiments of the invention generally involve significantly streamlined circuits having fewer components, higher overall power efficiencies, and smaller space requirements.

In some embodiments, a controlled predetermined power is provided to a load without requiring any feedback information from the load (i.e., without monitoring load voltage and/or current). Furthermore, in one aspect of these embodiments, no regulation of load voltage and/or load current is required. In another aspect of such embodiments in which feedback is not required, isolation components typically employed between a DC output voltage of a DC-DC converter (e.g., the load supply voltage) and a source of power derived from an AC line voltage (e.g., a high DC voltage input to the DC-DC converter) in some cases may be eliminated, thereby reducing the number of required circuit components. In yet another aspect, eliminating the need for a feedback loop generally increases circuit speed and avoids potentially challenging issues relating to feedback circuit stability.

Based on the foregoing concepts, one embodiment of the present invention is directed to a "feed-forward" driver for an LED-based light source. Such a feed-forward driver combines the functionality of a DC-DC converter and a light source controller, and is configured to control the intensity of light generated by the light source based on modulating the average power delivered to the light source in a given time period, without monitoring or regulating the voltage or current provided to the light source. In one aspect of this embodiment, the feed-forward driver is configured to store energy to and release energy from an energy transfer device using a "discontinuous mode" switching operation. This type of switching operation facilitates the transfer of a predictable quantum of energy per switching cycle, and hence a predictable controlled power delivery to the light source.

In embodiments the drive hardware 3802 includes at least one energy transfer element to store input energy based on an applied input voltage and to provide output energy to a load at an output voltage. The drive hardware 3802 may include at least one switch coupled to the at least one energy transfer element to control at least the input energy stored to the at least one energy transfer element and at least one switch controller configured to control the at least one switch, wherein the at least one switch controller does not receive any feedback information relating to the load to control the at least one switch.

As shown in FIG. 1, the lighting unit 102 also may include the processor 3600 that is configured to output one or more control signals to drive the light sources 300 so as to generate various apparent intensities of light from the light sources. For example, in one implementation, the processor 3600 may be configured to output at least one control signal for each light source so as to independently control the intensity of light generated by each light source. Some examples of control signals that may be generated by the processor to control the light sources include, but are not limited to, pulse modulated signals, pulse width modulated signals (PWM), pulse amplitude modulated signals (PAM), pulse displacement modulated signals, analog control signals (e.g., current control signals, voltage control signals), combinations and/or modulations of the foregoing signals, or other control signals. In one aspect, the processor 3600 may control other dedicated circuitry that in turn controls the light sources so as to vary their respective intensities.

Lighting systems in accordance with this specification can operate light sources 300 such as LEDs in an efficient manner. Typical LED performance characteristics depend on the amount of current drawn by the LED. The optimal efficacy may be obtained at a lower current than the level where maximum brightness occurs. LEDs are typically driven well above their most efficient operating current to increase the brightness delivered by the LED while maintaining a reasonable life expectancy. As a result, increased efficacy can be provided when the maximum current value of the PWM signal may be variable. For example, if the desired light output is less than the maximum required output the current maximum and/or the PWM signal width may be reduced. This may result in pulse amplitude modulation (PAM), for example; however, the width and amplitude of the current used to drive the LED may be varied to optimize the LED performance. In an embodiment, a lighting system may also be adapted to provide only amplitude control of the current through the LED. While many of the embodiments provided herein describe the use of PWM and PAM to drive the LEDs, one skilled in the art would appreciate that there are many techniques to accomplish the LED control described herein and, as such, the scope of the present invention is not limited by any one control technique. In embodiments, it is possible to use other techniques, such as pulse frequency modulation (PFM), or pulse displacement modulation (PDM), such as in combination with either or both of PWM and PAM.

Pulse width modulation (PWM) involves supplying a substantially constant current to the LEDs for particular periods of time. The shorter the time, or pulse-width, the less brightness an observer will observe in the resulting light. The human eye integrates the light it receives over a period of time and, even though the current through the LED may generate the same light level regardless of pulse duration, the eye will perceive short pulses as "dimmer" than longer pulses. The PWM technique is considered on of the preferred techniques for driving LEDs, although the present invention is not limited to such control techniques. When two or more colored LEDs are provided in a lighting system, the colors may be mixed and many variations of colors can be generated by changing the intensity, or perceived intensity, of the LEDs. In an embodiment, three colors of LEDs are presented (e.g., red, green and blue) and each of the colors is driven with PWM to vary its apparent intensity. This system allows for the generation of millions of colors (e.g., 16.7 million colors when 8-bit control is used on each of the PWM channels).

In an embodiment the LEDs are modulated with PWM as well as modulating the amplitude of the current driving the LEDs (Pulse Amplitude Modulation, or PAM). LED efficiency as a function of the input current increases to a maximum followed by decreasing efficiency. Typically, LEDs are driven at a current level beyond maximum efficiency to attain greater brightness while maintaining acceptable life expectancy. The objective is typically to maximize the light output from the LED while maintaining an acceptable lifetime. In an embodiment, the LEDs may be driven with a lower current maximum when lower intensities are desired. PWM may still be used, but the maximum current intensity may also be varied depending on the desired light output. For example, to decrease the intensity of the light output from a maximum operational point, the amplitude of the current may be decreased until the maximum efficiency is achieved. If further reductions in the LED brightness are desired the PWM activation may be reduced to reduce the apparent brightness.

One issue that may arise in connection with controlling multiple light sources 300 in the lighting unit 102, and controlling multiple lighting units 102 in a lighting system relates to potentially perceptible differences in light output between substantially similar light sources. For example, given two virtually identical light sources being driven by respective identical control signals, the actual intensity of light output by each light source may be perceptibly different. Such a difference in light output may be attributed to various factors including, for example, slight manufacturing differences between the light sources, normal wear and tear over time of the light sources that may differently alter the respective spectrums of the generated radiation, etc. For purposes of the present discussion, light sources for which a particular relationship between a control signal and resulting intensity are not known are referred to as "uncalibrated" light sources.

The use of one or more uncalibrated light sources in the lighting unit 102 may result in generation of light having an unpredictable, or "uncalibrated," color or color temperature. For example, consider a first lighting unit including a first uncalibrated red light source and a first uncalibrated blue light source, each controlled by a corresponding control signal having an adjustable parameter in a range of from zero to 255 (0-255). For purposes of this example, if the red control signal is set to zero, blue light is generated, whereas if the blue control signal is set to zero, red light is generated. However, if both control signals are varied from non-zero values, a variety of perceptibly different colors may be produced (e.g., in this example, at very least, many different shades of purple are possible). In particular, perhaps a particular desired color (e.g., lavender) is given by a red control signal having a value of 125 and a blue control signal having a value of 200.

Now consider a second lighting unit including a second uncalibrated red light source substantially similar to the first uncalibrated red light source of the first lighting unit, and a second uncalibrated blue light source substantially similar to the first uncalibrated blue light source of the first lighting unit. As discussed above, even if both of the uncalibrated red light sources are driven by respective identical control signals, the actual intensity of light output by each red light source may be perceptibly different. Similarly, even if both of the uncalibrated blue light sources are driven by respective identical control signals, the actual intensity of light output by each blue light source may be perceptibly different.

With the foregoing in mind, it should be appreciated that if multiple uncalibrated light sources are used in combination in lighting units to produce a mixed colored light as discussed above, the observed color (or color temperature) of light produced by different lighting units under identical control conditions may be perceivably different. Specifically, consider again the "lavender" example above; the "first lavender" produced by the first lighting unit with a red control signal of 125 and a blue control signal of 200 indeed may be perceptibly different than a "second lavender" produced by the second lighting unit with a red control signal of 125 and a blue control signal of 200. More generally, the first and second lighting units generate uncalibrated colors by virtue of their uncalibrated light sources.

In view of the foregoing, in one embodiment of the present invention, the lighting unit 102 includes a calibration facility to facilitate the generation of light having a calibrated (e.g., predictable, reproducible) color at any given time. In one aspect, the calibration facility is configured to adjust the light output of at least some light sources of the lighting unit so as to compensate for perceptible differences between similar light sources used in different lighting units.

For example, in one embodiment, the processor 3600 of the lighting unit 102 is configured to control one or more of the light sources 300 so as to output radiation at a calibrated intensity that substantially corresponds in a predetermined manner to a control signal for the light source(s). As a result of mixing radiation having different spectra and respective calibrated intensities, a calibrated color is produced. In one aspect of this embodiment, at least one calibration value for each light source is stored in the data facility 3700, and the processor 3600 is programmed to apply the respective calibration values to the control signals for the corresponding light sources so as to generate the calibrated intensities.

In one aspect of this embodiment, one or more calibration values may be determined once (e.g., during a lighting unit manufacturing/testing phase) and stored in memory 3700 for use by the processor 3600. In another aspect, the processor 3600 may be configured to derive one or more calibration values dynamically (e.g. from time to time) with the aid of one or more photosensors, for example. In various embodiments, the photosensor(s) may be one or more external components coupled to the lighting unit, or alternatively may be integrated as part of the lighting unit itself. A photosensor is one example of a signal source that may be integrated or otherwise associated with the lighting unit 102, and monitored by the processor 3600 in connection with the operation of the lighting unit. Other examples of such signal sources are discussed further below, in connection with the signal source 8400.

One exemplary method that may be implemented by the processor 3600 to derive one or more calibration values includes applying a reference control signal to a light source, and measuring (e.g., via one or more photosensors) an intensity of radiation thus generated by the light source. The processor may be programmed to then make a comparison of the measured intensity and at least one reference value (e.g., representing an intensity that nominally would be expected in response to the reference control signal). Based on such a comparison, the processor may determine one or more calibration values for the light source. In particular, the processor may derive a calibration value such that, when applied to the reference control signal, the light source outputs radiation having an intensity that corresponds to the reference value (i.e., the "expected" intensity).

In various aspects, one calibration value may be derived for an entire range of control signal/output intensities for a given light source. Alternatively, multiple calibration values may be derived for a given light source (i.e., a number of calibration value "samples" may be obtained) that are respectively applied over different control signal/output intensity ranges, to approximate a nonlinear calibration function in a piecewise linear manner.

Figure 25C:
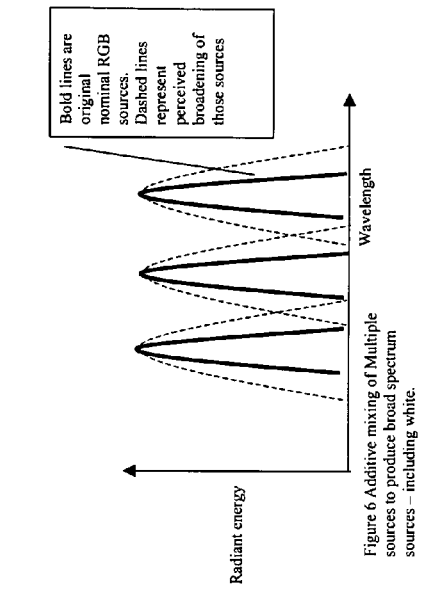
FIG. 25 depicts methods for driving lighting systems.
Figure 25D:
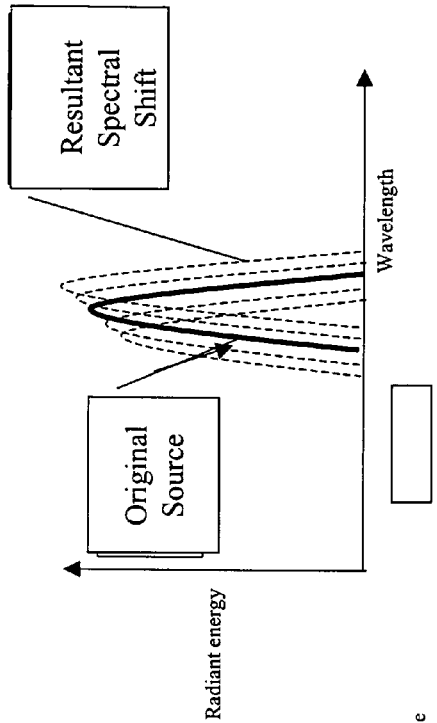

Referring to FIG. 25c, typically an LED produces a narrow emission spectrum centered on a particular wavelength; i.e. a fixed color. Through the use of multiple LEDs and additive color mixing a variety of apparent colors can be produced, as described elsewhere herein.

In conventional LED-based light systems, constant current control is often preferred because of lifetime issues. Too much current can destroy an LED or curtail useful life. Too little current produces little light and is an inefficient or ineffective use of the LED.

The light output from a semiconductor illuminator may shift in wavelength as a result in changes in current. In general, the shift in output has been thought to be undesirable for most applications, since a stable light color is often preferred to an unstable one. Recent developments in LED light sources with higher power ratings (>100mA) have made it possible to operate LED systems effectively without supplying maximum current. Such operational ranges make it possible to provide LED-based lighting units 102 that have varying wavelength outputs as a function of current. Thus, different wavelengths of light can be provided by changing the current supplied to the LEDs to produce broader bandwidth colors (potentially covering an area, rather than just a point, in the chromaticity diagram of FIG. 26), and to produce improved quality white light. This calibration technique not only changes the apparent intensity of the LEDs (reflecting the portion of the duty cycle of a pulse width modulation signal during which the LED is on as compared to the portion during which it is off), but also shifting the output wavelength or color. Current change can also broaden the narrow emission of the source, shifting the saturation of the light source towards a broader spectrum source. Thus, current control of LEDs allows controlled shift of wavelength for both control and calibration purposes.

In the visible spectrum, roughly 400 to 700 nm, the sensitivity of the eye varies according to wavelength. The sensitivity of the eye is least at the edges of that range and peaks at around 555 nm in the middle of the green.

Figure 25A:
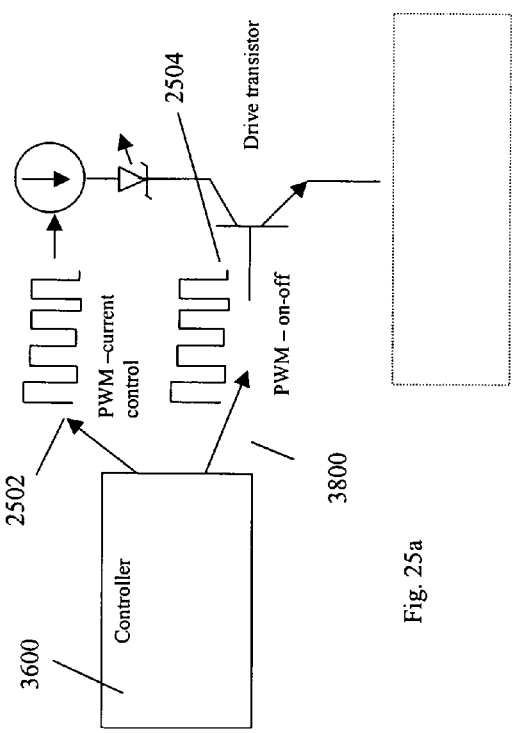
Figure 25B:
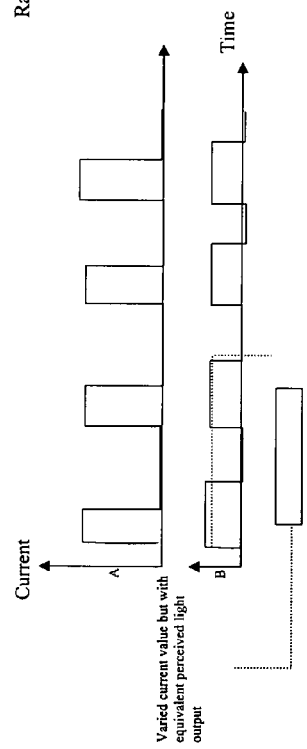

Referring to FIG. 25b, a schematic diagram shows pulse shapes for a PWM signal. By rapidly changing the current and simultaneously adjusting the intensity via PWM, a broader spectrum light source can be produced. FIG. 25b shows two PWM signals. The two PWM signals vary both in current level and width. The top one has a narrower pulse-width, but a higher current level than the bottom one. The result is that the narrower pulse offsets the increased current level in the top signal. As a result, depending on the adjustment of the two factors (on-time and current level) both light outputs could appear to be of similar brightness. The control is a balance between current level and the on time. FIG. 25a shows an embodiment of a drive facility 3800 for simultaneous current control and on-off control under the control of a processor 3600.

Controlled spectral shifting can also be used to adjust for differences between light sources 300, such as differences between individual light sources 300 from the same vendor, or different lots, or "bins," of light sources 300 from different vendors, such as to produce lighting units 102 that produce consistent color and intensity from unit to unit, notwithstanding the use of different kinds of light sources 300 in the respective lighting units 102.

FIG. 25c shows the effect of changing both the current and adjusting the PWM for the purposes of creating a better quality white by shifting current and pulse-widths simultaneously and then mixing multiple sources, such as RG & B, to produce a high quality white. The spectrum is built up by rapidly controlling the current and on-times to produce multiple shifted spectra. Thus, the original spectrum is shifted to a broader-spectrum by current shifts, while coordinated control of intensity is augmented by changes in PWM.

Current control can be provided with various embodiments, including feedback loops, such as using a light sensor as a signal source 8400, or a lookup table or similar facility that stores light wavelength and intensity output as a function of various combinations of pulse-width modulation and pulse amplitude modulation.

In embodiments, a lighting system can produce saturated colors for one purpose (entertainment, mood, effects), while for another purpose it can produce a good quality variable white light whose color temperature can be varied along with the spectral properties. Thus a single fixture can have narrow bandwidth light sources for multicolor light applications and then can change to a current and PWM control mode to get broad spectra to make good white light or non-white light with broader spectrum color characteristics. In addition, the control mode can be combined with various optical facilities 400 described above to further control the light output from the system. In embodiments, the methods and systems can include a control loop and fast current sources to allow an operator to sweep about a broad spectrum. This could be done in a feed-forward system or with feedback to insure proper operation over a variety of conditions.

The control facility 3500 can switch between a current-control mode 2502 (which itself could be controlled by a PWM stream) and a separate PWM mode 2504. Such a system can include simultaneous current control via PWM for wavelength and PWM control balanced to produce desired output intensity and color. FIG. 25a shows a schematic diagram with one possible embodiment for creating the two control signals from a controller, such as a microprocessor to control one or more LEDs in a string. Multiple such strings can be used to create a light fixture that can vary in color (HSB) and spectrum based on the current and on-off control. The PWM signal can also be a PWM Digital-to-analog converter (DAC) such as those from Maxim and others. Note that the functions that correspond to particular values of output can be calibrated ahead of time by determining nominal values for the PWM signals and the resultant variations in the LED output. These can be stored in lookup tables or a function created that allows the mapping of desired values from LED control signals.

It may even be desirable to overdrive the LEDs. Although the currents would be above nominal operating parameters as described by the LED manufacturers, this can provide more light than normally feasible. The power source will also be drained faster, but the result can be a much brighter light source.

Modulation of lighting units 102 can include a data facility 3700, such as a look-up table, that determines the current delivered to light sources 300 based on predetermined values stored in the data facility 3700 based on inputs, which may include inputs from signal sources 8400, sensors, or the like.

It is also possible to drive light sources 300 with constant current, such as to produce a single color of light.

The methods and systems disclosed herein also include a variety of methods and systems for light control, including central control facilities 3500 as well as control facilities that are local to lighting units 102. One grouping of control facilities 3500 includes dimmer controls, including both wired and wireless dimmer control. Traditional dimmers can be used with lighting units 102, not just in the traditional way using voltage control or resistive load, but rather by using a processor to scale and control output by interpreting the levels of voltage. In combination with a style and interface that is familiar to most people because of the ubiquity of dimmer switches, one aspect of the present specification allows the position of a dimmer switch (linear or rotary) to indicate color temperature or intensity through a power cycle control. That is, the mode can change with each on or off cycle. A special switch can allow multiple modes without having to turn off the lights. An example of a product that uses this technique is the Color Dial, available from Color Kinetics.

Figure 26:
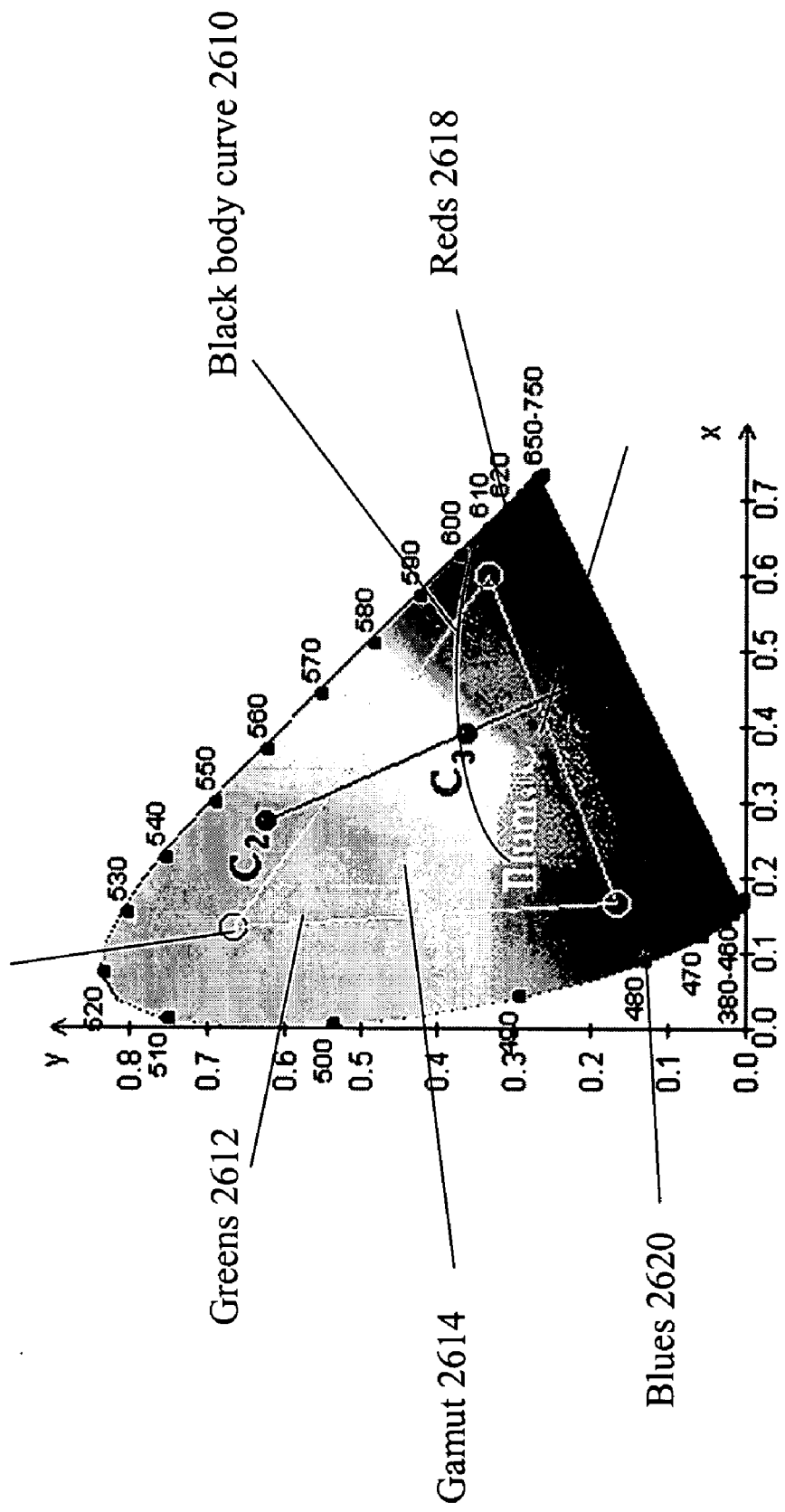
FIG. 26 depicts a chromaticity diagram for a lighting system.

Referring to FIG. 26, a chromaticity diagram shows a range of colors that can be viewed by the human eye. The gamut 2614 defines the range of colors that it is possible to produce by additively mixing colors from multiple sources, such as three LEDs. Green LEDs produce light in a green region 2612, red LEDs produce light in a red region 2618 and blue LEDs produce light in a blue region 2620. Mixing these colors produces mixed light output, such as in the overlapping areas between the regions, including those for orange, purple and other mixed light colors. Mixing all three sources produces white light, such as along a black body curve 1310. Different mixtures produce different color temperatures of white light along or near the black body curve 2610. Typically an LED produces a narrow emission spectrum centered on a particular wavelength; i.e. a fixed color and a single point on the chromaticity diagram. Through the use of multiple LEDs and additive color mixing a variety of apparent colors can be produced. In embodiments the gamut 2614 may be determined by a program stored on the data storage facility 3700, rather than by the light output capacities of light sources 300. For example, a more limited gamut 2614 may be defined to ensure that the colors within the gamut 2614 can be consistently produced by all light sources 300 across a wide range of lighting units 102, even accounting for lower quality light sources 300. Thus, such a program can improve consistency of lighting units 102 from unit to unit.

The photopic response of the human eye varies across different colors for a given intensity of light radiation. For example, the human eye may tend to respond more effectively to green light than to blue light of the same intensity. As a result, a lighting unit 102 may seem dimmer if turned on blue than the same lighting unit 102 seems when turned on green. However, in installations of multiple lighting units 102, users may desire that different lighting units 102 have similar intensities when turned on, rather than having some lighting units 102 appear dim while others appear bright. A program can be stored on a data storage facility 3700 for use by the processor 3600 to adjust the pulses of current delivered to the light sources 300 (and in turn the apparent intensity of the light sources) based on the predicted photopic response of the human eye to the color of light that is called for by the processor 3600 at any given time. A lookup table or similar facility can associate each color with a particular intensity scale, so that each color can be scaled relative to all others in apparent intensity. The result is that lighting units 102 can be caused to deliver light output along isoluminance curves (similar to topographic lines on a map) throughout the gamut 2614, where each curve represents a common level of apparent light output of the lighting unit 102. The program can account for the particular spectral output characteristics of the types of light sources 300 that make up a particular type of lighting unit 102 and can account for differences in the light sources 300 between different lighting units 102, so that lighting units 102 using different light sources 300, such as from different vendors, can nevertheless provide light output of consistent intensity at any given color.

A control interface 4900 may be provided for a lighting unit 102. The interface can vary in complexity, ranging from having minimal control, such as "on-off" control and dimming, to much more extensive control, such as producing elaborate shows and effects using a graphical user interface for authoring them and using network systems to deliver the shows and effects to lighting units 102 deployed in complex geometries.

Referring to FIG. 27a, it is desirable to provide a light system manager 5000 to manage a plurality of lighting units 102 or light systems 100.

Referring to FIG. 27b, the light system manager 5000 is provided, which may consist of a combination of hardware and software components. Included is a mapping facility 5002 for mapping the locations of a plurality of light systems. The mapping facility may use various techniques for discovering and mapping lights, such as described herein or as known to those of skill in the art. Also provided is a light system composer 5004 for composing one or more lighting shows that can be displayed on a light system. The authoring of the shows may be based on geometry and an object-oriented programming approach, such as the geometry of the light systems that are discovered and mapped using the mapping facility, according to various methods and systems disclosed herein or known in the art. Also provided is a light system engine, for playing lighting shows by executing code for lighting shows and delivering lighting control signals, such as to one or more lighting systems, or to related systems, such as power/data systems, that govern lighting systems. Further details of the light system manager 5000, mapping facility 5002, light system composer 5004 and light system engine 5008 are provided herein.

The light system manager 5000, mapping facility 5002, light system composer 5004 and light system engine 5008 may be provided through a combination of computer hardware, telecommunications hardware and computer software components. The different components may be provided on a single computer system or distributed among separate computer systems.

Figure 28:
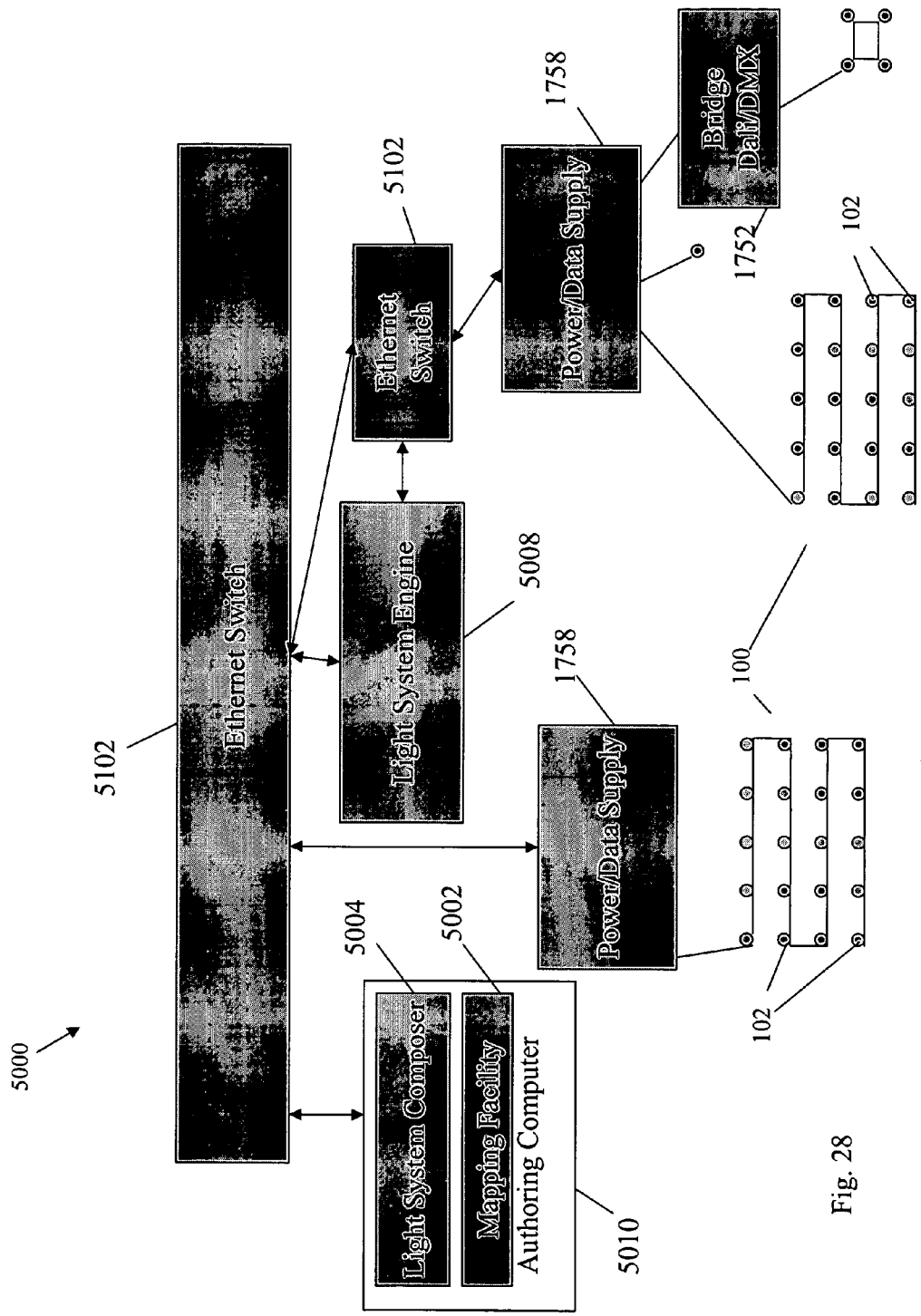
FIG. 28 depicts a configuration for a networked lighting system.

Referring to FIG. 28, in an embodiment, the mapping facility 5002 and the light system composer 5004 are provided on an authoring computer 5010. The authoring computer 5010 may be a conventional computer, such as a personal computer. In embodiments the authoring computer 5010 includes conventional personal computer components, such as a graphical user interface, keyboard, operating system, memory, and communications capability. In embodiments the authoring computer 5010 operates with a development environment with a graphical user interface, such as a Windows environment. The authoring computer 5010 may be connected to a network, such as by any conventional communications connection, such as a wire, data connection, wireless connection, network card, bus, Ethernet connection, Firewire, 802.11 facility, Bluetooth, or other connection. In embodiments, such as in FIG. 28, the authoring computer 5010 is provided with an Ethernet connection, such as via an Ethernet switch 5102, so that it can communicate with other Ethernet-based devices, optionally including the light system engine 5008, a light system itself (enabled for receiving instructions from the authoring computer 5010), or a power/data supply (PDS) 1758 that supplies power and/or data to a light system 100 comprised of one or more lighting units 102. The mapping facility 5002 and the light system composer 5004 may comprise software applications running on the authoring computer 5010.

Referring still to FIG. 28, in an architecture for delivering control systems for complex shows to one or more light systems, shows that are composed using the authoring computer 5010 are delivered via an Ethernet connection through one or more Ethernet switches to the light system engine 5008. The light system engine 5008 downloads the shows composed by the light system composer 5004 and plays them, generating lighting control signals for light systems. In embodiments, the lighting control signals are relayed by an Ethernet switch to one or more power/data supplies and are in turn relayed to light systems that are equipped to execute the instructions, such as by turning LEDs on or off, controlling their color or color temperature, changing their hue, intensity, or saturation, or the like. In embodiments the power/data supply may be programmed to receive lighting shows directly from the light system composer 5004. In embodiments a bridge may be programmed to convert signals from the format of the light system engine 5008 to a conventional format, such as DMX or DALI signals used for entertainment lighting.

Figure 29:
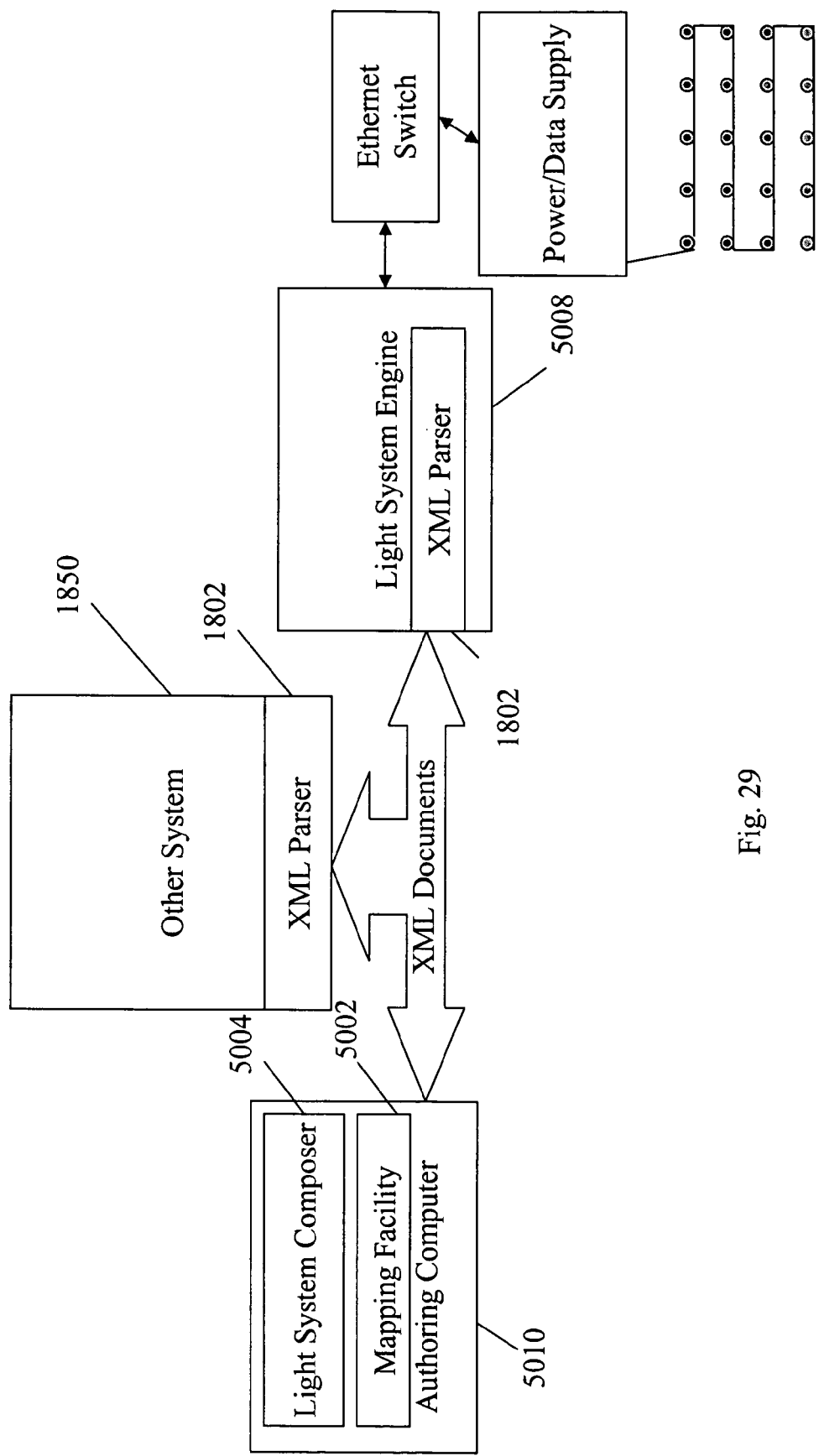
FIG. 29 depicts an XML parser environment for a lighting system.

Referring to FIG. 29, in embodiments the lighting shows composed using the light system composer 5004 are compiled into simple scripts that are embodied as XML documents. The XML documents can be transmitted rapidly over Ethernet connections. In embodiments, the XML documents are read by an XML parser of the light system engine 5008. Using XML documents to transmit lighting shows allows the combination of lighting shows with other types of programming instructions. For example, an XML document type definition may include not only XML instructions for a lighting show to be executed through the light system engine 5008, but also XML with instructions for another computer system, such as a sound system, and entertainment system, a multimedia system, a video system, an audio system, a sound-effect system, a smoke effect system, a vapor effect system, a dry-ice effect system, another lighting system, a security system, an information system, a sensor-feedback system, a sensor system, a browser, a network, a server, a wireless computer system, a building information technology system, or a communication system.

Thus, methods and systems provided herein include providing a light system engine for relaying control signals to a plurality of light systems, wherein the light system engine plays back shows. The light system engine 5008 may include a processor, a data facility, an operating system and a communication facility. The light system engine 5008 may be configured to communicate with a DALI or DMX lighting control facility. In embodiments, the light system engine communicates with a lighting control facility that operates with a serial communication protocol. In embodiments the lighting control facility is a power/data supply for a lighting unit 102.

In embodiments, the light system engine 5008 executes lighting shows downloaded from the light system composer 5004. In embodiments the shows are delivered as XML files from the light system composer 5004 to the light system engine 5008. In embodiment the shows are delivered to the light system engine over a network. In embodiments the shows are delivered over an Ethernet facility. In embodiments the shows are delivered over a wireless facility. In embodiments the shows are delivered over a Firewire facility. In embodiments shows are delivered over the Internet.

In embodiments lighting shows composed by the light system composer 5004 can be combined with other files from another computer system, such as one that includes an XML parser that parses an XML document output by the light system composer 5004 along with XML elements relevant to the other computer. In embodiments lighting shows are combined by adding additional elements to an XML file that contains a lighting show. In embodiments the other computer system comprises a browser and the user of the browser can edit the XML file using the browser to edit the lighting show generated by the lighting show composer. In embodiments the light system engine 5008 includes a server, wherein the server is capable of receiving data over the Internet. In embodiments the light system engine 5008 is capable of handling multiple zones of light systems, wherein each zone of light systems has a distinct mapping. In embodiments the multiple zones are synchronized using the internal clock of the light system engine 5008.

The methods and systems included herein include methods and systems for providing a mapping facility 5002 of the light system manager 5000 for mapping locations of a plurality of light systems. In embodiments, the mapping system discovers lighting systems in an environment, using techniques described above. In embodiments, the mapping facility then maps light systems in a two-dimensional space, such as using a graphical user interface.

In embodiments of the invention, the light system engine 5008 comprises a personal computer with a Linux operating system. In embodiments the light system engine is associated with a bridge to a DMX or DALI system.

A light system 100 may include a network interface 4902 for delivering data from a control facility 3500 to one or more light systems 100, which may include one or more lighting units 102. The term "network" as used herein refers to any interconnection of two or more devices (including controllers or processors) that facilitates the transport of information (e.g. for device control, data storage, data exchange, etc.) between any two or more devices and/or among multiple devices coupled to the network. As should be readily appreciated, various implementations of networks suitable for interconnecting multiple devices may include any of a variety of network topologies and employ any of a variety of communication protocols. Additionally, in various networks according to the present invention, any one connection between two devices may represent a dedicated connection between the two systems, or alternatively a non-dedicated connection. In addition to carrying information intended for the two devices, such a non-dedicated connection may carry information not necessarily intended for either of the two devices (e.g., an open network connection). Furthermore, it should be readily appreciated that various networks of devices as discussed herein may employ one or more wireless, wire/cable, and/or fiber optic links to facilitate information transport throughout the network.

Figure 30:
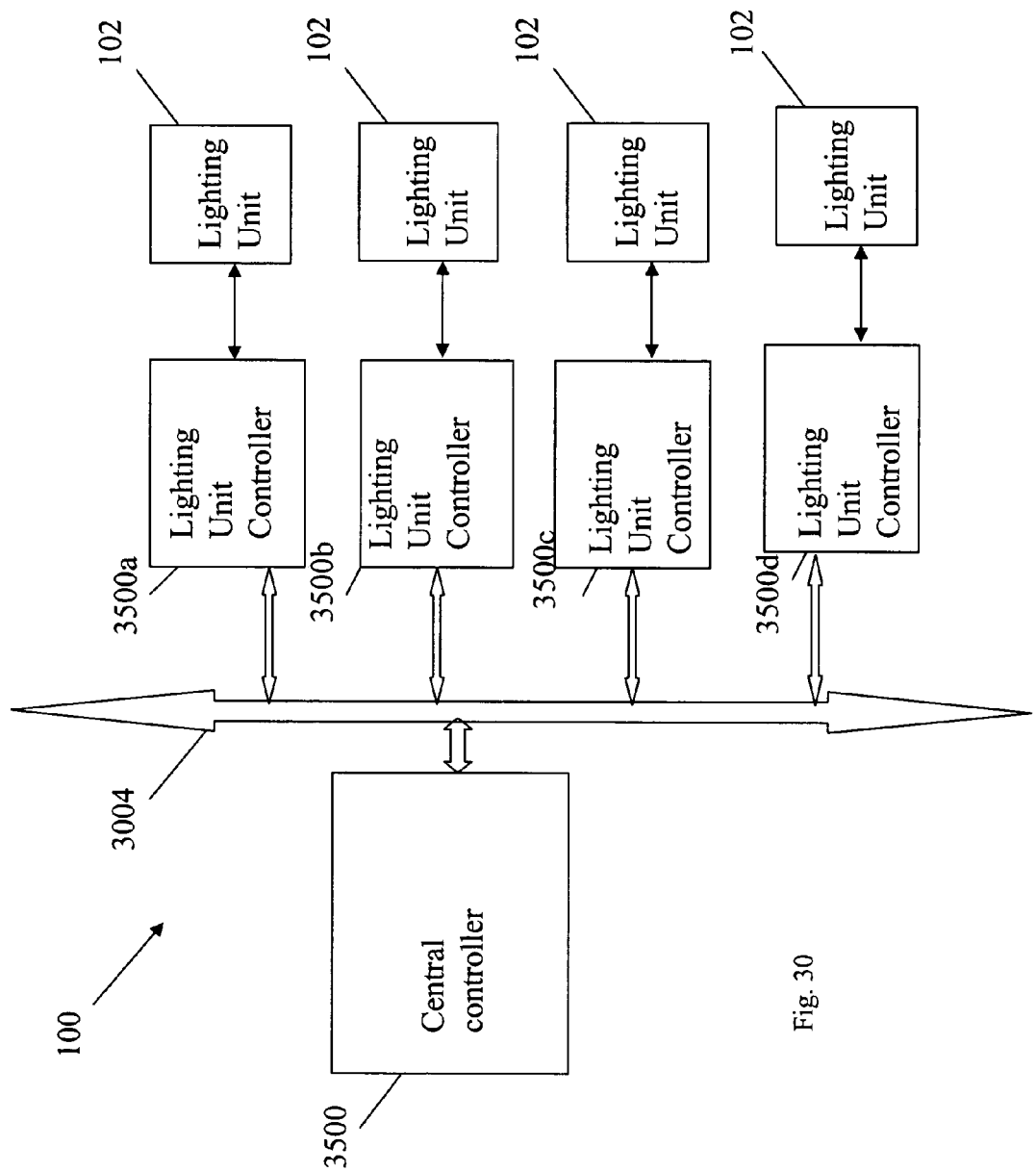
FIG. 30 depicts a network with a central control facility for a lighting system.

FIG. 28 illustrates one of many possible examples of a networked lighting system 100 in which a number of lighting units 102 are coupled together to form the networked lighting system. FIG. 30 depicts another networked configuration for a lighting system 100.

The networked lighting system 100 may be configured flexibly to include one or more user interfaces 4908, as well as one or more signal sources 8400 such as sensors/transducers 8402. For example, one or more user interfaces and/or one or more signal sources such as sensors/transducers 8402 (as discussed above in connection with FIG. 2) may be associated with any one or more of the lighting units 102 of the networked lighting system 100. Alternatively (or in addition to the foregoing), one or more user interfaces 4908 and/or one or more signal sources 8400 may be implemented as "stand alone" components in the networked lighting system 100. Whether stand alone components or particularly associated with one or more lighting units 102, these devices may be "shared" by the lighting units of the networked lighting system 100. Stated differently, one or more user interfaces 4908 and/or one or more signal sources 8400 such as sensors/transducers 8402 may constitute "shared resources" in the networked lighting system 100 that may be used in connection with controlling any one or more of the lighting units 102 of the system 100.

The lighting system 100 may include one or more lighting unit controllers (LUCs) 3500a, 3500b, 3500c, 3500d for lighting units 102, wherein each LUC is responsible for communicating with and generally controlling one or more lighting units 102 coupled to it. Different numbers of lighting units 102 may be coupled to a given LUC in a variety of different configurations using a variety of different communication media and protocols.

Each LUC in turn may be coupled to a central control facility 3500 that is configured to communicate with one or more LUCs. Although FIG. 2 shows four LUCs coupled to the central controller 3500 via a switching or coupling device 3004, it should be appreciated that according to various embodiments, different numbers of LUCs may be coupled to the central controller 3500. Additionally, according to various embodiments of the present invention, the LUCs and the central controller 3500 may be coupled together in a variety of configurations using a variety of different communication media and protocols to form the networked lighting system 100. Moreover, it should be appreciated that the interconnection of LUCs 3500a, 3500b, 3500c, 3500d and the central controller 3500, and the interconnection of lighting units 102 to respective LUCs, may be accomplished in different manners (e.g., using different configurations, communication media, and protocols).

For example, according to one embodiment of the present invention, the central controller 3500 shown in FIG. 30 may be configured to implement Ethernet-based communications with the LUCs, and in turn the LUCs may be configured to implement DMX-based communications with the lighting units 102. In particular, in one aspect of this embodiment, each LUC may be configured as an addressable Ethernet-based controller and accordingly may be identifiable to the central controller 3500 via a particular unique address (or a unique group of addresses) using an Ethernet-based protocol. In this manner, the central controller 3500 may be configured to support Ethernet communications throughout the network of coupled LUCs, and each LUC may respond to those communications intended for it. In turn, each LUC may communicate lighting control information to one or more lighting units coupled to it, for example, via a DMX protocol, based on the Ethernet communications with the central controller 3500.

More specifically, according to one embodiment, the LUCs 3500a, 3500b, 3500c and 3500d shown in FIG. 30 may be configured to be "intelligent" in that the central controller 3500 may be configured to communicate higher level commands to the LUCs that need to be interpreted by the LUCs before lighting control information can be forwarded to the lighting units 102. For example, a lighting system operator may want to generate a color changing effect that varies colors from lighting unit to lighting unit in such a way as to generate the appearance of a propagating rainbow of colors ("rainbow chase"), given a particular placement of lighting units with respect to one another. In this example, the operator may provide a simple instruction to the central controller 3500 to accomplish this, and in turn the central controller may communicate to one or more LUCs using an Ethernet-based protocol high-level command to generate a "rainbow chase." The command may contain timing, intensity, hue, saturation or other relevant information, for example. When a given LUC receives such a command, it may then interpret the command so as to generate the appropriate lighting control signals which it then communicates using a DMX protocol via any of a variety of signaling techniques (e.g., PWM) to one or more lighting units that it controls.

It should again be appreciated that the foregoing example of using multiple different communication implementations (e.g., Ethernet/DMX) in a lighting system according to one embodiment of the present invention is for purposes of illustration only, and that the invention is not limited to this particular example.

In embodiments the central controller 3500 may be a network controller that controls other functions, such as a home network, business enterprise network, building network, or other network.

In embodiments a switch, such as a wall switch, can include a processor 3600, memory 3700 and a communications port for receiving data. The switch can be linked to a network, such as an office network, Internet, or home network. Each switch can be an intelligent device that responds to communication signals via the communications port to provide control of any lighting units 102 from any location where another switch or intelligent device may be located. Such a switch can be integrated through smart interfaces and networks to trigger shows (such as using a lighting control player, such as iPlayer 2 available from Color Kinetics) as with a lighting controller such as a ColorDial from Color Kinetics. Thus, the switch can be programmed with light shows to create various aesthetic, utilitarian or entertainment effects, of white or non-white colors. In embodiments, an operator of a system can process, create or download shows, including from an external source such as the Internet. Shows can be sent to the switch over a communication facility of any kind. Various switches can be programmed to play back and control any given lighting unit 102. In embodiments, settings can be controlled through a network or other interface, such as a web interface.

A switch with a processor 3600 and memory 3700 can be used to enable upgradeable lighting units 102. Thus, lighting units 102 with different capabilities, shows, or features can be supplied, allowing users to upgrade to different capabilities, as with different versions of commercial software programs. Upgrade possibilities include firmware to add features, fix bugs, improve performance, change protocols, add capability and provide compatibility, among others.

In embodiments a control facility 3500 may be based on stored modes and a power cycle event. The operator can store modes for lighting control, such as on a memory 3700. The system can then look for a power event, such as turning the power on or off. When there is a power event the system changes mode. The mode can be a resting mode, with no signal to the lighting unit 102, or it can be any of a variety of different modes, such as a steady color change, a flashing mode, a fixed color mode, or modes of different intensity. Modes can include white and non-white illumination modes. The modes can be configured in a cycle, so that upon a mode change, the next stored mode is retrieved from memory 3700 and signals for that mode are delivered to the lighting unit 102, such as using a switch, slide, dial, or dimmer. The system can take an input signal, such as from the switch. Depending on the current mode, the input signal from the switch can be used to generate a different control signal. For example, if the mode is a steady color change, the input from the dimmer could accelerate of decelerate the rate of change. If the mode were a single color, then the dimmer signal could change the mode by increasing or decreasing the intensity of light. Of course, system could take multiple inputs from multiple switches, dials, dimmers, sliders or the like, to provide more modulation of the different modes. Finally, the modulated signal can be sent to the lighting unit 102.

In embodiments a system with stored modes can take input, such as from a signal source 8400, such as a sensor, a computer, or other signal source. The system can determine the mode, such as based on a cycle of modes, or by recalling modes from memory, including based on the nature of the signal from the signal source 8400. Then system can generate a control signal for a lighting unit, based on the mode.

Referring to FIG. 31*a*, the methods and systems disclosed herein may further comprise disposing a plurality of lighting units 102 in a serial configuration and controlling all of them by a stream of data to respective processors 3600, such as ASICS, of each of them, wherein each lighting unit 102 responds to the first unmodified bit of data in the stream, modifies that bit of data, and transmits the stream to the next ASIC. Using such a serial addressing protocol, data can be addressed to lighting units 102 based on their location in a series of lighting units 102, rather than requiring knowledge of the exact physical location of each lighting unit 102.

Methods and system provided herein also include providing a self-healing lighting system, which may include providing a plurality of lighting units in a system, each having a plurality of light sources; providing at least one processor associated with at least some of the lighting units for controlling the lighting units; providing a network facility for addressing data to each of the lighting units; providing a diagnostic facility for identifying a problem with a lighting unit; and providing a healing facility for modifying the actions of at least one processor to automatically correct the problem identified by the diagnostic facility.

A lighting unit controller according to the present invention may include a unique address such that the 208 can be identified and communicated with. The LUC may also include a universe address such that the lighting unit controller can be grouped with other controllers or systems and addressed information can be communicated to the group of systems. The lighting unit controller may also have a broadcast address, or otherwise listen to general commands provided to many or all associated systems.

Referring to FIG. 31*b*, the network interface 4900 may include a network topology with a control facility 3500 and multiple lighting units 102 disposed on the network in a hub-router configuration. Referring to FIG. 31*c*, the lighting units 102 can be disposed along a high-speed serial bus for receiving control signals from a data facility 3500.

Figure 32:
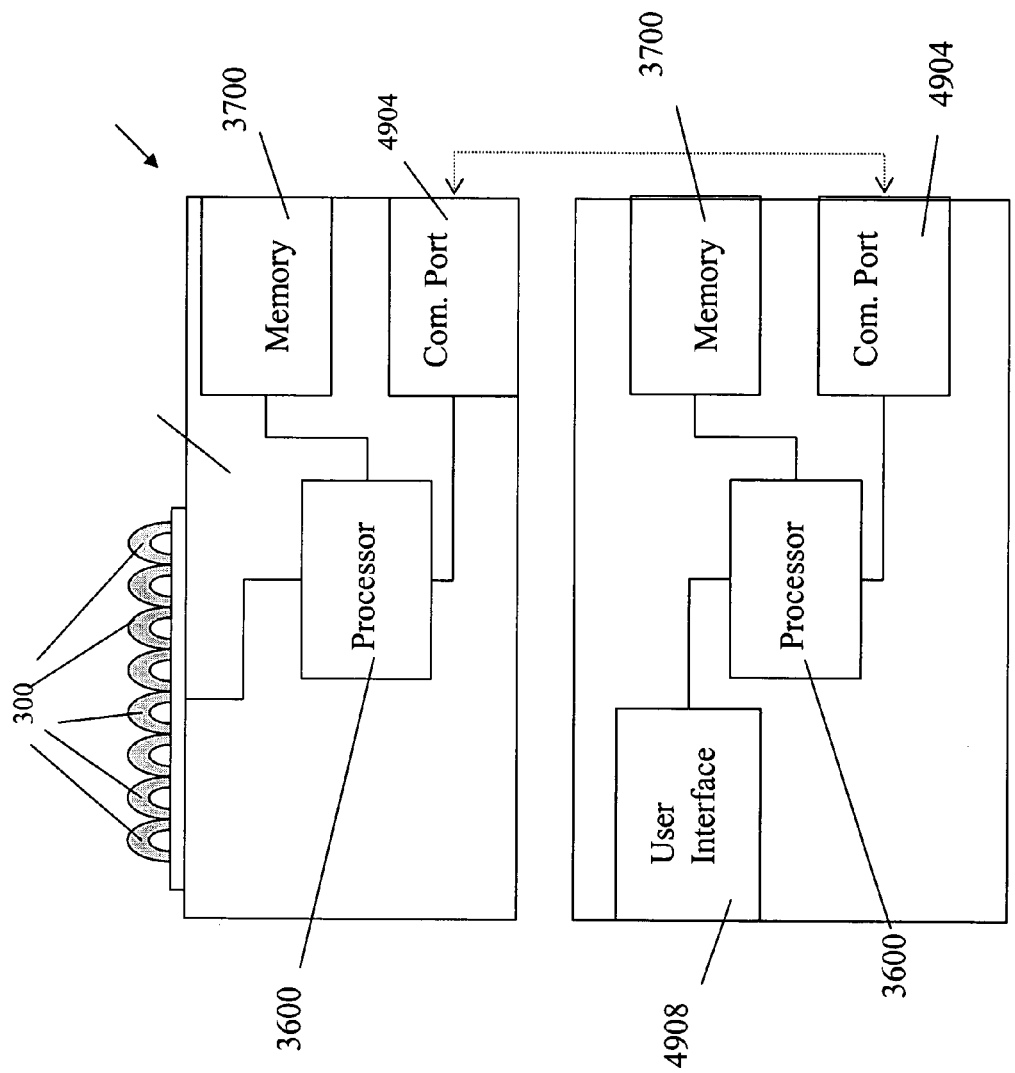
FIG. 32 depicts a physical data interface for a lighting system with a communication port.

A lighting unit 102 may include a physical data interface 4904 for receiving data, such as from another lighting unit 102, from a signal source 8400, from a user interface 4902, or from a control facility 3500. Referring to FIG. 32, the lighting unit 102 may include one or more communication ports 4904 to facilitate coupling of the lighting unit 102 to any of a variety of other devices. For example, one or more communication ports 4904 may facilitate coupling multiple lighting units together as a networked lighting system, in which at least some of the lighting units are addressable (e.g., have particular identifiers or addresses) and are responsive to particular data transported across the network.

In embodiments the communication port 4904 can receive a data cable, such as a standard CAT 5 cable type used for networking. Thus, the lighting unit 102 can receive data, such as from a network. By allowing connection of the lighting unit 102 to a communications port 4904, the system allows a lighting designer or installer to send data to a plurality of lighting units 102 to put them in common modes of control and illumination, providing more consistency to the lighting of the overall environment.

FIG. 33 shows various embodiments of physical data interfaces 4902. FIG. 33*a* shows an embodiment arranged in a wireless network arrangement, using a wireless data interface as the physical data interface, such as a radio frequency interface, infrared interface, Bluetooth interface, 802.11 interface, or other wireless interface. In embodiments the wireless arrangement is a peer-to-peer arrangement. In embodiments such as FIG. 33*b*, the arrangement is a master-slave arrangement, where on lighting unit 102 controls other lighting units 102 in close proximity. FIG. 33*c* a retrofit lighting unit 102 with a communication port 4904. FIG. 33*e* shows a socket 3302 or fixture for receiving a lighting unit 102. In this case the socket 3302 includes a processor 3600, such as to providing control signals to the lighting unit 102. The socket 3600 can be connected to a control interface 4900, such as a network, so that it can receive signals, such as from a control facility 3500. Thus, the socket 3302 can serve as a lighting unit controller. By placing control in the socket 3302, it is possible for a lighting designer or installer to provide control signals to a known location, regardless of what bulbs are removed or replaced into the socket 3302. Thus, an environmental lighting system can be arranged by the sockets 3302, then any different lighting units 102 can be installed, responsive to control signals sent to the respective sockets 3302. Sockets 3302 can be configured to receive any kind of light bulb, including incandescent, fluorescent, halogen, metal halide, LED-based lights, or the like. Thus, intelligence can be provided by the processor 3600 to a conventional socket. In embodiments, data can be provided over power lines, thus avoiding the need to rewire the environment, using power line carrier techniques as known in the art, the X10 system being one such example, and the HomeTouch system being another.

In the preceding embodiments, a fixture or network can give a lighting unit 102 a command to set to a particular look including, color, color temperature, intensity, saturation, and spectral properties. Thus, when the designer sets the original design he or she may specify a set of particular light bulb parameters so that when a lighting unit 102 is replaced the fixture or network can perform a startup routine that initializes that lighting unit 102 to a particular set of values which are then controlled. In embodiments, the lighting unit 102 identifies itself to the network when the power is turned on. The lighting unit 102 or fixture or socket 3302 can be assigned an address by the central control facility 3500, via a network interface 4900. Thus, there is an address associated with the fixture or socket 3302, and the lighting unit 102 control corresponds to that address. The lighting unit 102 parameters can be set in memory 3700, residing in either the lighting unit 102, socket 3302 or fixture, cable termination 3304 or in a central control facility 3500. The lighting unit 102 can now be set to those parameters. From then on, when the lighting unit 102 is powered up it receives a simple command value already set within the set of parameters chosen by the designer.

As used herein, the terms "wired" transmission and or communication should be understood to encompass wire, cable, optical, or any other type of communication where the devices are physically connected. As used herein, the terms "wireless" transmission and or communication should be understood to encompass acoustical, RF, microwave, IR, and all other communication and or transmission systems were the devices are not physically connected.

Referring to FIG. 33e, the physical data interface 4904 can include a processor included in an end of a cable 3304, so that the cable itself is a lighting unit controller, such as to ensure that as lighting units 102 are replaced, any lighting unit attached to that cable 3304 will respond to signals intended to be addressed to locations of that cable. 3304. This is helpful in environments like airline cabins, where maintenance staff may not have time to enter address information for replacement lighting units 102 when earlier units fail.

A lighting unit 102 can respond to input from a user interface 4908. The term "user interface" as used herein refers to an interface between a human user or operator and one or more devices that enable communication between the user and the device(s). Examples of user interfaces that may be employed in various implementations of the present invention include, but are not limited to, switches, human-machine interfaces, operator interfaces, potentiometers, buttons, dials, sliders, a mouse, keyboard, keypad, various types of game controllers (e.g., joysticks), track balls, display screens, various types of graphical user interfaces (GUIs), touch screens, microphones and other types of sensors that may receive some form of human-generated stimulus and generate a signal in response thereto.

In another aspect, as also shown in FIG. 2, the lighting unit 102 optionally may include one or more user interfaces 4908 that are provided to facilitate any of a number of user-selectable settings or functions (e.g., generally controlling the light output of the lighting unit 102, changing and/or selecting various pre-programmed lighting effects to be generated by the lighting unit, changing and/or selecting various parameters of selected lighting effects, setting particular identifiers such as addresses or serial numbers for the lighting unit, etc.). In various embodiments, the communication between the user interface 4908 and the lighting unit may be accomplished through wire or cable, or wireless transmission.

In one implementation, the processor 3600 of the lighting unit monitors the user interface 4908 and controls one or more of the light sources 300 based at least in part on a user's operation of the interface. For example, the processor 3600 may be configured to respond to operation of the user interface by originating one or more control signals for controlling one or more of the light sources. Alternatively, the processor 3600 may be configured to respond by selecting one or more pre-programmed control signals stored in memory, modifying control signals generated by executing a lighting program, selecting and executing a new lighting program from memory, or otherwise affecting the radiation generated by one or more of the light sources.

In particular, in one implementation, the user interface 4908 may constitute one or more switches (e.g., a standard wall switch) that interrupt power to the processor 3600. In one aspect of this implementation, the processor 3600 is configured to monitor the power as controlled by the user interface, and in turn control one or more of the light sources 300 based at least in part on a duration of a power interruption caused by operation of the user interface. As discussed above, the processor may be particularly configured to respond to a predetermined duration of a power interruption by, for example, selecting one or more pre-programmed control signals stored in memory, modifying control signals generated by executing a lighting program, selecting and executing a new lighting program from memory, or otherwise affecting the radiation generated by one or more of the light sources.

Referring to FIG. 34 simple user interfaces can be used to trigger control signals. FIG. 34a shows a push button 3402 that triggers stored modes when pressed. FIG. 34b and FIG. 34c show user interfaces 4908 involving slides 3404 that can change the intensity or color, depending on the mode. A dual slide is shown in FIG. 34c, where one slide 3404 can adjust color and the other can adjust intensity, or the like. FIG. 34d and FIG. 34e show dials 3408. The dial can trigger stored modes or adjust color or intensity of light. The dual-dial embodiment of FIG. 34e can include one dial for color and another for intensity. FIG. 34f shows a dial 3408 that includes a processor 3600 and memory 3700, so that the user interface can provide basic instructions, such as for stored modes, but the user interface 4908 also reacts to instructions from a central control facility 3500. FIG. 34g shows a dipswitch 3410, which can beg used to set simple modes of a lighting unit 102. FIG. 34h shows a microphone 3412, such as for a voice recognition facility interface to a lighting unit 102, such as to trigger lighting by voice interaction. In embodiments such as FIG. 34a, the slide can provide voltage input to a lighting unit 102, and the switch can allow the user to switch between modes of operation, such as by selecting a color wash, a specific color or color temperature, a flashing series of colors, or the like.

In various embodiments the slides, switches, dials, dipswitches and the like can be used to control a wide range of variables, such as color, color temperature, intensity, hue, and triggering of lighting shows of varying attributes.

In other embodiments of the present invention it may be desirable to limit user control. Lighting designers, interior decorators and architects often prefer to create a certain look to their environment and wish to have it remain that way over time. Unfortunately, over time, the maintenance of an environment, which includes light bulb replacement, often means that a lighting unit, such as a bulb, is selected whose properties differ from the original design. This may include differing wattages, color temperatures, spectral properties, or other characteristics. It is desirable to have facilities for improving the designer's control over future lighting of an environment.

Referring to FIG. 34*i*, in embodiments a dial allows a user to select one or more colors or color temperatures from a scale 3414. For example, the scale 3414 can include different color temperatures of white light. The lighting designer can specify use of a particular color temperature of light, which the installer can select by setting the right position on the scale 3414 with the dial. A slide mechanism can be used like the dial to set a particular color temperature of white light, or to select a particular color of non-white light, in either case on a scale. Again, the designer can specify a particular setting, and the installer can set it according to the design plan. Providing adjustable lighting units 102 offers designers and installers much greater control over the correct maintenance of the lighting of the environment.

In embodiments, the fixture, socket 3302 or lighting unit 102 can command color setting at installation, either a new setting or a fine adjustment to provide precise color control. In embodiments, the lighting unit 102 allows color temperature control as described elsewhere. The lighting unit 102 is settable, but the fixture itself stores an instruction or value for the setting of a particular color temperature or color. Since the fixture is set, the designer or architect can insure that all settable lighting units 102 will be set correctly when they are installed or replaced. An addressable fixture can be accomplished through a cable connection where the distal end of the cable, at the fixture, has a value programmed or set. The value is set through storage in memory 3700 or over the power lines. A physical connection can be made with a small handheld device, such as a Zapi available from Color Kinetics, to create and set the set of parameters for that fixture and others. If the environment changes over time, as for example during a remodeling, then those values can be updated and changed to reflect a new look for the environment. A person could either go from fixture to fixture to reset those values or change those parameters remotely to set an entire installation quickly. Once the area is remodeled or repainted, as in the lobby of a hotel for example, the color temperature or color can be reset and, for example, have all lighting units 102 in the lobby set to white light of 3500K. Then, in the future, is any lighting unit 102 is replaced or upgraded, any bulb plugged in can be set to that new value. Changes to the installation parameters can be done in various ways, such as by network commands, or wireless communication, such as RF or IR communication.

In various embodiments, the setting can occur in the fixture or socket 3302, in the distal end of a cable 3304, in the proximal end of the cable 3304, or in a central control facility 3500. The setting can be a piece of memory 3700 embedded in any of those elements with a facility for reading out the data upon startup of the lighting unit 102.

In other embodiments it may be desirable to prevent or deter user adjustment. A lighting unit 102 can be programmed to allow adjustment and changes to parameters by a lighting designer or installer, but not by other users. Such systems can incorporate a lockout facility to prevent others from easily changing the settings. This can take the form of memory 3700 to store the current state but allow only a password-enabled user to make changes. One embodiment is a lighting unit 102 that is connected to a network or to a device that allows access to the lighting unit 102 or network. The device can be an authorized device whose initial communication establishes trust between two devices or between the device and network. This device can, once having established the connection, allow for the selection or modification of pattern, color, effect or relationship between other devices such as ambient sensors or external devices. The system can store modes, such as in memory 3700. The system can detect a user event, such as an attempt by the user to change modes, such as sending an instruction over a network or wireless device. The system queries whether the user is authorized to change the mode of the lighting unit 102, such as by asking for a password, searching for a stored password, or checking a device identifier for the device through which the user is seeking to change the mode of the lighting unit 102. If the user is not authorized, then the system maintains the previous mode and optionally notifies the lighting designer, installer, or other individual of the unauthorized attempt to change the mode. If the user is authorized, then the user is allowed to change the mode. Facilities for allowing only authorized users to trigger events are widely known in the arts of computer programming, and any such facilities can be used with a processor 3600 and memory 3700 used with a lighting unit 102.

In other embodiments, the lighting designer can specify changes in color over time or based on time of day or season of year. It is beneficial for a lighting unit 102 to measure the amount of time that it has been on and store information in a compact form as to its lighting history. This provides a useful history of the use of the light and can be correlated to use lifetime and power draw, among other measurements. An intelligent networked lighting unit 102 can store a wide variety of useful information about its own state over time and the environmental state of its surroundings. A lighting unit can store a histogram, a chart representing value and time of lighting over time. The histogram can be stored in memory 3700. A histogram can chart on time versus off time for a lighting unit 102. A histogram can be correlated to other data, such as room habitation, to develop models of patterns of use, which can then be tied into a central control facility 3500, such as integrated with a building control system.

In embodiments a user interface 4908 instructs a lighting system 100 to produce a desired mixed light output. The user interface can be a remote control, a network interface, a dipswitch, a computer, such as a laptop computer, a personal computer, a network computer, or a personal digital assistant, an interface for programming an on-board memory of the illumination system, a wireless interface, a digital facility, a remote control, a receiver, a transceiver, a network interface, a personal computer, a handheld computer, a push button, a dial, a toggle/membrane switch, an actuator that actuates when one part of a housing is rotated relative to another, a motion sensor, an insulating strip that is removed to allow power to a unit, an electrical charge to turn a unit on, or a magnetic interface such as a small reed-relay or Hall-effect sensor that can be incorporated so when a magnetic material is brought within the proximity of the device it completes a power circuit.

Figures 35A, 35B:
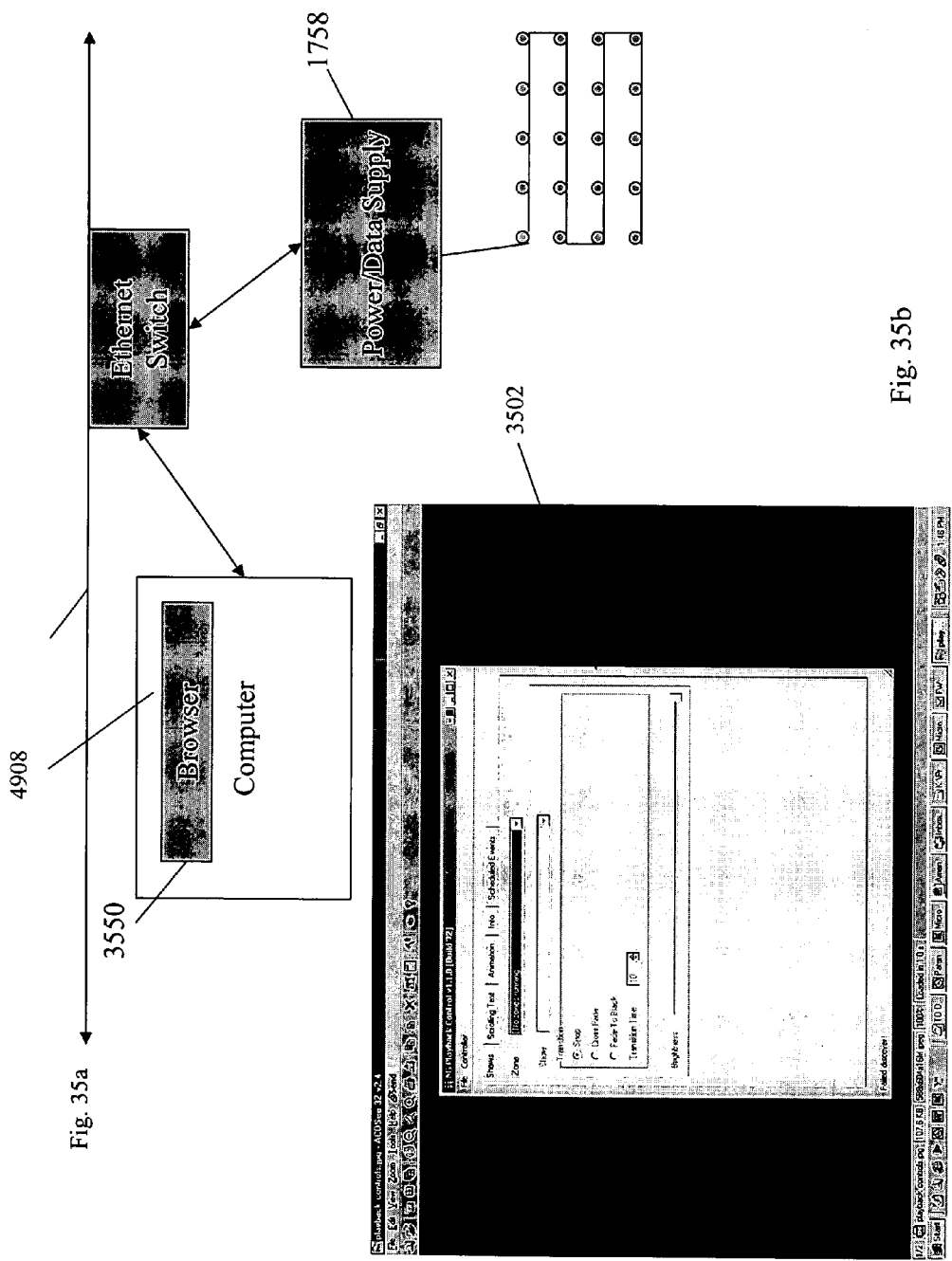
FIG. 35 depicts additional user interfaces for lighting systems.

Referring to FIG. 35*a*, a user interface 4908 may include a browser 3550 running on a computer. The browser 3550 may be used to trigger shows, such as ones stored locally at a power data supply 1758 connected to a network, such as through an Ethernet switch. In general a computer may supply a graphical user interface for authoring and triggering shows, as described in more detail below. FIG. 35*b* shows a graphical user interface 3502 for a playback controller that can control the playback of shows, such as ones stored in memory 3700 of a lighting system 100.

Figure 36:
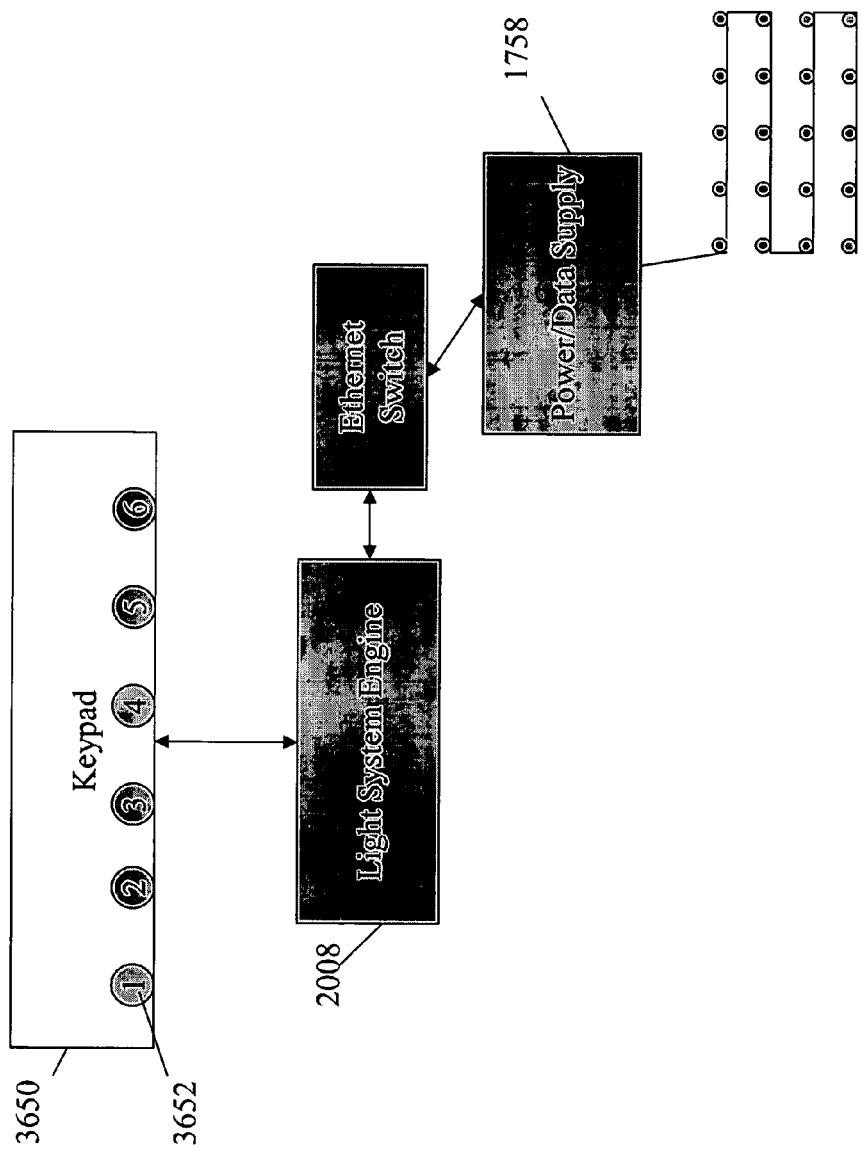
FIG. 36 depicts a keypad user interface.

In embodiments a keypad 3650 may be used to store control signals for lighting shows. Buttons 3652 on the keypad 3650 may be used to trigger stored shows, such as to be delivered directly to lighting units 102 or to deliver them across a network, such as in the Ethernet configuration of FIG. 36.

In embodiments it may be important to provide an addressing facility 6600 for providing an address to a lighting unit 102 or light system 100. An address permits a particular lighting unit 102 to be identified among a group of lighting units 102 or a group of lighting units 102 to be identified among a larger group, or a group of other devices deployed on a common network. An address in turn permits use of the mapping facility 5002 for mapping locations of lighting units 102 according to their unique identifiers or addresses. Once locations are mapped, it is possible to deliver control signals to the lighting units 102 in desired sequences to create complex effects, such as color-chasing rainbows, or the like, based on their correct locations in the world.

The term "addressable" is used herein to include a device (e.g., a light source in general, a lighting unit or fixture, a controller or processor associated with one or more light sources or lighting units, other non-lighting related devices, etc.) that is configured to receive information (e.g., data) intended for multiple devices, including itself, and to selectively respond to particular information intended for it. The term "addressable" often is used in connection with a networked environment (or a "network," discussed further below), in which multiple devices are coupled together via some communications medium or media.

In one implementation, one or more devices coupled to a network may serve as a controller for one or more other devices coupled to the network (e.g., in a master/slave relationship). In another implementation, a networked environment may include one or more dedicated controllers that are configured to control one or more of the devices coupled to the network. Generally, multiple devices coupled to the network each may have access to data that is present on the communications medium or media; however, a given device may be "addressable" in that it is configured to selectively exchange data with (i.e., receive data from and/or transmit data to) the network, based, for example, on one or more particular identifiers (e.g., "addresses") assigned to it.

More specifically, one embodiment of the present invention is directed to a system of multiple controllable lighting units coupled together in any of a variety of configurations to form a networked lighting system. In one aspect of this embodiment, each lighting unit has one or more unique identifiers (e.g., a serial number, a network address, etc.) that may be pre-programmed at the time of manufacture and/or installation of the lighting unit, wherein the identifiers facilitate the communication of information between respective lighting units and one or more lighting system controllers. In another aspect of this embodiment, each lighting unit 102 may be flexibly deployed in a variety of physical configurations with respect to other lighting units of the system, depending on the needs of a given installation.

One issue that may arise in such a system of multiple controllable lighting units 102 is that upon deployment of the lighting units 102 for a given installation, it is in some cases challenging to configure one or more system controllers a priori with some type of mapping information that provides a relationship between the identifier for each lighting unit 102 and its physical location relative to other lighting units 102 in the system. In particular, a lighting system designer/installer may desire to purchase a number of individual lighting units each pre-programmed with a unique identifier (e.g., serial number), and then flexibly deploy and interconnect the lighting units in any of a variety of configurations to implement a networked lighting system. At some point before operation, however, the system needs to know the identifiers of the controllable lighting units deployed, and preferably their physical location relative to other units in the system, so that each unit may be appropriately controlled to realize system-wide lighting effects.

Referring to FIG. 37, one way to accomplish mapping is to have one or more system operators and/or programmers manually create one or more custom system configuration files 3700 containing the individual identifiers 3702 for each lighting unit 102 and corresponding mapping information that provides some means of identifying the relative physical locations 3708 of lighting units 102 in the system. Configuration files 3700 can include other attributes, such as the positions lit by a lighting unit 102, as well as the positions of the lighting units 102 themselves. As the number of lighting units 192 deployed in a given system increases and the physical geometry of the system becomes more complex, however, and the process of creating manual configuration files can quickly become unwieldy. Rather than manually entering configuration data, it is desirable to have other methods of detecting addresses and mapping addresses of lighting units 102 to physical locations.

In view of the foregoing, one embodiment of the invention is directed to methods and systems that facilitate a determination of the respective identifiers of controllable lighting units coupled together to form a networked lighting system. In one aspect of this embodiment, each lighting unit of the system has a pre-programmed multiple-bit binary identifier, and a determination algorithm is implemented to iteratively determine (i.e., "learn") the identifiers of all lighting units that make up the system. In various aspects, such determination/learning algorithms may employ a variety of detection schemes during the identifier determination process, including, but not limited to, monitoring a power drawn by lighting units at particular points of the process, and/or monitoring an illumination state of one or more lighting units at particular points of the determination process.

Once the collection of identifiers for all lighting units of the system is determined (or manually entered), another embodiment of the present invention is directed to facilitating the compilation of mapping information that relates the identified lighting units 102 to their relative physical locations in the installation. In various aspects of this embodiment, the mapping information compilation process may be facilitated by one or more graphical user interfaces that enable a system operator and/or programmer to conveniently configure the system based on either learned and/or manually entered identifiers of the lighting units, as well as one or more graphic representations of the physical layout of the lighting units relative to one another.

In an embodiment, identifiers for lighting units 102 can be determined by a series of steps. First, a set of lighting units 102 having unique identifiers stored in memory 3700 are provided. Next, address identification information is provided to the lighting units. Next, the lighting unit 102 is caused to read the address identification information, compare the address identification information to at least a portion of the identifier, and cause the lighting unit 102 to respond to the address identification information by either energizing or de-energizing one or more light sources of the lighting unit 102. Finally, the system monitors the power consumed by the lighting unit to provide an indication of the comparison between the identifier and the address identification information.

In embodiments each lighting unit controller includes a power sensing module that provides one or more indications to the LUC when power is being drawn by one or more lighting units coupled to the LUC (i.e., when one or more light sources of one or more of the lighting units is energized).

The power-sensing module also may provide one or more output signals to the processor 3600, and the processor 3600 in turn may communicate to the central control facility 3500 information relating to power sensing.

The power sensing module, together with the processor 3600, may be adapted to determine merely when any power is being consumed by any of the lighting units coupled to the LUC, without necessarily determining the actual power being drawn or the actual number of units drawing power. As discussed further below, such a "binary" determination of power either being consumed or not consumed by the collection of lighting units 102 coupled to the LUC facilitates an identifier determination/learning algorithm (e.g., that may be performed by the LUC processor 3600 or the central control facility 3500) according to one embodiment of the invention. In other aspects, the power sensing module and the processor 3600 may be adapted to determine, at least approximately, and actual power drawn by the lighting units at any given time. If the average power consumed by a single lighting unit is known a priori, the number of units consuming power at any given time can then be derived from such an actual power measurement. Such a determination is useful in other embodiments of the invention, as discussed further below.

As discussed above, according to one embodiment of the invention, the LUC processor 3600 may monitor the output signal from the power sensing module to determine if any power is being drawn by the group of lighting units, and use this indication in an identifier determination/learning algorithm to determine the collection of identifiers of the group of lighting units coupled to the LUC. For purposes of illustrating the various concepts related to such an algorithm, the following discussion assumes an example of a unique four bit binary identifier for each of the lighting units coupled to a given LUC. It should be appreciated, however, that lighting unit identifiers according to the present invention are not limited to four bits, and that the following example is provided primarily for purposes of illustration.

Figure 38:
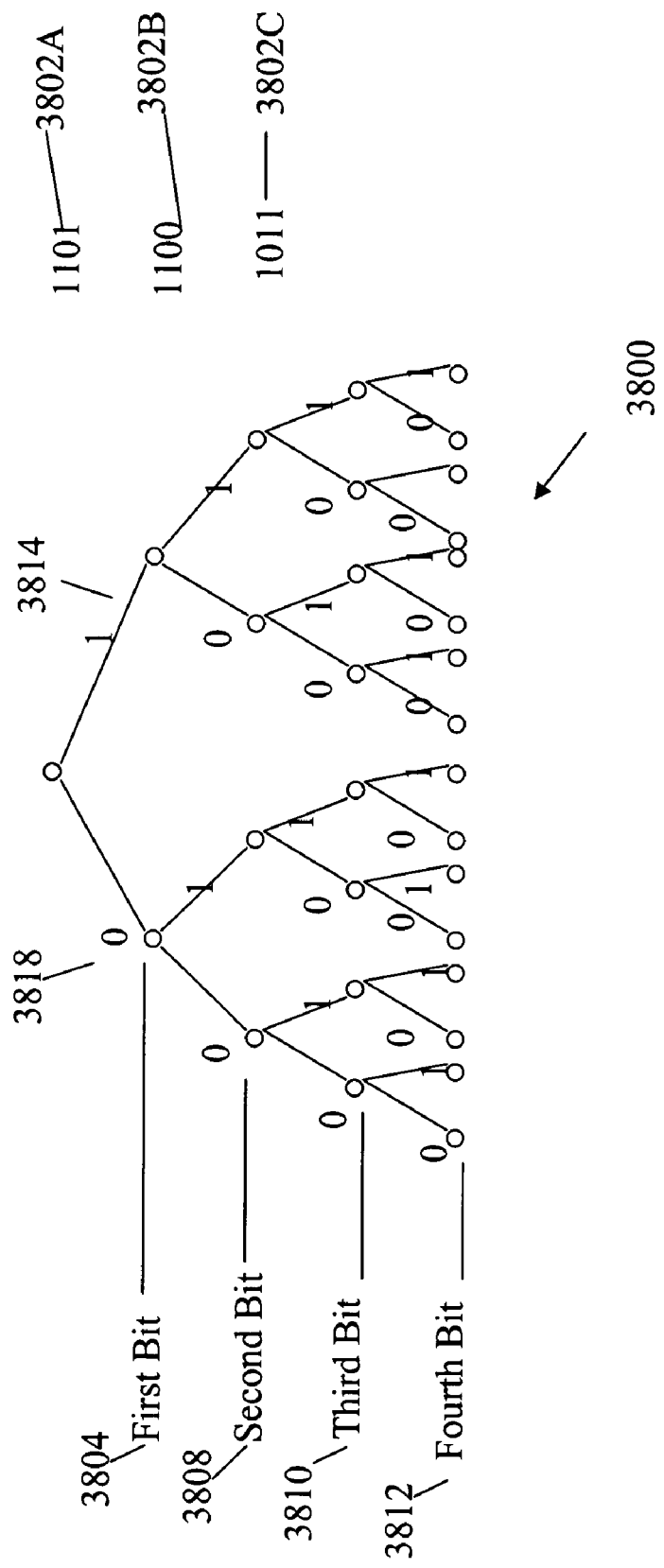
FIG. 38 depicts a binary tree for a method of addressing lighting units.
Figure 39:
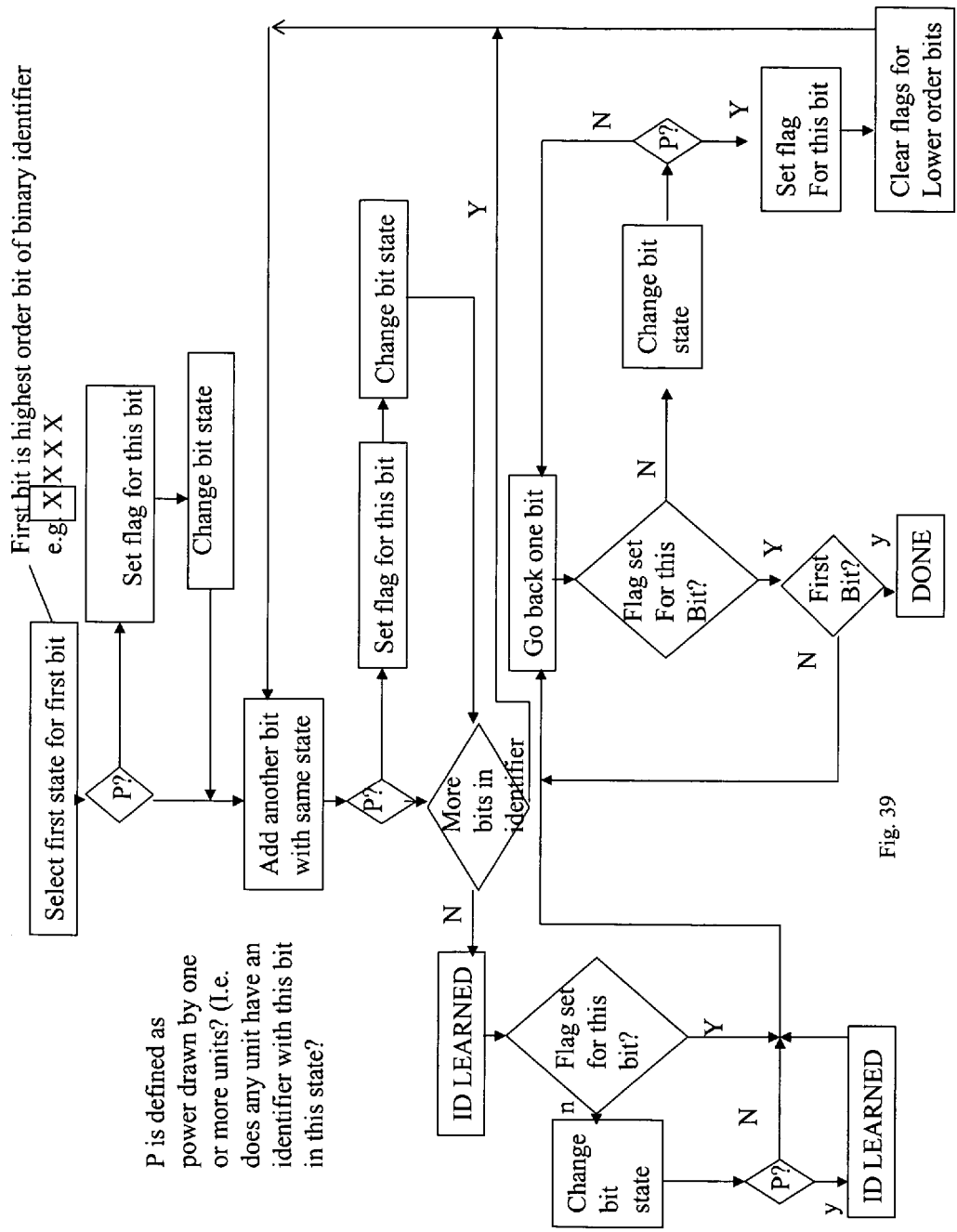
FIG. 39 depicts a flow diagram for mapping locations of lighting units.

FIG. 38 illustrates a binary search tree 3800 based on four bit identifiers for lighting units, according to one embodiment of the invention. In FIG. 38, it is assumed that three lighting unit 102 are coupled to a generic LUC, and that the first lighting unit has a first binary identifier 3802A of one, one, zero, one (1101), the second lighting unit has a second binary identifier 3802B of one, one, zero, zero (1100), and the third lighting unit has a third binary identifier 3802C of one, zero, one, one (1011). Referring to FIG. 39, exemplary identifiers are used below to illustrate an example of an identifier determination/learning algorithm depicted in FIG. 39.

In embodiments, the collection of identifiers corresponding to the respective units and the number of units are determined. However, it should be appreciated that no particular determination is made of which lighting unit has which identifier. Stated differently, the algorithm does not determine a one-to-one correspondence between identifiers and lighting units, but rather merely determines the collection of identifiers of all of the lighting units coupled to the LUC. According to one embodiment of the invention, such a determination is sufficient for purposes of subsequently compiling mapping information regarding the physical locations of the lighting units relative to one another.

One or both of a given LUC processor 3600 or the central control facility 3500 may be configured to execute the algorithm, and that either the processor 3600 or the central control facility 3500 may include memory 3700 to store a flag for each bit of the identifier, which flag may be set and reset at various points during the execution of the algorithm, as discussed further below. Furthermore, for purposes of explaining the algorithm, it is to be understood that the "first bit" of an identifier refers to the highest order binary bit of the identifier. In particular, with reference to the example of FIG. 38, the four identifier bits are consecutively indicated as a first bit 3804, a second bit 3808, a third bit 3810, and a fourth bit 3812.

Referring again to the exemplary identifiers and binary tree illustrated in FIG. 38, the mapping algorithm implements a complete search of the binary tree to determine the identifiers of all lighting units coupled to a given LUC. The algorithm begins by selecting a first state (either a 1 or a 0) for the highest order bit 3804 of the identifier, and then sends a global command to all of the lighting units coupled to the LUC to energize one or more of their light sources if their respective identifiers have a highest order bit corresponding to the selected state. Again for purposes of illustration, it is assumed here that the algorithm initially selects the state "1" (indicated with the reference character 3814 in FIG. 38). In response to this command, all of the lighting units energize their light sources and, hence, power is drawn from the LUC. It should be appreciated, however, that the algorithm may initially select the state "0" (indicated with the reference character 3818 in FIG. 38); in the present case, since no lighting unit has an identifier with a "0" in the highest order bit 3804, no power would be drawn from the LUC and the algorithm would respond by setting a flag for this bit, changing the state of this bit, and by default assume that all of the lighting units coupled to the LUC necessarily have a "1" in the highest order bit (as is indeed the case for this example).

As a result of a "1" in the highest order bit having been identified, the algorithm adds another bit 3808 with the same state (i.e., "1"), and then sends a global command to all of the lighting units to energize their light sources if their respective identifiers begin with "11" (i.e., 11XX). As a result of this query, the first and second lighting units energize their light sources and draw power, but the third lighting unit does not energize. In any event, some power is drawn, so the algorithm then queries if there are any more bits in the identifier. In the present example there are more bits, so the algorithm returns to adding another bit 3810 with the same state as the previous bit and then sends a global command to all lighting units to energize their light sources if their respective identifiers begin with "111" (i.e., 111X).

At this point in the example, no identifiers correspond to this query, and hence no power is drawn from the LUC. Accordingly, the algorithm sets a flag for this third bit 3810, changes the state of the bit (now to a "0"), and again queries if there are any more bits in the identifier. In the present example there are more bits, so the algorithm returns to adding another bit 3812 with the same state as the previous bit (i.e., another "0") and then sends a global command to all lighting units to energize their light sources if they have the identifier "1100."

In response to this query, the second lighting unit energizes its light sources and hence power is drawn from the LUC. Since there are no more bits in the identifiers, the algorithm has thus learned a first of the three identifiers, namely, the second identifier 3802B of "1100." At this point, the algorithm checks to see if a flag for the fourth bit 3812 has been set. Since no flag yet has been set for this bit, the algorithm changes the bit state (now to a "1"), and sends a global command to all lighting units to energize their light sources if they have the identifier "1101." In the present example, the first lighting unit energizes its light sources and draws power, indicating that yet another identifier has been learned by the algorithm, namely, the first identifier 3802A of "1101."

At this point, the algorithm goes back one bit in the identifier (in the present example, this is the third bit 3810) and checks to see if a flag was set for this bit. As pointed out above, indeed the flag for the third bit was set (i.e., no identifiers corresponded to "111X"). The algorithm then checks to see if it has arrived back at the first (highest order) bit 3804 again, and if not, goes back yet another bit (to the second bit 3808). Since no flag has yet been set for this bit (it is currently a "1"), the algorithm changes the state of the second bit (i.e., to a "0" in the present example), and sends a global command to all lighting units to energize their light sources if their respective identifiers begin with "10" (i.e., 10XX). In the current example, the third lighting unit energizes its light sources, and hence power is drawn. Accordingly, the algorithm then sets the flag for this second bit, clears any lower order flags that may have been previously set (e.g., for the third or fourth bits 3810 and 3812), and returns to adding another bit 3810 with the same state as the previous bit. From this point, the algorithm executes as described above until ultimately it learns the identifier 1402C of the third lighting unit (i.e., 1011), and determines that no other lighting units are coupled to the LUC.

Again, it should be appreciated that although an example of four bit identifiers was used for purposes of illustration, the algorithm may be applied similarly to determine identifiers having an arbitrary number of bits. Furthermore, it should be appreciated that this is merely one example of an identifier determination/learning algorithm, and that other methods for determining/learning identifiers may be implemented according to other embodiments of the invention.

Figure 40:
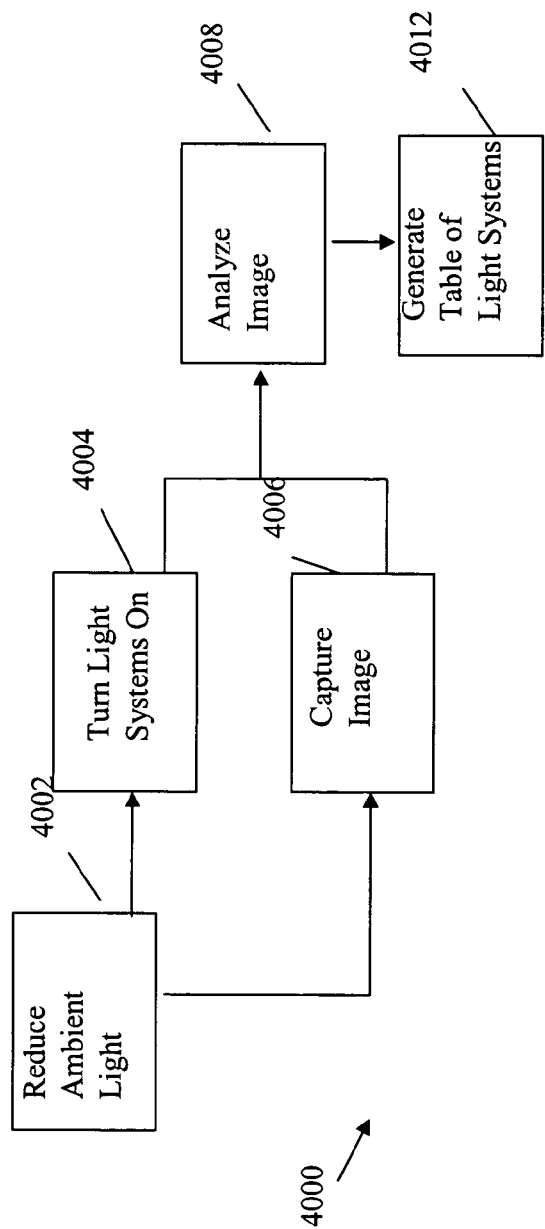
FIG. 40 depicts steps for mapping lighting units.

Referring to FIG. 40, in another embodiment, the lighting unit controller may not include a power monitoring system but the methodology of identifying lighting unit addresses according to the principles of the present invention may still be achieved. For example, rather than monitoring the power consumed by one or more lighting units, a visible interpretation of the individual lighting units may be recorded, either by human intervention or another image capture system such as a camera or video recorder. In this case, the images of the light emitted by the individual lighting units may be recorded for each bit identification and it may not be necessary to go up and down the binary task tree as identified above.

The method may involve the controlling of light from a plurality of lighting units that are capable of being supplied with addresses (identifiers). The method may comprise the steps of equipping each of the lighting units with a processing facility for reading data and providing instructions to the lighting units to control at least one of the color and the intensity of the lighting units, each processing facility capable of being supplied with an address. For example, the lighting units may include a lighting unit 102 where the processor 3600 is capable of receiving network data. The processor may receive network data and operate the LED(s) 300 in a manner consistent with the received data. The processor may read data that is explicitly or implicitly addressed to it or it may respond to all of the data supplied to it. The network commands may be specifically targeting a particular lighting unit with an address or group of lighting units with similar addresses or the network data may be communicated to all network devices. A communication to all network devices may not be addressed but may be a universe or world style command.

The method may further comprise the step of supplying each processor with an identifier, the identifier being formed of a plurality of bits of data. For example, each lighting unit 102 may be associated with memory 3700 (e.g. EPROM) and the memory 3700 may contain a serial number that is unique to the light or processor. Of course, the setting of the serial number or other identifier may be set through mechanical switches or other devices and the present invention is not limited by a particular method of setting the identifier. The serial number may be a 32-bit number in EPROM for example.

The method may also comprise sending to a plurality of such processors an instruction, the instruction being associated with a selected and numbered bit of the plurality of bits of the identifier, the instruction causing the processor to select between an "on" state of illumination and an "off" state of illumination for light sources controlled by that processor, the selection being determined by the comparison between the instruction and the bit of the identifier corresponding to the number of the numbered bit of the instruction. For example, a network command may be sent to one or more lighting units in the network of lighting units. The command may be a global command such that all lighting units that receive the command respond. The network command may instruct the processors 102 to read the first bit of data associated with its serial number. The processor 3600 may then compare the first bit to the instructions in the network instruction or assess if the bit is a one or a zero. If the bit is a one, the processor may turn the lighting unit on or to a particular color or intensity. This provides a visual representation of the first bit of the serial number. A person or apparatus viewing the light would understand that the first bit in the serial number is either a one (e.g. light is on) or a zero (e.g. light is off). The next instruction sent to the light may be to read and indicate the setting of the second bit of the address. This process can be followed for each bit of the address allowing a person or apparatus to decipher the address by watching the light sources of the lighting unit turn on and/or off following each command.

After reducing ambient light at a step 4002, a camera may capture at a step 4006 a representation of which lights are turned on at a step 4004. The method may further comprise capturing a representation of which lighting units are illuminated and which lighting units are not illuminated for that instruction. For example, a camera, video or other image capture system may be used to capture the image of the lighting unit(s) following each such network command. Repeating the preceding two steps for all numbered bits of the identifier allows for the reconstruction of the serial number of each lighting unit in the network at an analysis step 4008. At a step 4012 the analysis is used to generate a table of mapping data for lighting units 102.

The method may further comprise assembling the identifier for each of the lighting units, based on the "on" or "off" state of each bit of the identifier as captured in the representation. For example, a person could view the lighting unit's states and record them to decipher the lighting unit's serial number or software can be written to allow the automatic reading of the images and the reassembly of the serial numbers from the images. The software may be used to compare the state of the lighting unit with the instruction to calculate the bit state of the address and then proceed to the next image to calculate the next bit state. The software may be adapted to calculate a plurality or all of the bit states of the associated lighting units in the image and then proceed to the next image to calculate the next bit state. This process could be used to calculate all of the serial numbers of the lighting units in the image.

The method may also comprise assembling a correspondence between the known identifiers (e.g. serial numbers) and the physical locations of the lighting units having the identifiers. For example, the captured image not only contains lighting unit state information but it also contains lighting unit position information. The positioning may be relative or absolute. For example, the lighting units may be mounted on the outside of a building and the image may show a particular lighting unit is below the third window from the right on the seventy second floor. This lighting unit's position may also be referenced to other lighting unit positions such that a map can be constructed which identifies all of the identifiers (e.g. serial numbers) with a lighting unit and its position. Once these positions and/or lighting units are identified, network commands can be directed to the particular lighting units by addressing the commands with the identifier and having the lighting unit respond to data that is addressed to its identifier. The method may further comprise controlling the illumination from the lighting units by sending instructions to the desired lighting units at desired physical locations. Another embodiment may involve sending the now identified lighting units address information such that the lighting units store the address information as its address and will respond to data sent to the address. This method may be useful when it is desired to address the lighting units in some sequential scheme in relation to the physical layout of the lighting units. For example, the user may want to have the addresses sequentially increase as the lighting fixtures go from left to right across the face of a building. This may make authoring of lighting sequences easier because the addresses are associated with position or progression.

Another aspect of the present invention relates to communicating with lighting units and altering their address information. In an embodiment, a lighting unit controller LUC may be associated with several lighting units and the controller may know the address information/identifiers for the lighting units associated with the controller. A user may want to know the relative position of one lighting unit as compared to another and may communicate with the controller to energize a lighting unit such that the user can identify its position within an installation. For example, the user may use a computer with a display to show representations of the controller and the lighting units associated with the controller. The user may select the controller, using the representation on the display, and cause all of the associated lighting units to energize allowing the user to identify their relative or absolute positions. A user may also elect to select a lighting unit address or representation associated with the controller to identify its particular position with the array of other lighting units. The user may repeat this process for all the associated lighting unit addresses to find their relative positions. Then, the user may rearrange the lighting unit representations on the display in an order that is more convenient (e.g. in order of the lighting unit's actual relative positions such as left to right). Information relating to the rearrangement may then be used to facilitate future communications with the lighting units. For example, the information may be communicated to the controller and the lighting units to generate new 'working' addresses for the lighting units that correspond with the re-arrangement. In another embodiment, the information may be stored in a configuration file to facilitate the proper communication to the lighting units.

In embodiments a method of determining/compiling mapping information relating to the physical locations of lighting units is provided that includes steps of providing a display system; providing a representation of a first and second lighting unit wherein the representations are associated with a first address; providing a user interface wherein a user can select a lighting unit and cause the selected lighting units to energize; selecting a lighting unit to identify its position and repeating this step for the other lighting unit; re-arranging the representations of the first lighting unit and the second lighting unit on the display using a user interface; and communicating information to the lighting units relating to the rearrangement to set new system addresses. The method may include other steps such as storing information relating to the re-arrangement of the representations on a storage medium. The storage medium may be any electronic storage medium such as a hard drive; CD; DVD; portable memory system or other memory device. The method may also include the step of storing the address information in a lighting unit as the lighting unit working address.

In various embodiments, once the lighting units have been identified, the lighting unit controller may transmit the address information to a computer system. The computer system may include a display (e.g., a graphics user interface) where a representation of the lighting unit controller is displayed as an object. The display may also provide representations of the lighting unit 102 as an object. In an embodiment, the computer, possibly through a user interface, may be used to re-arrange the order of the lighting unit representations. For example, a user may click on the lighting unit representation and all of the lighting units associated with the lighting unit controller may energize to provide the user with a physical interpretation of the placement of the lighting unit (e.g. they are located on above the window on the $72^{nd}$ floor of the building). Then, the user may click on individual lighting unit representations to identify the physical location of the lighting unit within the array of lighting units. As the user identifies the lighting unit locations, the user may rearrange the lighting unit representations on the computer screen such that they represent the ordering in the physical layout. In an embodiment, this information may be stored to a storage medium. The information may also be used in a configuration file such that future communications with the lighting units are directed per the configuration file. In an embodiment, information relating to the rearrangement may be transmitted to the lighting unit controller and new 'working' addresses may be assigned to the individual lighting units. This may be useful in providing a known configuration of lighting unit addresses to make the authoring of lighting shows and effects easier.

Another aspect of the present invention relates to systems and methods of communicating to large-scale networks of lighting units. In an embodiment, the communication to the lighting units originates from a central controller where information is communicated in high level commands to lighting unit controllers. The high level commands are then interpreted by the lighting unit controllers, and the lighting unit controllers generate lighting unit commands. In an embodiment, the lighting unit controller may include its own address such that commands can be directed to the associated lighting units through controller-addressed information. For example, the central controller may communicate light controller addressed information that contains instructions for a particular lighting effect. The lighting unit controller may monitor a network for its own address and once heard, read the associated information. The information may direct the lighting unit controller to generate a dynamic lighting effect (e.g. a moving rainbow of colors) and then communicate control signals to its associated lighting units to effectuate the lighting effect. In an embodiment, the lighting unit controller may also include group address information. For example, it may include a universe address that associates the controller with other controllers or systems to create a universe of controllers that can be addressed as a group; or it may include a broadcast address such that broadcast commands can be sent to all controllers on the network.

Figure 41:
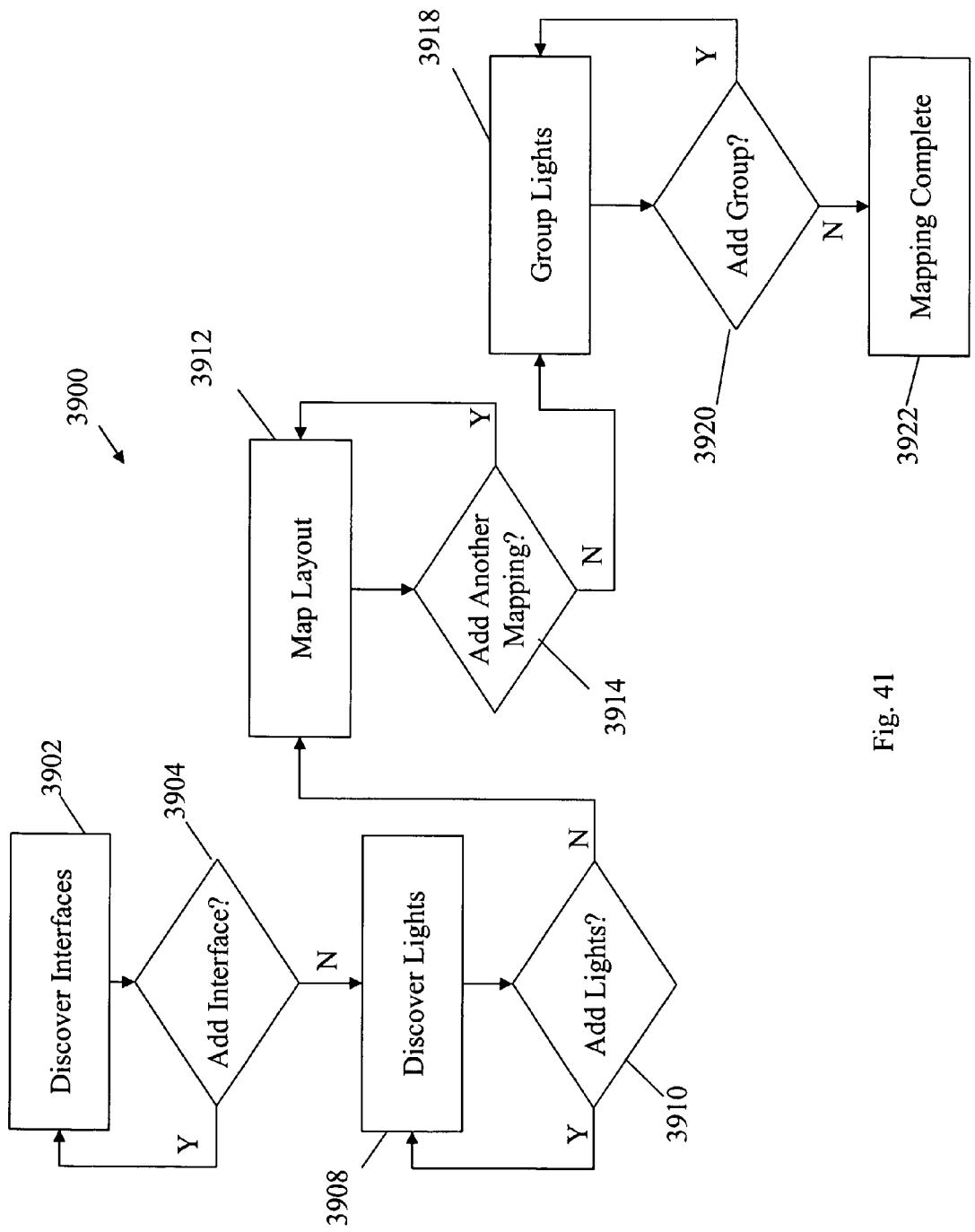
FIG. 41 depicts a method for mapping and grouping lighting systems for purposes of authoring shows.

Referring to FIG. 41, a flow diagram 3900 includes steps for a mapping facility 5002. A mapping facility 5002 can first discover what interfaces are located on an associated network, such as Ethernet switches or power-data systems. The mapping facility can then discover what lights are present. The mapping facility then creates a map layout, using the addresses and locations identified for lights as described above. The mapping can be a two-dimensional representation of the lighting units 102 associated with the mapping facility 5002. The mapping facility 5002 allows the user to group lights within the mapping, until a mapping is complete.

The light system manager 5000 may operate in part on the authoring computer 5010, which may include a mapping facility 5002. The mapping facility 5002 may include a graphical user interface 4212, or management tool, which may assist a user in mapping lighting units to locations. The management tool may include various panes, graphs or tables, each displayed in a window of the management tool. A lights/interfaces pane lists lighting units or lighting unit interfaces that are capable of being managed by the management tool. Interfaces may include power/data supplies (PDS) 1758 for one or more lighting systems, DMX interfaces, DALI interfaces, interfaces for individual lighting units, interfaces for a tile lighting unit, or other suitable interfaces. The interface also includes a groups pane, which lists groups of lighting units that are associated with the management tool, including groups that can be associated with the interfaces selected in the lights/interfaces pane. As described in more detail below, the user can group lighting units into a wide variety of different types of groups, and each group formed by the user can be stored and listed in the groups pane. The interface also includes the layout pane, which includes a layout of individual lighting units for a light system or interface that is selected in the lights/interfaces pane. The layout pane shows a representative geometry of the lighting units associated with the selected interface, such as a rectangular array if the interface is an interface for a rectangular tile light. The layout can be any other configuration, as described in connection with the other figures above. Using the interface 4212, a user can discover lighting systems or interfaces for lighting systems, map the layout of lighting units associated with the lighting system, and create groups of lighting units within the mapping, to facilitate authoring of shows or effects across groups of lights, rather than just individual lights. The grouping of lighting units dramatically simplifies the authoring of complex shows for certain configurations of lighting units.

Figure 42:
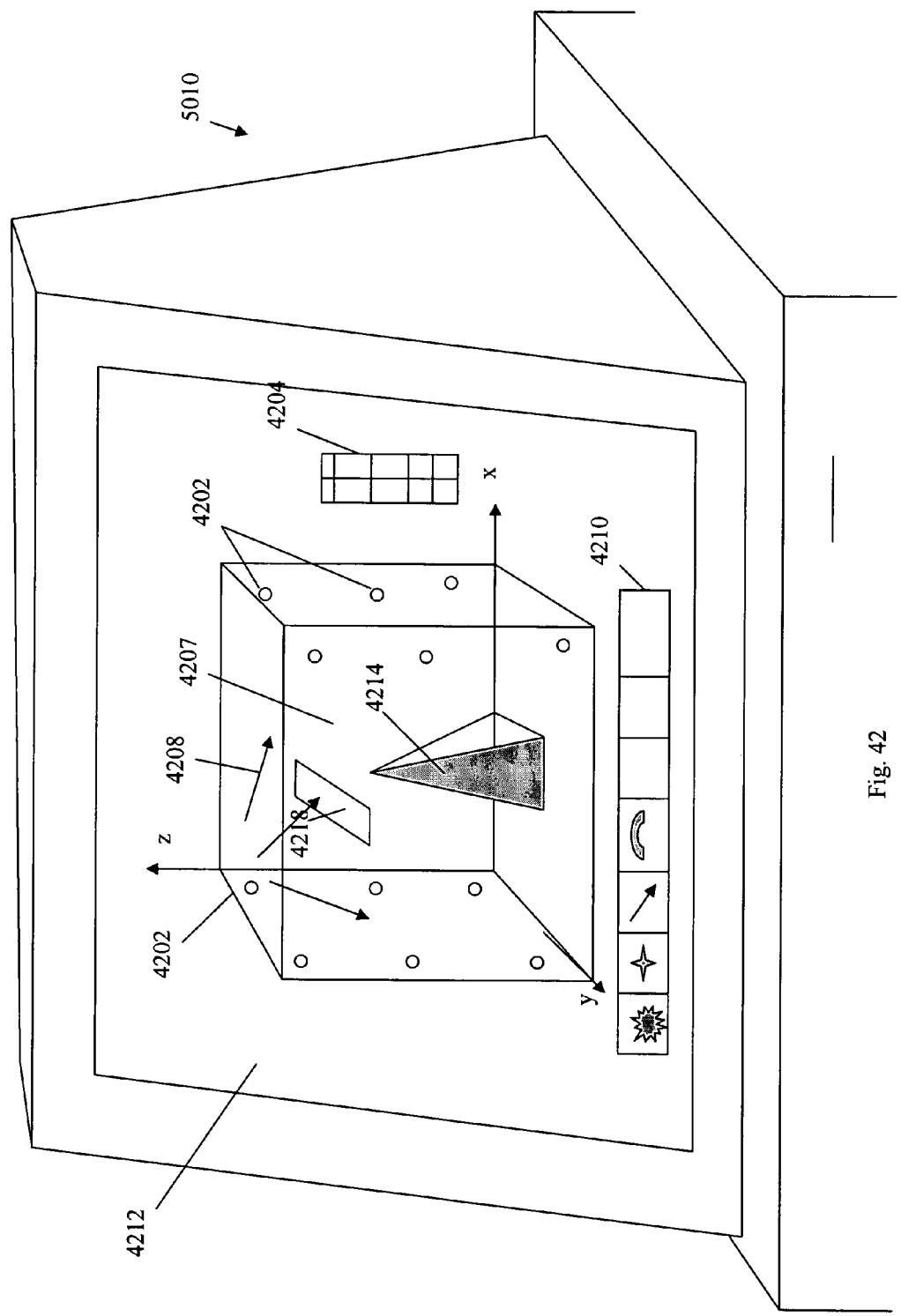
FIG. 42 depicts a graphical user interface for authoring lighting shows.

Referring to FIG. 42, the graphical user interface 4212 of the mapping facility 5002 of the authoring computer 5010 can display a map, or it may represent a two- or three- dimensional space in another way, such as with a coordinate system, such as Cartesian, polar or spherical coordinates. In embodiments, lights in an array, such as a rectangular array, can be represented as elements in a matrix, such as with the lower left corner being represented as the origin (0, 0) and each other light being represented as a coordinate pair (x, y), with x being the number of positions away from the origin in the horizontal direction and y being the number of positions away from the origin in the vertical direction. Thus, the coordinate (3, 4) can indicate a light system three positions away from the origin in the horizontal direction and four positions away from the origin in the vertical direction. Using such a coordinate mapping, it is possible to map addresses of real world lighting systems into a virtual environment, where control signals can be generated and associated geometrically with the lighting systems. With conventional addressable lighting systems, a Cartesian coordinate system may allow for mapping of light system locations to authoring systems for light shows. In other embodiments, three-dimensional representations can be provided to simulate three-dimensional locations of lights in the real world, and object-oriented techniques allow manipulation of the representations in the graphical user interface 4212 to be converted to lighting control signals that reflect what is occurring in the graphical user interface 4212.

It may be convenient to map lighting systems in various ways. For example, a rectangular array can be formed by suitably arranging a curvilinear string of lighting units. The string of lighting units may use a serial addressing protocol, such as described in the applications incorporated by reference herein, wherein each lighting unit in the string reads, for example, the last unaltered byte of data in a data stream and alters that byte so that the next lighting unit will read the next byte of data. If the number of lighting units N in a rectangular array of lighting units is known, along with the number of rows in which the lighting units are disposed, then, using a table or similar facility, a conversion can be made from a serial arrangement of lighting units 1 to N to another coordinate system, such as a Cartesian coordinate system. Thus, control signals can be mapped from one system to the other system. Similarly, effects and shows generated for particular configurations can be mapped to new configurations, such as any configurations that can be created by arranging a string of lighting units, whether the share is rectangular, square, circular, triangular, or has some other geometry. In embodiments, once a coordinate transformation is known for setting out a particular geometry of lights, such as building a two-dimensional geometry with a curvilinear string of lighting units, the transformation can be stored as a table or similar facility in connection with the light management system 5002, so that shows authored using one authoring facility can be converted into shows suitable for that particular geometric arrangement of lighting units using the light management system 5002. The light system composer 5004 can store pre-arranged effects that are suitable for known geometries, such as a color chasing rainbow moving across a tile light with sixteen lighting units in a four-by-four array, a burst effect moving outward from the center of an eight-by-eight array of lighting units, or many others.

Various other geometrical configurations of lighting units are so widely used as to benefit from the storing of pre-authored coordinate transformations, shows and effects. For example, a rectangular configuration is widely employed in architectural lighting environments, such as to light the perimeter of a rectangular item, such as a space, a room, a hallway, a stage, a table, an elevator, an aisle, a ceiling, a wall, an exterior wall, a sign, a billboard, a machine, a vending machine, a gaming machine, a display, a video screen, a swimming pool, a spa, a walkway, a sidewalk, a track, a roadway, a door, a tile, an item of furniture, a box, a housing, a fence, a railing, a deck, or any other rectangular item. Similarly, a triangular configuration can be created, using a curvilinear string of lighting units, or by placing individual addressable lighting units in the configuration. Again, once the locations of lighting units and the dimensions of the triangle are known, a transformation can be made from one coordinate system to another, and pre-arranged effects and shows can be stored for triangular configurations of any selected number of lighting units. Triangular configurations can be used in many environments, such as for lighting triangular faces or items, such as architectural features, alcoves, tiles, ceilings, floors, doors, appliances, boxes, works of art, or any other triangular items.

Lighting units 102 can be placed in the form of a character, number, symbol, logo, design mark, trademark, icon, or other configuration designed to convey information or meaning. The lighting units can be strung in a curvilinear string to achieve any configuration in any dimension. Again, once the locations of the lighting units are known, a conversion can be made between Cartesian (x, y) coordinates and the positions of the lighting units in the string, so that an effect generated using a one coordinate system can be transformed into an effect for the other. Characters such as those mentioned above can be used in signs, on vending machines, on gaming machines, on billboards, on transportation platforms, on buses, on airplanes, on ships, on boats, on automobiles, in theatres, in restaurants, or in any other environment where a user wishes to convey information.

Lighting units can be configured in any arbitrary geometry, not limited to two-dimensional configurations. For example, a string of lighting units can cover two sides of a building. The three-dimensional coordinates (x, y, z) can be converted based on the positions of the individual lighting units in the string. Once a conversion is known between the (x, y, z) coordinates and the string positions of the lighting units, shows authored in Cartesian coordinates, such as for individually addressable lighting units, can be converted to shows for a string of lighting units, or vice versa. Pre-stored shows and effects can be authored for any geometry, whether it is a string or a two- or three-dimensional shape. These include rectangles, squares, triangles, geometric solids, spheres, pyramids, tetrahedrons, polyhedrons, cylinders, boxes and many others, including shapes found in nature, such as those of trees, bushes, hills, or other features.

Referring to FIG. 41, a flow diagram 3900 shows various steps that are optionally accomplished using the mapping facility 5002, such as the interface 4212, to map lighting units and interfaces for an environment into maps and layouts on the authoring computer 5010. At a step 3902, the mapping facility 1652 can discover interfaces for lighting systems, such as power/data supplies 1758, tile light interfaces, DMX or DALI interfaces, or other lighting system interfaces, such as those connected by an Ethernet switch. At a step 3904 a user determines whether to add more interfaces, returning to the step 3902 until all interfaces are discovered. At a step 3908 the user can discover a lighting unit, such as one connected by Ethernet, or one connected to an interface discovered at the step 3902. The lights can be added to the map of lighting units associated with each mapped interface, such as in the lights/interfaces pane of the interface 4212. At a step 3910 the user can determine whether to add more lights, returning to the step 3908 until all lights are discovered. When all interfaces and lights are discovered, the user can map the interfaces and lights, such as using the layout pane of the interface 4212. Standard maps can appear for tiles, strings, arrays, or similar configurations. Once all lights are mapped to locations in the layout pane, a user can create groups of lights at a step 3918, returning from the decision point 3920 to the step 3918 until the user has created all desired groups. The groups appear in the groups pane as they are created. The order of the steps in the flow diagram 3900 can be changed; that is, interfaces and lights can be discovered, maps created, or groups formed, in various orders. Once all interfaces and lights are discovered, maps created and groups formed, the mapping is complete at a step 3922. Many embodiments of a graphical user interface for mapping lights in a software program may be envisioned by one of skill in the art in accordance with this invention.

Using a mapping facility, light systems can optionally be mapped into separate zones, such as DMX zones. The zones can be separate DMX zones, including zones located in different rooms of a building. The zones can be located in the same location within an environment. In embodiments the environment can be a stage lighting environment.

Thus, in various embodiments, the mapping facility allows a user to provide a grouping facility for grouping light systems, wherein grouped light systems respond as a group to control signals. In embodiments the grouping facility comprises a directed graph. In embodiments, the grouping facility comprises a drag and drop user interface. In embodiments, the grouping facility comprises a dragging line interface. The grouping facility can permit grouping of any selected geometry, such as a two-dimensional representation of a three-dimensional space. In embodiments, the grouping facility can permit grouping as a two-dimensional representation that is mapped to light systems in a three-dimensional space. In embodiments, the grouping facility groups lights into groups of a predetermined conventional configuration, such as a rectangular, two-dimensional array, a square, a curvilinear configuration, a line, an oval, an oval-shaped array, a circle, a circular array, a square, a triangle, a triangular array, a serial configuration, a helix, or a double helix.

Referring to FIG. 42, a light system composer 5004 can be provided, running on the authoring computer 5010, for authoring lighting shows comprised of various lighting effects. The lighting shows can be downloaded to the light system engine 5008, to be executed on lighting units 102. The light system composer 5004 is preferably provided with a graphical user interface 4212, with which a lighting show developer interacts to develop a lighting show for a plurality of lighting units 102 that are mapped to locations through the mapping facility 5002. The user interface 4212 supports the convenient generation of lighting effects, embodying the object-oriented programming approaches described above.

Figure 43:
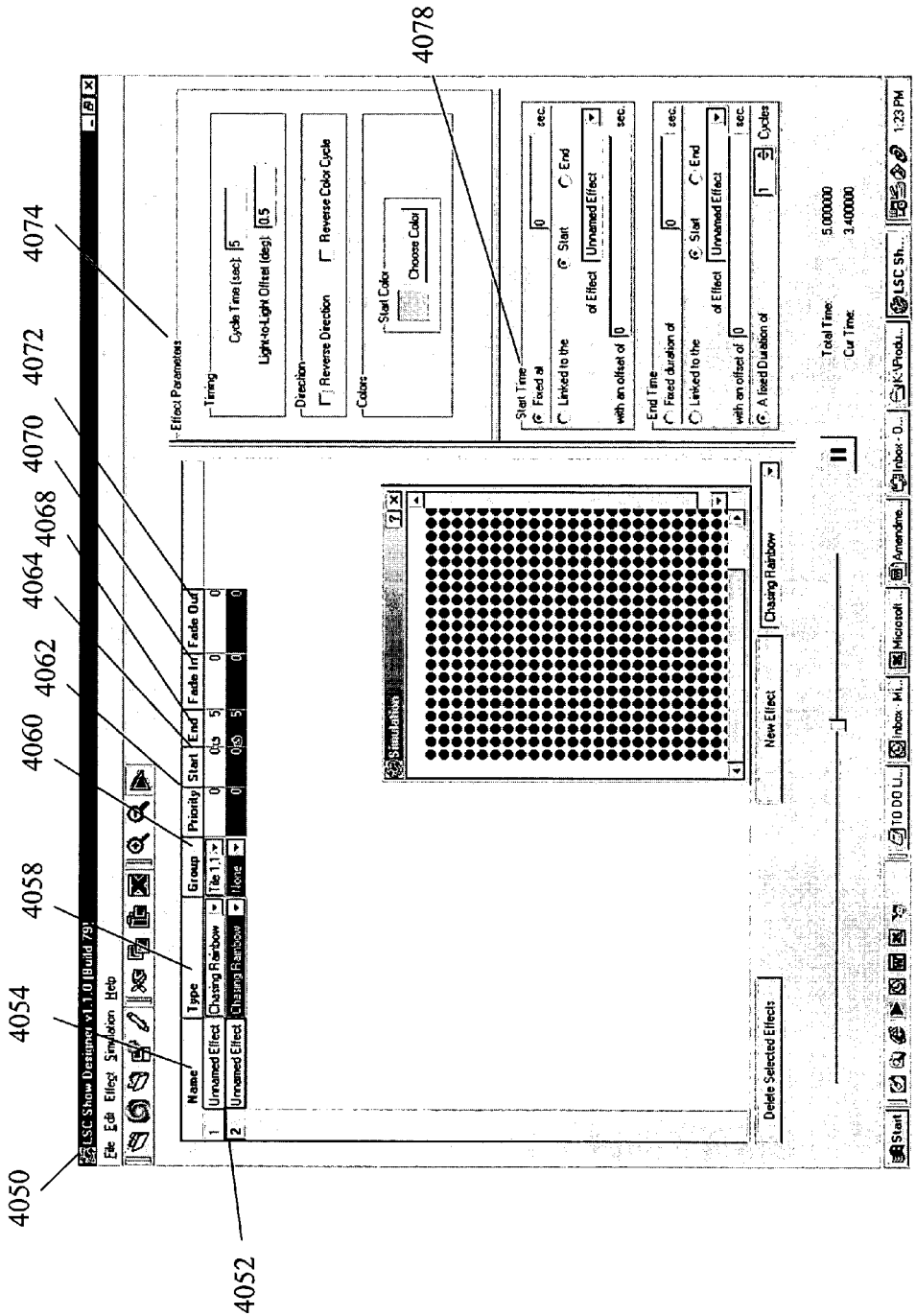
FIG. 43 depicts a user interface screen for an authoring facility.

Referring to FIG. 43, the user interface 4212 allows a user to develop shows and effects for associated lighting units 102. The user can select an existing effect by initiating a tab 4052 to highlight that effect. In embodiments, certain standard attributes are associated with all or most effects. Each of those attributes can be represented by a field in the user interface 4050. For example, a name field 4054 can hold the name of the effect, which can be selected by the user. A type field 4058 allows the user to enter a type of effect, which may be a custom type of effect programmed by the user, or may be selected from a set of preprogrammed effect types, such as by clicking on a pull-down menu to choose among effects. For example, in FIG. 43, the type field 4058 for the second listed effect indicates that the selected effect is a color-chasing rainbow. A group field 4060 indicates the group to which a given effect is assigned, such as a group created through the light system manager interface 2550 described above. For example, the group might be the first row of a tile light, or it might be a string of lights disposed in an environment. A priority field 4062 indicates the priority of the effect, so that different effects can be ranked in their priority. For example, an effect can be given a lower priority, so that if there are conflicting effects for a given group during a given show, the a higher priority effect takes precedence. A start field 4064 allows the user to indicate the starting time for an effect, such as in relation to the starting point of a lighting show. An end field 4068 allows the user to indicate the ending time for the effect, either in relation to the timing of the lighting show or in relation to the timing of the start of the effect. A fade in field 4070 allows the user to create a period during which an effect fades in, rather than changes abruptly. A fade out field 4072 allows the user to fade the effect out, rather than ending it abruptly. For a given selected type of effect, the parameters of the effect can be set in an effects pane 4074. The effects pane 4074 automatically changes, prompting the user to enter data that sets the appropriate parameters for the particular type of effect. A timing pane 4078 allows the user to set timing of an effect, such as relative to the start of a show or relative to the start or end of another effect. Parameters can exist for all or most effects. These include the name 4152, the type 4154, the group 4158, the priority 4160, the start time 4162, the end time 4164, the fade in parameter 4168 and the fade out parameter 4170.

Figure 44:
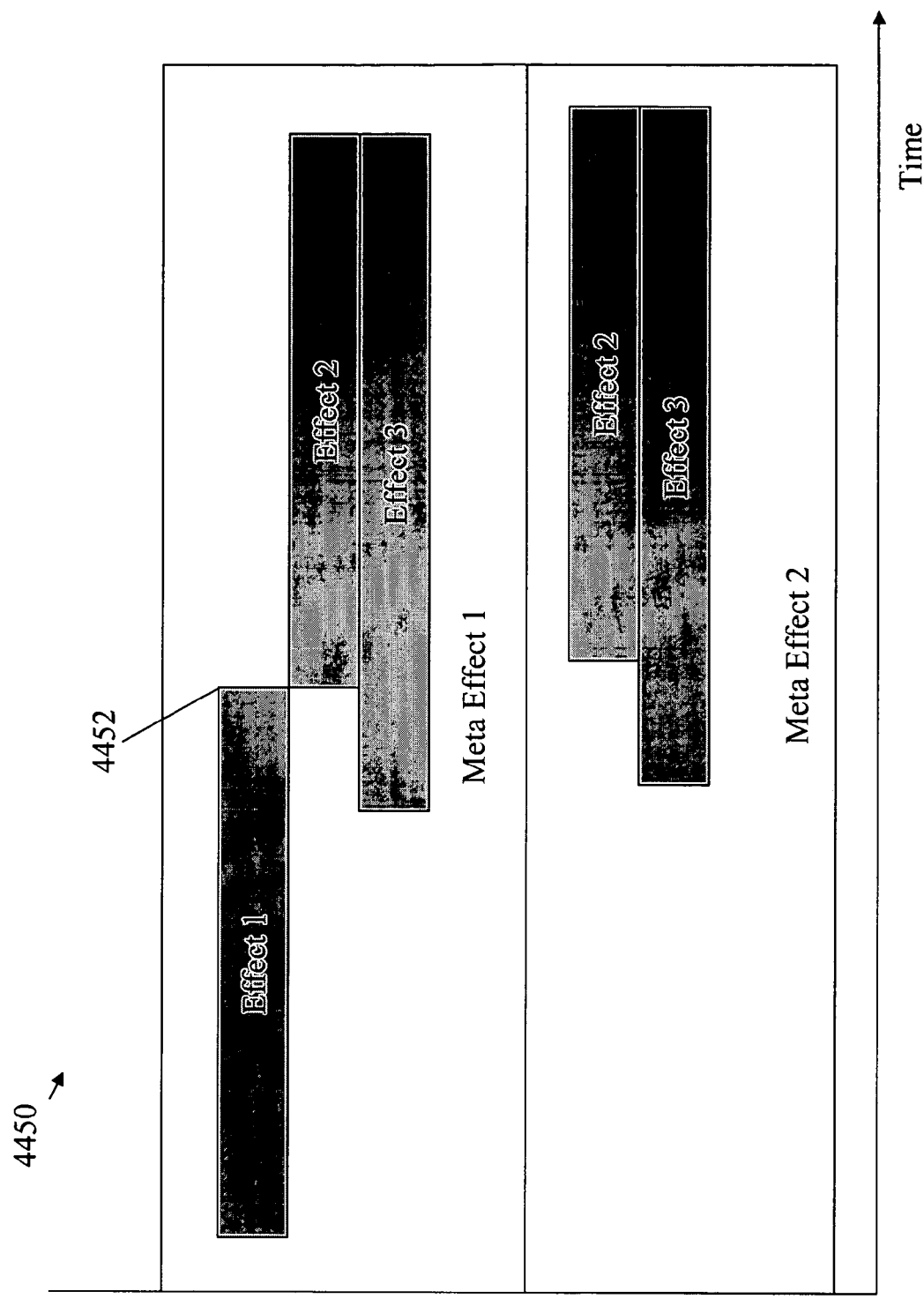
FIG. 44 depicts effects and meta effects for a lighting show.

Referring to FIG. 44, a set of effects can be linked temporally, rather than being set at fixed times relative to the beginning of a show. For example, a second effect can be linked to the ending of a first effect at a point 4452. Similarly, a third effect might be set to begin at a time that is offset by a fixed amount relative to the beginning of the second effect. With linked timing of effects, a particular effect can be changed, without requiring extensive editing of all of the related effects in a lighting show. Once a series of effects is created, each of them can be linked, and the group can be saved together as a meta effect, which can be executed across one or more groups of lights. Once a user has created meta effects, the user can link them, such as by linking a first meta effect and a second meta effect in time relative to each other. Linking effects and meta effects, a user can script entire shows, or portions of shows. The creation of reusable meta effects can greatly simplify the coding of shows across groups.

In embodiments a user can select an animation effect, in which a user can generate an effect using software used to generate a dynamic image, such as Flash 5 computer software offered by Macromedia, Incorporated. Flash 5 is a widely used computer program to generate graphics, images and animations. Other useful products used to generate images include, for example, Adobe Illustrator, Adobe Photoshop, and Adobe LiveMotion.

Figure 45:
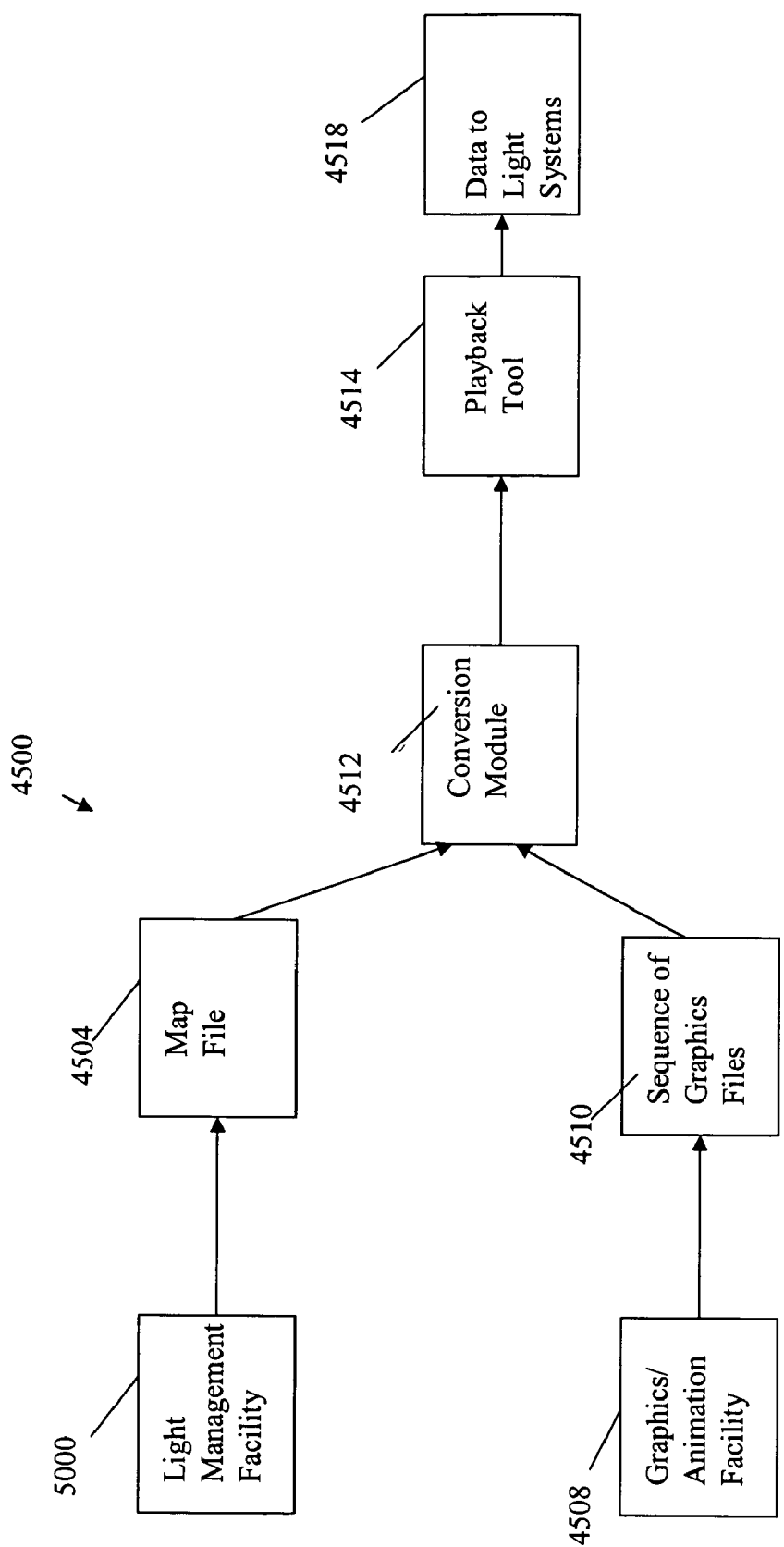
FIG. 45 depicts steps for converting an animation into a set of lighting control signals.

Referring to FIG. 45, a flow diagram 4500 shows steps for converting computer animation data to lighting control signals. In a light management facility 5000, a map file 4504 is created. A graphics facility 4508 is used to create an animation, which is a sequence 4510 of graphics files. A conversion module 4512 converts the map file and the animation facility, based on linking pixels in the animation facility to lights in the mapping facility. The playback tool 4514 delivers data to light systems 4518, so that the light systems 100 play lighting shows that correspond to the animation effects generated by the animation facility.

Various effects can be created, such as a fractal effect, a random color effect, a sparkle effect, streak effect, sweep effect, white fade effect, XY burst effect, XY spiral effect, and text effect.

As seen in connection with the various embodiments of the user interface 4212 and related figures, methods and systems are included herein for providing a light system composer 5004 for allowing a user to author a lighting show using a graphical user interface 4212. The light system composer 5004 includes an effect authoring system for allowing a user to generate a graphical representation of a lighting effect. In embodiments the user can set parameters for a plurality of predefined types of lighting effects, create user-defined effects, link effects to other effects, set timing parameters for effects, generate meta effects, and generate shows comprised of more than one meta effect, including shows that link meta effects.

In embodiments, a user may assign an effect to a group of light systems. Many effects can be generated, such as a color chasing rainbow, a cross fade effect, a custom rainbow, a fixed color effect, an animation effect, a fractal effect, a random color effect, a sparkle effect, a streak effect, an X burst effect, an XY spiral effect, and a sweep effect.

In embodiments an effect can be an animation effect. In embodiments the animation effect corresponds to an animation generated by an animation facility. In embodiments the effect is loaded from an animation file. The animation facility can be a flash facility, a multimedia facility, a graphics generator, or a three-dimensional animation facility.

In embodiments the lighting show composer facilitates the creation of meta effects that comprise a plurality of linked effects. In embodiments the lighting show composer generates an XML file containing a lighting show according to a document type definition for an XML parser for a light engine. In embodiments the lighting show composer includes stored effects that are designed to run on a predetermined configuration of lighting systems. In embodiments the user can apply a stored effect to a configuration of lighting systems. In embodiments the light system composer includes a graphical simulation of a lighting effect on a lighting configuration. In embodiments the simulation reflects a parameter set by a user for an effect. In embodiments the light show composer allows synchronization of effects between different groups of lighting systems that are grouped using the grouping facility. In embodiments the lighting show composer includes a wizard for adding a predetermined configuration of light systems to a group and for generating effects that are suitable for the predetermined configuration. In embodiments the configuration is a rectangular array, a string, or another predetermined configuration.

Once a show is downloaded to the light system engine 5008, the light system engine 5008 can execute one or more shows in response to a wide variety of user input. For example, a stored show can be triggered for a lighting unit 102 that is mapped to a particular PDS 1758 associated with a light system engine 5008. There can be a user interface for triggering shows downloaded on the light system engine 5008. For example, the user interface may be a keypad, with one or more buttons for triggering shows. Each button might trigger a different show, or a given sequence of buttons might trigger a particular show, so that a simple push-button interface can trigger many different shows, depending on the sequence. In embodiments, the light system engine 5008 might be associated with a stage lighting system, so that a lighting operator can trigger pre-scripted lighting shows during a concert or other performance by pushing the button at a predetermined point in the performance.

In embodiments, other user interfaces can trigger shows stored on a light system engine 5008, such as a knob, a dial, a button, a touch screen, a serial keypad, a slide mechanism, a switch, a sliding switch, a switch/slide combination, a sensor, a decibel meter, an inclinometer, a thermometer, a anemometer, a barometer, or any other input capable of providing a signal to the light system engine 5008. In embodiments the user interface is the serial keypad, wherein initiating a button on the keypad initiates a show in at least one zone of a lighting system governed by a light system engine connected to the keypad.

Figure 46:
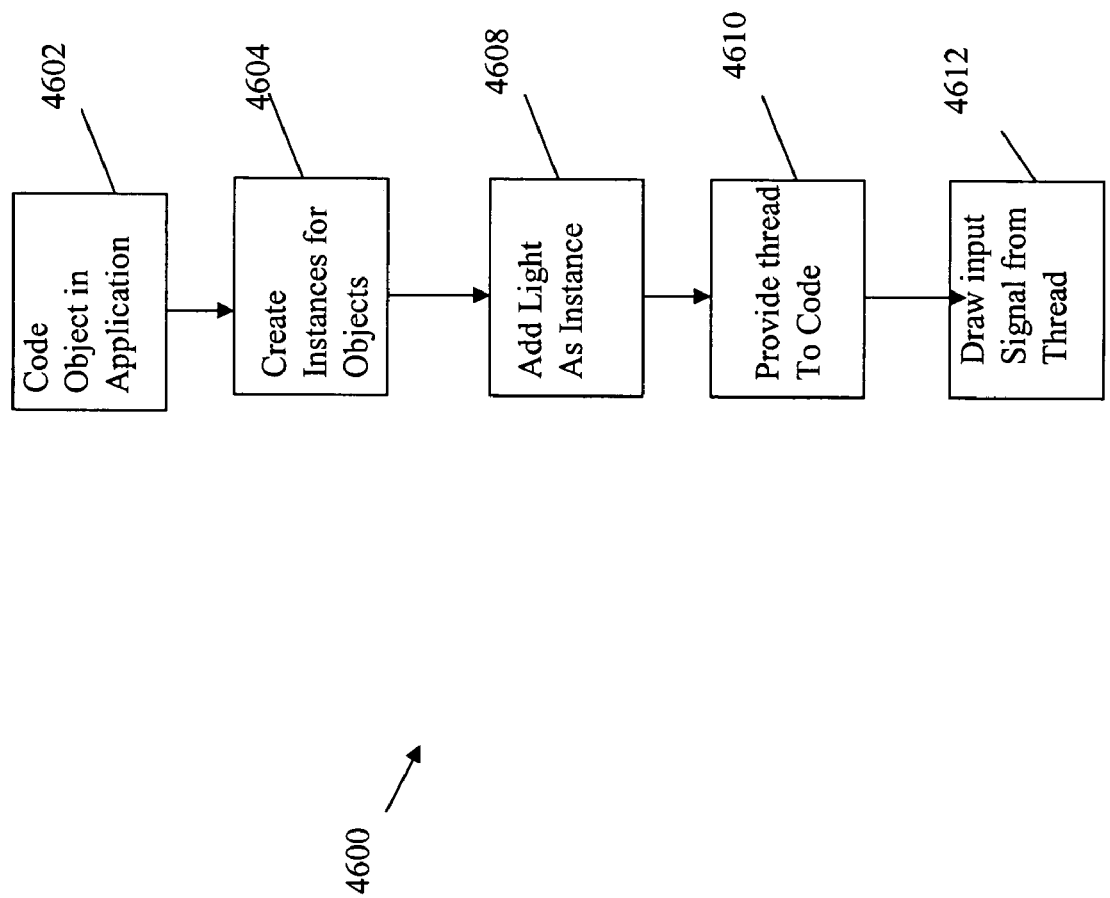
FIG. 46 depicts steps for associating lighting control signals with other object-oriented programs.

Referring to FIG. 46, a flow diagram 4600 indicates steps for object-oriented authoring of lighting shows as associated with other computer programs, such as computer games, three-dimensional simulations, entertainment programs and the like. First, at a step 4602 it is possible to code an object in an application. At a step 4604 it is possible to create instances for the objects. At a step 4608 light a system can add light as an instance to the object in the program. At the step 4610 the system can add a thread to the code of the object-oriented program. At a step 4612 the system can draw an input signal from the thread of the object-oriented program for delivering control signals to a light system 100. By adding light as an instance, lighting control signals can go hand-in-hand with other objects, instances and events that take place in other object-oriented computer programs.

Figure 47:
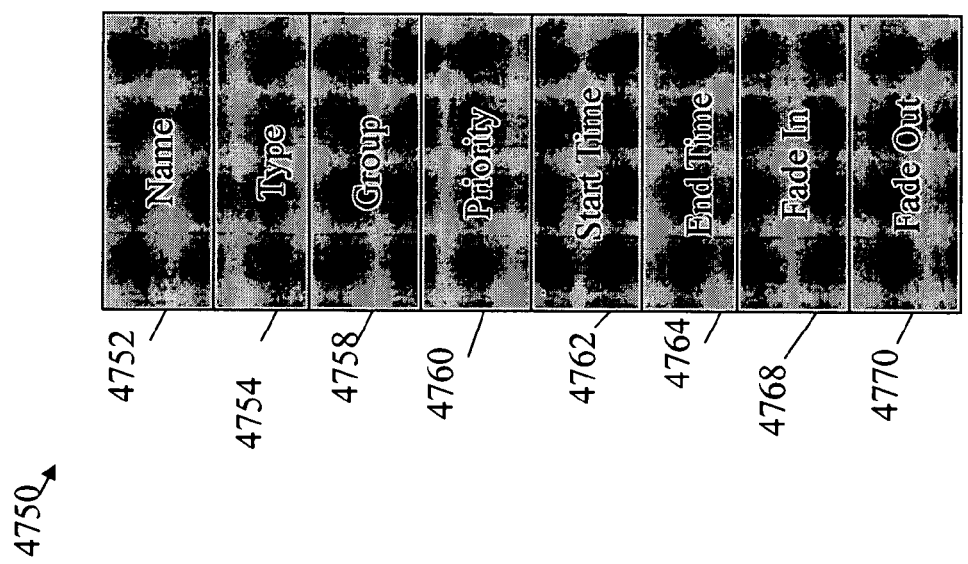
FIG. 47 depicts parameters for effects.

Referring to FIG. 47, a light system composer 5004 can be used to generate an effect that has various parameters. The parameters include the name 4752, type 4754, group 4758, priority 4760, start time 4762, end time 4764, fade in 4768 and fade out 4770, as well as other parameters for particular effects.

FIG. 2 also illustrates that the lighting unit 102 may be configured to receive one or more signals 122 from one or more other signal sources 8400. In one implementation, the processor 3600 of the lighting unit may use the signal(s), either alone or in combination with other control signals (e.g., signals generated by executing a lighting program, one or more outputs from a user interface, etc.), so as to control one or more of the light sources 300 in a manner similar to that discussed above in connection with the user interface 4908.

Examples of the signal(s) that may be received and processed by the processor 3600 include, but are not limited to, one or more audio signals, video signals, power signals, various types of data signals, signals representing information obtained from a network (e.g., the Internet), signals representing some detectable/sensed condition, signals from lighting units, signals consisting of modulated light, etc. In various implementations, the signal source(s) 8400 may be located remotely from the lighting unit 102, or included as a component of the lighting unit. For example, in one embodiment, a signal from one lighting unit 102 could be sent over a network to another lighting unit 102.

Some examples of a signal source 8400 that may be employed in, or used in connection with, the lighting unit 102 of FIG. 2 include any of a variety of sensors 8402 or transducers that generate one or more signals in response to some stimulus. Examples of such sensors include, but are not limited to, various types of environmental condition sensors, such as thermally sensitive (e.g., temperature, infrared) sensors, humidity sensors, motion sensors, photosensors/light sensors (e.g., sensors that are sensitive to one or more particular spectra of electromagnetic radiation), sound or vibration sensors or other pressure/force transducers (e.g., microphones, piezoelectric devices), and the like.

Additional examples of a signal source 8400 include various metering/detection devices that monitor electrical signals or characteristics (e.g., voltage, current, power, resistance, capacitance, inductance, etc.) or chemical/biological characteristics (e.g., acidity, a presence of one or more particular chemical or biological agents, bacteria, etc.) and provide one or more signals based on measured values of the signals or characteristics. Yet other examples of a signal source 8400 include various types of scanners, image recognition systems, voice or other sound recognition systems, artificial intelligence and robotics systems, and the like.

A signal source 8400 could also be a lighting unit 102, a processor 3600, or any one of many available signal generating devices, such as media players, MP3 players, computers, DVD players, CD players, television signal sources, camera signal sources, microphones, speakers, telephones, cellular phones, instant messenger devices, SMS devices, wireless devices, personal organizer devices, and many others.

Many types of signal source 8400 can be used, for sensing any condition or sending any kind of signal, such as temperature, force, electricity, heat flux, voltage, current, magnetic field, pitch, roll, yaw, acceleration, rotational forces, wind, turbulence, flow, pressure, volume, fluid level, optical properties, luminosity, electromagnetic radiation, radio frequency radiation, sound, acoustic levels, decibels, particulate density, smoke, pollutant density, positron emissions, light levels, color, color temperature, color saturation, infrared radiation, x-ray radiation, ultraviolet radiation, visible spectrum radiation, states, logical states, bits, bytes, words, data, symbols, and many others described herein, described in the documents incorporated by reference herein, and known to those of ordinary skill in the arts.

In embodiments the lighting unit 102 can include a timing feature based on an astronomical clock, which stores not simply time of day, but also solar time (sunrise, sunset) and can be used to provide other time measurements such as lunar cycles, tidal patterns and other relative time events (harvest season, holidays, hunting season, fiddler crab season, etc.) In embodiments, using a timing facility, a controller 202 can store data relating to such time-based events and make adjustments to control signals based on them. For example, a lighting unit 102 can allow 'cool' color temperature in the summer and warm color temperatures in the winter.

In embodiments the sensor 8402 can be a light sensor, and the sensor can provide control of a lighting signal based on a feedback loop, in which an algorithm modifies the lighting control signal based on the lighting conditions measured by the sensor. In embodiments, a closed-loop feedback system can read spectral properties and adjust color rendering index, color temperature, color, intensity, or other lighting characteristics based on user inputs or feedback based on additional ambient light sources to correct or change light output.

A feedback system, whether closed loop or open loop, can be of particular use in rendering white light. Some LEDs, such as those containing amber, can have significant variation in wavelength and intensity over operating regimes. Some LEDs also deteriorate quickly over time. To compensate for the temperature change, a feedback system can use a sensor to measure the forward voltage of the LEDs, which gives a good indication of the temperature at which the LEDs are running. In embodiments the system could measure forward voltage over a string of LEDs rather than the whole fixture and assume an average value. This could be used to predict running temperature of the LED to within a few percent. Lifetime variation would be taken care of through a predictive curve based on experimental data on performance of the lights. Degradation can be addressed through an LED that produces amber or red through another mechanism such as phosphor conversion and does this through a more stable material, die or process. Consequently, CRI could also improve dramatically. That LED plus a bluish white or Red LED then enables a color temperature variable white source with good CRI.

In embodiments a lighting system may coordinate with an external system 8800, such as to trigger lighting shows or effects in response to events of the external system, to coordinate the lighting system with the other system, or the like. External systems 8800 can include other lighting systems 100, entertainment systems, security systems, control systems, information technology systems, servers, computers, personal digital assistants, transportation systems, and many other computer-based systems, including control signals for specific commercial or industrial applications, such as machine vision systems, photographic systems, medical systems, pool systems, spa systems, automotive systems, and many others.

A lighting system 100 can be used to produce various effects 9200, including static effects, dynamic effects, meta effects, geometric effects, object-oriented shows and the like. Effects can include illumination effects 9300, where light from a lighting unit 102 illuminates another object, such as a wall, a diffuser, or other object. Illumination effects 9300 include generating white lighting with color-temperature control. Effects can also include direct view effects 9400, where light sources 300 are viewed directly or through another material. Direct view effects include displays, works of art, information effects, and others. Effects can include pixel-like effects, effects that occur along series or strings of lighting units 102, effects that take place on arrays of lighting units 102, and three-dimensional effects.

In various embodiments of the present invention, the lighting unit 102 shown in FIG. 2 may be used alone or together with other similar lighting units in a system of lighting units (e.g., as discussed further below in connection with FIG. 2). Used alone or in combination with other lighting units, the lighting unit 102 may be employed in a variety of applications including; but not limited to, interior or exterior space illumination in general, direct or indirect illumination of objects or spaces, theatrical or other entertainment-based/special effects illumination, decorative illumination, safety-oriented illumination, vehicular illumination, illumination of displays and/or merchandise (e.g. for advertising and/or in retail/consumer environments), combined illumination and communication systems, etc., as well as for various indication and informational purposes.

Figure 48:
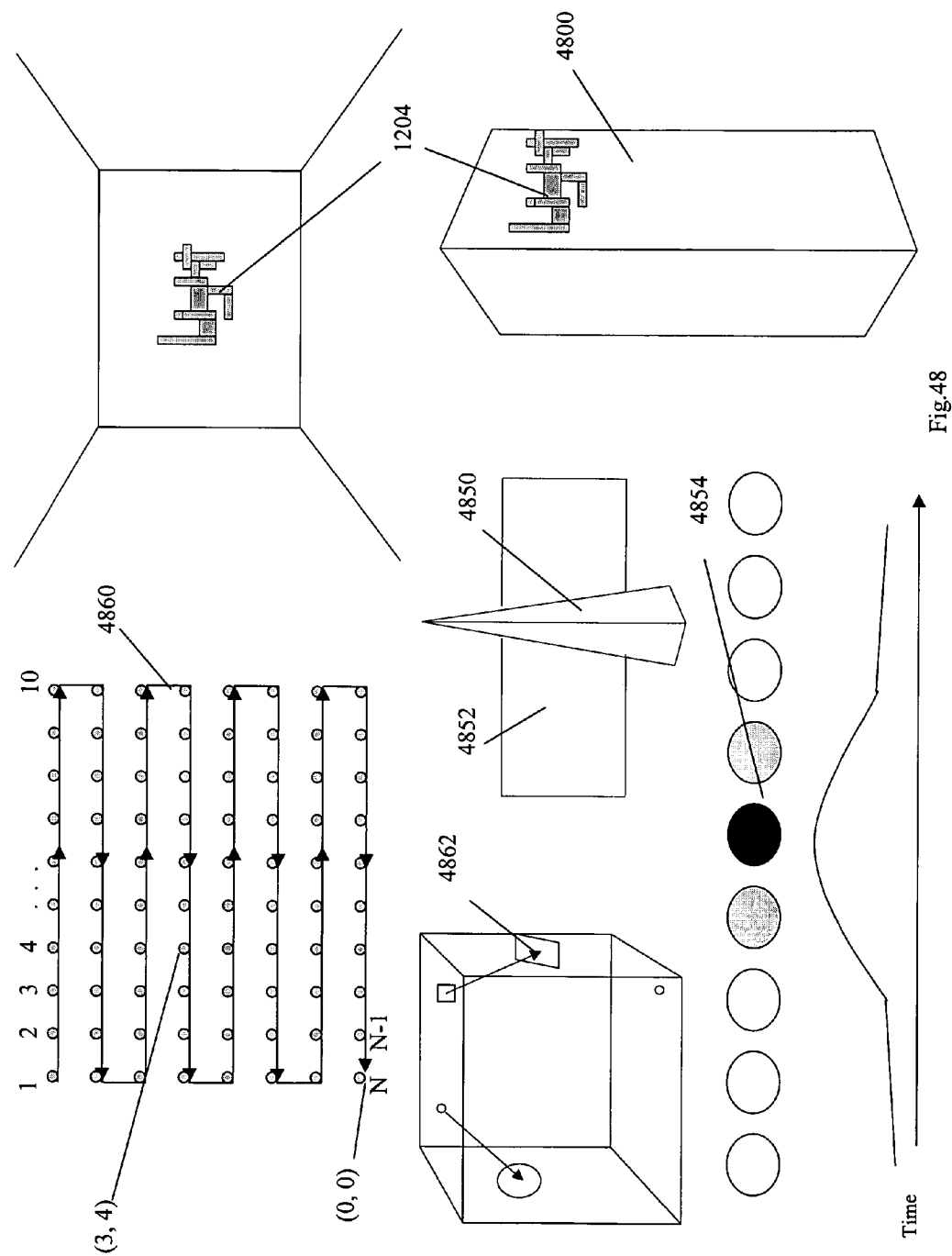
FIG. 48 depicts effects that can be created using lighting systems.

Referring to FIG. 48, an effect 9200 can include a symbolic effect, such as a sign 1204 disposed on the exterior of a building 4800 or on an interior wall or other object. Such a sign 1204 can be displayed many other places, such as inside a building, on a floor, wall, or ceiling, in a corridor, underwater, submerged in a liquid other than water, or in many other environments. A sign 1204 can consist of a backlit display portion and a configuration, such as of letters, numbers, logos, pictures, or the like. The lighting of the backlit portion and the configuration can be coordinated to provide contrasting colors and various aesthetic effects.

Referring to FIG. 48, an object 4850 is lit by a lighting system 4850. In this case the object 4850 is a three-dimensional object. The object 4850 can also be lit internally, to provide its own illumination. Thus, the object 4850 can include color and color temperature of light as a medium, which can interact with changes in color and color temperature from the lighting system 4850. FIG. 48 depicts a foreground object 4850 and a background 4852, both with lighting units 102. Thus, both the foreground object 4850 and the background 4852 can be illuminated in various colors, intensities or color temperatures. In an embodiment, the illumination of the foreground object 4850 and the background 4852 can be coordinated by a processor 3600, such as to produce complementary illumination. For example, the colors of the two can be coordinated so that the color of the background 4852 is a complementary color to the color of the foreground object 4850, so when the background 4852 is red, the foreground object 4850 is green, etc. Any object 4850 in any environment can serve as a foreground object 4850. For example, it might be an item of goods in a retail environment, an art object in a display environment, an emergency object in a safety environment, a tool in a working environment, or the like. For example, if a processor 3600 is part of a safety system, the object 4850 could be a fire extinguisher, and the background 4852 could be the case that holds the extinguisher, so that the extinguisher is illuminated upon a fire alert to make it maximally noticeable to a user. Similarly, by managing the contrast between the background 4852 and the object 4850, an operator of a retail environment can call attention to the object 4850 to encourage purchasing.

In embodiments linear strings or series of lights can embody time-based effects 4854, such as to light a lighting unit 102 in a series when a timed-pulse crosses the location of that lighting unit 102.

Effects can be designed to play on arrays 4860, such as created by strings of lighting units 102 that are arranged in such arrays. Effects can be designed in accordance with target areas 4862 that are lit by lighting units 102, rather than in accordance with the lighting units 102 themselves.

Figure 49:
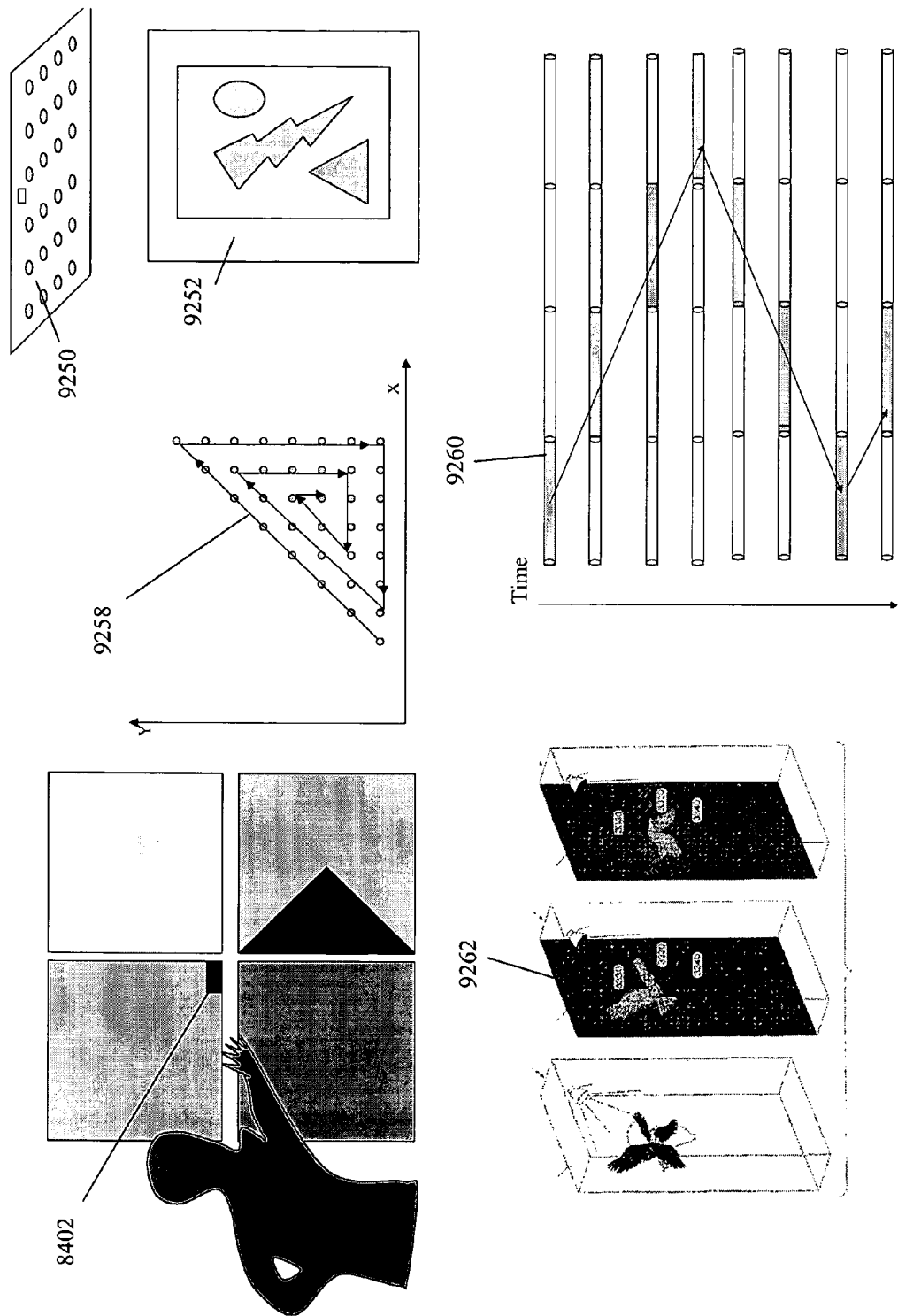
FIG. 49 depicts additional effects.

Referring to FIG. 49, effects can be tied to a sensor 8402 that detects motion in proximity to a lighting unit 102. Waving a hand or other object in proximity to the sensor 8402 can trigger shows or effects. Effects can also play out over arrays, such as triangular configurations 9258 and rectangular arrays 9260. Effects can cause shows to play out over such arrays in a wide range of effects, such as a bounce effect 9260. In embodiments a lighting system 9250 illuminates an object 9252. Depending on the color of the object, it may either be highlighted or not based on the color of the illumination. For example, red illumination will highlight a red object, but blue illumination will make the red object appear dark. Systems can produce motion effects 9262 by illuminating in different colors over time, so that different items appear highlighted at different times, such as the wings 9262 of different colors in FIG. 49.

Referring to FIG. 50, in embodiments of the methods and systems provided herein, the lighting systems further include disposing at least one such lighting unit on a building 5050. In embodiments the lighting units are disposed in an array on a building. In embodiments the array is configured to facilitate displaying at least one of a number, a word, a letter, a logo, a brand, and a symbol. In embodiments the array is configured to display a light show with time-based effects. In other embodiments lighting units may be disposed on interior walls 5052 to produce such effects.

Figure 51:
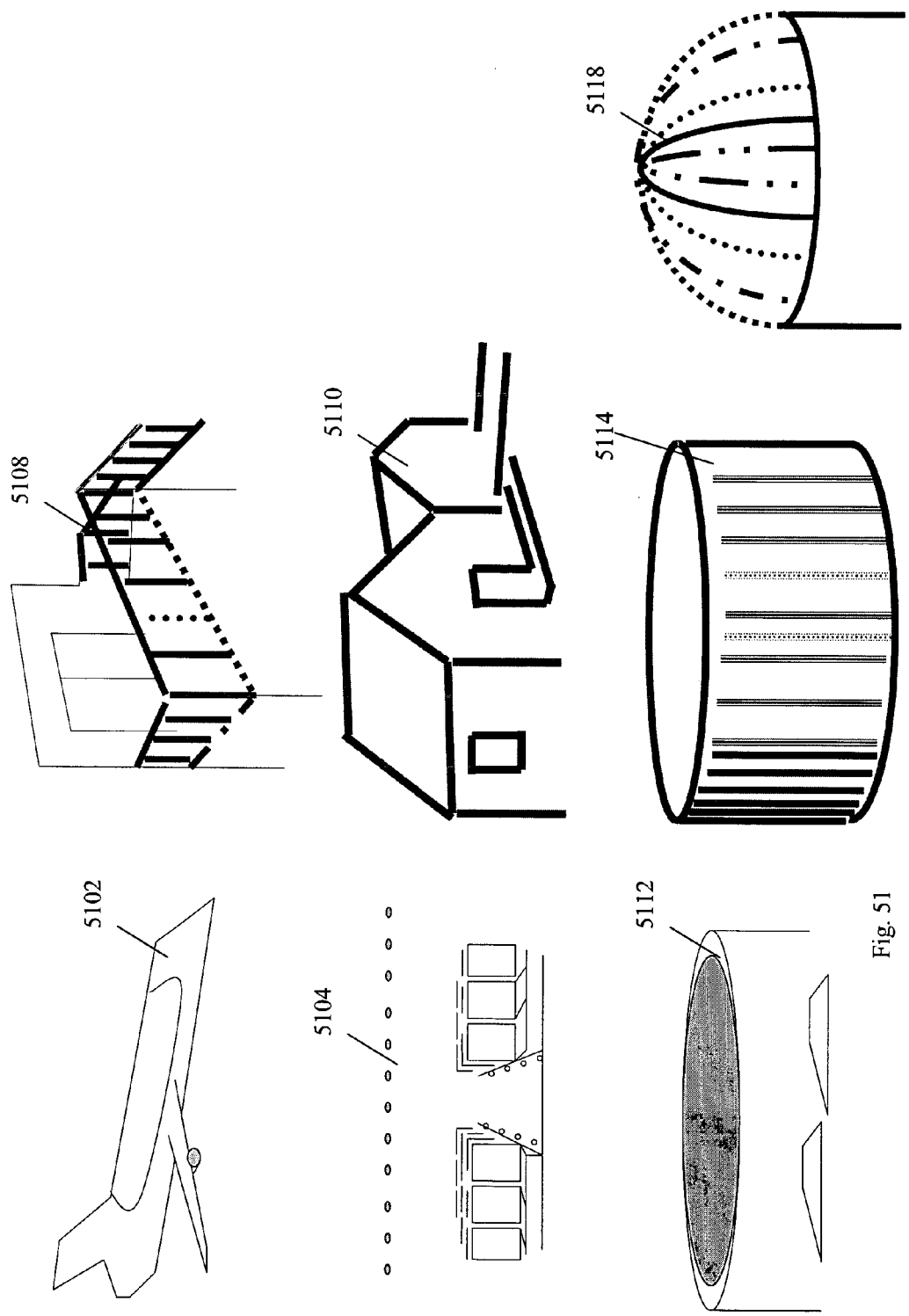
FIG. 51 depicts environments for lighting systems.
Figure 52:
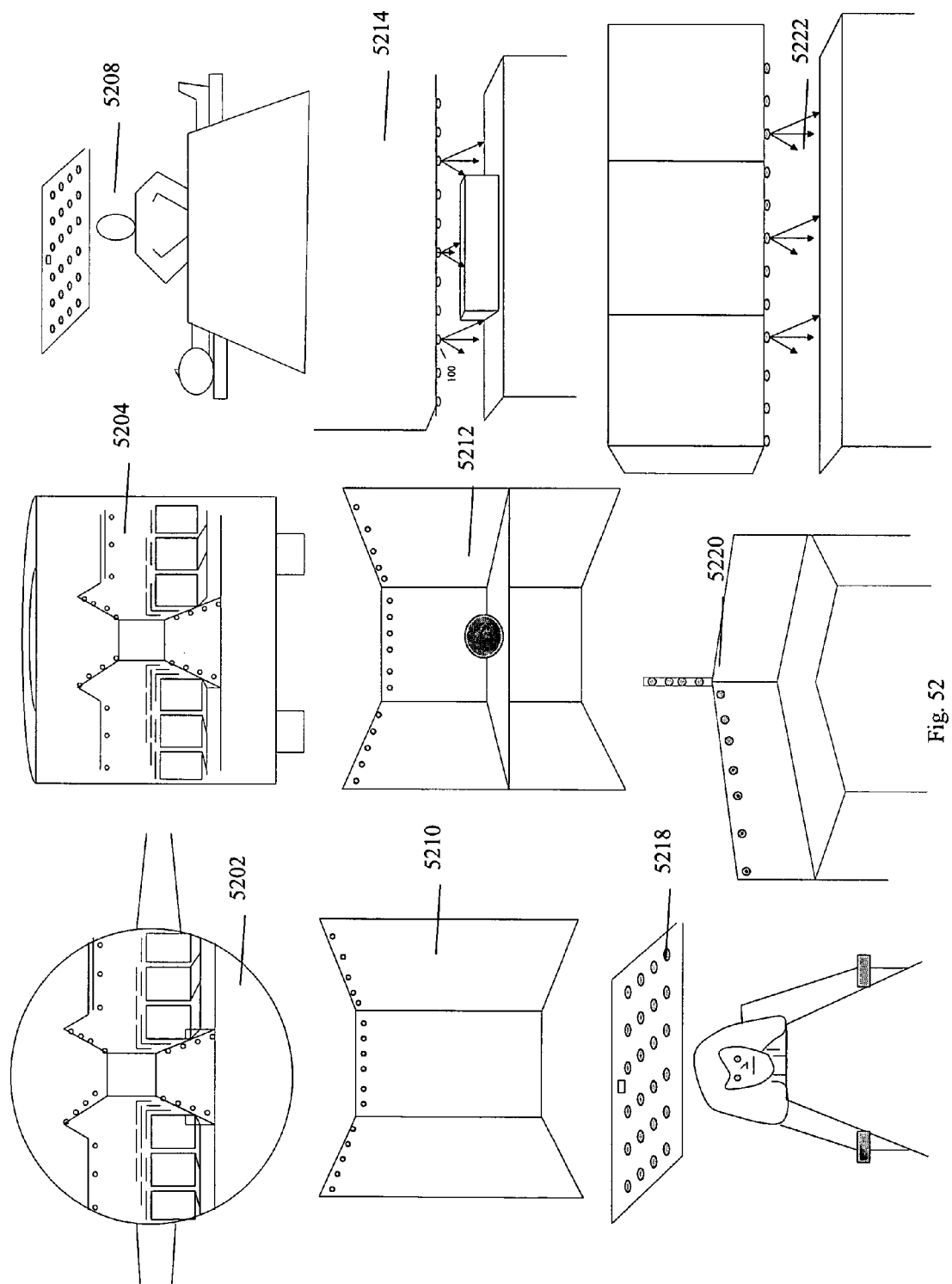
FIG. 52 depicts additional environments for lighting systems.
Figure 53:
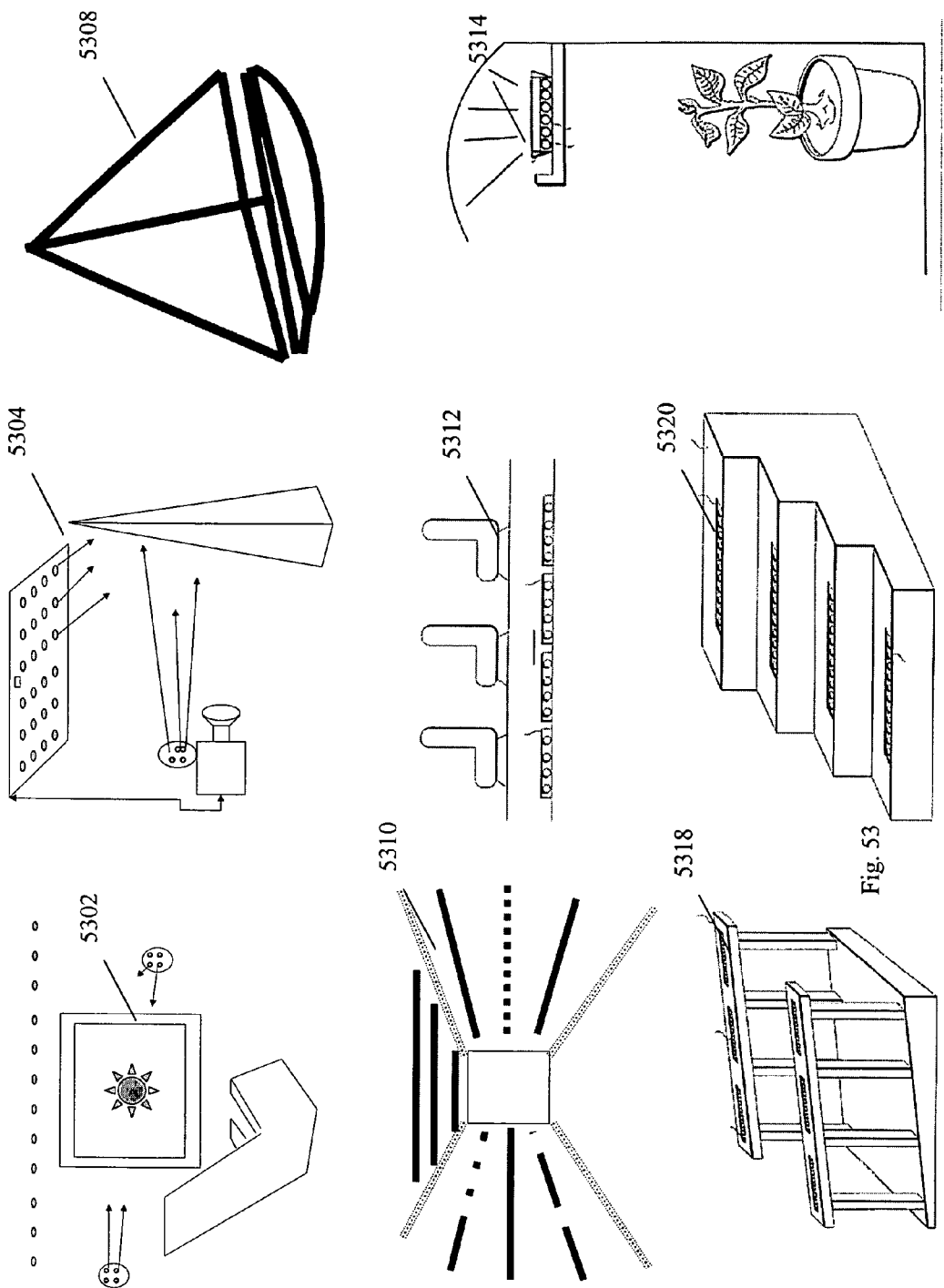
FIG. 53 depicts additional environments for lighting systems.
Figure 54:
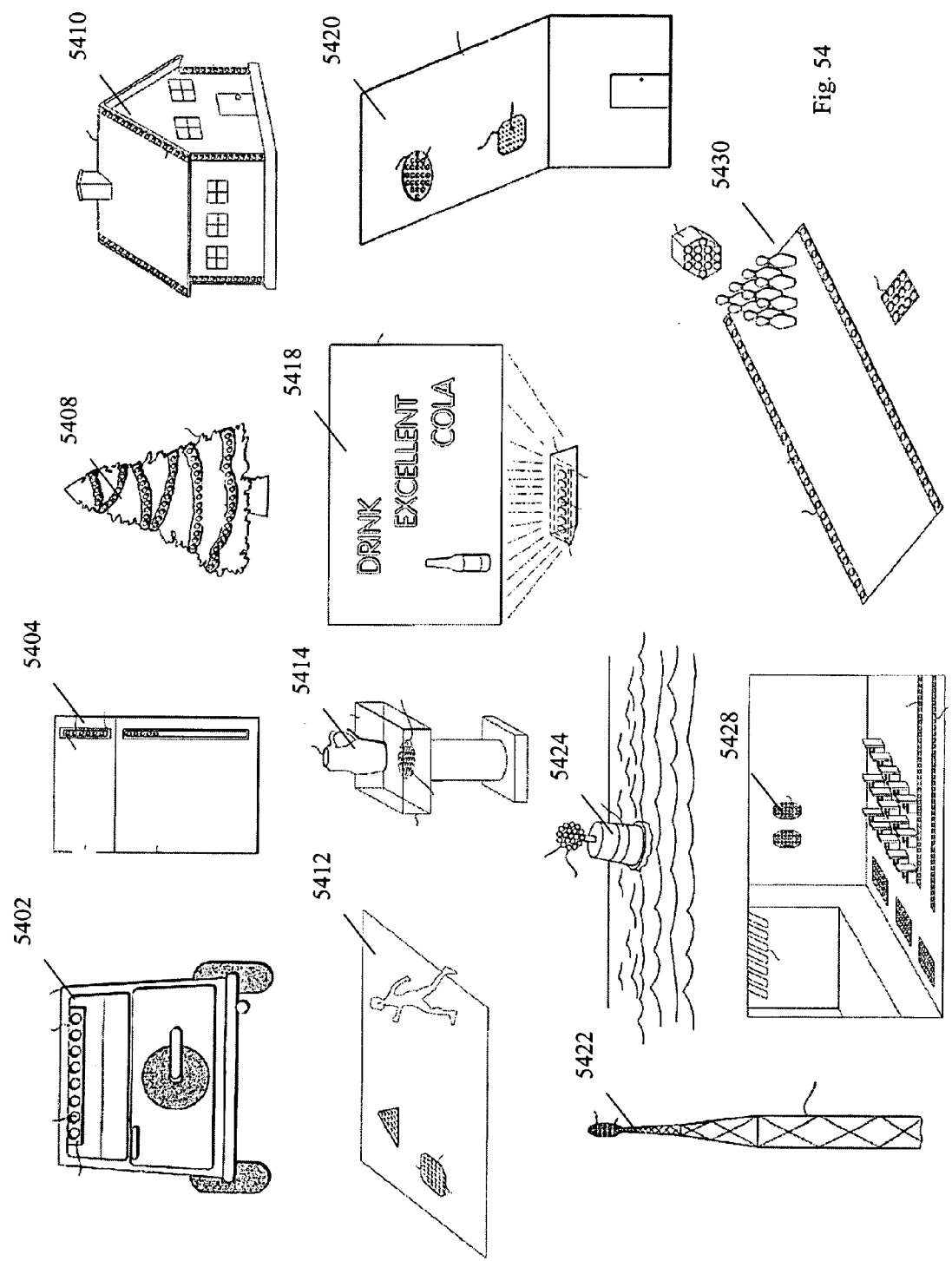
FIG. 54 depicts additional environments for lighting systems.
Figure 55:
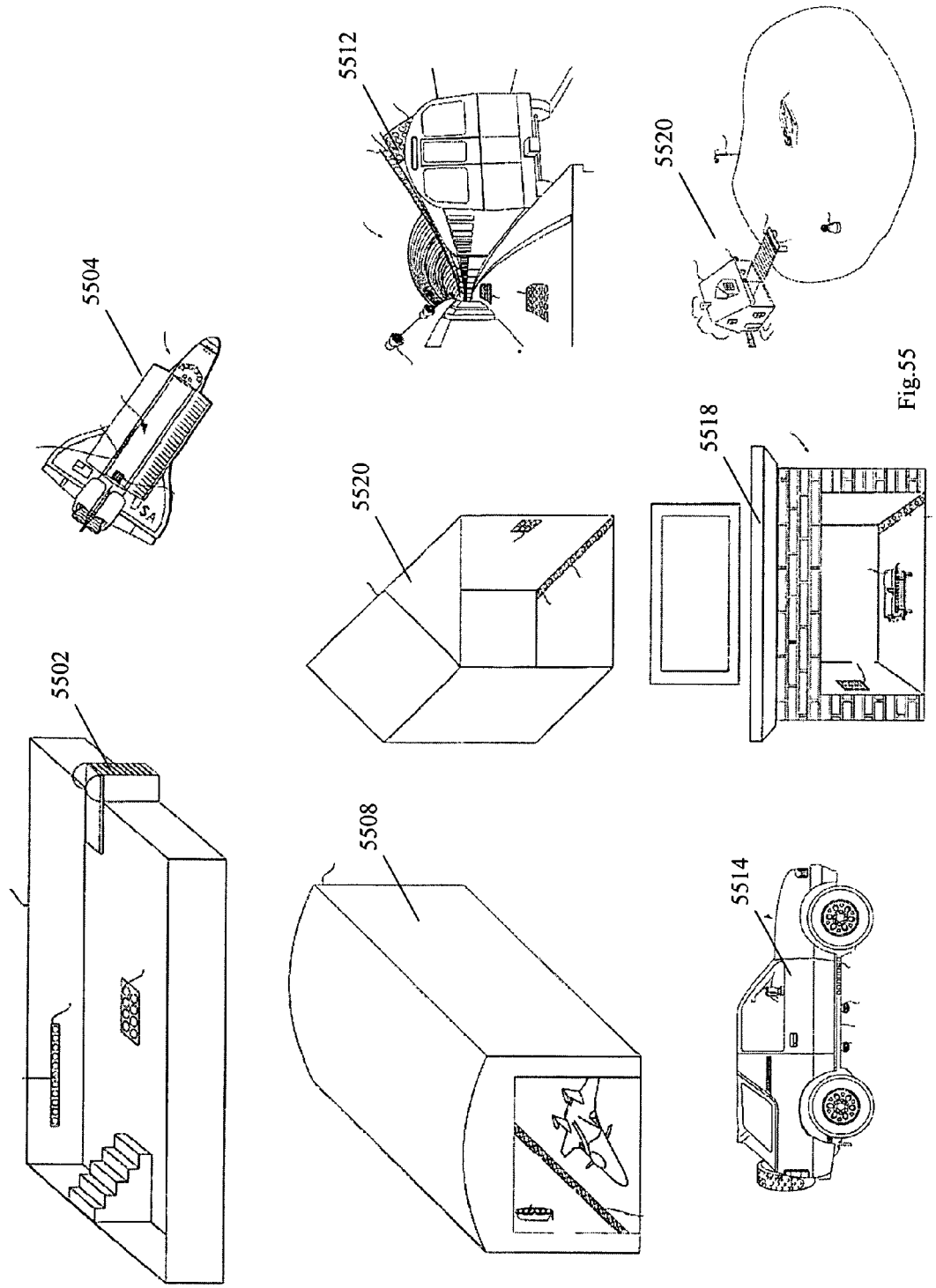
FIG. 55 depicts additional environments for lighting systems.

Lighting systems 100 can be found in a wide range of environments 9600. Referring to FIG. 51, environments 9600 include airline environments 5102 and other transportation environments, home exterior environments 5108, such as decks, patios and walkways, seating environments 5104 such as in airline cabins, buses, boats, theatres, movies, auditoriums and other seating environments, building environments 5110, such as to light a profile of a building, pool and spa environments 5112, cylindrical lighting environments 5114, domed lighting environments 5118 and many others. Referring to FIG. 52, environments 9600 can include airline cabins 5202, bus environments 5204, medical and surgical environments 5208, dressing room environments 5210, retail display environments 5212, cabinet environments 5214, beauty environments 5218, work environments 5220, and under-cabinet environments 5222. Referring to FIG. 53, additional environments 9600 include home entertainment environments 5302, motion picture and other camera environments 5304, recreational environments 5308, such as boating, interior environments 5310, seating environments 5312, railings 5318, stairs 5320 and alcoves 5314. Referring to FIG. 54, environments 9600 can include automobiles 5402, appliances 5404, trees and plants 5408, houses 5410, playing fields and courts 5412, display environments 5414, signage environments 5418, ceiling tiles 5420, signaling environments 5422, marine signaling environments 5424, theatrical environments 5428 and bowling environments 5430. Referring to FIG. 55, other environments 9600 include swimming environments 5502, military and aircraft environments 5504, industrial environments 5508, such as hangars and warehouses, house environments 5520, train environments 5512, automotive environments 5514, such as undercar lightings, fireplace environments 5518 and landscape environments 5520.

The various concepts discussed herein may be suitably implemented in a variety of environments involving LED-based light sources, other types of light sources not including LEDs, environments that involve both LEDs and other types of light sources in combination, and environments that involve non-lighting-related devices alone or in combination with various types of light sources.

The combination of white light with light of other colors as light sources for lighting units 102 can offer multi-purpose lights for many commercial and home applications, such as in pools, spas, automobiles, building interiors (commercial and residential), indirect lighting applications, such as alcove lighting, commercial point of purchase lighting, merchandising, toys, beauty, signage, aviation, marine, medical, submarine, space, military, consumer, under cabinet lighting, office furniture, landscape, residential including kitchen, home theater, bathroom, faucets, dining rooms, decks, garage, home office, household products, family rooms, tomb lighting, museums, photography, art applications, and many others.

One environment 9600 is a retail environment. An object might be an item of goods to be sold, such as apparel, accessories, electronics, toys, food, or any other retail item. The lighting units 102 can be controlled to light the object with a desired form of lighting. For example, the right color temperature of white light can render the item in a true color, such as the color that it will appear in daylight. This may be desirable for food items or for apparel items, where color is very significant. In other cases, the lighting units 102 can light the item with a particular color, to draw attention to the items, such as by flashing, by washing the item with a chasing rainbow, or by lighting the item with a distinctive color. In other cases the lighting can indicate data, such as rendering items that are on sale in a particular color, such as green. The lighting can be controlled by a central controller, so that different items are lit in different colors and color temperatures along any timeline selected by the user. Lighting systems can also interact with other computer systems, such as cards or handheld devices of a user. For example, a light can react to a signal from a user's handheld device, to indicate that the particular user is entitled to a discount on the object that is lit in a particular color when the user is in proximity. The lighting units 102 can be combined with various sensors that produce a signal source 8400. For example, an object may be lit differently if the system detects proximity of a shopper.

Subjects to be displayed under controlled lighting conditions also appear in other environment, such as entertainment environments, museums, galleries, libraries, homes, workplaces, and the like.

In a workplace environment lighting units 102 can be used to light the environment 9600, such as a desk, cubicle, office, workbench, laboratory bench, or similar workplace environment. The lighting systems can provide white and non-white color illumination of various colors, color temperatures, and intensities, so that the systems can be used for conventional illumination as well as for aesthetic, entertainment, or utilitarian effects, such as illuminating workplace objects with preferred illumination conditions, such as for analysis or inspection, presenting light shows or other entertainment effects, or indicating data or status. For example, coupled with a signal source 8400, such as a sensor, the workplace lighting systems could illuminate in a given color or intensity to indicate a data condition, such as speed of a factory line, size of a stock portfolio, outside temperature, presence of a person in an office, whether someone is available to meet, or the like.

In embodiments, lighting systems can include an architectural lighting system, an entertainment lighting system, a restaurant lighting system, a stage lighting system, a theatrical lighting system, a concert lighting system, an arena lighting system, a signage system, a building exterior lighting system, a landscape lighting system, a pool lighting system, a spa lighting system, a transportation lighting system, a marine lighting system, a military lighting system, a stadium lighting system, a motion picture lighting system, photography lighting system, a medical lighting system, a residential lighting system, a studio lighting system, and a television lighting system.

In embodiments of the methods and systems provided herein, the lighting systems can be disposed on a vehicle, an automobile, a boat, a mast, a sail, an airplane, a wing, a fountain, a waterfall or similar item. In other embodiments, lighting units can be disposed on a deck, a stairway, a door, a window, a roofline, a gazebo, a jungle gym, a swing set, a slide, a tree house, a club house, a garage, a shed, a pool, a spa, furniture, an umbrella, a counter, a cabinet, a pond, a walkway, a tree, a fence, a light pole, a statue or other object.

Figure 56:
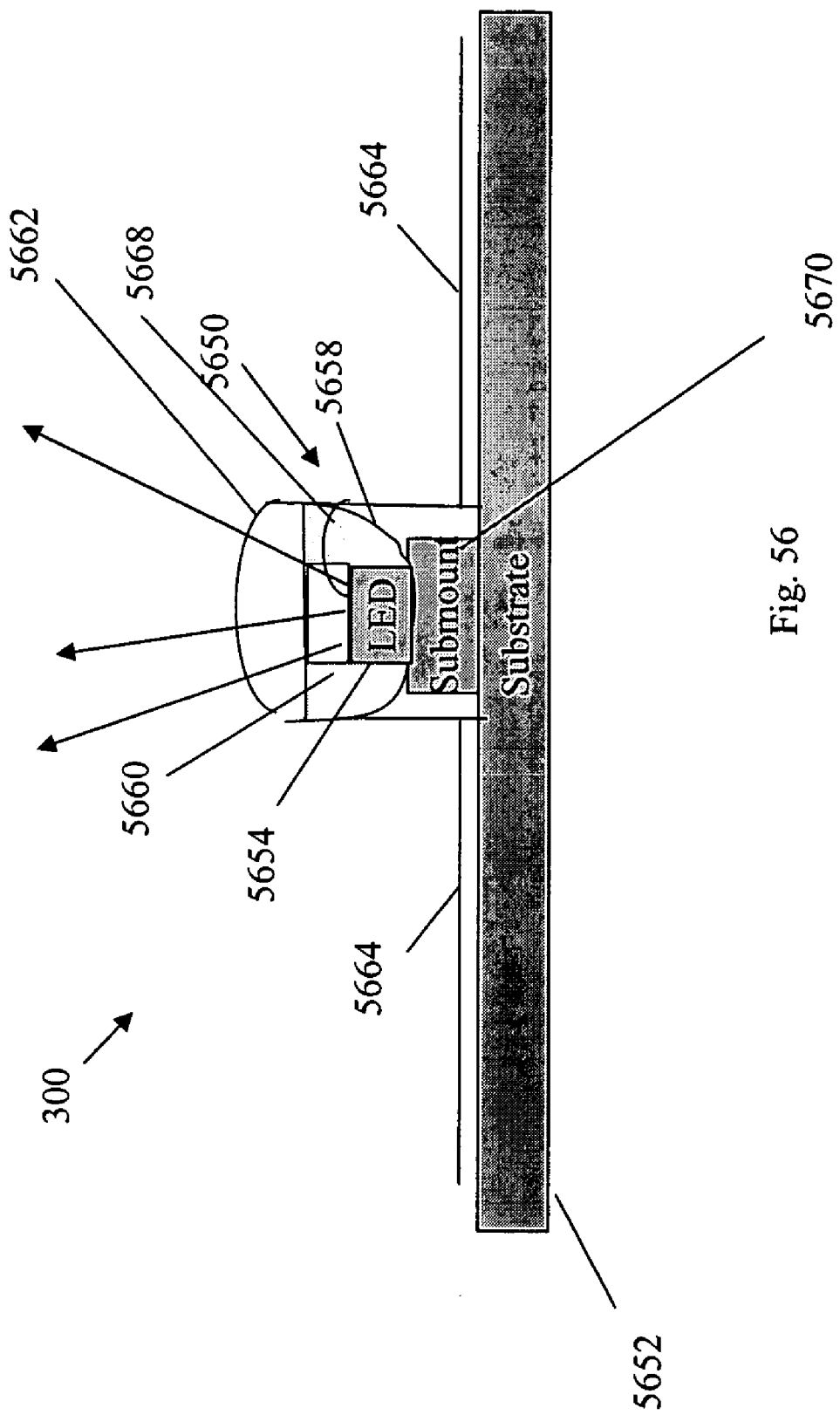
FIG. 56 shows a cross-section of an LED module used as a light source.

Referring to FIG. 56, one form of light source 300 is an LED module 5650. An LED module 5650 may be used as a light source 300 in a wide variety of components, subassemblies, boards 204, products, fixtures, housings 800, applications, methods of use and environments as described in this disclosure. In an embodiment, the LED module 5650 may comprise an LED package with a substrate 5652, one or more LED die 5654 (which, as context permits, may comprise any other light emitting source, such as the light sources 300 described above), a reflector 5658 for reflecting light from the LED die 5654 out from the module 5650, a filler 5660, such as a silicone or injection-molded plastic filler (which may have a hole or space in it to allow more light to pass through), a lens 5662 or other optical facility 400 (which may be any type of optical facility described throughout this disclosure), and one or more leads 5664 for providing an external electrical connection from the module 5650 to other electronic components. In embodiments the reflector 5668 and the components held in the reflector 5668 are positioned on top of the leads 5664. A wire bond 5668 may connect the LED die 5654 to the edge of the reflector 5658. A submount 5670 may include one or more other electronic components for controlling the intensity of light emitted from the LED die 5654 as described below. Thus, the present invention encompasses a light source, such as an LED module, with at least one LED die 5654, and a package for the LED die 5654, the package including a submount 5670, wherein the submount 5670 incorporates an electronic component for controlling the LED, wherein the electronic component facilitates control of at least one of the intensity and the apparent intensity of the LED die between at least three distinct levels of intensity.

Figure 57:
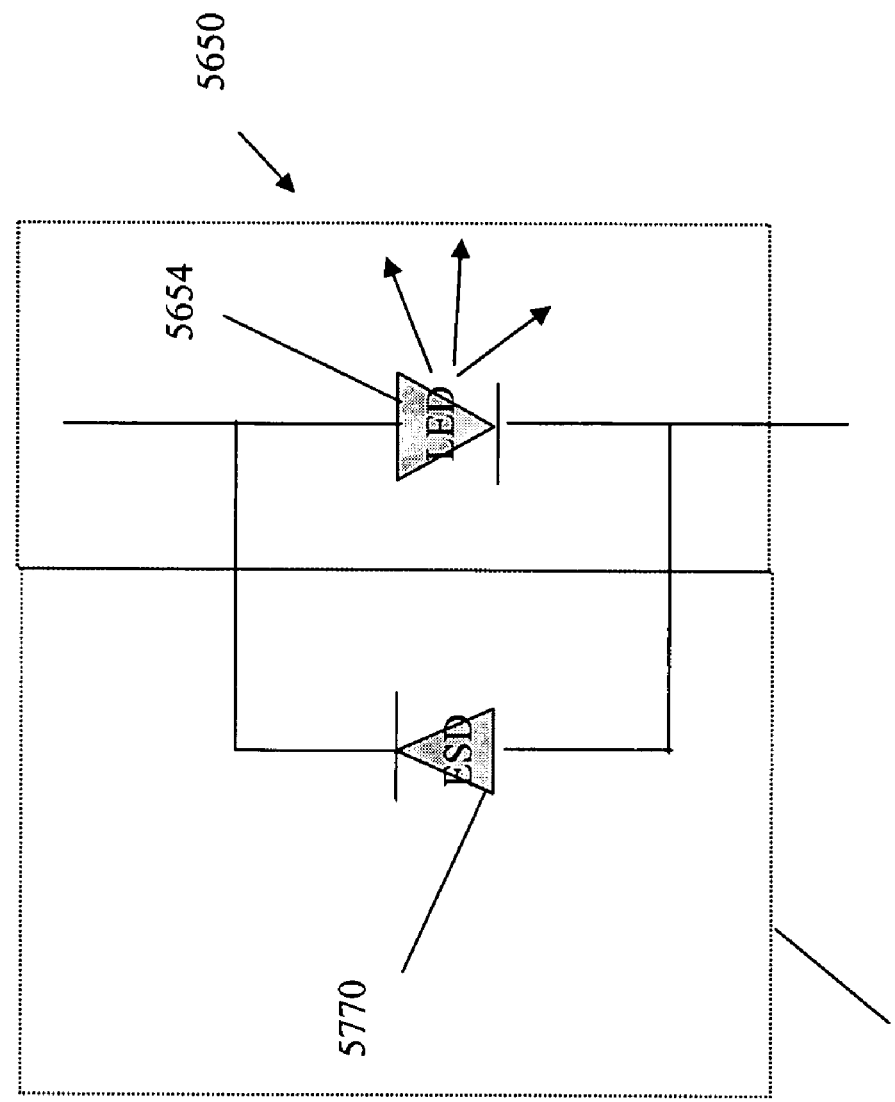
FIG. 57 shows an LED module with electro-static discharge protection.

FIG. 57 shows a simple configuration of a conventional LED module 5650, with an ESD protection diode 5770 serving as the submount 5670 in a circuit with the LED die 5654. In embodiments, the submount may be augmented with other electronic components as described below.

Figure 58:
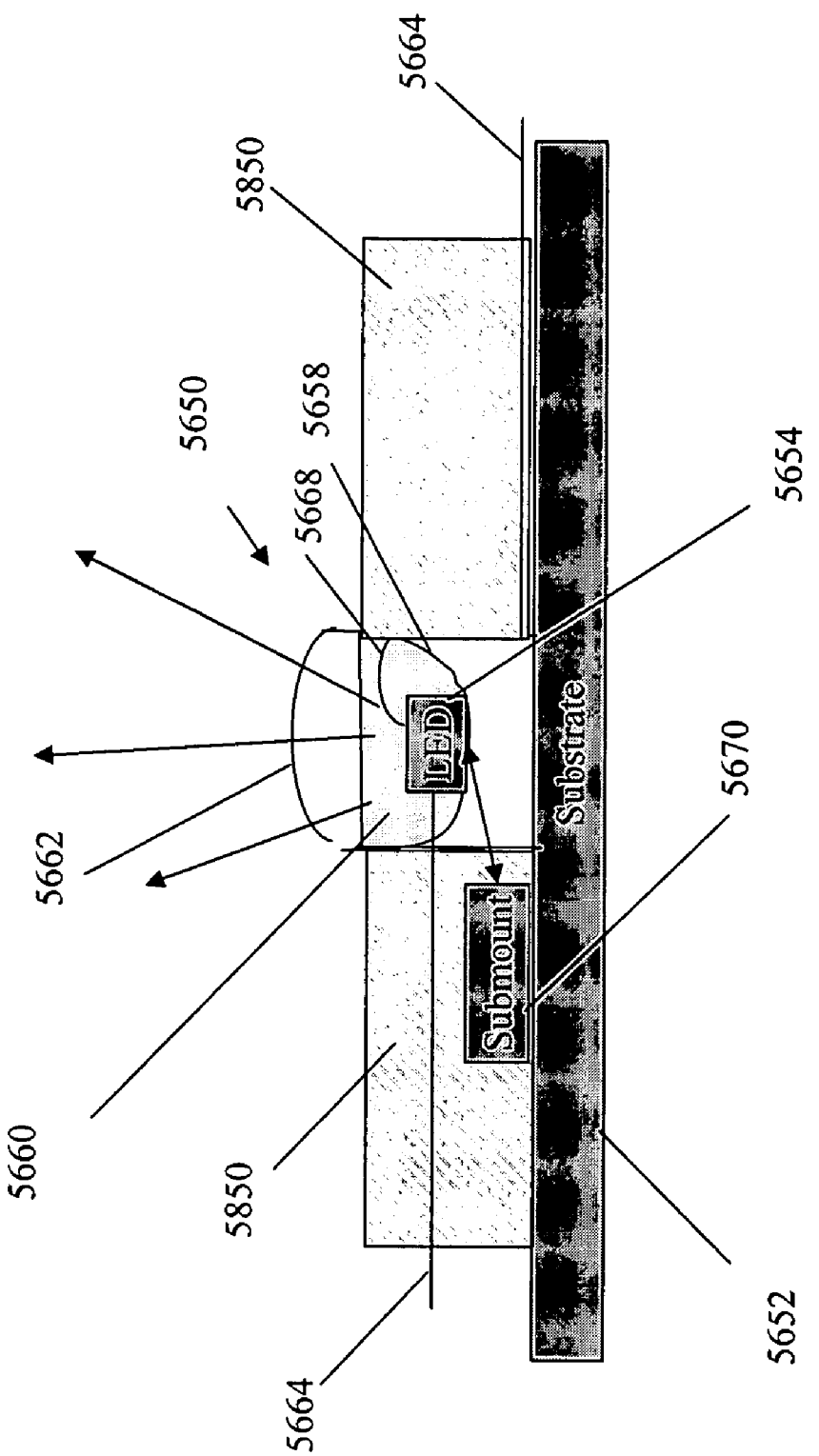
FIG. 58 shows a cross-section of an LED module constructed with injection molding.

FIG. 58 shows another embodiment of an LED module 5650, which like the LED module of FIG. 56 can be used as a light source 300 in a wide variety of components, subassemblies, boards 204, products, fixtures, housings 800, applications, methods of use and environments as described in this disclosure. In this embodiment, the LED module 5650 may again comprise an LED package with a substrate 5652, one or more LED die 5654 (which, as context permits, may comprise any other light emitting source, such as the light sources 300 described above), a reflector 5658 for reflecting light from the LED die 5654 out from the module 5650, a filler 5660, such as a silicone or injection-molded plastic filler (which may have a hole or space in it to allow more light to pass through), a lens 5662 or other optical facility 400 (which may be any type of optical facility described throughout this disclosure), and one or more leads 5664 for providing an external electrical connection from the module 5650 to other electronic components. In this case one of the leads 5664 may connect to the side of the reflector 5658. The entire package may include an injection molding 5850, such as injection-molded plastic, for holding the components in place. A wire bond 5668 may connect the LED die 5654 to the edge of the reflector 5658. A submount 5670 may include one or more other electronic components for controlling the intensity of light emitted from the LED die 5654 as described below. In this case the submount 5670, rather than being located directly under the LED die 5654 and the reflector 5658, is located in close proximity to the reflector cup on the substrate 5652 and is in electrical connection to the LED die 5654.

Figure 59:
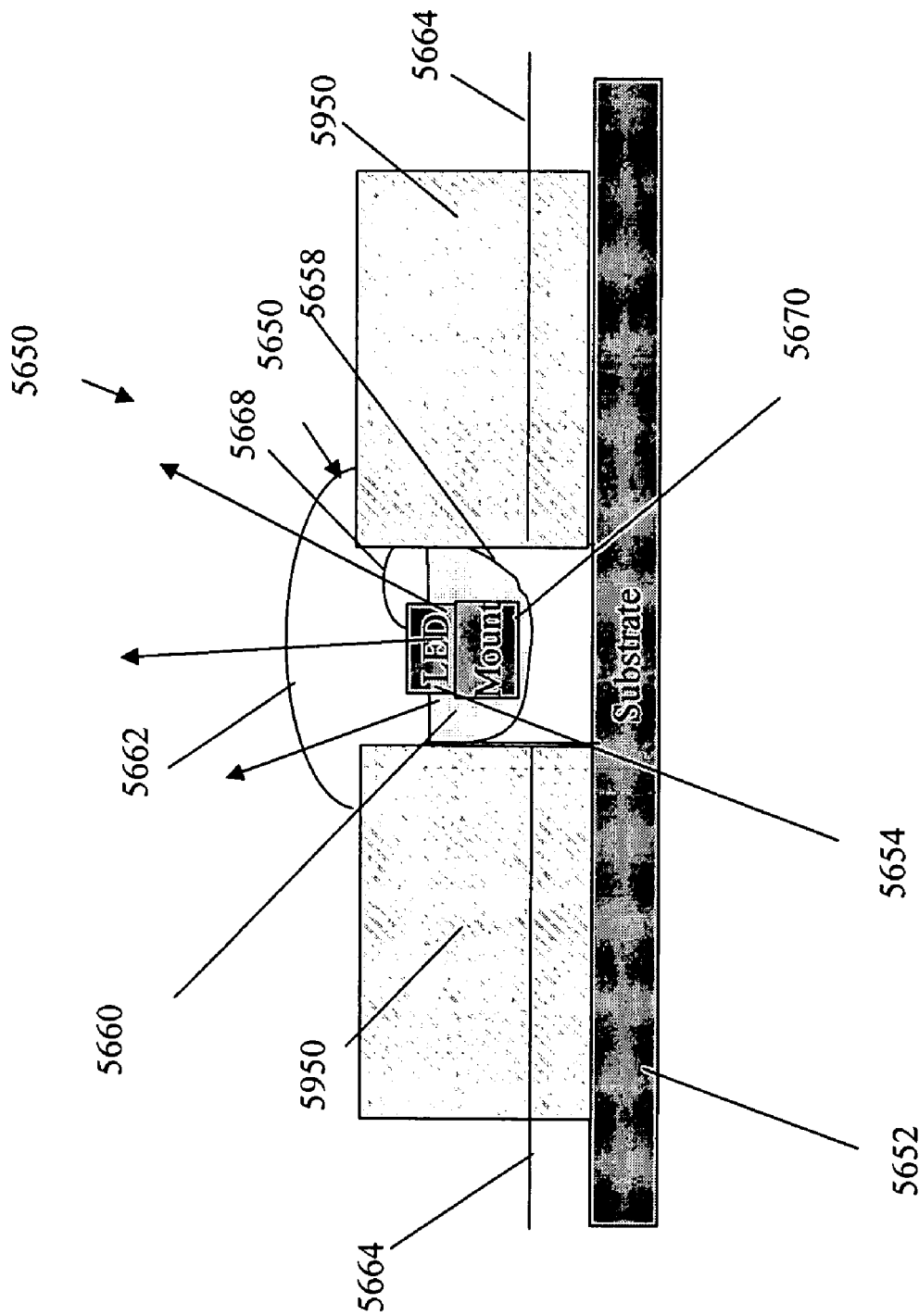
FIG. 59 shows a cross-section of an LED module with components mounted in a cup of a reflector.

FIG. 59 shows another embodiment of an LED module 5650, which like the LED modules of FIGS. 56 and 58 can be used as a light source 300 in a wide variety of components, subassemblies, boards 204, products, fixtures, housings 800, applications, methods of use and environments as described in this disclosure. In this embodiment, the LED module 5650 may again comprise an LED package with a substrate 5652, one or more LED die 5654 (which, as context permits, may comprise any other light emitting source, such as the light sources 300 described above), a reflector 5658 for reflecting light from the LED die 5654 out from the module 5650, a filler 5660, such as a silicone or injection-molded plastic filler (which may have a hole or space in it to allow more light to pass through), a plastic encasing element 5950, a lens 5662 or other optical facility 400 (which may be any type of optical facility described throughout this disclosure), and one or more leads 5664 for providing an external electrical connection from the module 5650 to other electronic components. In this case the leads 5664 may connect to the side of the reflector 5658. As in other embodiments, a wire bond 5668 may connect the LED die 5654 to the edge of the reflector 5658. A submount 5670 may include one or more other electronic components for controlling the intensity of light emitted from the LED die 5654 as described below. In this case the submount 5670, rather than being located directly under the LED die 5654 and the reflector 5658, is located in the cup of the reflector 5658 with the LED die 5654. In embodiments the LED module 5650 may be made by a mask process.

Other embodiments of LED packages that include an LED die 5654 and a submount 5670 may be understood by those of ordinary skill in the art and are encompassed herein. In embodiments the LED die 5654 may be is a high-power LED die. In embodiments the LED die 5654 may be a five watt or greater LED die.

The substrate 5652 of the embodiments of FIGS. 56, 58 and 59 may be any conventional substrate for an LED package, such as a metal core substrate, a ceramic substrate, a ceramic on metal substrate, an FR4 substrate, a sapphire substrate, a silicon on sapphire substrate, or a silicon carbide substrate.

In the various embodiments described herein, an LED 5654 may be controlled by the electronic components of the submount 5770. In addition to offering basic "on" and "off" or protection circuitry, in embodiments of the inventions electronic components located in the submount 5670 that is integrated with the LED 5654 in the package 5650 can control the intensity or apparent intensity of light coming from the LED 5654, such as by controlling the level of current to the LED, by controlling the amplitude of pulses or current to the LED (pulse amplitude modulation), by controlling the width of pulses of current to the LED (pulse width modulation) or by a combination of any of the foregoing. Thus, the various embodiments described herein for providing such control can be embodied in the submount 5670, such as in packages of the types disclosed in connection with FIGS. 56, 58 and 59 and other embodiments described herein, such as described in connection with FIGS. 25a, 25b, and 25c, among others.

Figure 60:
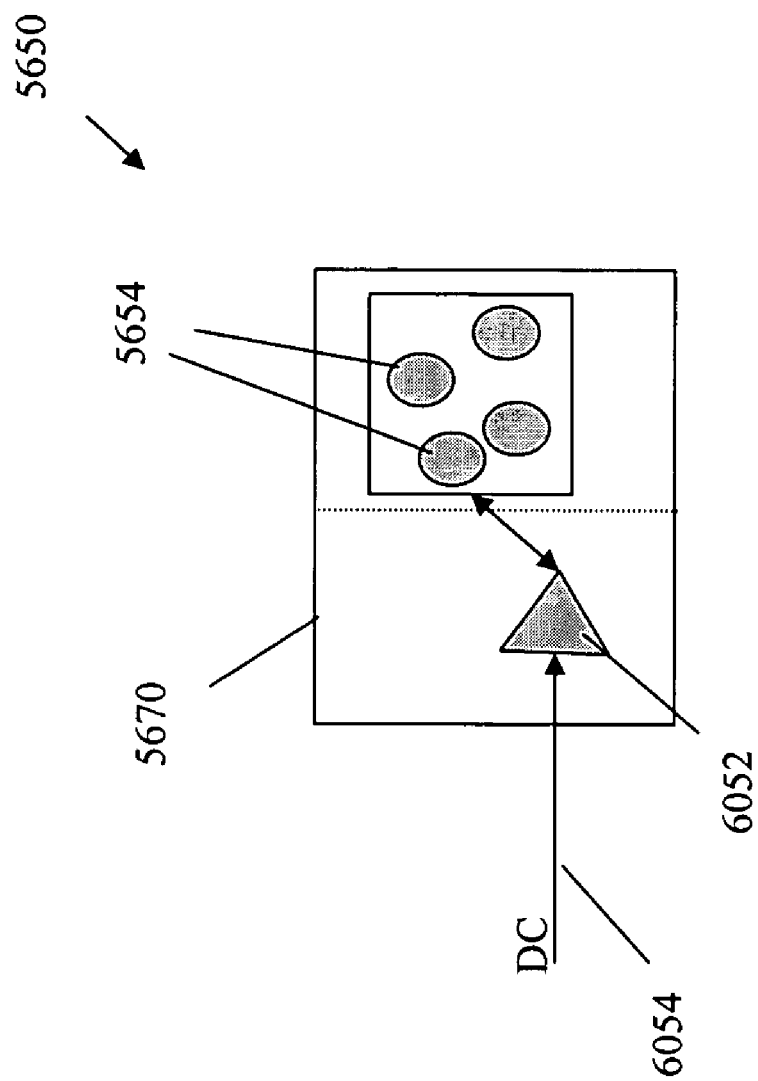
FIG. 60 shows an LED module having a group of LED dies in a package with a current regulator.

Referring to FIG. 60, a schematic diagram is provided that shows a submount 5670 and a group of LED dies 5654 in a package 5650. It should be understood that the submount 5670 could be combined with a single LED die 5654, and that the submount 5670 and LED die(s) 5654 could be integrated into a variety of physical packages, such as those described in connection with FIGS. 56, 58 and 59, or other LED packages 5650 of various configurations that include a submount 5670 and LED die(s) 5654. Thus, the schematic diagrams of FIG. 60 and subsequent figures are intended to encompass any of the various physical packages 5650 that can include the components disclosed in connection with such figures.

FIG. 60 shows an LED package where the submount 5670 includes a current regulator 6052. The current regulator 6052 may be any current regulation component, such as for taking in a DC signal 6054. In embodiments, the current regulator 6052 located in the submount 5670 allows the LED package to take a direct twelve volt DC signal 6054 without requiring any components that are external to the LED package 5650.

Figure 61:
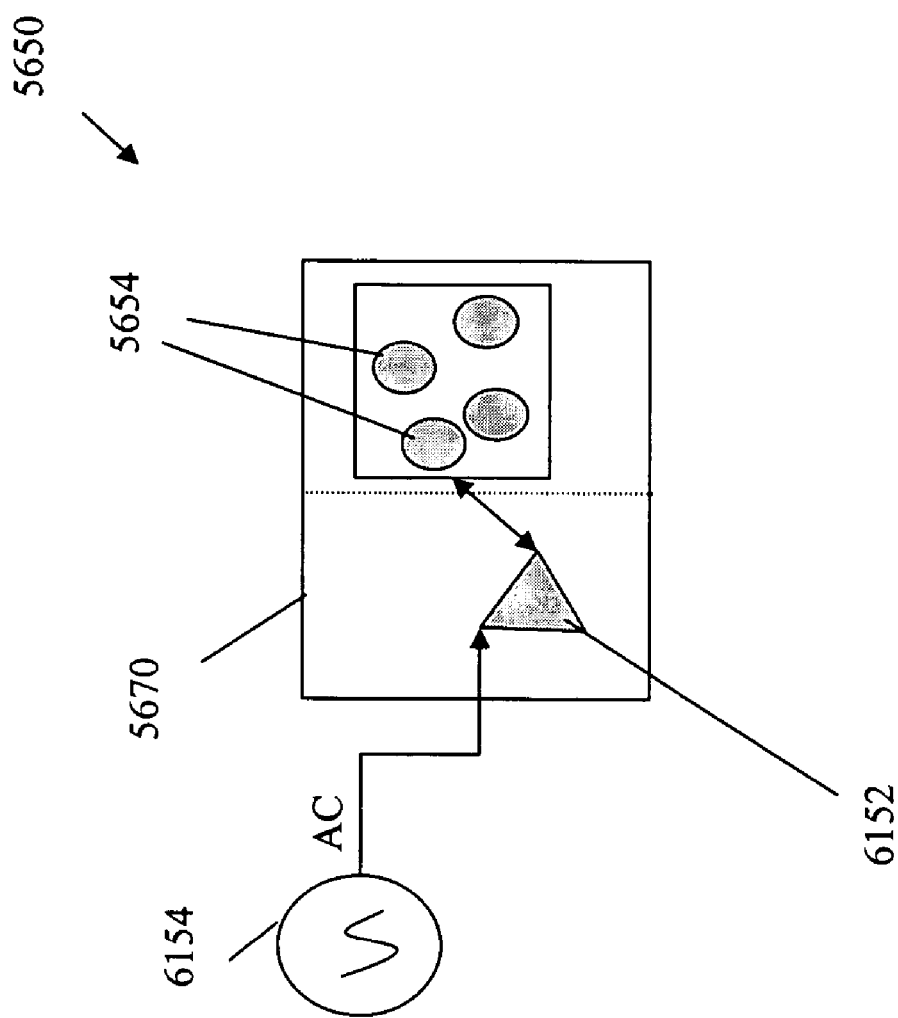
FIG. 61 shows an LED package adapted to receive an AC signal.

FIG. 61 shows an LED package 5650 where the submount 5670 includes a circuit 6152 for taking an alternating current signal, such as a twelve-volt AC signal 6154, directly. The circuit may include a bridge rectifier, a capacitor, a current regulator, and/or other circuit elements for converting an AC signal into an input suitable for delivery to an LED die 5654. In embodiments the circuit 6152 can take an AC signal with voltage in a range of voltages, such as a range from 100V to 240V, or a range from 12V to 240V. The circuit 6152 can include any suitable components for taking an AC signal 6154 and converting the signal to control the intensity or apparent intensity of the LED die(s) 5654. Examples of such circuits include those disclosed throughout this disclosure and other known to those of ordinary skill in the art.

Figure 62:
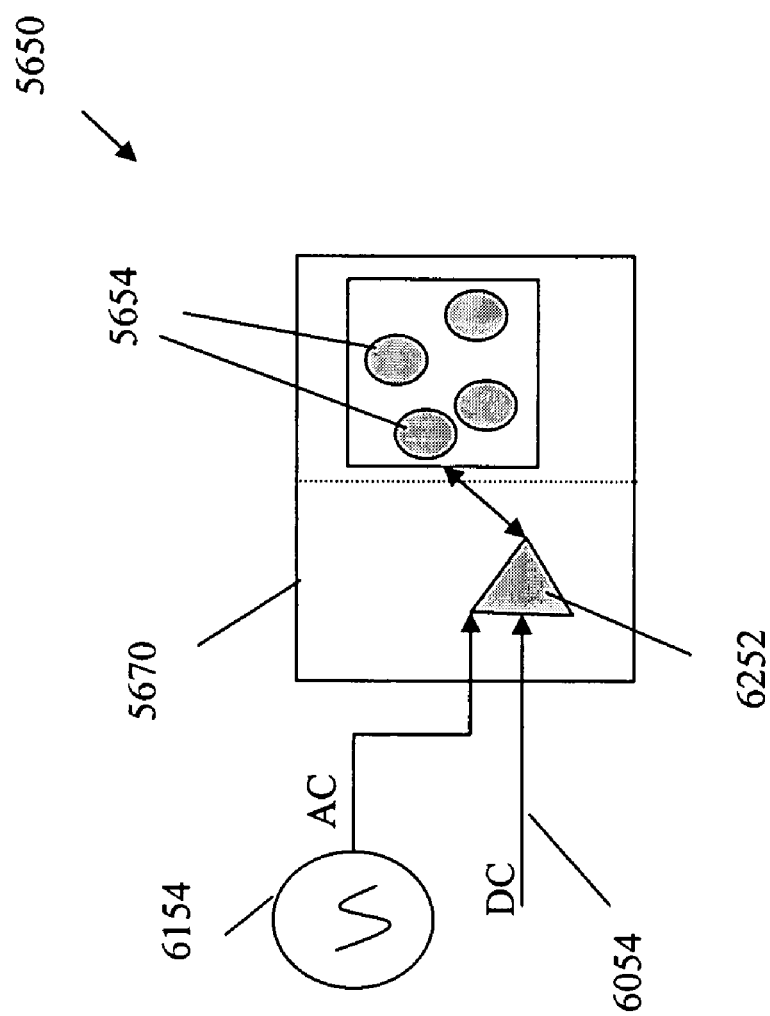
FIG. 62 shows an LED package adapted to receive either an AC signal or a DC signal.

Referring to FIG. 62, in embodiments the submount 5670 may include one or more electronic components, such as a circuit 6252, for accepting either an AC signal 6154 or a DC signal 6054. The components may include those similar to those described in connection with FIGS. 60 and 61, as well as other suitable components for accepting AC and DC signals. In embodiments, the component 6252 may comprise a switch mode power supply and/or a current regulator, so that the LED package 5650 can accept either AC power or DC power directly, without requiring a separate power supply or other component, and the LED package 5650 can convert the AC or DC power into a suitable signal for controlling the intensity or apparent intensity of the LED die(s) 5654. Embodiments such as the one depicted in the schematic diagram of FIG. 62 offer the substantial convenience of allowing users to connect LED packages 5650 to various types of power without requiring separate power supplies. In embodiments, the LED package 5650 may include an interface for switching the power supply between modes, such as an AC mode, a DC mode, or a selected voltage. The interface may include an optional resistor that can be placed in circuit with the LED package 5650, such as to alter the incoming voltage, or it may include a signal, such as a signal to cause a circuit or component of the LED package 5650 to regulate itself, such as to change modes.

Figure 63:
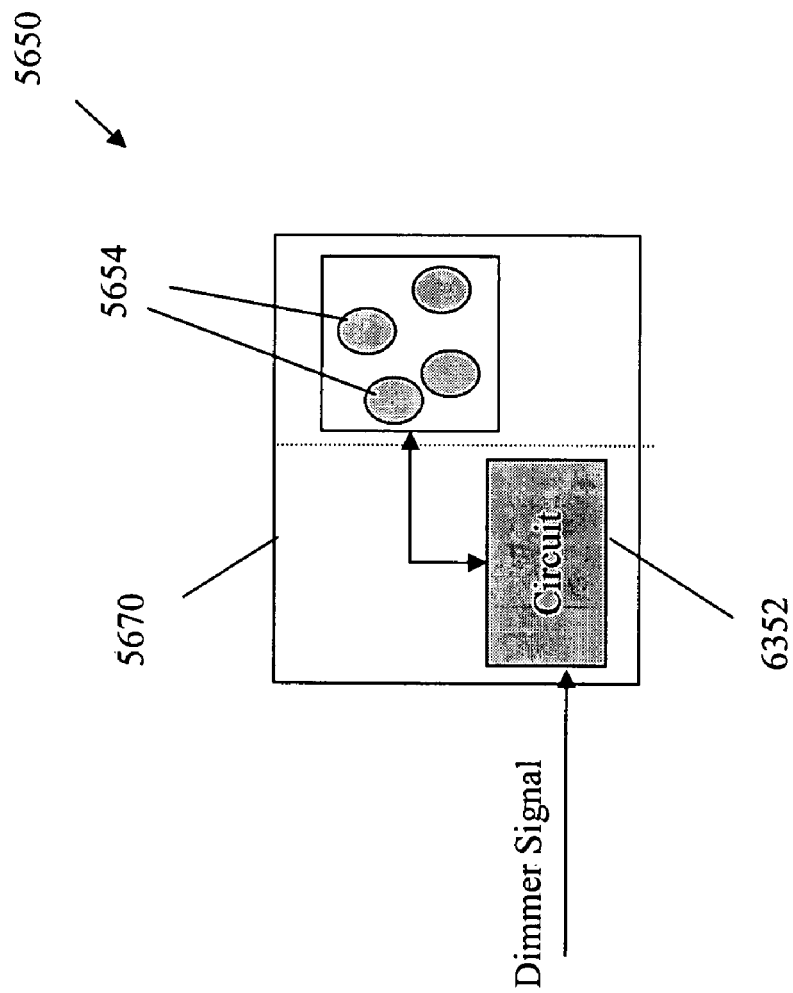
FIG. 63 shows an LED package including circuitry to control LED intensity.

Referring to FIG. 63, in embodiments the submount 5670 may include a circuit 6352, such as a circuit for controlling the current or voltage delivered to the LED package 5650, such as through any of the techniques described herein. In an embodiment, the circuit 6352 may be a circuit or other electronic component that is configured to receive an input signal from a conventional electrical component, such as an electrical power circuit that includes a dimmer. Thus, as the input signal is dimmed or increased in intensity, the circuit 6352 may respond by changing the signal sent to the LED die(s) 5654, to change the apparent intensity of the LED die(s) to correspond in a way that is proportionate, or related to, the signal sent from the dimmer circuit, such as by changing the pulse width and/or pulse amplitude of the signals sent to the LED die(s). The circuit 6352 may take the form of various dimmer compatible control circuits described in applications and patent incorporated by reference herein, as well as other dimmer-compatible circuits 6352. In embodiments the circuit 6352 may be a drive circuit adapted to receive an arbitrary voltage and to control the LED die(s) 5654 in response to different voltages without requiring other components.

Figure 64:
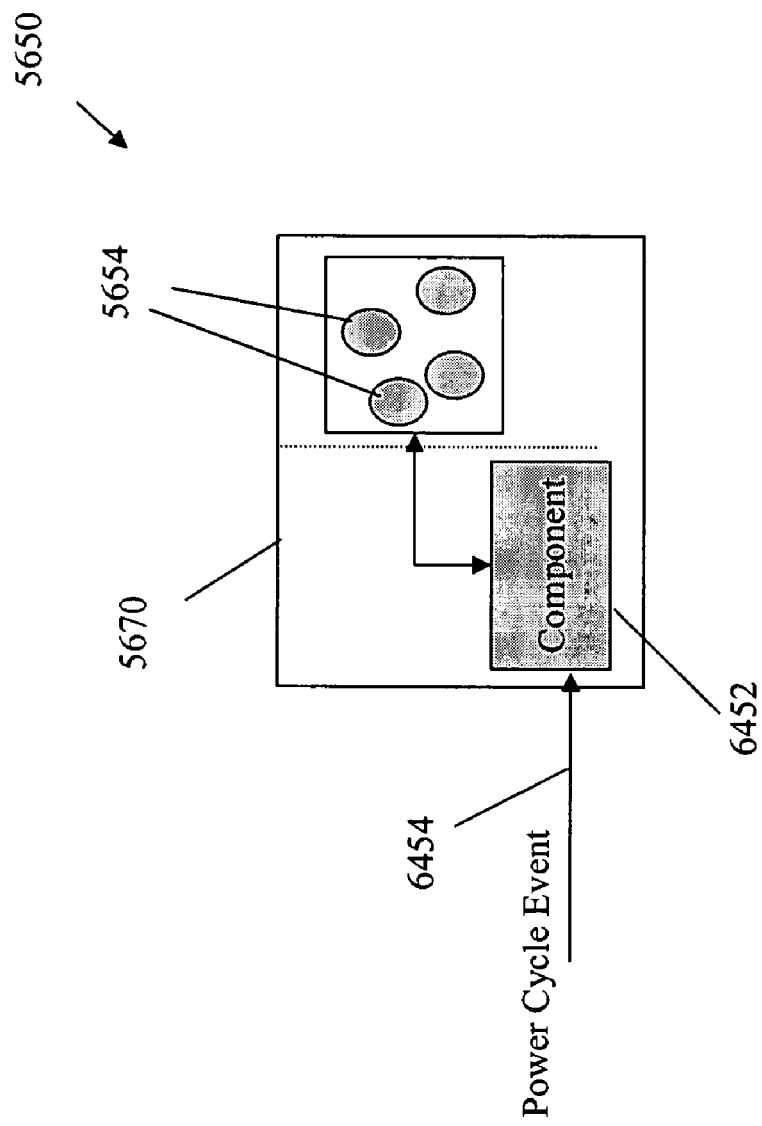
FIG. 64 shows an LED package including circuitry to respond to power signal events.

Referring to FIG. 64, in embodiments the LED package 5650 may include one or more electronic components 6452, such as components 6452 configured to respond to events related to the incoming power signal. For example, the components 6452 may include various stored control modes for controlling the signals sent to the LED die(s) 5654, such as stored control modes for generating specific sequences, such as shows and effects, from the LED die(s) 5654, including any of the effects described in this disclosure. The stored modes can be triggered, for example, by a power cycle event 6454. For example, turning on or off the power can change the mode of the component 6454, such as to allow a user to cycle through a series of different modes of the LED package 5650 by repeatedly switching power on or off, or by otherwise altering the incoming power signal 6454. Power cycle control components and circuits can take various forms, including those described in the applications and patent incorporated by reference herein and disclosed elsewhere in this disclosure, including in connection with FIG. 25.

Figure 65:
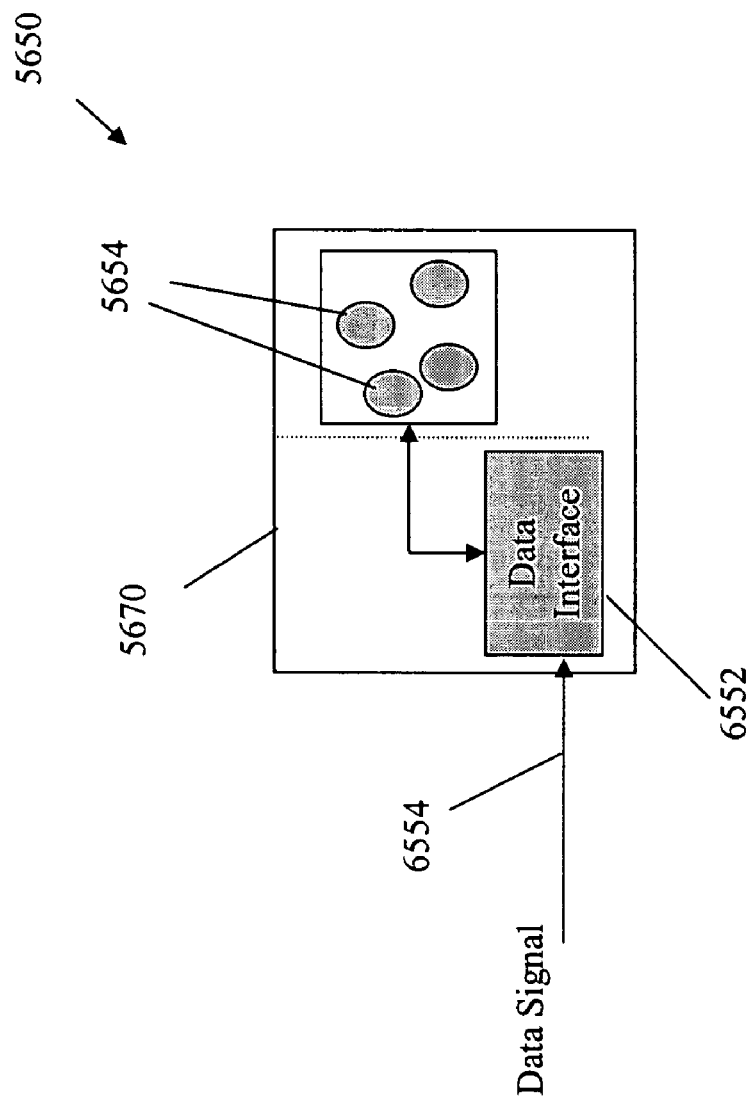
FIG. 65 shows an LED package including a data interface.

Referring to FIG. 65, in embodiments the submount 5670 may include an electronic component that includes a data interface 6552 for receiving an incoming data signal 6554. For example, the data interface may be configured to receive a lighting control signal, such as used in connection with any conventional lighting units, including LED-based lighting units as described in this disclosure and in the patents and applications incorporated by reference herein. For example, the data interface 6552 may be configured to receive a data signal 6554 that is a DMX signal, a DALI signal, an Ethernet signal, a TCP/IP protocol signal, an HTTP protocol signal, an XML or other mark-up language instruction, a script, an 802.11 or other wireless signal, a cellular or radio-frequency signal, an infrared signal, a Bluetooth signal or any other kind of wired or wireless data signal. The data interface 6552 may include a processor, memory, and/or one or more suitable circuit elements for receiving and responding to data, such as to trigger stored programs to be executed as lighting signals from the LED die(s) 5654 or to control the LED die(s) 5654 in response to the signals. Embodiments may include circuits such as disclosed in connection with FIGS. 28 and 31b of this disclosure, as well as other interface circuits known to those of ordinary skill in the art. In embodiments the submount 5670 may include various firmware components. In embodiments the firmware may include a data interface 6552, such as an XML parser or other data interface as described herein.

Figure 66:
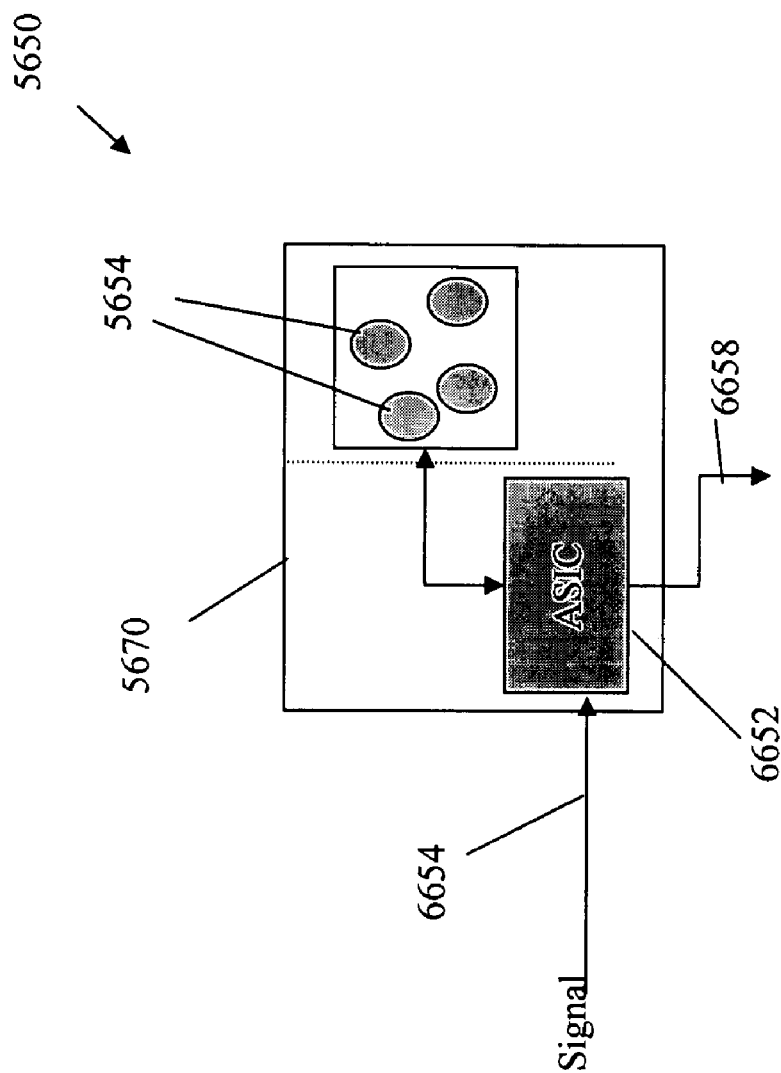
FIG. 66 shows an LED package including an application specific integrated circuit.

Referring to FIG. 66, in embodiments the submount 5670 may include an application specific integrated circuit, or ASIC 6652. The ASIC 6652 may be configured to respond to an incoming signal 6654, which may be a signal configured according to a protocol that is suitable to be read by the ASIC 6652. In various embodiments, an ASIC 6652 may perform any of a wide variety of processes and functions.

In embodiments the ASIC 6652 may respond to signals 6654 according to a serial addressing protocol, such as described in connection with FIG. 31a above and in the documents incorporated by reference herein. For example, in embodiments the ASIC 6652 may receive an incoming data signal 6654 that is comprised of a series of bytes. The ASIC 6652 may respond to the first byte of the data signal that does is unmodified, such as by checking each byte in the series and responding to the first bit that does not contain a "1". The ASIC may control the LED die(s) 5654 based on the first byte that does not contain the "1", such as by causing the LED die(s) 5654 to emit light at an intensity or apparent intensity based on the information contained in that byte. The ASIC 6652 can then alter the first bit of the byte to which it responded by inserting a "1" in that bit and relay the data signal on to another similar LED package 5650 or lighting unit 102 that contains a similar ASIC, so that the next ASIC responds to the next byte of the data signal, i.e., the first remaining unmodified byte of the signal. With such a protocol, a series of LED packages 5650 can respond to a simple data signal that includes all instructions in a serial protocol. Other ASICs 6652 can be designed and included in the submount 5670 for controlling LED die(s) 5654, as may be envisioned by those of ordinary skill in the art.

In embodiments the LED packages 5650 disclosed throughout this disclosure may be incorporated into displays, such as a graphics display, a monitor, a video display, or an animation display, such as a large-scale display for display on a wall, building, or the like. In embodiments such a display may include a string of nodes, each of which includes an LED package 5650, with each package including an ASIC 6652 on the submount 5670. The ASIC 6652 may be configured to receive a video signal in various formats, including a video signal delivered according to a serial addressing protocol.

Figure 67:
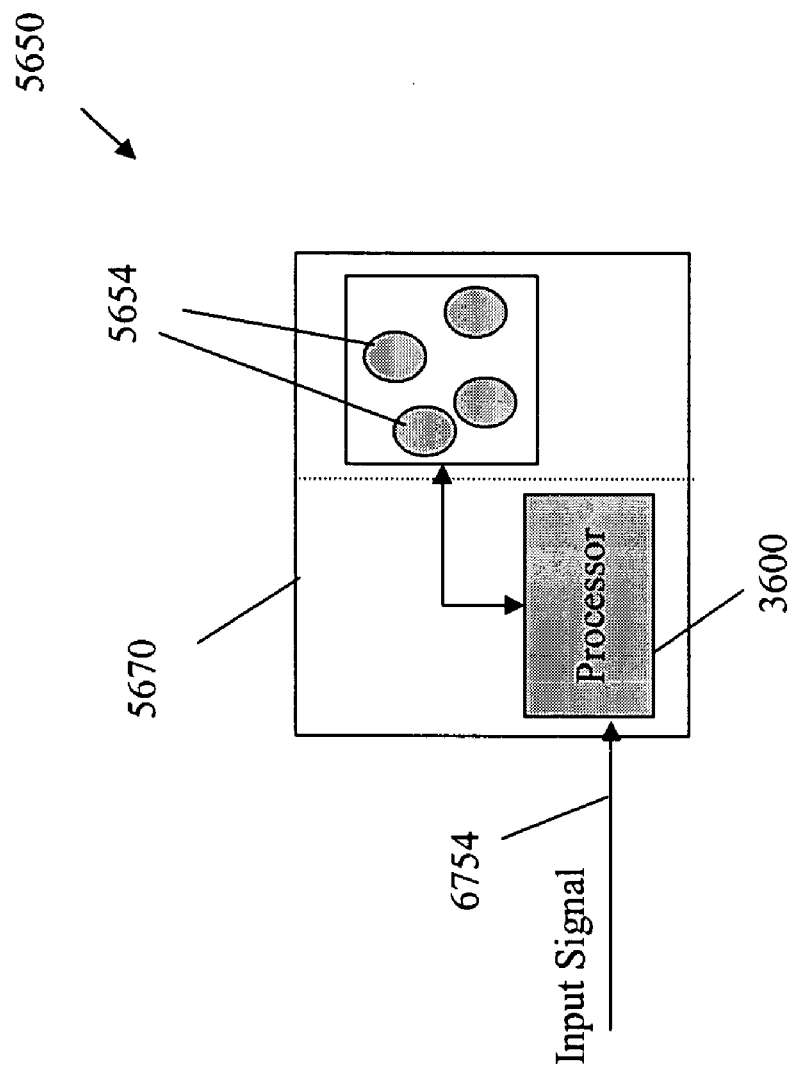
FIG. 67 shows an LED package including a processor.

Referring to FIG. 67, the submount 5670 may include a processor 3600 among other electronic components for controlling a signal to the LED die(s) 5654. The processor 3600 may have any of the attributes described above, such as the capability to respond to power-cycle events, power/data signals as described in connection with FIG. 16a, FIG. 18 and FIG. 24, data, network signals, and other signals. The processor 3600 can support various control capabilities, such as feed forward capabilities 4100, pulse width and pulse amplitude modulation, such as described in connection with FIGS. 25a, 25b and 25c, voltage regulation, current regulation, power mode selection, inductive loop capabilities 4200, response to dimming signals, response to signal sources 8400, response to sensors, addressing capabilities 6600, calibration capabilities, control facilities 3500, drive facilities 3800, power factor control facilities, such as described in connection with FIG. 15, high voltage facilities, such as described in connection with FIGS. 16b and 17, data facilities 3700, and other capabilities, all as described herein and in the patents, applications and other documents incorporated by reference herein or as known by those of ordinary skill in the art. In embodiments the processor 3600 can select between a pulse-width-modulation mode and a pulse-amplitude-modulation mode. In embodiments the processor 3600 can be configured to respond to signal sources 8400 of a wide variety, as described above in connection with the description of FIG. 2. In embodiments the processor 3600 may be a microcontroller. In embodiments the processor 3600 may allow the LED package 5650 to respond to power signals delivered at any arbitrary voltage.

Figure 68:
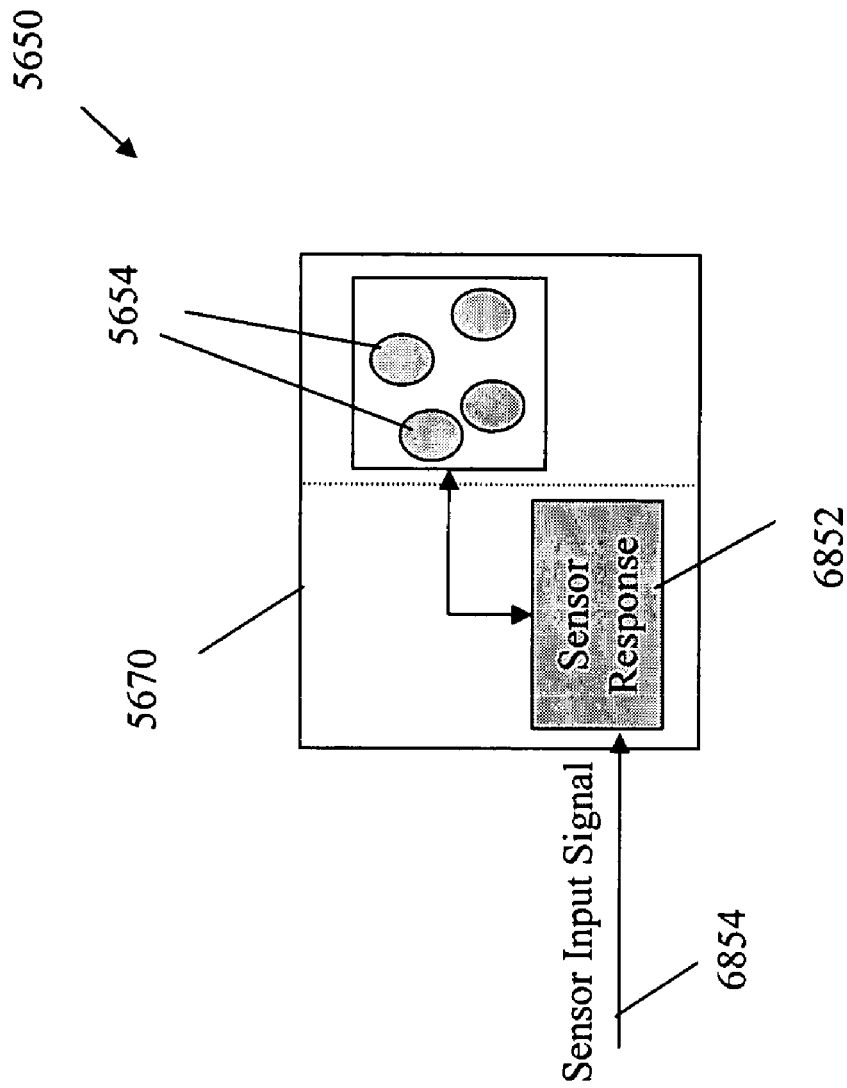
FIG. 68 shows an LED package including a sensor input.

Referring to FIG. 68, in embodiments the submount 5670 may include a circuit or other component 6852, which is responsive to an input signal 6854 from a sensor, which may be any kind of sensor or signal source 8400 described above. Thus, an LED package 5650 can be made directly responsive to sensors, such as temperature sensors (such as to preserve lifetime of the LED die(s) 5654 under adverse thermal conditions), photosensors (such as to aid in calibrating light coming from the LED die(s) 5654), motion sensors, sound sensors, and other kinds of sensors and transducers, without requiring additional control circuitry. In embodiments the sensor may be integrated as part of the submount 5670, or it may be external to the LED package 5650 and provide an input signal to a sensor-responsive circuit or other component in the submount 5670. In embodiments the LED package 5650 may be incorporated into an illumination system that responds to sensors. In other embodiments, the LED package 5650 may be incorporated into an indicator device, such as an indicator light to indicate a sensed condition. Thus, an LED package 5650 may be respond to any signal source or sensor described herein such as the operating state of a device, the operating state of a sensor, or a sensed condition, such as acceleration, pressure, temperature, time, humidity, light, a fault condition, proximity, or a chemical condition.

Figure 69:
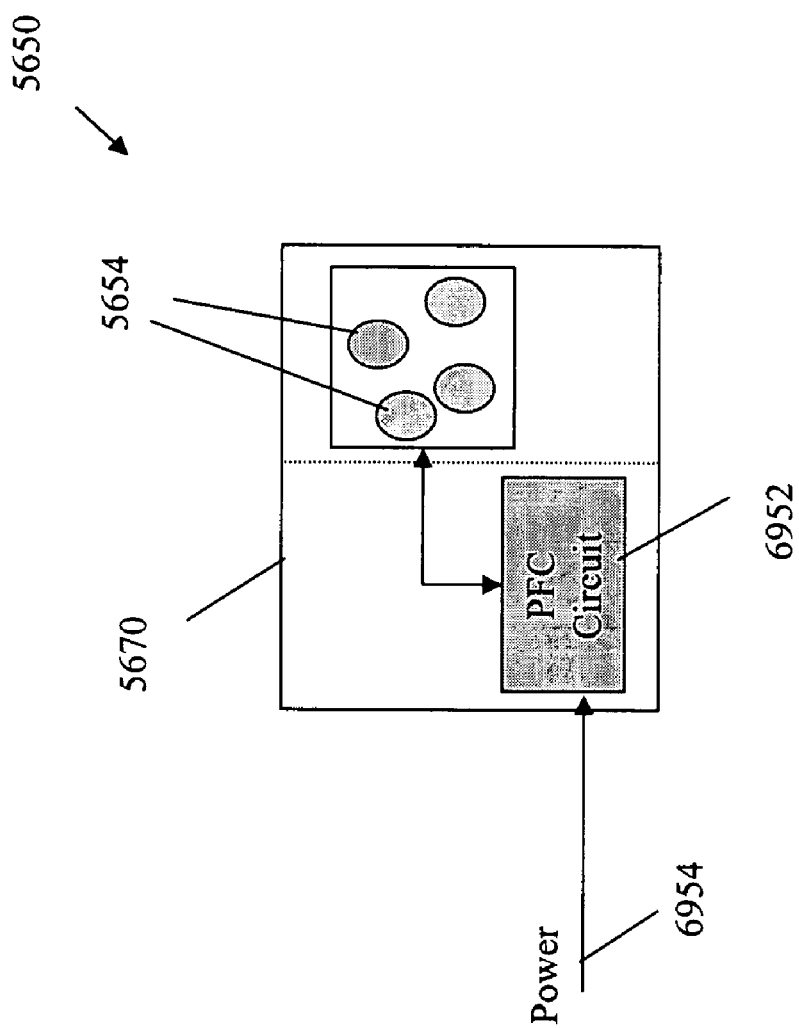
FIG. 69 shows an LED package including a power factor control circuit.

Referring to FIG. 69, in embodiments the submount 5670 may include one or more components for providing power-factor-control 6952. The power-factor-control circuit may be a circuit similar to the ones described in connection with FIG. 15 above or in other patents, applications and documents incorporated by reference herein. The power-factor-control circuit 6952 may take incoming power 6954, such as from AC or DC line voltage, and convert it to a form suitable for driving the LED die(s) 5654, without requiring other external components.

Figure 70:
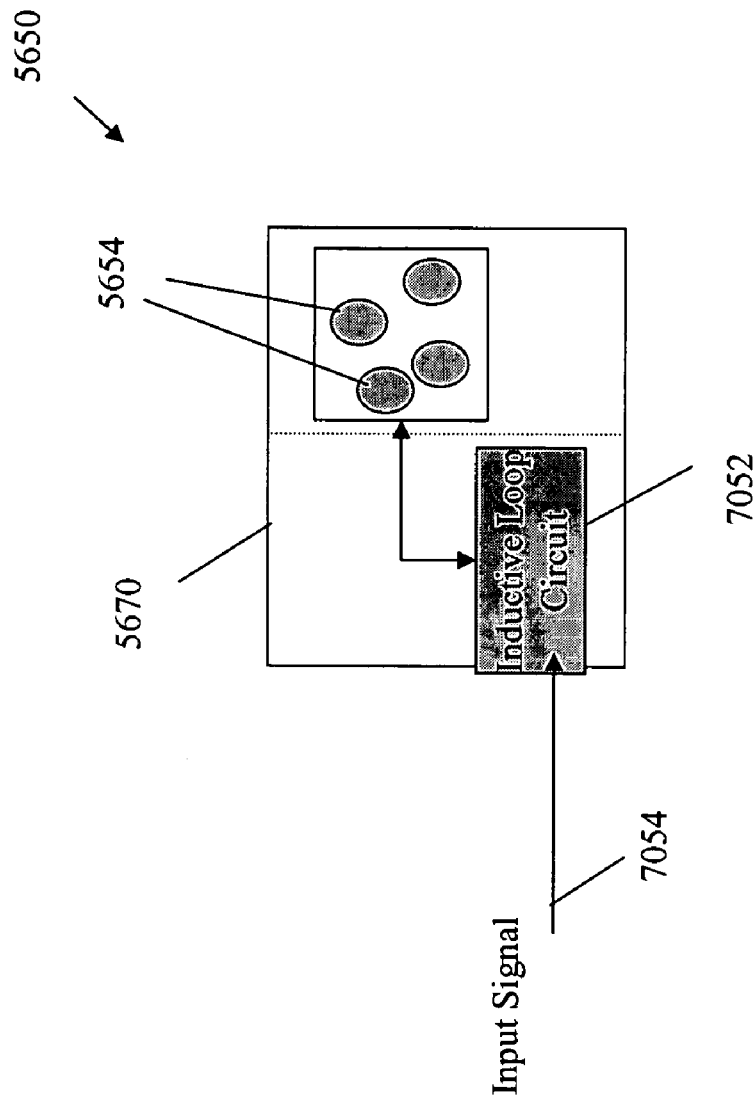
FIG. 70 shows an LED package including an inductive loop drive circuit.

Referring to FIG. 70, in embodiments the submount 5670 may include an inductive loop drive circuit 7052 in response to an input signal 7054, such as for inductively driving the LED die(s) 5654 as described in certain patent applications and documents incorporated herein by reference.

Figure 71:
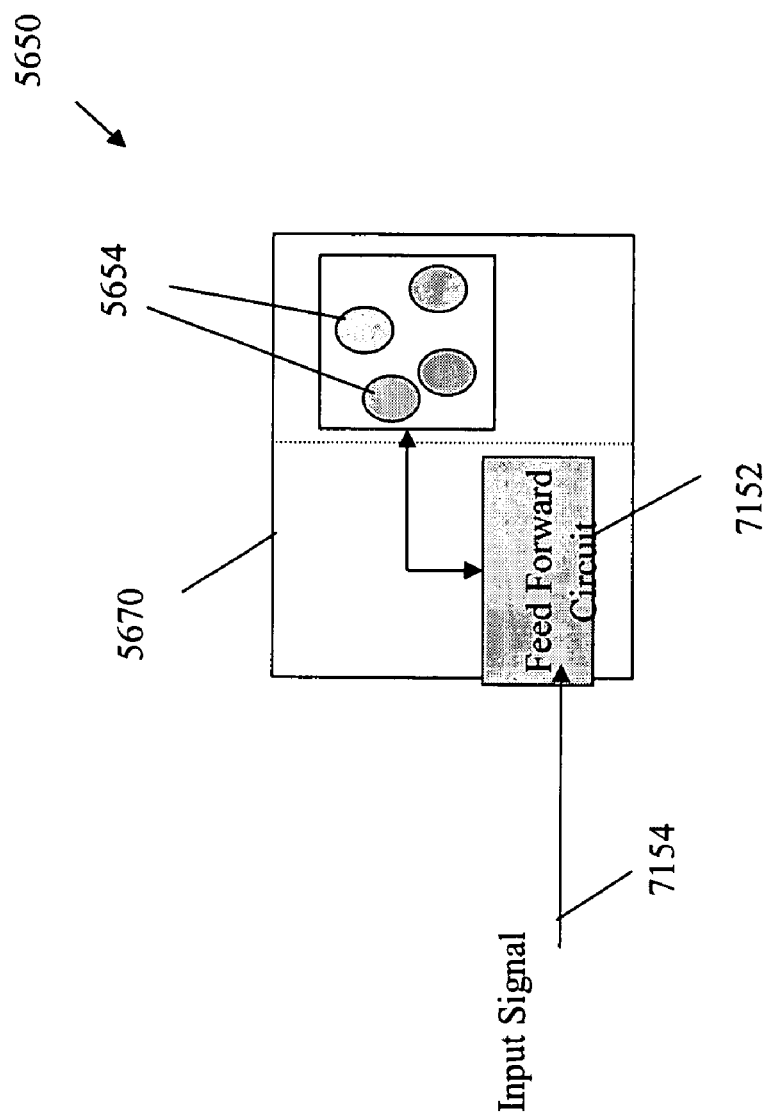
FIG. 71 shows an LED package including a feed-forward drive circuit.

Referring to FIG. 71, in embodiments the submount 5670 may include feed-forward drive circuit 7152 in response to an input signal 7154, such as for driving the LED die(s) 5654 with a feed-forward facility 4100 as described elsewhere herein and in certain patent applications and documents incorporated herein by reference.

Figure 72:
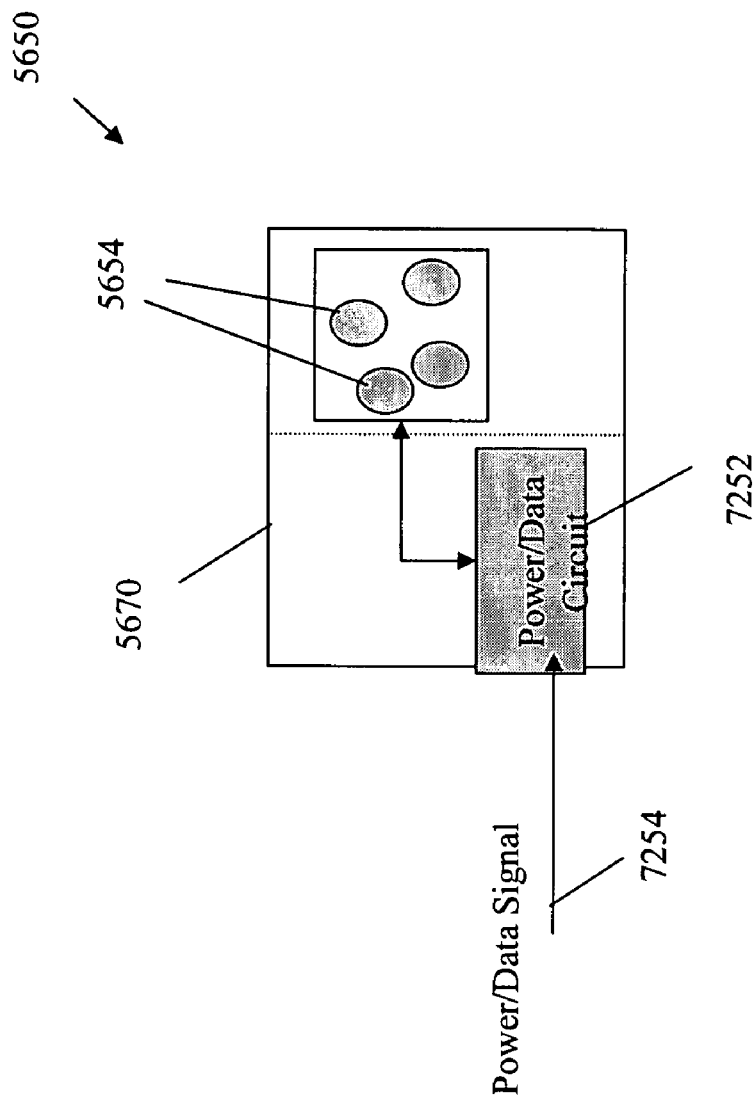
FIG. 72 shows an LED package including a power/data facility.

Referring to FIG. 72, in embodiments the submount 5670 may include a power/data facility 7252 in response to an input combined power/data signal 7254, such as for driving the LED die(s) 5654 with a power/data facility as described elsewhere herein in connection with FIGS. 16a, 18 and 24, as well as in certain patent applications and documents incorporated herein by reference.

Figure 73:
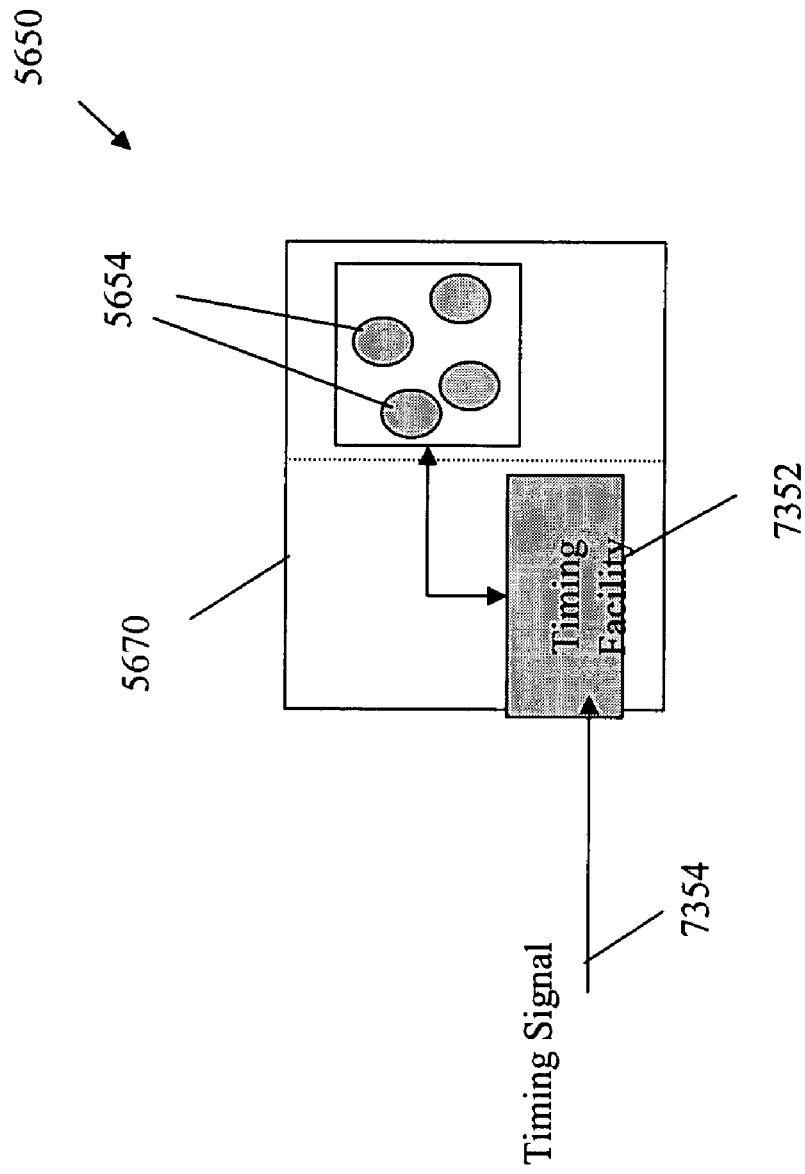
FIG. 73 shows an LED package including a timing facility.

Referring to FIG. 73, in embodiments the submount 5670 may include a timing facility 7352 that allows the LED package 5650 to respond to timing signals 7354 or that may generate an internal timing signal to generate light from the LED package 5650 according to predetermined timing requirements, such as for shows stored in memory 3700 or controlled by a processor 3600, as described elsewhere herein and in certain patent applications and documents incorporated herein by reference.

Figure 74:
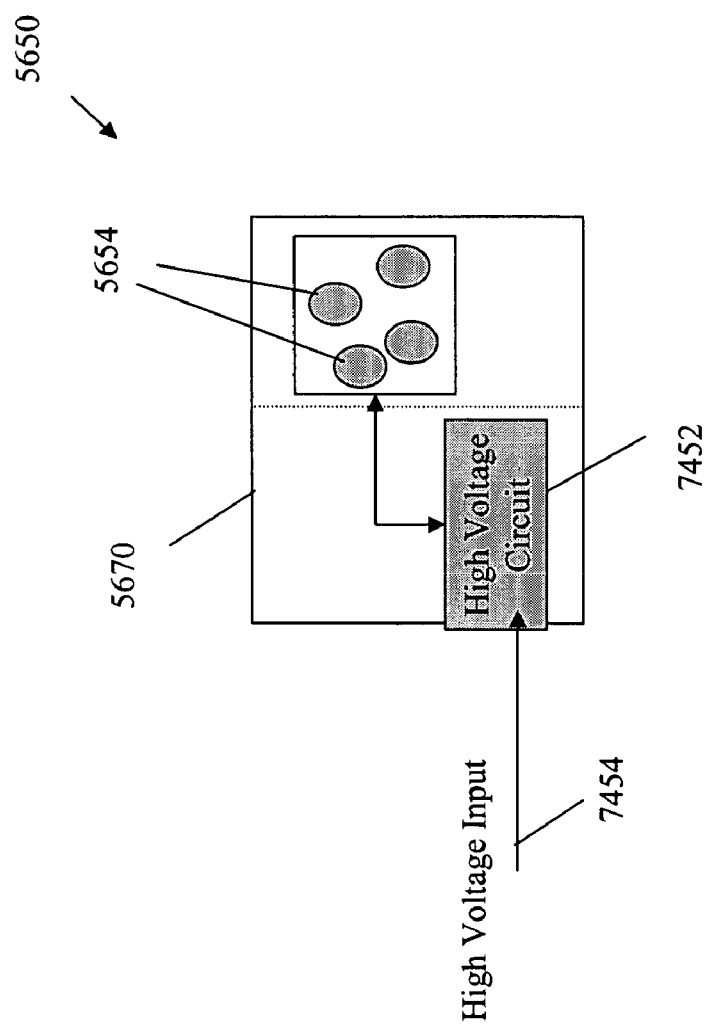
FIG. 74 shows an LED package including a high-voltage input.

Referring to FIG. 74, in embodiments the submount 5670 may include a circuit 7452 for responding to a high-voltage input 7454, such as for driving the LED die(s) 5654 with a high-voltage facility as described herein in connection with FIG. 16b and FIG. 17 and in certain patent applications and documents incorporated herein by reference.

Figure 75:
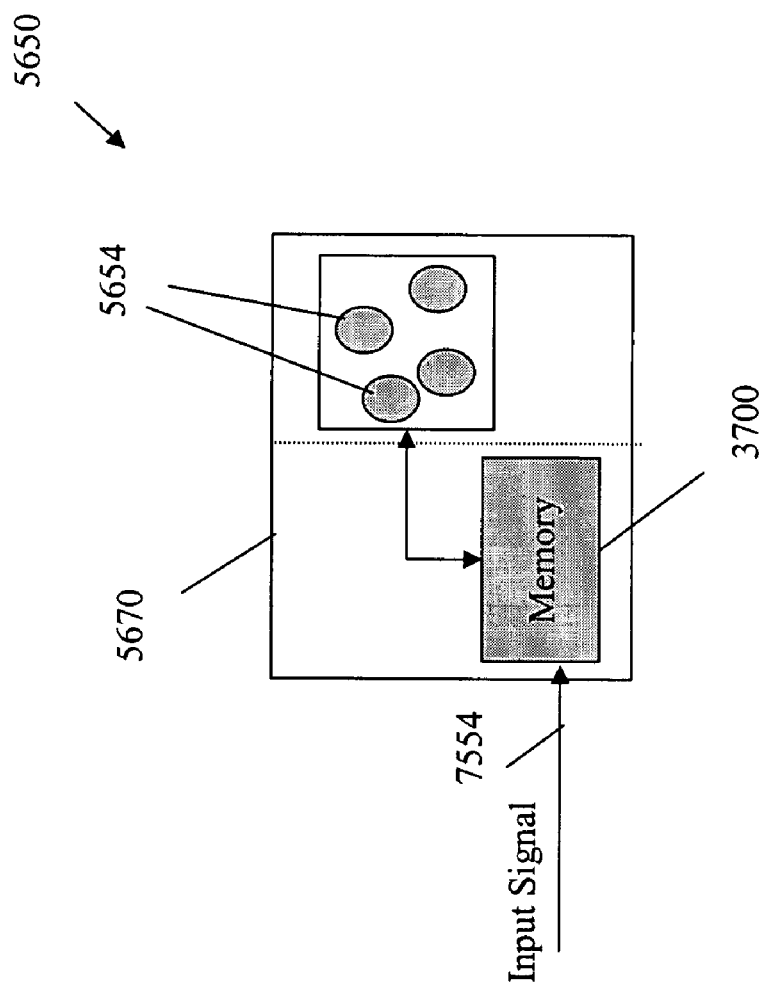
FIG. 75 shows an LED package including a data facility.

Referring to FIG. 75, in embodiments the submount 5670 may include a data facility 3700, such as memory 3700, for storing programs and/or data, such as for responding to an input signal 7454, such as for driving the LED die(s) 5654 in intelligent response to the input signal 7554. A data storage facility 3700 may include a look-up table, stored program modes, programs for responding to control signals, programs for responding to data according to various protocols, protocols for responding to signal sources 8400, including sensors, calibration programs, addressing programs, programs for executing shows and effects, or other data storage capabilities as described herein and in certain patent applications and documents incorporated herein by reference. In embodiments the memory 3700 may include a stored program for controlling power to the LED die 5654 based on the anticipated requirements of the installation of the LED package 5650. In embodiments the memory 3700 may be EPROM. In embodiments the memory 3700 may be DRAM, SRAM, or other RAM.

Figure 76:
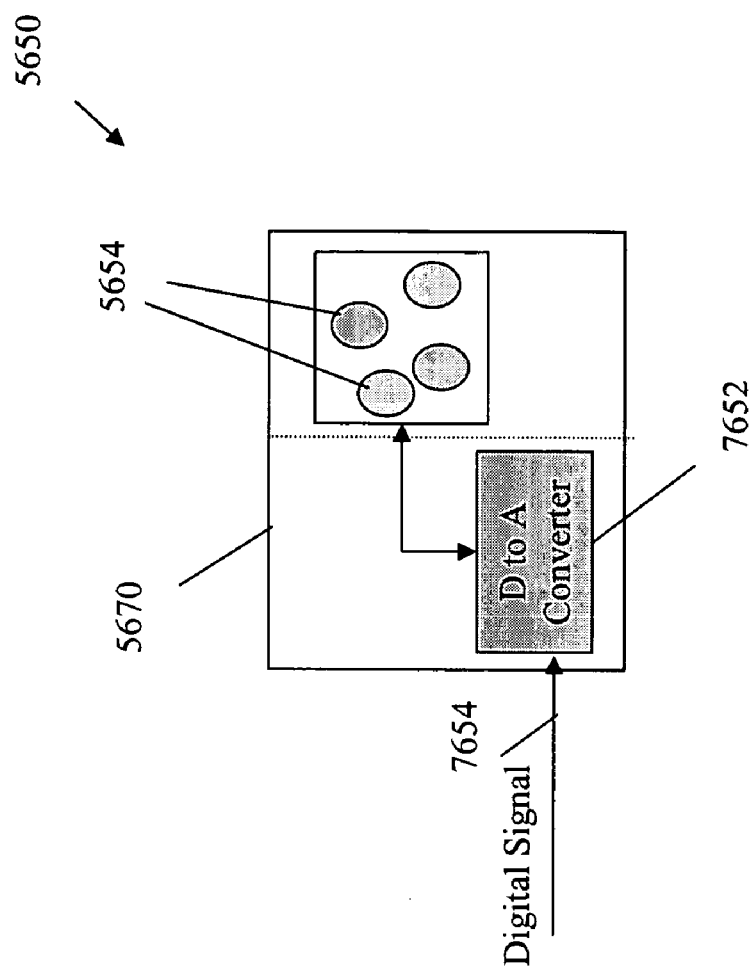
FIG. 76 shows an LED package including a digital-to-analog converter.

Referring to FIG. 76, in embodiments the submount 5670 may include a digital-to-analog converter 7652, such as for converting an incoming digital signal 7654 to an analog signal, such as to be relayed to drive the LED die(s) 5654. Alternatively, a submount could also include an analog-to-digital converter in conjunction with other components, such as to take an incoming analog signal and convert it to a digital signal for further processing before a control signal is relayed to the LED die(s) 5654.

Figure 77:
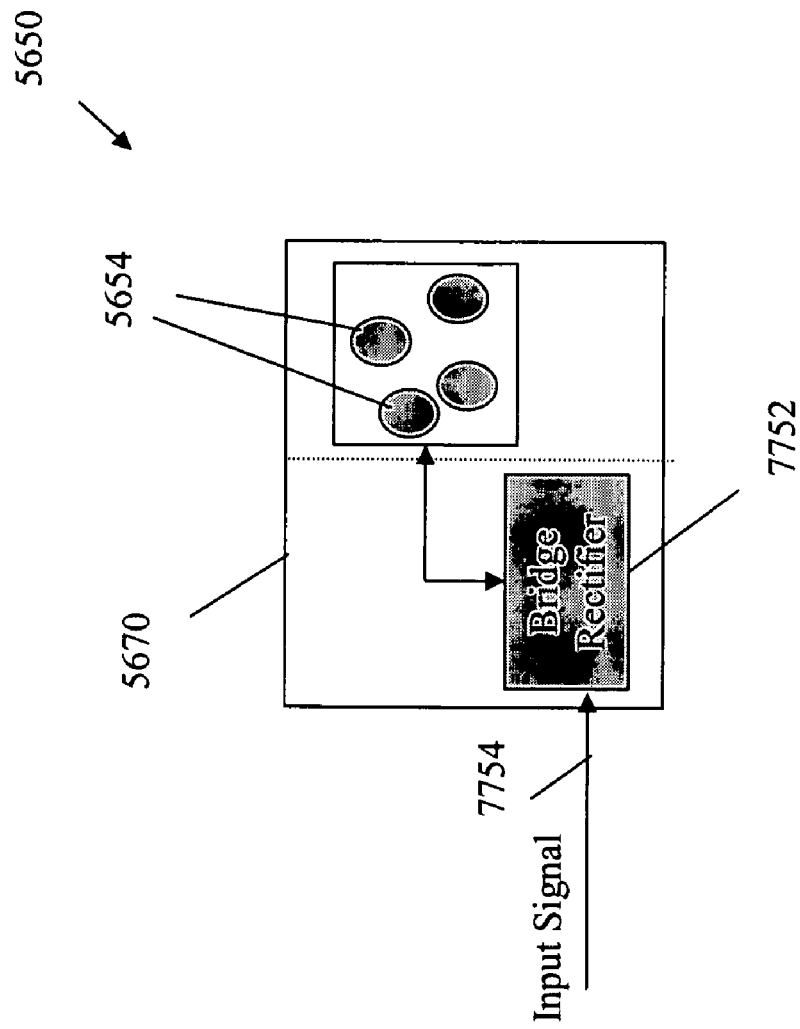
FIG. 77 shows an LED package including a bridge rectifier.

Referring to FIG. 77, in embodiments the submount 5670 may include a bridge rectifier, such as for rectifying an incoming signal 7754, such as to be relayed to drive the LED die(s) 5654.

Figure 78:
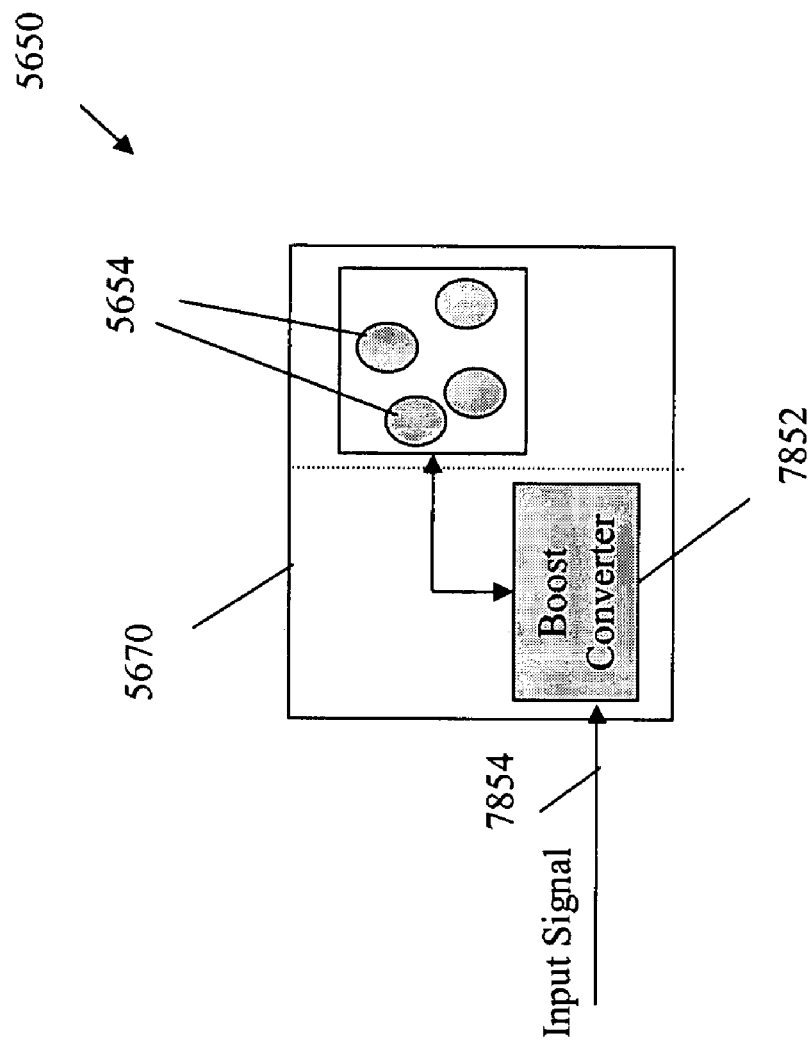
FIG. 78 shows an LED package including a boost converter.

Referring to FIG. 78, in embodiments the submount 5670 may include a boost converter, such as for converting an incoming signal 7854, such as to be relayed to drive the LED die(s) 5654.

Figure 79:
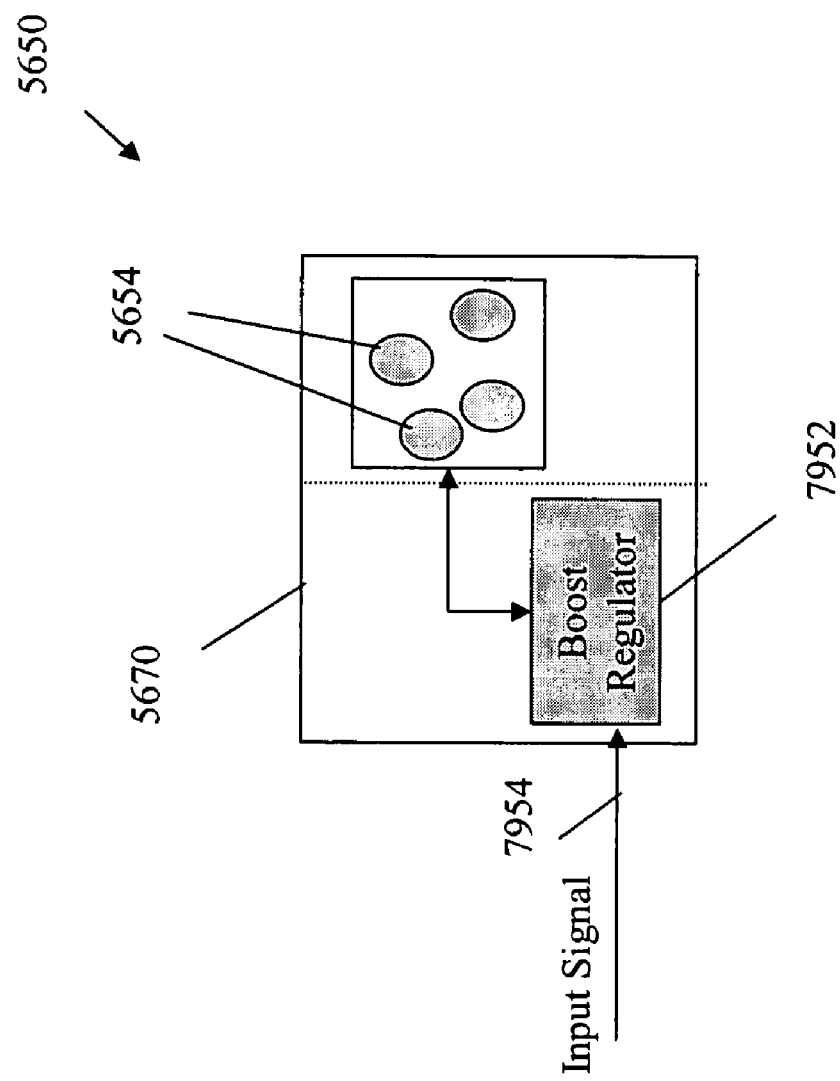
FIG. 79 shows an LED package including a boost regulator.

Referring to FIG. 79, in embodiments the submount 5670 may include a boost regulator, such as for regulating an incoming signal 7954, such as to be relayed to drive the LED die(s) 5654.

Figure 80:
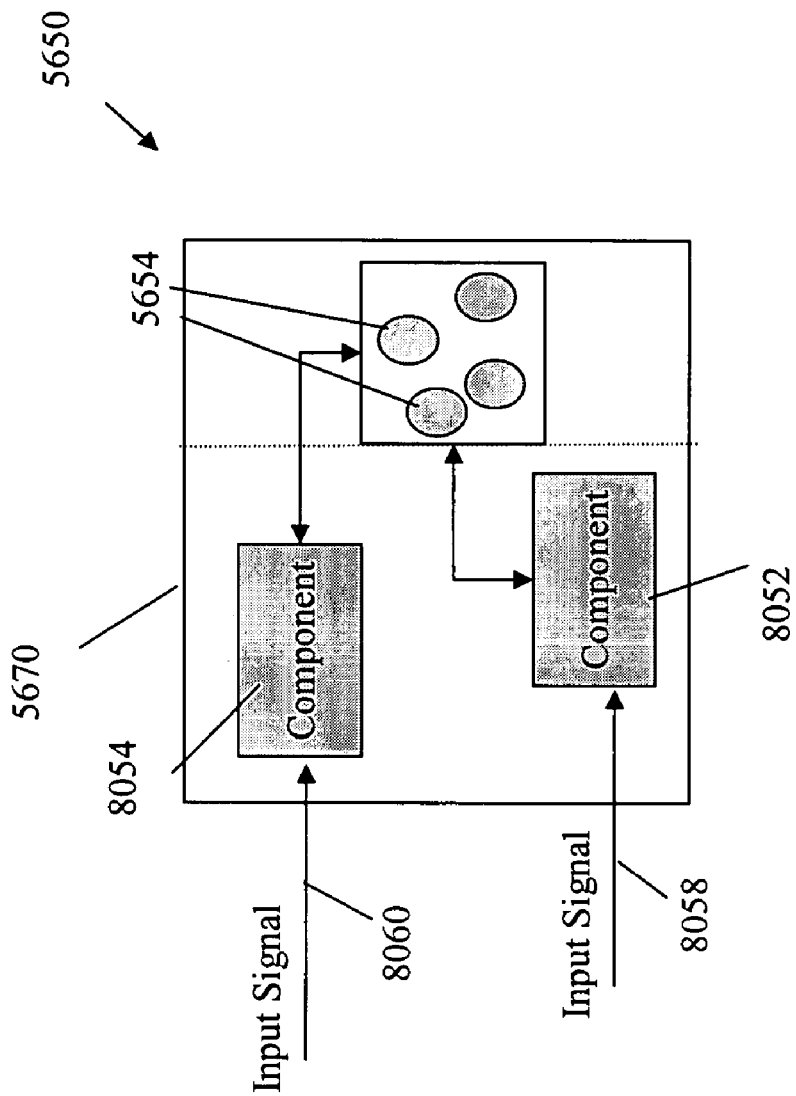
FIG. 80 shows an LED package including multiple components and multiple inputs.

Referring to FIG. 80, in embodiments the submount 5670 may include multiple components 8052, 8054, such as to respond to multiple input signals 8058, 8060. The components 8052, 8054 can be any of the circuits or other components described herein, including those described in connection with FIGS. 60 through 79.

Figure 81:
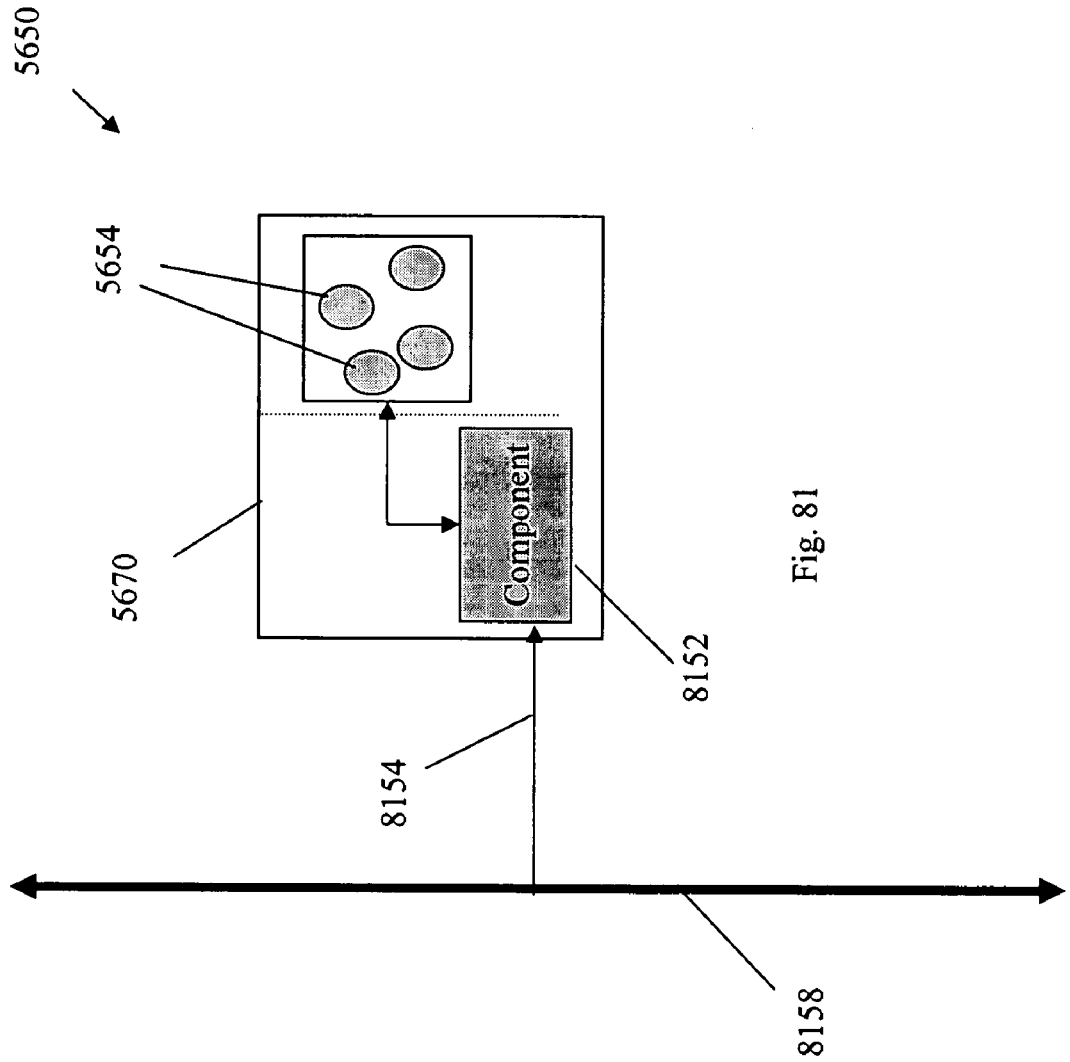
FIG. 81 shows an LED package including a component for attaching to an external conductor.

Referring to FIG. 81, a submount 5670 may include a component 8152 for receiving an incoming signal 8154 from an electrically conductive element 8158, such as a bus, wire, track, or other element. In embodiments the LED package 5650 can be snapped into such a conductive element 8158 for easy assembly of lighting units 102 that include LED packages 5650.

Lighting units 102 that include LED packages 5650 such as disclosed in connection with FIGS. 56 through 81 may be used in a variety of products, components, subassemblies, fixtures, products, systems, applications, and environments to produce a wide variety of shows and effects, including those described throughout this disclosure. For example, the LED packages 5650 can be used as a camera flash unit, a boat light, in an MR-type lighting fixture, or in various other products.

In embodiments the LED package 5650 may be provided with other elements, such as a user interface for programming the LED package. For example, the LED package 5650 could be provided with a set of resistors, where each resistor, when placed in series with the LED package 5650, adjusts the control signal to the LED package 5650 to operate in a different mode, or wherein the resistor or other user interface assists in identifying the type of LED package 5650 that is being used, such as to assist in addressing control signals to the LED package 5650.

Figure 82:
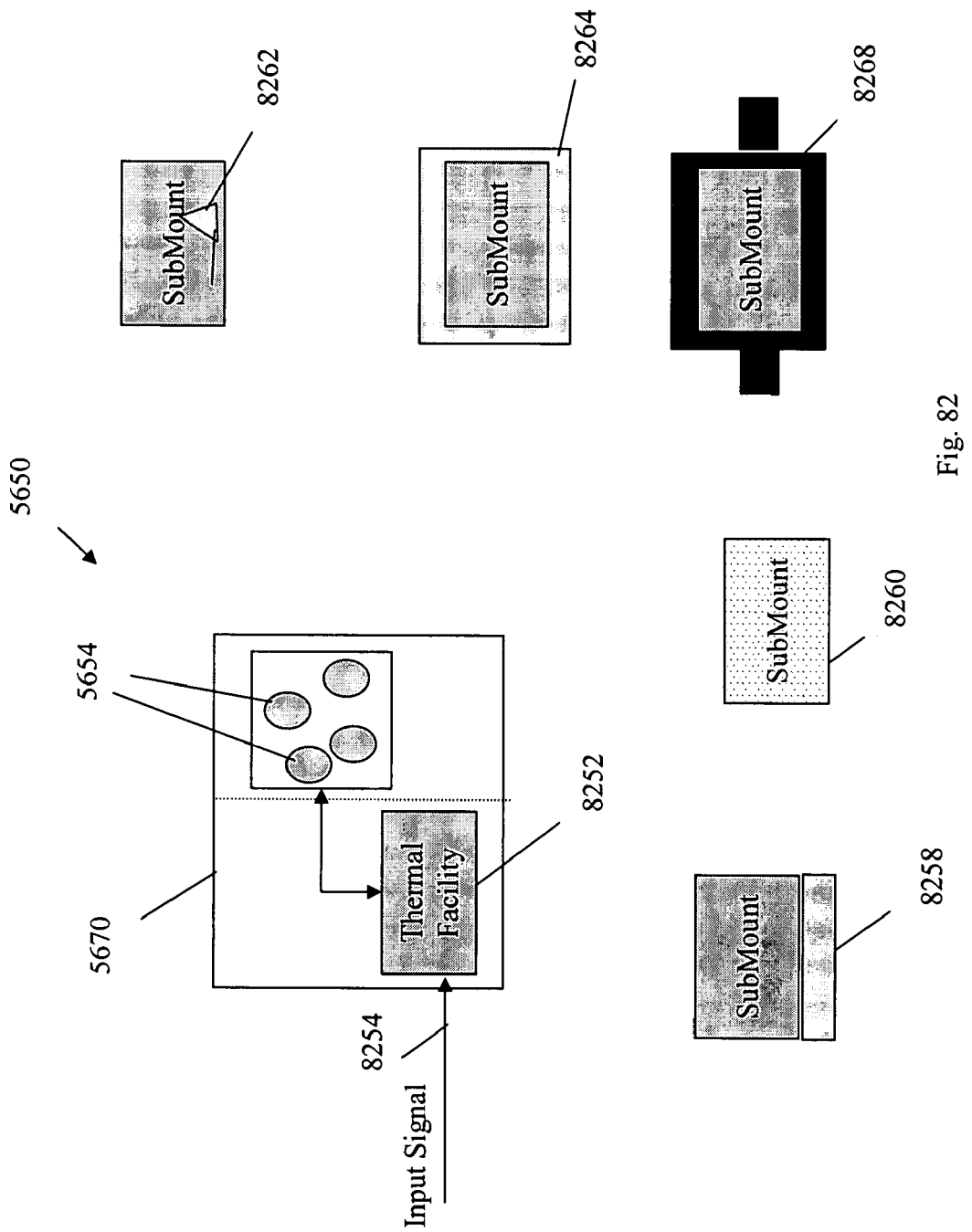
FIG. 82 shows an LED package including a thermal facility.

Referring to FIG. 82, in embodiments the submount 5670 of the LED package 5650 may include a thermal facility 8252 for cooling at least one of the LED die(s) and the submount 5670. The thermal facility may be any thermal facility 2500 as described above. In embodiments the thermal facility 8252 may be a Peltier effect device, a fluid cooling facility 8268, such as for cooling the submount 5670 with water or another cooling fluid, a potting facility 8264, such as for surrounding the submount 5670 and accepting heat from the submount 5670 or the LED die 5654, a thermally conductive plate 8258 or gap pad, such as for conducting heat away from the submount 5670, a micro-machine, such as a MEMs device 8260 fabricated from nano-materials and, for example, sprayed onto the submount 5670 for active cooling, a micro-fan or other thermal facility.

Figure 83:
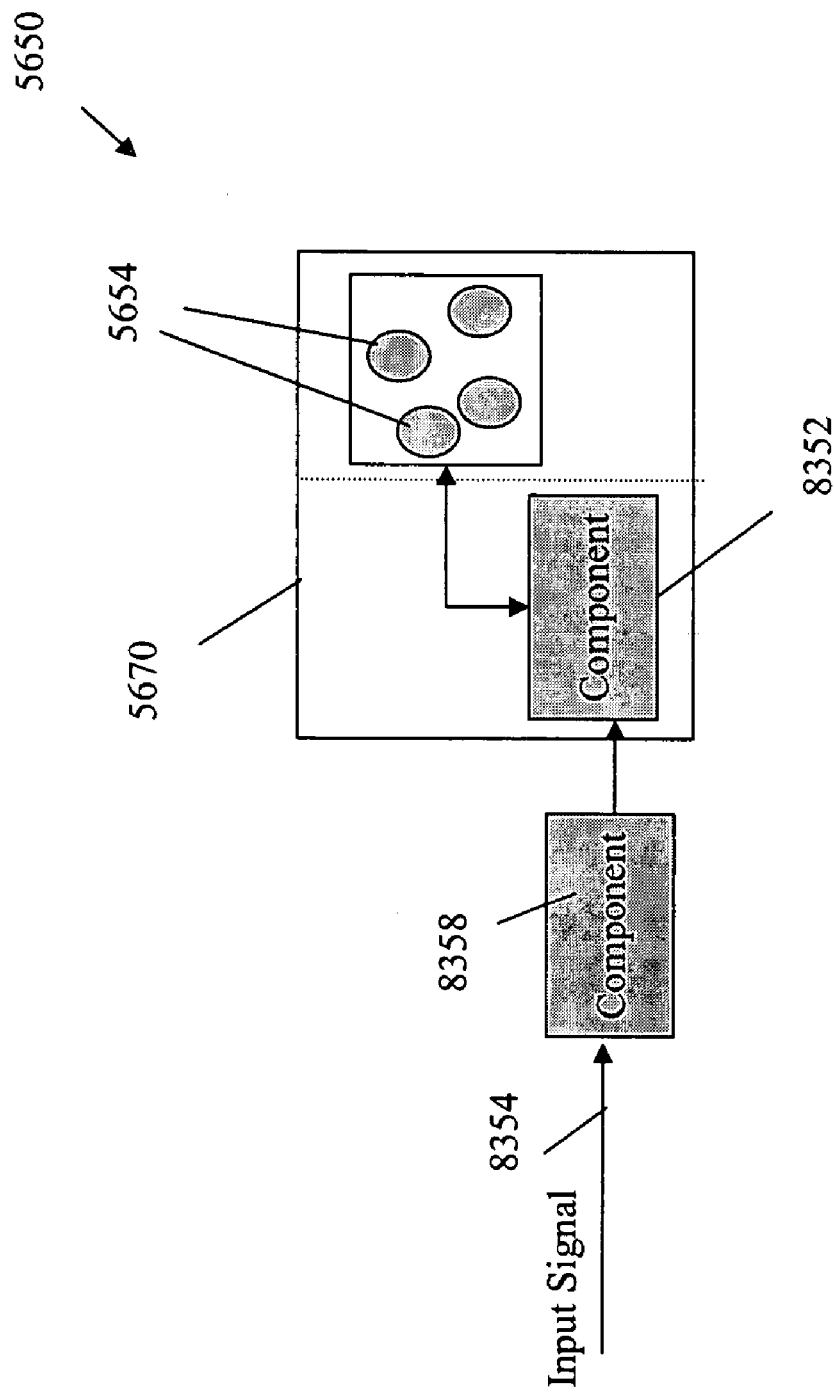
FIG. 83 shows an LED package with external components.

Referring to FIG. 83, in embodiments the LED packages, such as those disclosed in FIGS. 56 through 100, may be provided in conjunction with one or more other electrical components 8358, such as external electrical components that can improve the performance of the LED package 5650. Electrical components 8358 may include a capacitor, a resistor, a diode, an inductor, or the like.

Figure 84:
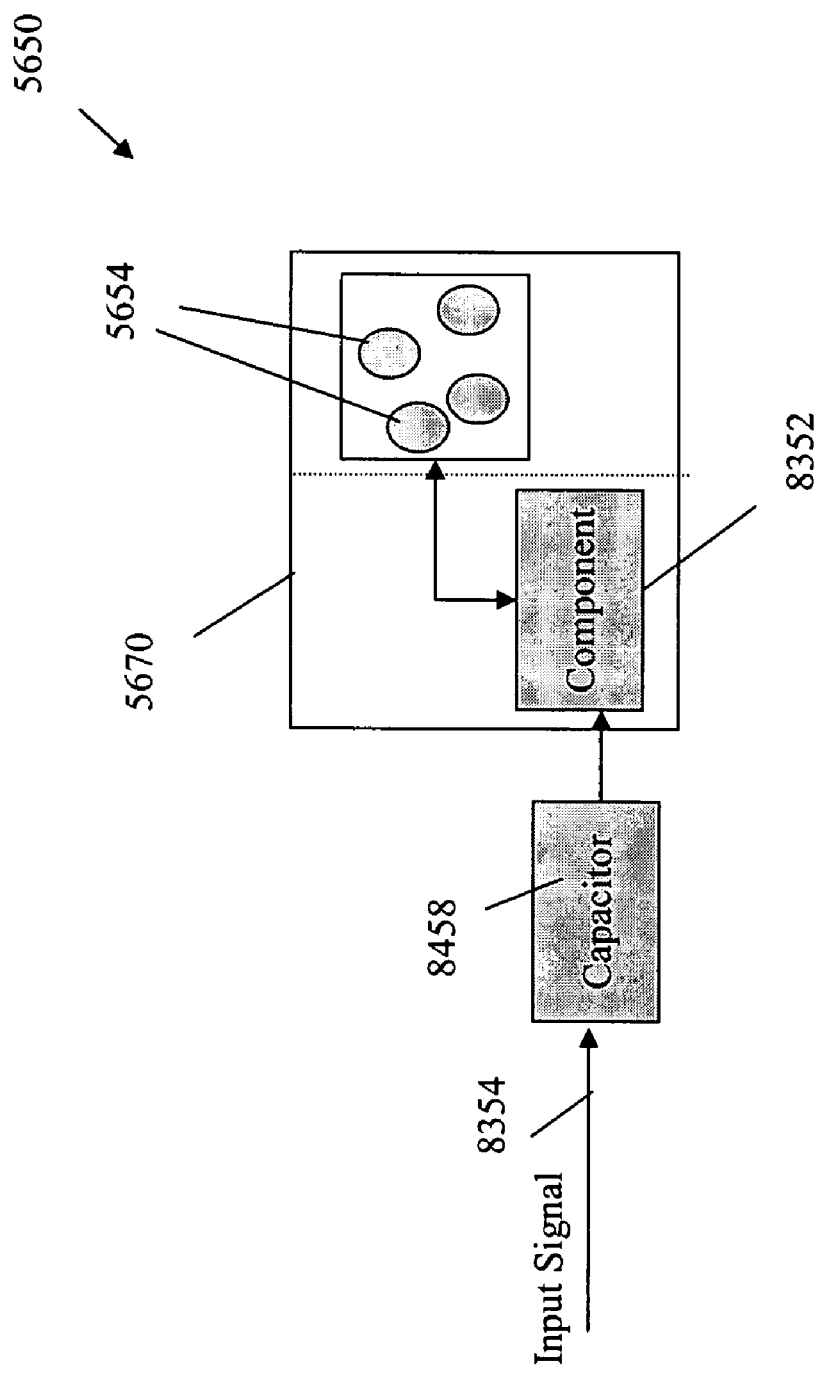
FIG. 84 shows an LED package with an external capacitor.

Referring to FIG. 84, in embodiments a capacitor 8458 is supplied for external energy storage. Such a capacitor 8458 may be useful for a dimmer-compatible circuit, a timing circuit, or other circuit as described in the embodiments of FIGS. 56 through 100.

Figure 85:
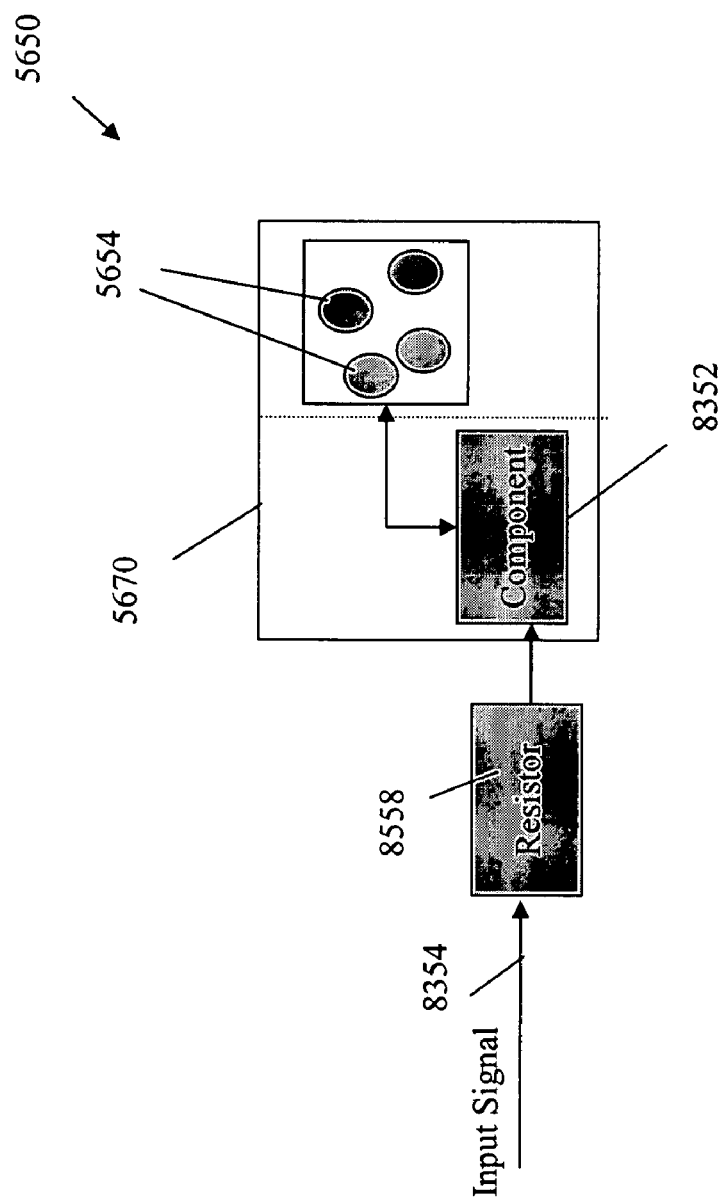
FIG. 85 shows an LED package with an external resistor.

Referring to FIG. 85, in embodiments a resistor 8558 may be used with the LED packages 5654 described in connection with FIGS. 56 through to set a voltage level of the input signal to the LED package 5650.

Figure 86:
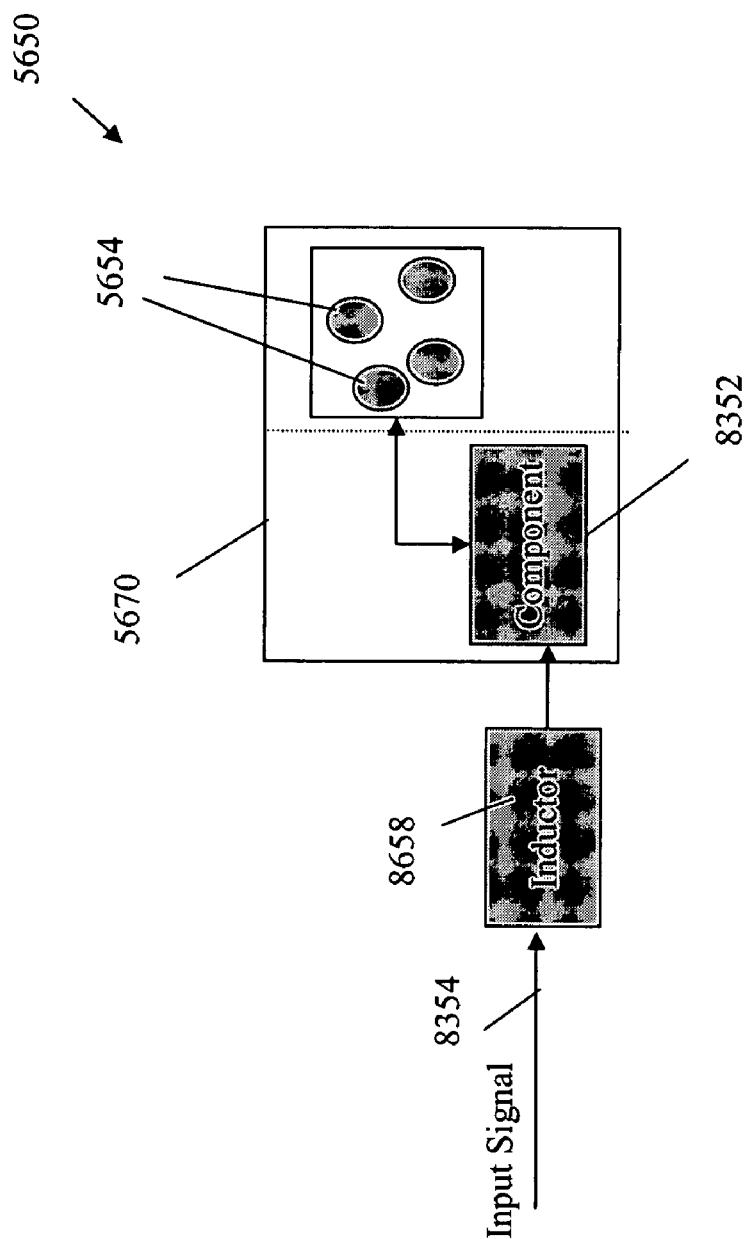
FIG. 86 shows an LED package with an external inductor.

Referring to FIG. 86, in embodiments the external component may be an inductor 8658 to provide an inductive input to the LED package 5650. In embodiments the inductor 8658 may comprise the reflector for the LED package 5650.

Figure 87:
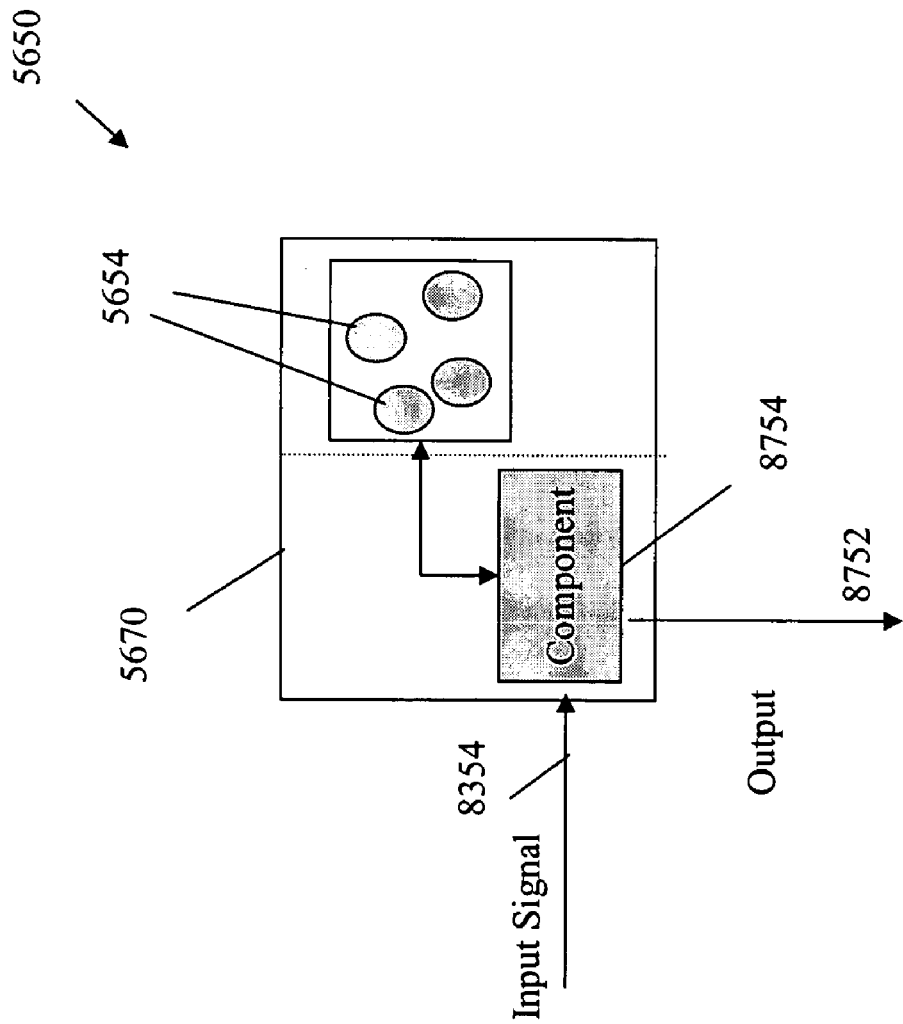
FIG. 87 shows an LED package with an input/output facility.

Referring to FIG. 87, the submount 5670 may include a component 8754 that provides an output signal 8752. Thus, the LED packages 5654 of FIGS. 56 through 100 may be provided with input/output facilities to provide signals and data to other LED packages 5654 or to any other devices.

Figure 88:
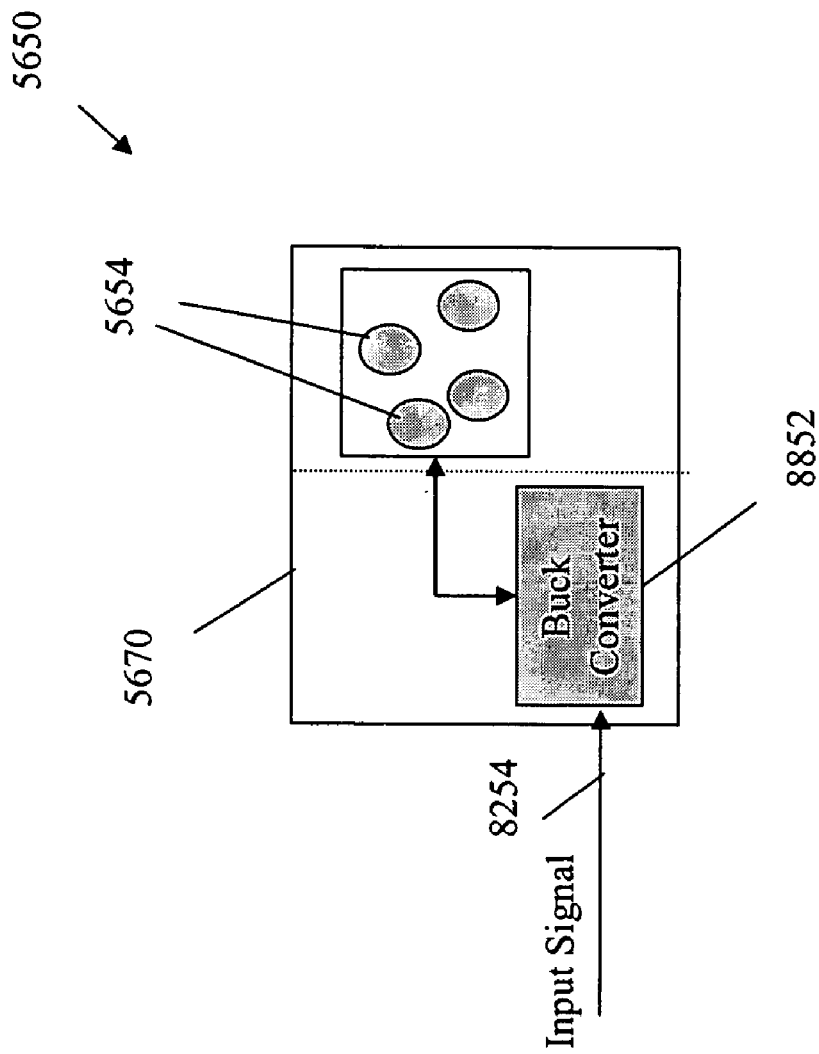
FIG. 88 shows an LED package including a converter.

Referring to FIG. 88, the electronic component in the submount 5670 may be a buck converter 8852, down converter, or the like.

Figure 89:
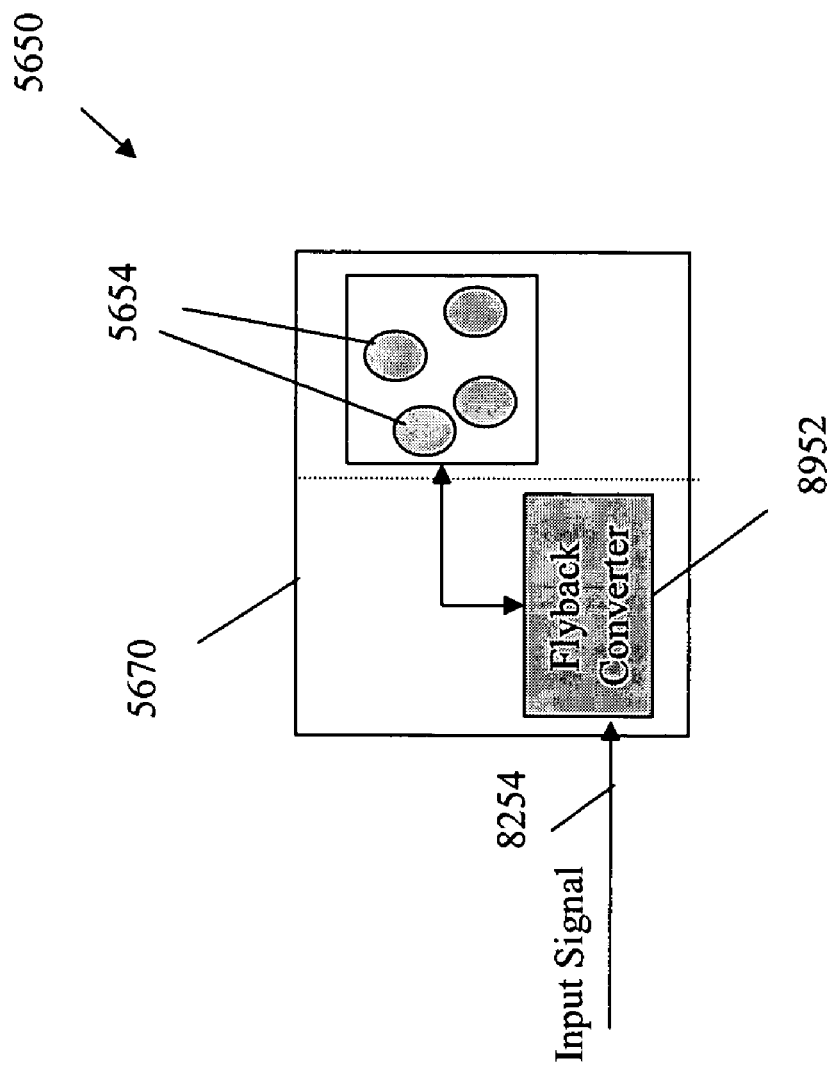
FIG. 89 shows an LED package including a converter.

Referring to FIG. 89, in embodiments the electronic component in the submount 5670 may be a flyback converter 8952.

Figure 90:
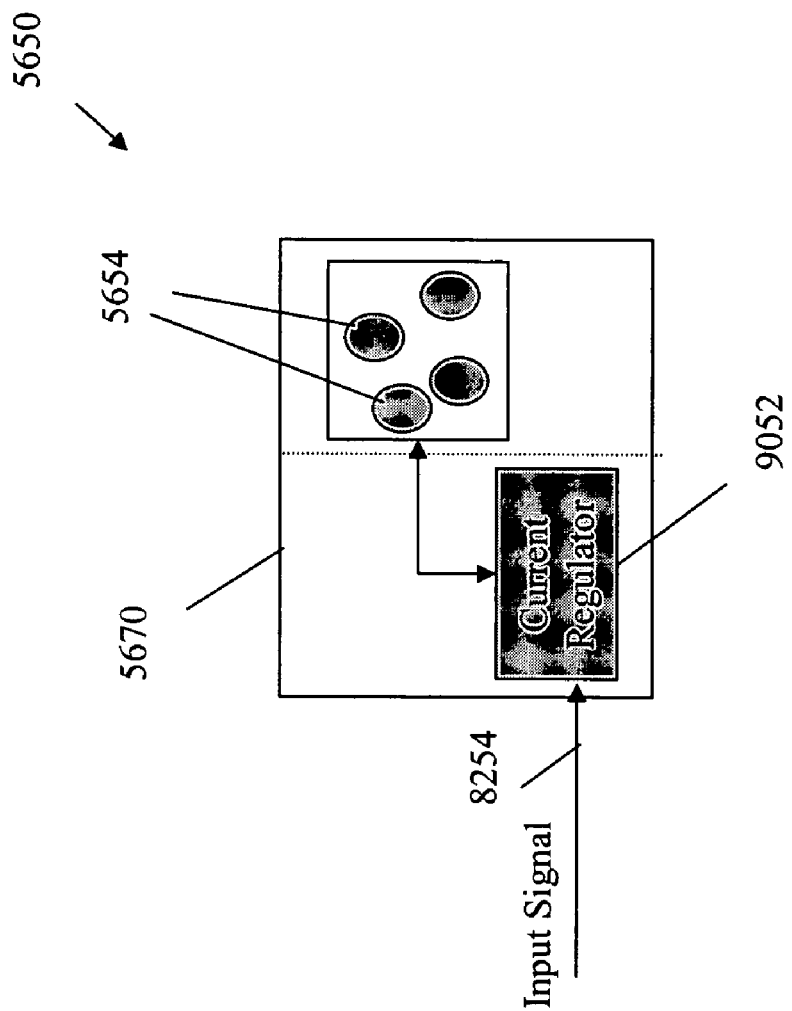
FIG. 90 shows an LED package including a current regulator.

Referring to FIG. 90, in embodiments the electronic component in the submount 5670 may be a current regulator 9052.

Figure 91:
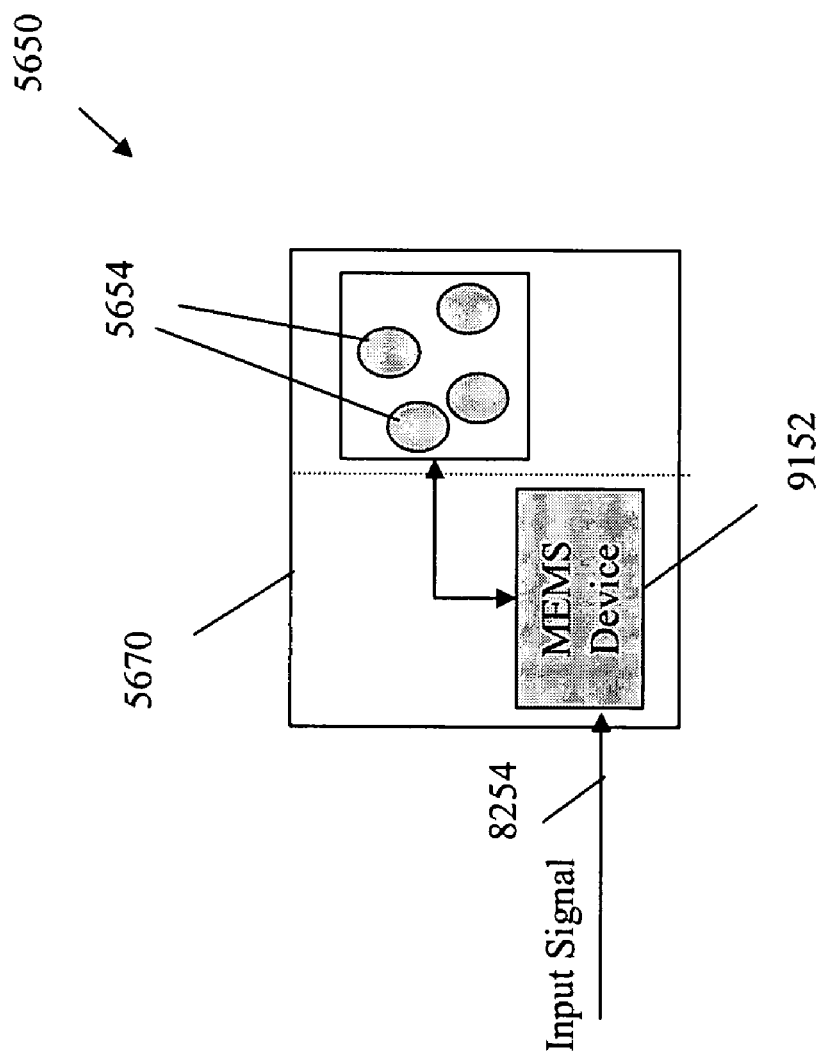
FIG. 91 shows an LED package including a MEMS device.

Referring to FIG. 91, in embodiments the LED package 5650 may include a micro-electromechanical system ("MEMS") device 9152 in the submount 5670. Thus, the LED packages 5654 of this disclosure may include integrated MEMS devices, such as micro-machines, micro-fans, pressure transducers, temperature sensors, oscillators, accelerometers, and other MEMS devices.

Figure 92:
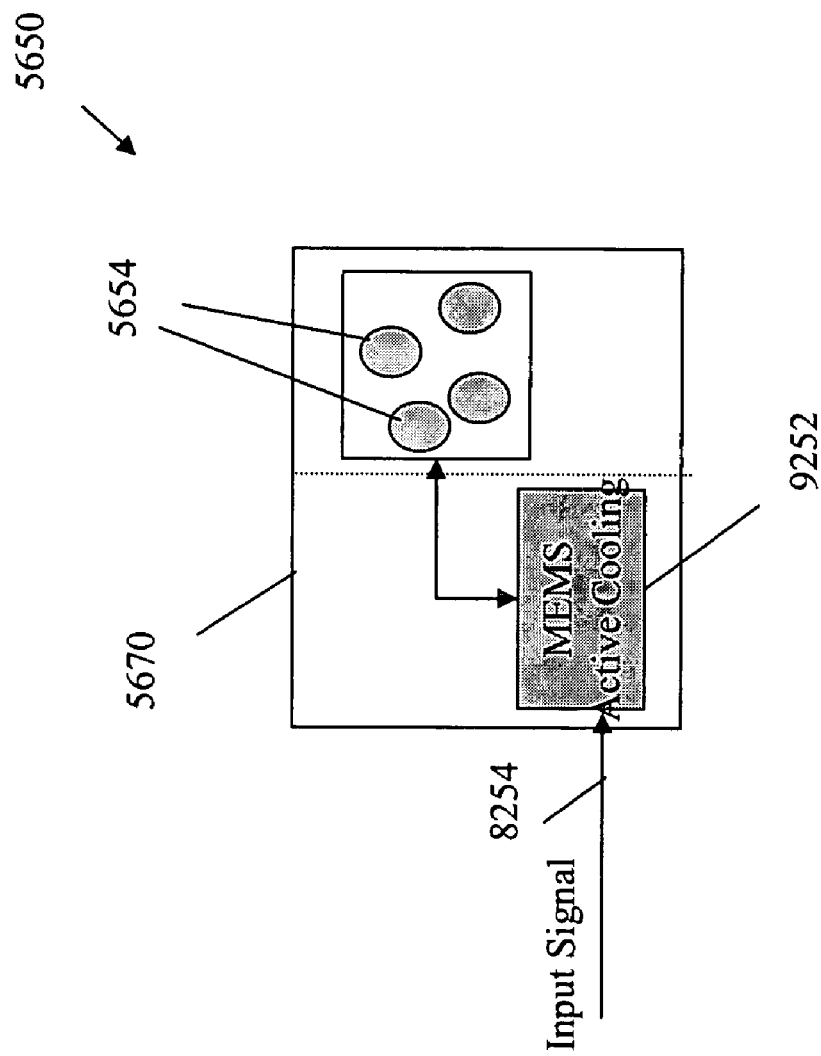
FIG. 92 shows an LED package including a MEMS cooling element.

Referring to FIG. 92, a MEMS active cooling element 9252 may be incorporated into the submount 5670, such as to serve as a thermal facility 2500 for cooling the LED package 5650.

Figure 93:
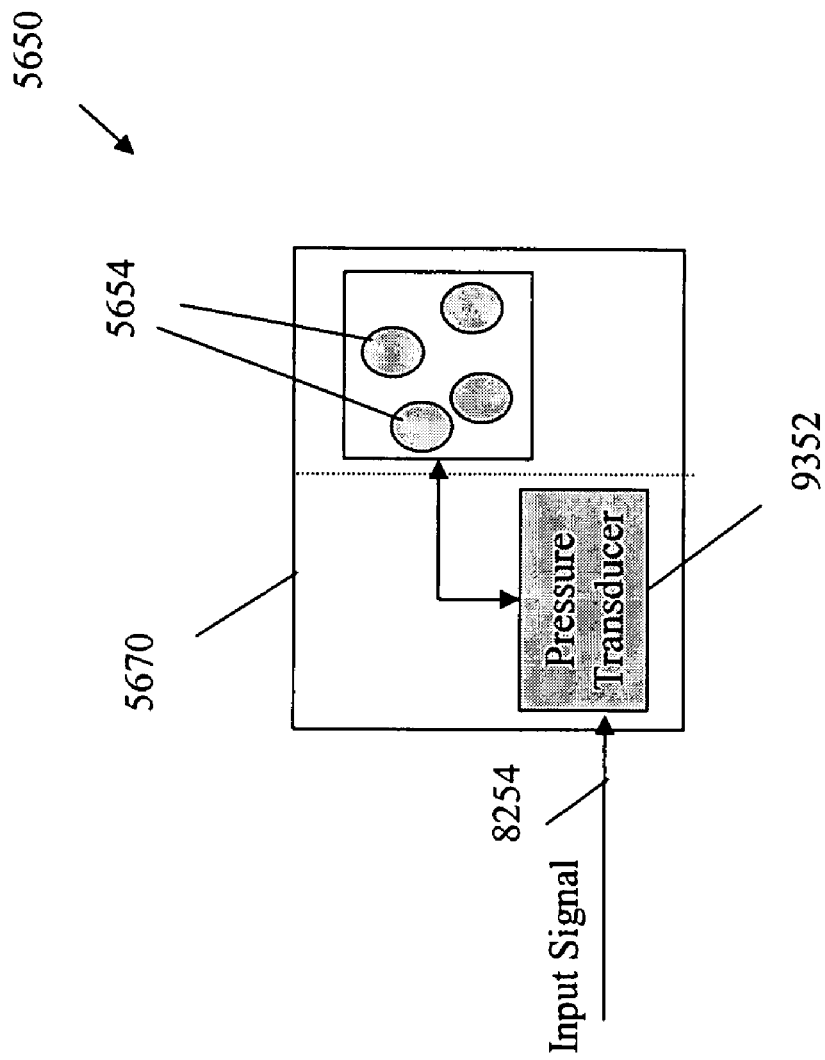
FIG. 93 shows an LED package including a MEMS pressure transducer.

Referring to FIG. 93, in embodiments the MEMS element that is incorporated in the submount 5670 may be a pressure transducer 9352.

Figure 94:
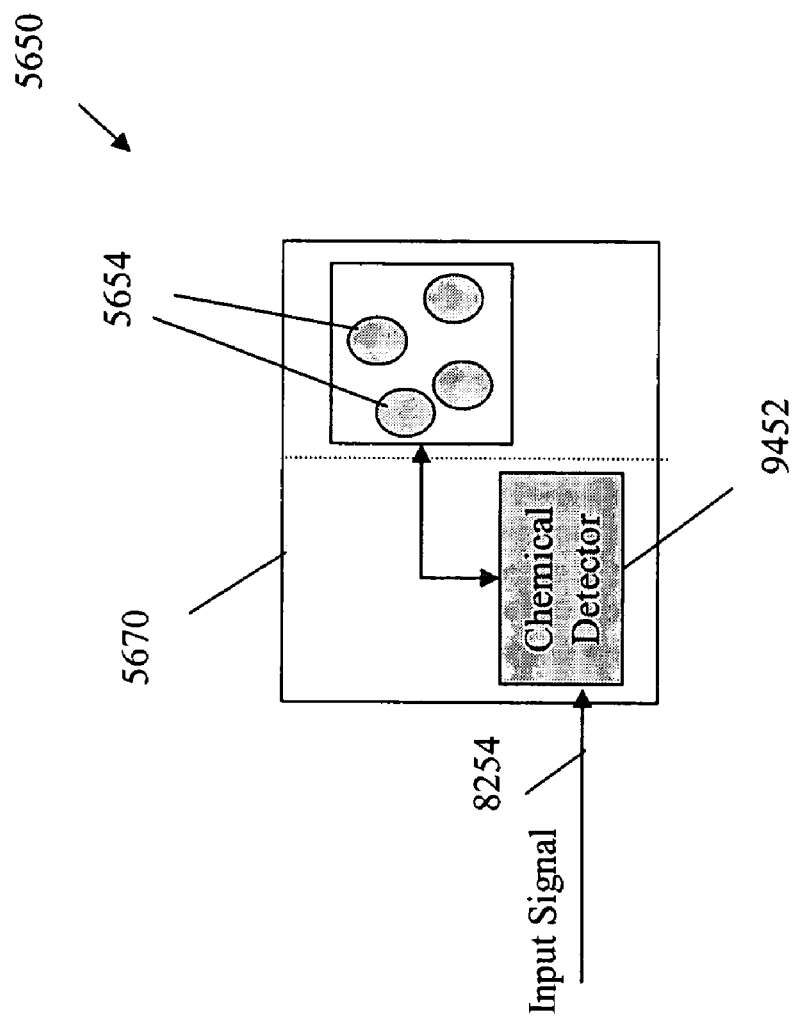
FIG. 94 shows an LED package including a chemical detector.

Referring to FIG. 94, in embodiments the electronic component integrated in the submount 5670 may be a chemical detector, such as a MEMS device for chemical detection. In such embodiments the LED packages 5654 may be used to indicate a sensed chemical condition, such as to provide a warning as to the presence of a pollutant or toxic chemical.

Figure 95:
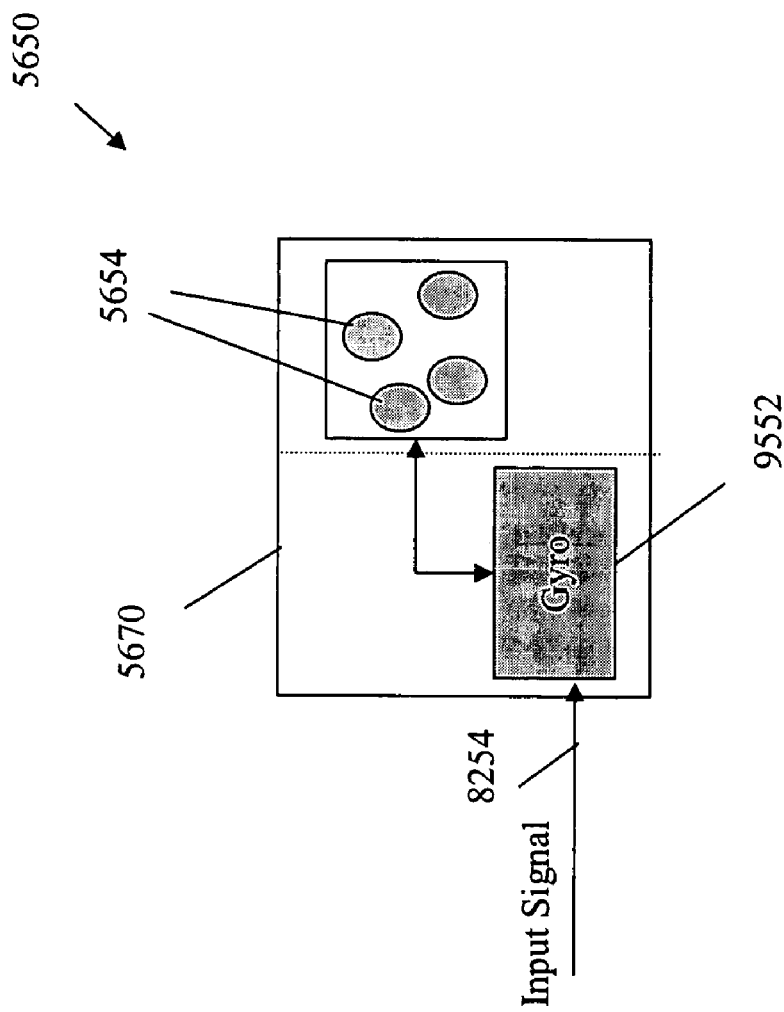
FIG. 95 shows an LED package including a gyro.

Referring to FIG. 95, in embodiments the electronic component integrated in the submount 5670 may be a gyro, such as a MEMS based gyro, for providing a gyro-based signal, such as to measure acceleration, to provide a reference as to a direction, such as for navigation applications, or the like.

Figure 96:
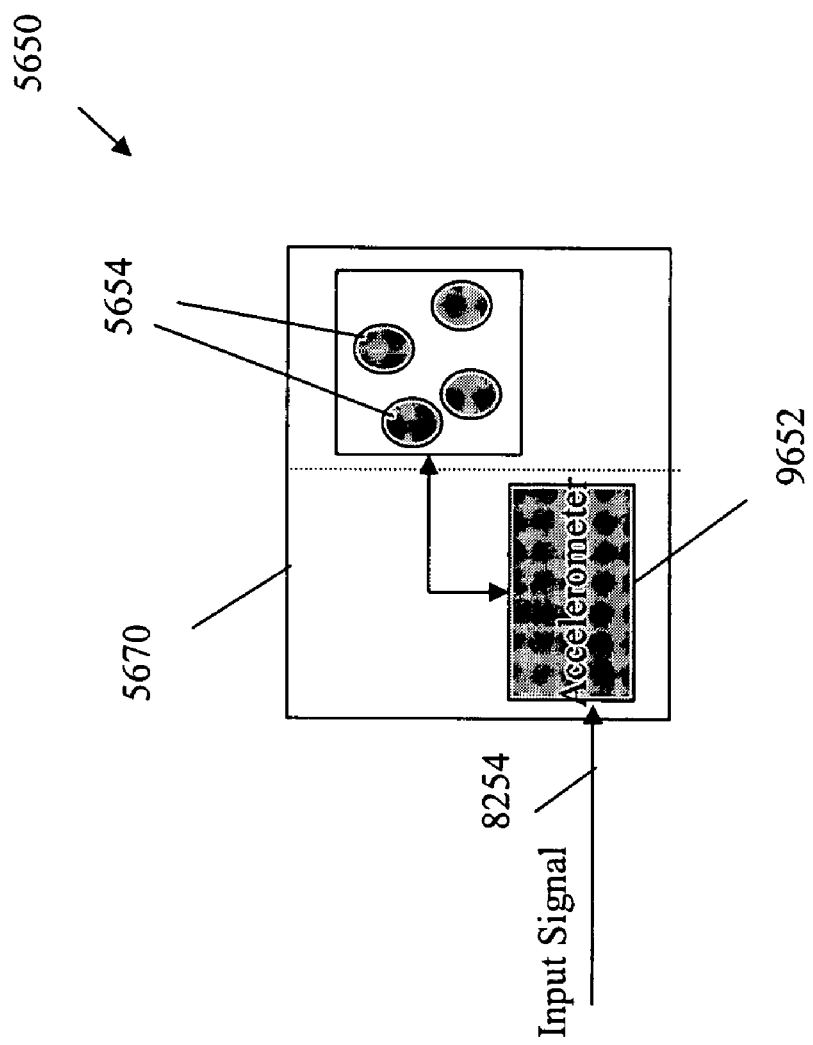
FIG. 96 shows an LED package including an accelerometer.

Referring to FIG. 96, in embodiments the electronic component integrated with the submount 5670 may be an accelerometer 9652, so that an LED package 5650 may respond to acceleration, such as to provide a warning light, alert, or other signal upon acceleration.

Figure 97:
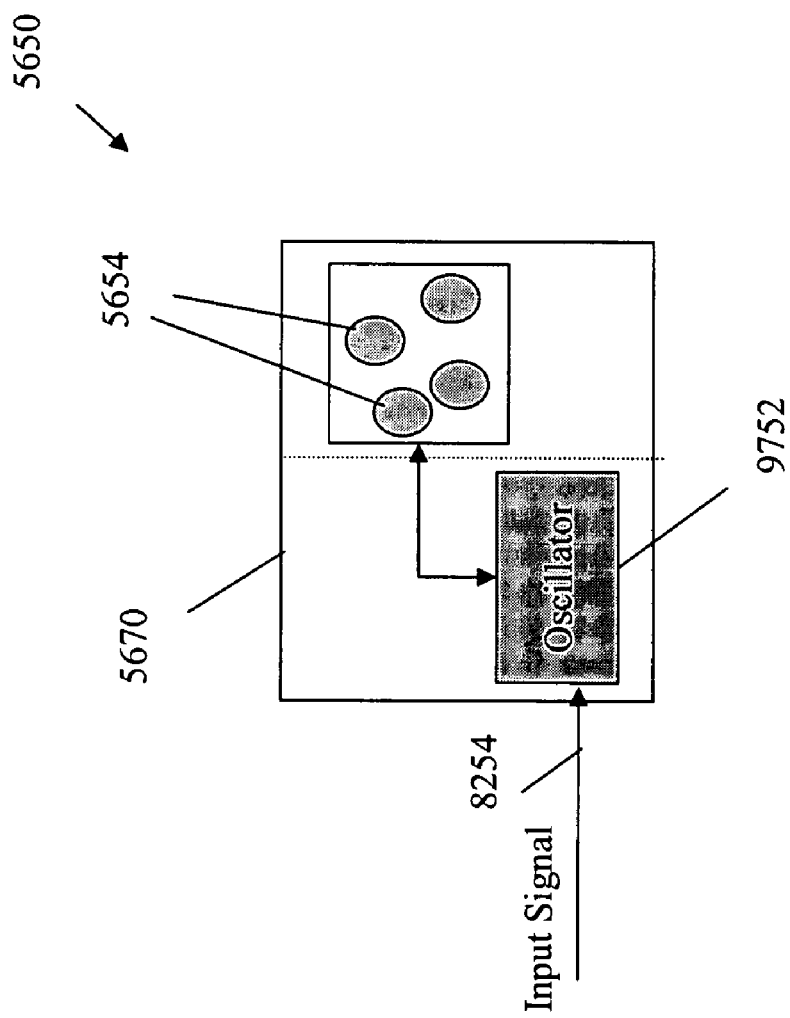
FIG. 97 shows an LED package including an oscillator.

Referring to FIG. 97, in embodiments the submount 5670 may include an oscillator 9752, such as for providing a timing reference signal for the LED package 5650.

Figure 98:
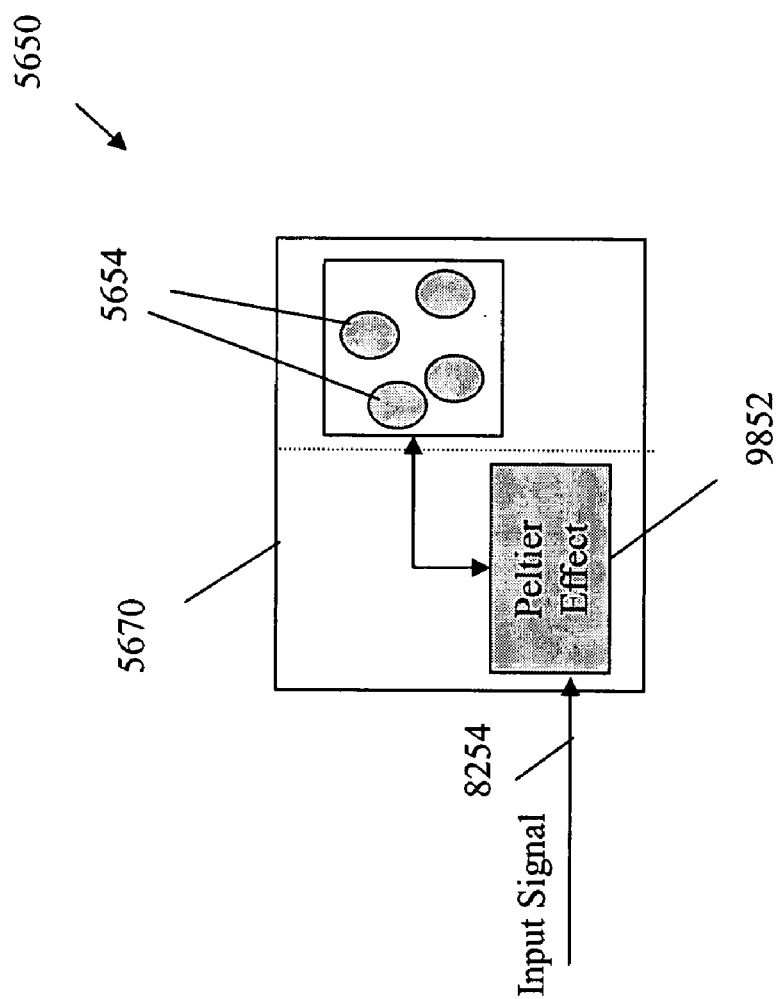
FIG. 98 shows an LED package including a Peltier effect device.

Referring to FIG. 98, in embodiments the submount 5670 may include a Peltier effect device 9852, or a similar component for removing heat from the submount 5670 or the LED die(s). In generally, a Peltier device is understood to refer to a semiconductor-based cool or heating device that can product temperature differentials between two surfaces in response to an applied current. A Peltier module may include successively mounted semiconductors where successive p-n and n-p junctions has a thermal contact with radiators. Under applied current one of the radiators heats while the other cools. A conventional Peltier module may provide temperature differentials of several tens of degrees Celsius. Greater temperature differentials can be achieved by cascading modules. By cooling the hot radiator, it is also possible to drive the cool radiator of a single Peltier module below freezing.

While Peltier modules are one solid state technique for temperature control, it will be appreciated that other techniques are known and may be usefully employed with the systems described herein. For example, an active cooling system may use an electrokinetic pump with no moving parts to move a cooling fluid through microchannels etched into a semiconductor material. A sealed cooling loop may be formed, with microchannel heat collectors is attached to packaged semiconductor to absorb heat generated by hot spots. The heat may then travel short distances to a fluid flowing through channels in the collectors which may be 20 to 100 microns wide each. Thus heat may be transported away from a chip to a radiator where the heat is exhausted to the outside air. The fluid may then travel through a solid-state pump to complete the cooling loop. One such system is commercially available from Cooligy, Inc., and described in U.S. Pat. No. 6,678,168, the teachings of which are incorporated herein by reference.

The LED packages 5650 of FIGS. 56 et seq. may be fabricated from a variety of materials. In embodiments the submount 5670 and/or the LED die(s) 5654 may be fabricated from a relatively heat-tolerant semiconductor material. In one preferred embodiment the material may be silicon carbide.

In embodiments the LED packages 5650 may be compression molded or injection molded and may include plastic, metal, ceramic, epoxy, glass, polymer, and compound materials.

In embodiments the LED packages 5650 can be used in a variety of illumination, indication and display applications, product and environments as described herein and in the documents incorporated by reference herein.

Figure 99:
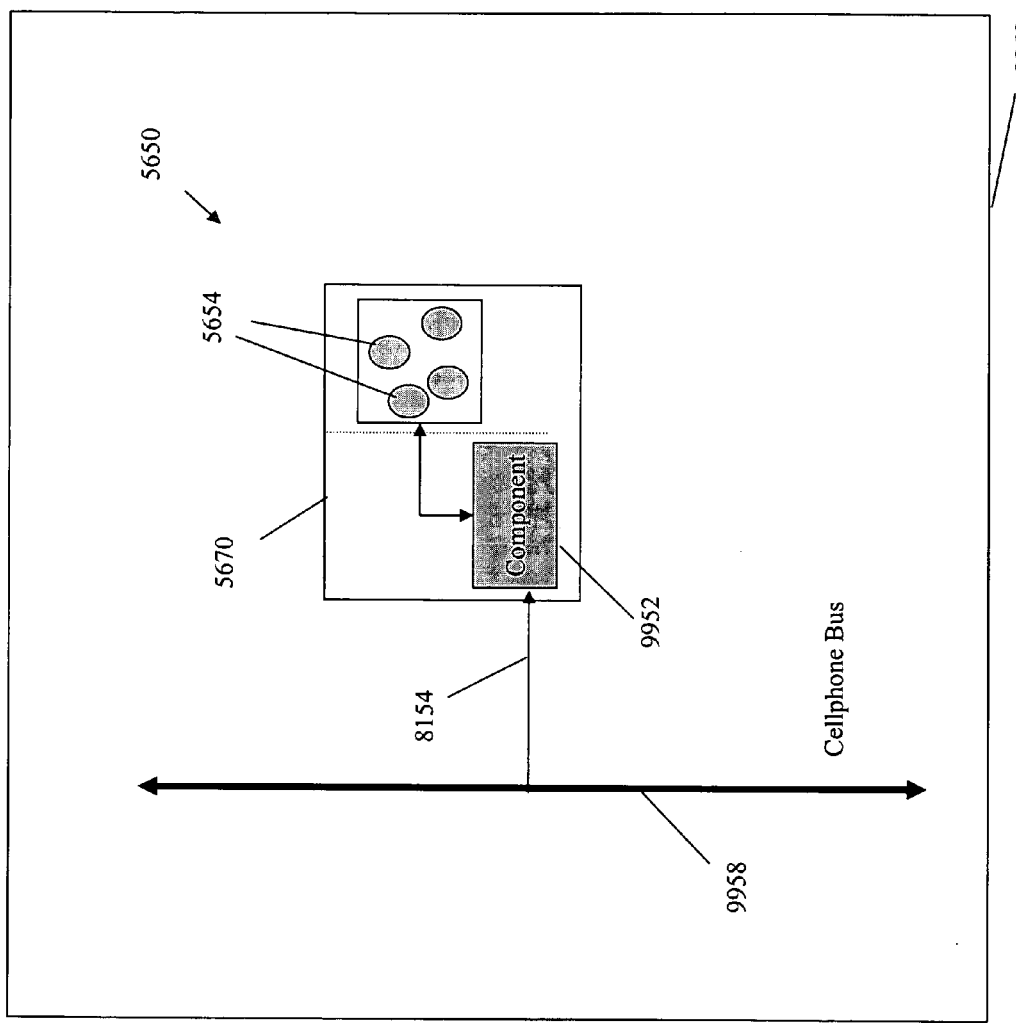
FIG. 99 shows an LED package used in a cellular phone.

Referring to FIG. 99, in embodiments an LED package 5650 such as described throughout this disclosure may be incorporated in a cellular phone system 9960. A component 9952 may be incorporated in the submount 5670 that is compatible with the power system of the cell phone system 9960, such as to take power directly from the electrical system 9958, such as a bus, of the cellular phone system 9960. In embodiments, a similar device could be a PDA, notebook computer, or any other kind of mobile or portable device. Thus, disclosed herein is an LED package with a circuit built into the submount 5670 for receiving power directly from the electrical system of a cell phone or other portable device.

Figure 100:
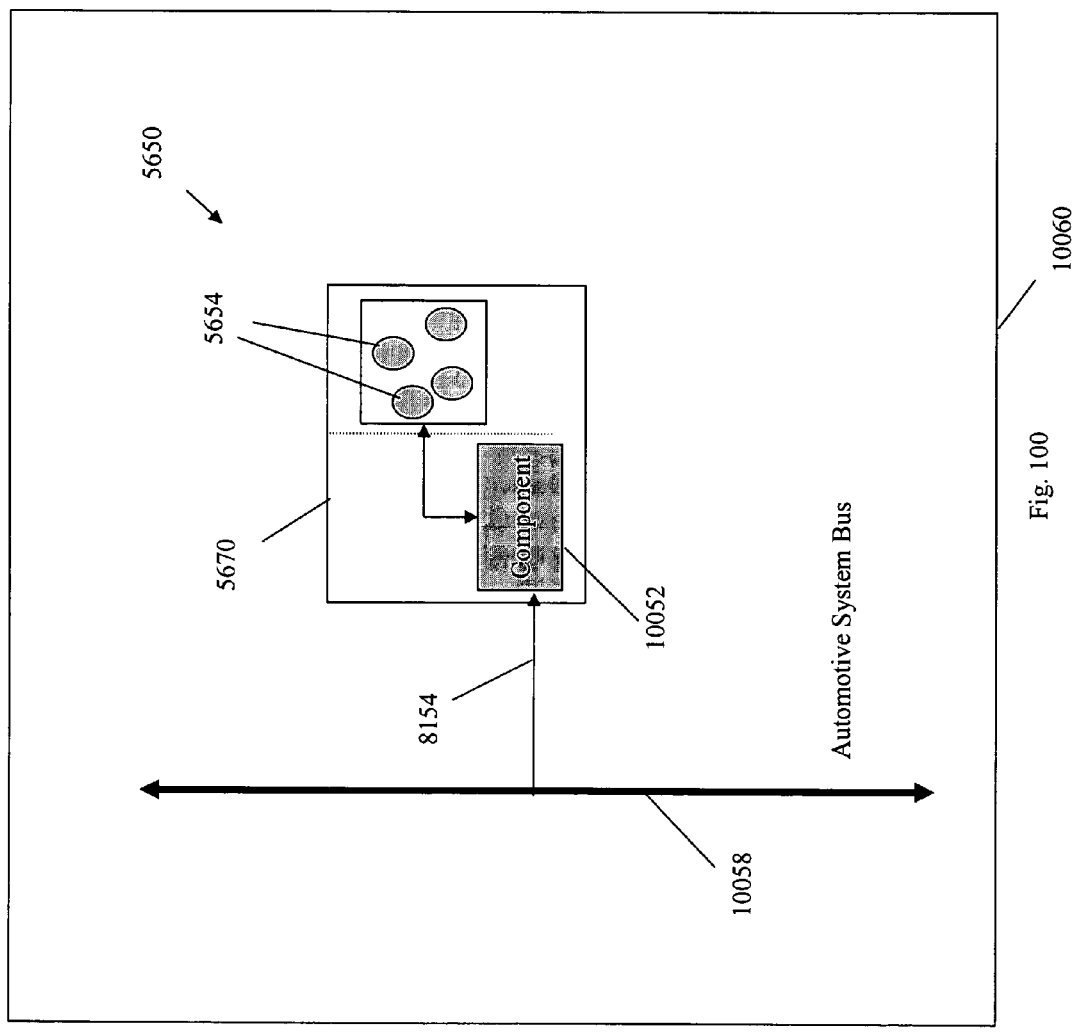
FIG. 100 shows an LED package used in an automobile.

Referring to FIG. 100, in embodiments an LED package 5650 may be incorporated into or on an automobile and connected to the electrical and/or computer system 10060 of the automobile. The submount 5670 may include a component 10052 designed to accommodate the electrical voltage and other characteristics of the automobile's electrical system, such as taking power from a bus 10058 without requiring a separate wire. Thus, disclosed herein is an LED package with a circuit built into the submount 5670 for receiving power directly from the electrical system of an automobile or other vehicle.

In embodiments an LED package 5650 may be equipped with a circuit for accepting a low-voltage input, such as an input from a battery, such as a one and one-half volt battery.

In other embodiments, the LED packages 5650 may be used in a wide variety of devices, products, applications, environments and systems, such as casino gaming devices, personal computers, computer gaming devices, entertainment devices, elevators, automation systems, such as for factories, traffic signals, photographic flashes and the like.

Figure 101:
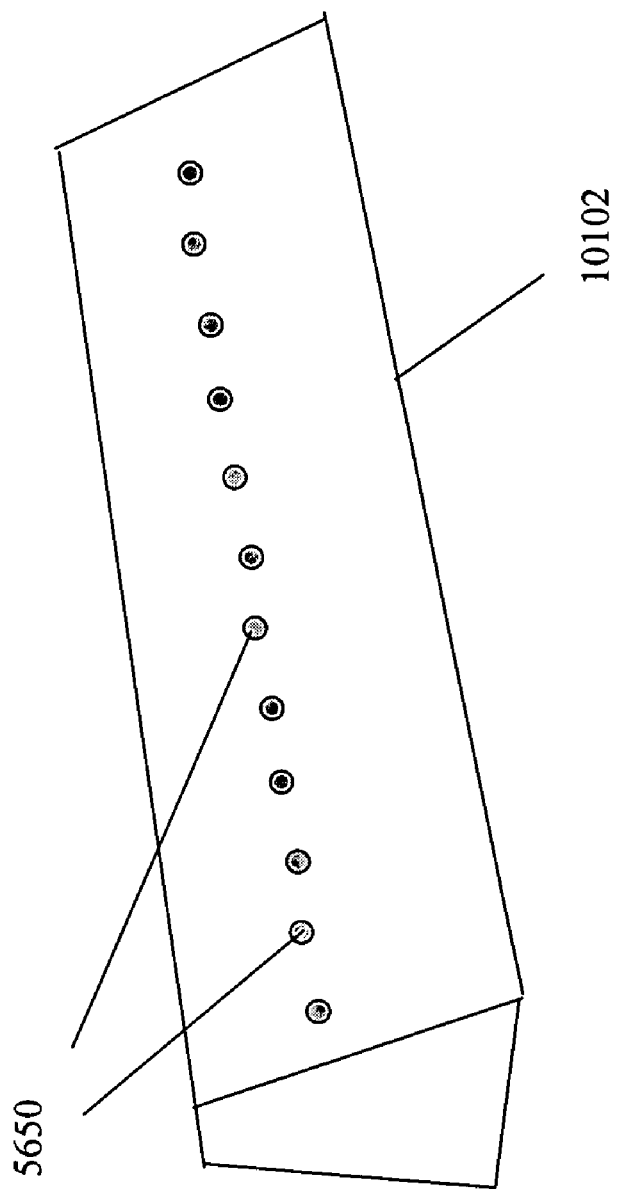
FIG. 101 shows an LED package used in a road barrier.

Referring to FIG. 101, in embodiments an LED package 5650 may be included in a road barrier 10102, such as to light the roadway or to provide a warning signal that a vehicle is approaching the barrier. The barrier might include an energy source, such as a photovoltaic source.

Provided herein are methods and systems that integrate and combine all power conversion into single modules using a single DSP (digital signal processor) and a small number of passive components. This reduces parts count and cost substantially as compared to conventional LED power facilities. Furthermore, the costs and size are reduced to the point where, instead of large networks of low voltage supplies and downstream conversions, the integrated DSP approach can be integrated into each fixture. While the additional components in each fixture increase the fixture cost slightly the overall system cost is reduced substantially. Wiring and cabling is simplified, installation and turn-on processes are reduced significantly and overall system reliability actually improves. In embodiments, the DSP devices may use wide band gap materials such as Silicon Carbide. In addition, by increasing the rate of the control loop that controls the power to an LED lighting system, substantial improvements in the control and stability of the system can be achieved.

Provided herein are power facilities designed for LED-based white light systems. Such power facilities may include the following features: a compact, integrated power management solution; universal input voltage ranges; system level protection; closed loop control; smaller parts count and smaller size, lowering total system cost; surface mount components for inexpensive assembly; high efficiency even at low loads; low power consumption in no-load mode; and power factor correction, resulting in cleaner main power and lower energy costs and voltage losses, ultimately improving facility efficiency. Power factor is a measure of how effectively equipment converts electric current to useful power output. Low power factor results in higher currents for a given amount of power, and low power factor can be detrimental to system performance, because higher currents require heavier gauge wiring and larger transformers, resulting in greater losses. Thus, many of the costs of generating and distributing power are related to current, rather than power. Also, low power factor loads can pollute the electricity for other electricity customers as well. Loads such as motors, transformers, lighting ballasts and low quality power supplies for computers and consumer electronics often have poor power factors. Power Factor Correction (PFC) irons out the artifacts in current, producing a clean current waveform similar to that of an incandescent bulb, which has an excellent power factor.

Methods and systems disclosed herein provide an integrated power system that meets both EMC (Electro-Magnetic Compatibility) Directives: EN61000-3-2 (harmonics) and EN61000-3-3 (flicker) under Class C for lighting devices.

Methods and systems disclosed herein may be used on connection with various lighting components and technologies, including, without limitation, mechanical systems for enabling solid-state lighting, including circuit boards for architectural lighting fixtures and mechanisms for allowing solid-state lighting systems to retrofit into conventional sockets and fixtures; optics for solid-state lighting systems, such as lenses, diffusing tubes and diffusing panels; various architectural lighting fixture types, including wall-washing lights, linear lighting fixtures, and light-emitting surfaces; lamps, bulbs, and circuit boards designed to work with architectural lighting fixtures; methods to make solid-state lighting systems compatible with the installed fixtures and wiring for traditional lighting; methods for illuminating materials in architectural lighting environments based on features of the materials; methods for placing solid-state lighting systems on dimmer circuits; mechanical and electrical systems for retrofitting solid-state lighting systems into fixtures and sockets for traditional lighting sources, such as incandescent, fluorescent, and halogen; color temperature control systems for producing high-quality white light from solid-state lighting systems; and methods for using white light systems in a variety of environments, such as retail, beauty, medical, machine vision, and other environments where light quality is important.

Methods and systems disclosed herein may include small cost-effective control systems that provide high-speed triplicate streams of PWM control with non-linear scaling that are networked addressable systems for energy control and integration into building automation systems. Methods and systems are provided herein for integrating a power supply system directly into LED-based fixtures to provide clean, regulated and power-factor corrected energy and power. The general approach is the elimination of components or part count in favor of more sophisticated control means or the integration of power conversion and output control means. Such methods and systems may include single-stage and two-stage designs for allowing feedback for adjustment of output power, as well as use of a fly-back converter in a power supply with a current source. Power supply design requires effective techniques to store and release energy to provide clean power with little ripple and good power factor. The challenge is to provide good, efficient, low cost, PFC power. A single stage design appears to have some advantages over the 2-stage including fewer components and lower manufacturing cost, but these advantages have a trade-off: performance. To increase the performance by decreasing the ripple, this requires that more energy storage be shifted to the output of the circuit. A typical low voltage switching power supply incorporates a line filter power factor correction (PFC), a capacitor and a DC-DC converter. The line filter provides general rectification and filtering of the high voltage AC input. PFC insures that the voltage and current are in phase. An output capacitor provides a level of energy storage in the event of lapsed input power. This capacitor value is usually sized to permit a missing cycle of input waveform without affecting the output. Finally the DC output voltage is converted to a desired DC level, such as 24VDC.

Another method uses an integrated PFC and DC-DC converter. This is termed a single-stage PFC low voltage power supply. The benefits of a single stage include lower costs and smaller size. The energy storage capacitor is now at the output to maintain output under cycle loss. Without this, the output is adversely affected by power lapse and hold-up, the ability to maintain voltage level.

In a typical LED illumination power and data supply system, the power supply section provides a low-voltage bus to directly drive LED-based lighting fixtures. This is equivalent to several commercial low voltage systems including the Color Kinetics iColor Accent lighting product. The Data Converter provides information to the lights to communicate lighting levels, colors, effects, and other information in a data stream. The communication and power may be provided over a unified power and data cable or over traces on a circuit board or one of many ways to provide data or power to electronics devices including wireless communication systems.

Referring to FIG. 17, the lighting units 102 are the recipient of the power and the data and, in this instantiation, are fed low voltage power to control and drive the light sources 100. With low voltages, voltage drop down the length of a cable is a given and limits the feasible length of a lighting system. The resistance of a wire, while small, is significant and must be taken into account in the system design. Typical lengths for such low voltage systems may be a few tens of meters of cable length. Voltage drop that exceeds a certain amount means that the voltage will decrease to an unusable level at some distance and the electronics within the lights cannot operate. The voltage drop effect can be mitigated through larger gauge of wire, which has a lower electrical resistance. The wire becomes quite heavy and expensive however and there are practical issues of installation and cost that prohibit this approach.

FIG. 17 shows the evolution of this type of system with a direct connection of a high voltage bus to line power (e.g. 120 or 240 VAC) through an optional line filter. This implementation still has all power and data originating from a specific source, perhaps a single enclosure, to provide power and data to a number of fixtures.

Taking the next step allows each of the fixtures to directly connect to line power through a wall plug or direct connection to power locally. This obviates the need to run additional and specific wires for that particular installation and allows the use of standard electrical contractors to install the wiring for powering this system. The data converter can, as shown earlier, be provided by a separate data bus, which can be wired, through the power line or another wireless system. This solution gives flexibility in location and installation.

The system of FIG. 17 is lower is cost, easier to install and less expensive to install, run and maintain than the previous generation of low voltage systems.

In embodiments, a high power ASIC may be provided that embodies a power-factor-corrected power supply, as well as control facilities described herein and in the documents incorporated by reference herein.

While the invention has been described in connection with certain preferred embodiments, other embodiments will be recognized by those of ordinary skill in the art and are encompassed herein. All patents, patent applications and other documents referenced herein are hereby incorporated in their entirety by reference.

The invention claimed is:

1. A light source, comprising:
at least one LED die including an LED;
a first electronic component, including a control facility; and
a package for the LED die, the package including a submount,
wherein the submount incorporates at least one second electronic component for controlling the LED,
wherein the at least one second electronic component is coupled between the first electronic component and the LED die, and
wherein the at least one second electronic component facilitates control of at least one of the intensity and the apparent intensity of the LED die.

2. The light source of claim 1 wherein the LED package includes components selected from the group consisting of an optical facility, a lens, an LED die mounted in a reflector cup, a silicone filling, a wire bond between the LED and the edge of the reflector cup, a submount, a diode in the submount, and a plurality of isolated leads for electrically connecting the LED die to a power source.

3. The light source of claim 1 wherein the LED package includes an LED die and submount mounted in a reflector cup and surrounded by a plastic package.

4. The light source of claim 1 wherein the LED package has a substrate, wherein the substrate is selected from the group consisting of a metal core substrate, a ceramic substrate, a ceramic on metal substrate, an FR4 substrate, a sapphire substrate, an silicon on sapphire substrate, and a silicon carbide substrate.

5. The light source of claim 1 wherein the package includes a reflector.

6. The light source of claim 1 wherein the package includes an electro-static discharge protection diode.

7. The light source of claim 1 wherein the at least one second electronic component includes an application specific integrated circuit.

8. The light source of claim 7 wherein the application specific integrated circuit responds to signals according to a data protocol.

9. The light source of claim 8 wherein the protocol is a serial addressing protocol.

10. The light source of claim 1 further comprising a facility for connecting the light source to a conductive element.

11. The light source of claim 1 wherein the LED die includes a high-power LED die.

12. The light source of claim 11 wherein the LED die includes a 5W or greater LED die.

13. The light source of claim 1 further comprising an optical facility including at least one of a lens, a filter, a diffuser, a reflector, a phosphorescent material, or a luminescent material.

14. The light source of claim 1 further comprising an optical facility including at least one of a Bragg cell, a holographic film, a digital mirror, a spinning mirror, a light pipe, a color mixing system, or a microlens array.

15. A method for providing a light source comprising:
including at least one LED in an LED die;
packaging the LED die with a submount;
incorporating a first electronic component, including a control facility, and at least one second electronic component for controlling the LED in the submount; and
coupling the at least one second electronic component between the LED die and the first electronic component for facilitating control of at least one of the intensity and the apparent intensity of the LED die.

16. The method of claim 15 wherein the LED package includes components selected from the group consisting of a an optical facility, a lens, an LED die mounted in a reflector cup, a silicone filling, a wire bond between the LED and the edge of the reflector cup, a submount, a diode in the submount, and a plurality of isolated leads for electrically connecting the LED die to a power source.

17. The method of claim 15 wherein the LED package includes an LED die and submount mounted in a reflector cup and surrounded by a plastic package.

18. The method of claim 15 wherein the package includes a reflector.

19. The method of claim 15 further comprising providing an optical facility having at least one of a lens, a filter, a diffuser, a reflector, a phosphorescent material, or a luminescent material.

20. The method of claim 15 further comprising providing an optical facility having at least one of a Bragg cell, a holographic film, a digital mirror, a spinning mirror, a light pipe, a color mixing system, or a microlens array.

21. The light source of claim 1 wherein the LED package includes a thermal facility for cooling at least one of the LED die and the submount.

22. The light source of claim 21 wherein the thermal facility is selected from the group consisting of a Peltier effect device, a fluid cooling facility, a potting facility, a thermally conductive plate, a gap pad, a micro-machine, a MEMs device, and a fan.

23. The light source of claim 1 further comprising an external electrical component for the package, wherein the external component is selected from the group consisting of a capacitor, a resistor, and an inductor.

24. The light source of claim 23 wherein the external component is a resistor to set a voltage level of the input signal to the LED package.

25. The light source of claim 1 wherein at least one of the submount and the LED is comprised of a heat-tolerant material.

26. The light source of claim 25 wherein the heat-tolerant material is silicon carbide.

27. The light source of claim 1 wherein the LED package includes a material selected from the group consisting of a metal, a ceramic, an epoxy, a plastic, a glass, a polymer, and a compound.

28. The light source of claim 1 wherein the LED package is used as an indicator.

29. The light source of claim 28 wherein the indicator indicates a sensed condition.

30. The light source of claim 29 wherein the condition is at least one of acceleration, pressure, temperature, time, humidity, light, a fault condition, proximity, and a chemical condition.

31. The light source of claim 28 wherein the indicator displays a state of a device.

32. The light source of claim 28 wherein the indicator displays a state of a sensor.

33. The light source of claim 1 wherein the LED package is used as a component for a display.

34. The light source of claim 33 wherein the display includes one or more of a graphics display, a monitor, a video display, and an animation display.

35. The light source of claim 1 wherein the LED package has an input/output facility.

36. The light source of claim 1 further comprising a photovoltaic energy source.

37. The light source of claim 1 wherein the LED package operates on power supplied from a battery.

* * * * *